(12) United States Patent
Hsu

(10) Patent No.: US 12,002,525 B2
(45) Date of Patent: Jun. 4, 2024

(54) METHODS AND APPARATUS FOR NAND FLASH MEMORY

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days.

(21) Appl. No.: 17/492,553

(22) Filed: Oct. 1, 2021

(65) Prior Publication Data

US 2022/0028469 A1    Jan. 27, 2022

Related U.S. Application Data

(63) Continuation-in-part of application No. 17/446,165, filed on Aug. 26, 2021, which is a
(Continued)

(51) Int. Cl.
*G11C 16/00* (2006.01)
*G11C 16/12* (2006.01)
(Continued)

(52) U.S. Cl.
CPC .......... *G11C 16/3459* (2013.01); *G11C 16/12* (2013.01); *G11C 16/24* (2013.01); *G11C 16/30* (2013.01)

(58) Field of Classification Search
CPC ..... G11C 5/025; G11C 13/0002; G11C 16/08; G11C 2213/71; G11C 16/0483;
(Continued)

(56) References Cited

U.S. PATENT DOCUMENTS 4,796,230 A    1/1989   Young
5,835,414 A   11/1998   Hung et al.
(Continued)

FOREIGN PATENT DOCUMENTS

CN    101055764 A    10/2007
CN    101573762 A    11/2009
(Continued)

OTHER PUBLICATIONS

China Office Action, dated Mar. 16, 2022, for corresponding China Application No. 2019800894490 with English translation (11 pages).
(Continued)

*Primary Examiner* — Thong Q Le
(74) *Attorney, Agent, or Firm* — Intellectual Property Law Group LLP

(57) ABSTRACT

Methods and apparatus for memory operations disclosed. In an embodiment, a method is provided for programming multiple-level cells in a memory array. The memory array includes a plurality of planes and each plane includes a plurality of bit lines. The method includes storing multiple data bits in a first group of planes, one data bit per plane. The multiple data bits are stored in bit line capacitances of the first group of planes. The method also includes programming a selected multiple-level cell in a selected plane according to the multiple data bits that are stored in the bit line capacitances of the first group of planes. The selected plane is not one of the first group of planes.

14 Claims, 132 Drawing Sheets

Related U.S. Application Data continuation-in-part of application No. 17/330,304, filed on May 25, 2021, which is a continuation of application No. 16/849,875, filed on Apr. 15, 2020, now Pat. No. 11,049,579, which is a continuation-in-part of application No. 16/687,556, filed on Nov. 18, 2019, now Pat. No. 11,056,190.

(60) Provisional application No. 63/116,159, filed on Nov. 19, 2020, provisional application No. 63/112,038, filed on Nov. 10, 2020, provisional application No. 63/107,386, filed on Oct. 29, 2020, provisional application No. 63/105,877, filed on Oct. 27, 2020, provisional application No. 63/104,305, filed on Oct. 22, 2020, provisional application No. 63/094,343, filed on Oct. 20, 2020, provisional application No. 63/091,895, filed on Oct. 14, 2020, provisional application No. 63/090,171, filed on Oct. 9, 2020, provisional application No. 63/086,543, filed on Oct. 1, 2020, provisional application No. 63/070,266, filed on Aug. 26, 2020, provisional application No. 62/884,139, filed on Aug. 7, 2019, provisional application No. 62/871,198, filed on Jul. 7, 2019, provisional application No. 62/848,567, filed on May 15, 2019, provisional application No. 62/843,556, filed on May 5, 2019, provisional application No. 62/799,669, filed on Jan. 31, 2019, provisional application No. 62/783,199, filed on Dec. 20, 2018, provisional application No. 62/774,128, filed on Nov. 30, 2018, provisional application No. 62/770,150, filed on Nov. 20, 2018, provisional application No. 62/768,979, filed on Nov. 18, 2018.

(51) Int. Cl.
*G11C 16/24* (2006.01)
*G11C 16/30* (2006.01)
*G11C 16/34* (2006.01)

(58) Field of Classification Search
CPC ..... G11C 16/24; G11C 13/0028; G11C 16/10; G11C 16/26; G11C 13/0069; G11C 13/0026; G11C 8/08; G11C 13/0007; G11C 13/0033; G11C 16/06; G11C 7/18; G11C 16/3459; G11C 13/0023; G11C 16/30; G11C 5/06; G11C 13/00; G11C 16/32; G11C 11/5628; G11C 11/5642; G11C 16/14; G11C 13/0064; G11C 16/16; G11C 2211/5641; G11C 2213/32; G11C 2213/34; G11C 2213/77; G11C 8/14; G11C 13/0021; G11C 13/003; G11C 13/004; G11C 16/02; G11C 16/12; G11C 16/3445; G11C 2216/22; G11C 8/12; G11C 11/5671; G11C 16/102; G11C 16/3427; G11C 2211/5642; G11C 2216/24; G11C 8/10; G11C 11/16; G11C 11/56; G11C 11/5614; G11C 11/5678; G11C 11/5685; G11C 13/0004; G11C 13/0011; G11C 13/0038; G11C 13/025; G11C 15/046; G11C 16/0433; G11C 16/0441; G11C 16/107; G11C 16/20; G11C 16/34; G11C 16/3436; G11C 17/16; G11C 2013/0054; G11C 2013/0076; G11C 2029/0411; G11C 2207/2254; G11C 2213/19; G11C 2213/78; G11C 29/42; G11C 7/1006; G11C 7/1042; G11C 11/4094; G11C 16/3418; G11C 16/3431; G11C 2211/562; G11C 2211/5621; G11C 2211/563; G11C 2211/5648; G11C 2216/14; G11C 5/02; G11C 5/04; G11C 7/1039; G11C 7/1045; G11C 7/12

USPC ..... 365/185.12, 185.18, 148, 185.03, 185.24
See application file for complete search history.

(56) References Cited

U.S. PATENT DOCUMENTS

| | | | |
|---|---|---|---|
| 6,266,272 B1 | 7/2001 | Kirihata et al. | |
| 7,016,229 B2 | 3/2006 | Kim | |
| 7,133,303 B2 | 11/2006 | Ito et al. | |
| 7,630,251 B2 | 12/2009 | Hosono | |
| 7,751,242 B2* | 7/2010 | Roohparvar | G11C 16/0483 365/185.12 |
| 7,827,348 B2 | 11/2010 | Lee et al. | |
| 8,891,311 B2 | 11/2014 | Joo | |
| 8,917,556 B2* | 12/2014 | Kwak | G11C 16/0483 365/185.18 |
| 8,937,833 B2 | 1/2015 | Lee | |
| 9,218,874 B1 | 12/2015 | Koh et al. | |
| 9,747,992 B1 | 8/2017 | Chen et al. | |
| 9,858,993 B2 | 1/2018 | Kang | |
| 10,121,551 B1 | 11/2018 | Miller et al. | |
| 11,049,579 B2 | 6/2021 | Hsu | |
| 11,056,190 B2 | 7/2021 | Hsu | |
| 2002/0075731 A1 | 6/2002 | Amano | |
| 2003/0193824 A1 | 10/2003 | Tsukikawa et al. | |
| 2004/0057310 A1 | 3/2004 | Hosono et al. | |
| 2008/0049530 A1 | 2/2008 | Hirota et al. | |
| 2008/0130363 A1 | 6/2008 | Hosono | |
| 2009/0010064 A1 | 1/2009 | Nazarian | |
| 2009/0310414 A1 | 12/2009 | Lee et al. | |
| 2010/0020602 A1 | 1/2010 | Baek et al. | |
| 2010/0058003 A1 | 3/2010 | Goto et al. | |
| 2010/0214845 A1 | 8/2010 | Choi | |
| 2011/0051524 A1 | 3/2011 | Hsu et al. | |
| 2013/0076781 A1 | 3/2013 | Sirpal et al. | |
| 2013/0141974 A1 | 6/2013 | Jang | |
| 2013/0148429 A1 | 6/2013 | Kim et al. | |
| 2013/0229861 A1 | 9/2013 | Ueda | |
| 2013/0279251 A1 | 10/2013 | Lee | |
| 2014/0022846 A1 | 1/2014 | Kim | |
| 2014/0036590 A1 | 2/2014 | Feeley et al. | |
| 2014/0056072 A1 | 2/2014 | Hung | |
| 2014/0078826 A1 | 3/2014 | Sel et al. | |
| 2014/0233315 A1 | 8/2014 | Park et al. | |
| 2016/0071599 A1 | 3/2016 | Hsu | |
| 2016/0163395 A1 | 6/2016 | Suito | |
| 2016/0027504 A1 | 7/2016 | Lee | |
| 2016/0315097 A1 | 10/2016 | Hsu | |
| 2016/0358661 A1 | 12/2016 | Vali et al. | |
| 2017/0123666 A1 | 5/2017 | Sinclair et al. | |
| 2018/0293014 A1 | 10/2018 | Ravimohan et al. | |
| 2019/0066804 A1 | 2/2019 | Vali et al. | |
| 2019/0087343 A1 | 3/2019 | Shen et al. | |
| 2020/0118630 A1 | 4/2020 | Lin et al. | |
| 2020/0160910 A1 | 5/2020 | Hsu | |
| 2020/0243149 A1 | 7/2020 | Hsu | |
| 2020/0402553 A1 | 12/2020 | Koh et al. | |
| 2021/0327519 A1 | 10/2021 | Hsu | |
| 2021/0391027 A1 | 12/2021 | Hsu | |
| 2022/0028469 A1 | 1/2022 | Hsu | |
| 2022/0044746 A1 | 2/2022 | Hsu | |
| 2022/0351790 A1 | 11/2022 | Hsu | |
| 2023/0022531 A1 | 1/2023 | Hsu | |

FOREIGN PATENT DOCUMENTS

| | | |
|---|---|---|
| CN | 101842849 A | 9/2010 |
| CN | 103021463 A | 4/2013 |

(56) References Cited

FOREIGN PATENT DOCUMENTS

CN 106158037 A 11/2016
JP 2003229545 A1 8/2003

OTHER PUBLICATIONS

International Search Report, dated Mar. 17, 2020, for corresponding International Application No. PCT/US2019/062057 (4 pages).
Written Opinion of the International Searching Authority, dated Mar. 17, 2020, for corresponding International Application No. PCT/US2019/062057 (4 pages).
International Search Report, dated Aug. 6, 2020, for corresponding International Application No. PCT/US2020/028367 (4 pages).
Written Opinion of the International Searching Authority, dated Aug. 6, 2020, for corresponding International Application No. PCT/US2020/028367 (7 pages).
International Search Report, dated Dec. 2, 2021, for corresponding International Application No. PCT/US2021/047828 (2 pages).
Written Opinion of the International Searching Authority, dated Dec. 2, 2021, for corresponding International Application No. PCT/US2021/047828 (4 pages).
China Office Action, dated Nov. 18, 2021 for corresponding China application No. 202080009779.7 with English translation (9 pages).
International Search Report, dated Jan. 11, 2022, for corresponding International Application No. PCT/US2021/053268 (2 pages).
Written Opinion of the International Searching Authority, dated Jan. 11, 2022, for corresponding International Application No. PCT/US2021/053268 (5 pages).
International Search Report, dated Feb. 25, 2022, for corresponding International Application No. PCT/US2021/055918 (4 pages).
Written Opinion of the International Searching Authority, dated Feb. 25, 2022, for corresponding International Application No. PCT/US2021/055918 (5 pages).
International Search Report, dated Oct. 14, 2022, for corresponding International Application No. PCT/US2022/073810 (4 pages).
Written Opinion of the International Searching Authority, dated Oct. 14, 2022, for corresponding International Application No. PCT/US2022/073810 (5 pages).
Ali et al., "In-Memory Low-Cost Bit-Serial Addition using Commodity DRAM Technology" IEEE Transactions on Circuits and Systems I: Regular Papers 67, 1 (2019): 155-156. Oct. 16, 2019 (11 pages).
International Search Report, dated Oct. 28, 2022, for corresponding International Application No. PCT/US2022/074403 (2 pages).
Written Opinion of the International Searching Authority, dated Oct. 28, 2022, for corresponding International Application No. PCT/US2022/074403 (5 pages).
Taiwan Office Action, dated Jun. 2, 2023, for corresponding Taiwan Application No. 111128648 with English translation (18 pages).
Taiwan Office Action, dated Sep. 1, 2023 for corresponding Taiwan Application No. 111128983 with English translation (12 pages).

* cited by examiner

TLC PROGRAM

MLC embodiment

TLC embodiment

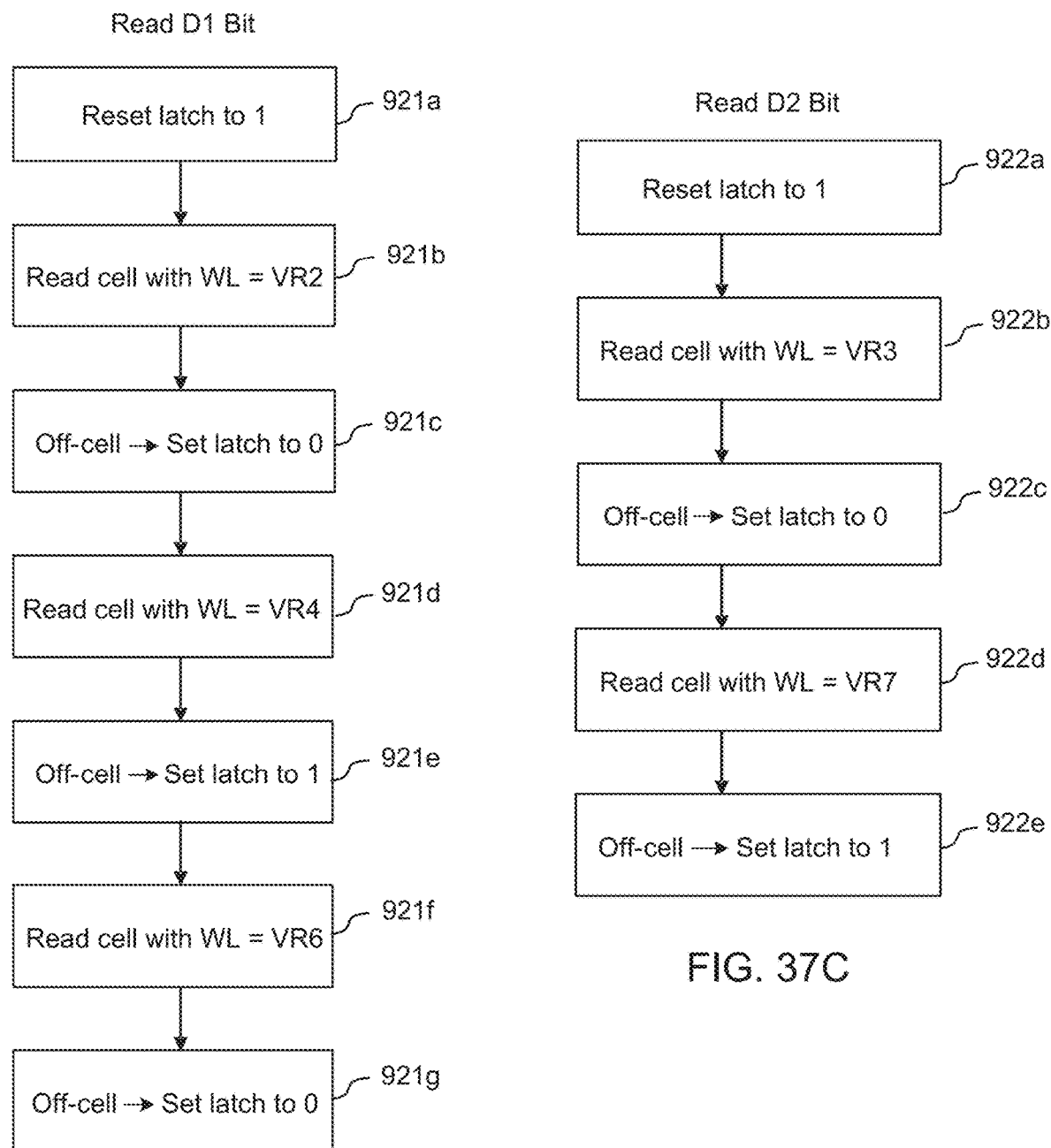

|  | Program even BL | Program odd BL |
|---|---|---|
| VG1 | 0V | VDD+Vt |
| VG2 | VDD+Vt | 0V |
| VS1 | don't care | VDD |
| VS2 | VDD | don't care |
| even BL<br>odd BL | Floating<br>VDD | VDD<br>Floating |

FIG. 49D

| | Read | Pre-charge |
|---|---|---|
| VG1 | Vbias | Vbias |
| VG2 | < VDD-Vt | 0V |
| VS | VDD | VDD |

|      | Select even BL | Select odd BL |
|------|----------------|---------------|
| VG1  | Vbias          | VDD           |
| VG2  | VDD            | Vbias         |
| VS   | 0V             | 0V            |

FIG. 53A

|      | Select even BL | Select odd BL |
|------|----------------|---------------|
| VG1  | Vbias          | VDD           |
| VG2  | VDD            | Vbias         |
| VS1  | 0V             | VDD           |
| VS2  | VDD            | 0V            |

FIG. 53B

|      | Select even BL | Select odd BL |
|------|----------------|---------------|
| VG   | Vbias          | Vbias         |
| VS1  | 0V             | VDD           |
| VS2  | VDD            | 0V            |

FIG. 53C

READ / PROGRAM VERIFY OPERATIONS

PROGRAM OPERATIONS

| | plane0 | plane1 | plane2 | plane3 |
|---|---|---|---|---|
| Operation 1 | program | D0 | D1 | D2 |
| Operation 2 | D0 | program | D1 | D2 |
| Operation 3 | D0 | D1 | program | D2 |
| Operation 4 | D0 | D1 | D2 | program |

| | MLC | TLC | QLC | PLC |
|---|---|---|---|---|
| Read/program Throughput Multiplied by value shown | N/3 | N/4 | N/5 | N/6 |

* N is the number of planes

METHODS AND APPARATUS FOR NAND FLASH MEMORY

CROSS-REFERENCE TO RELATED APPLICATIONS

This application is a continuation-in-part (CIP) of U.S. patent application Ser. No. 17/446,165 filed on Aug. 26, 2021 and entitled "METHODS AND APPARATUS FOR NAND FLASH MEMORY." This application claims the benefit under 35 U.S.C. § 119 of U.S. Provisional Patent Application No. 63/086,543, filed on Oct. 1, 2020 and entitled "NAND FLASH MEMORY READ AND WRITE OPERATIONS" and U.S. Provisional Patent Application No. 63/090,171, filed on Oct. 9, 2020 and entitled "NAND FLASH MEMORY MULTIPLE-LEVEL-CELL READ AND WRITE OPERATIONS" and U.S. Provisional Patent Application No. 63/094,343, filed on Oct. 20, 2020 and entitled "NAND FLASH MEMORY READ AND WRITE OPERATIONS" and U.S. Provisional Patent Application No. 63/104,305, filed on Oct. 22, 2020 and entitled "NAND FLASH MEMORY READ AND WRITE OPERATIONS" and U.S. Provisional Patent Application No. 63/105,877, filed on Oct. 27, 2020 and entitled "NAND FLASH MEMORY READ AND WRITE OPERATIONS" and U.S. Provisional Patent Application No. 63/107,386, filed on Oct. 29, 2020 and entitled "NAND FLASH MEMORY READ AND WRITE OPERATIONS" and U.S. Provisional Patent Application No. 63/112,038, filed on Nov. 10, 2020 and entitled "NAND FLASH MEMORY MULTIPLE-LEVEL-CELL READ AND WRITE OPERATIONS" and U.S. Provisional Patent Application No. 63/116,159, filed on Nov. 19, 2020 and entitled "NAND FLASH MEMORY MULTIPLE-LEVEL-CELL READ AND WRITE OPERATIONS," all of which are hereby incorporated herein by reference in their entireties.

The application Ser. No. 17/446,165 is a continuation-in-part (CIP) of U.S. patent application Ser. No. 17/330,304 filed on May 25, 2021 and entitled "METHODS AND APPARATUS FOR NAND FLASH MEMORY." The application Ser. No. 17/446,165 claims the benefit under 35 U.S.C. § 119 of U.S. Provisional Patent Application No. 63/107,386, filed on Oct. 29, 2020, and entitled "NAND Flash Memory Read and Write Operations," and U.S. Provisional Patent Application No. 63/105,877, filed on Oct. 27, 2020, and entitled "NAND Flash Memory Read and Write Operations," and U.S. Provisional Patent Application No. 63/091,895, filed on Oct. 14, 2020, and entitled "NAND Flash Memory Read and Write Operations," and U.S. Provisional Patent Application No. 63/070,266, filed on Aug. 26, 2020, and entitled "NAND Flash Memory Read and Write Operations, all of which are hereby incorporated herein by reference in their entireties.

The application Ser. No. 17/330,304 is a continuation of U.S. patent application Ser. No. 16/849,875 filed on Apr. 15, 2020 and entitled "METHODS AND APPARATUS FOR NAND FLASH MEMORY." The application Ser. No. 16/849,875 is a continuation-in-part (CIP) of U.S. patent application Ser. No. 16/687,556, filed on Nov. 18, 2019 and entitled "METHODS AND APPARATUS FOR NAND FLASH MEMORY." The application Ser. No. 16/687,556 claims the benefit under 35 U.S.C. § 119 of U.S. Provisional Patent Application No. 62/843,556, filed on May 5, 2019, and entitled "NAND Flash Memory Read and Write Operations," and U.S. Provisional Patent Application No. 62/848,567, filed on May 15, 2019, and entitled "NAND Flash Memory Read and Write Operations," and U.S. Provisional Patent Application No. 62/871,198, filed on Jul. 7, 2019, and entitled "NAND Flash Memory Read and Write Operations," and U.S. Provisional Patent Application No. 62/884,139, filed on Aug. 7, 2019, and entitled "NAND Flash Memory Read and Write Operations," all of which are hereby incorporated herein by reference in their entireties.

The application Ser. No. 16/687,556 claims the benefit under 35 U.S.C. § 119 of U.S. Provisional Patent Application No. 62/768,979, filed on Nov. 18, 2018, and entitled "NAND Flash Memory Read and Write Operations," and U.S. Provisional Patent Application No. 62/770,150, filed on Nov. 20, 2018, and entitled "NAND Flash Memory Read and Write Operations," and U.S. Provisional Patent Application No. 62/774,128, filed on Nov. 30, 2018, and entitled "NAND Flash Memory Read and Write Operations," and U.S. Provisional Patent Application No. 62/783,199, filed on Dec. 20, 2018, and entitled "NAND Flash Memory Read and Write Operations," and U.S. Provisional Patent Application No. 62/799,669, filed on Jan. 31, 2019, and entitled "NAND Flash Memory Read and Write Operations," all of which are hereby incorporated herein by reference in their entireties.

FIELD OF THE INVENTION

The exemplary embodiments of the present invention relate generally to the field of semiconductors and integrated circuits, and more specifically to the design and operation of NAND flash memory.

BACKGROUND OF THE INVENTION

Memory devices are extensively used in industrial and consumer electronics. In many cases, the limitations of the memory affect the size, performance, or cost of an industrial or consumer device, such as a mobile phone.

One type of memory that is used in many devices is called a NAND flash memory. This type of memory is organized as one or more blocks and each block includes strings of memory cells that are accessed by word lines and bit lines. Data is programmed into the memory cells or read from the memory cells using page buffers that are coupled to the bit lines. In a typical NAND flash memory, the number of bit lines that can be program or read at one time is equal to the number of page buffers. This is referred to as 'page-programming' or 'page-reading'. Increasing the number of page buffers may increase the data read/write throughput, to enhance the memory performance. However, the page buffer's circuit size is quite large and typically occupies about 20% to 40% of the memory's die size. Therefore, a typical number of page buffers is limited to a range of 16 KB to 64 KB in today's 512 Gb to 1 Tb products, which limits the read/write performance of the NAND flash memory.

SUMMARY

In various exemplary embodiments, NAND flash memory architectures and methods are provided for use with two-dimensional (2D) or three-dimensional (3D) NAND memory arrays. Embodiments can also be applied to single-level cell (SLC), multi-level cell (MLC), triple-level cell (TLC), quad-level cell (QLC), or any number of bits per cell technology.

In an embodiment, a NAND architecture includes bit line select gates that connect page buffers to a large number of bit lines to increase read/write throughput. In another embodiment, the bit line select gates couple the page buffer to non-adjacent bit lines to mitigate capacitive coupling. In other embodiments, additional pass gates and data registers are used to enhance the operation of the NAND memory. In still other embodiments, novel programming and reading operations are provided that result in increased performance.

In an embodiment, a method is provided for programming a NAND flash memory and includes setting programming conditions on word lines to set up programming of multiple memory cells associated with multiple bit lines, and sequentially enabling bit line select gates to load data from a page buffer to the multiple bit lines of the memory. After each bit line is loaded with selected data, an associated bit line select gate is disabled so that the selected data is maintained on the bit line using bit line capacitance. The method also includes waiting for a programming interval to complete after all the bit lines are loaded with data to program the multiple memory cells associated with the multiple bit lines. At least a portion of the multiple memory cells are programmed simultaneously.

In an embodiment, a NAND flash memory is provided that comprises a memory array having a plurality of bit lines and a plurality of word lines, and a page buffer that stores data to be written into the memory array or data read from the memory array. The page buffer includes a plurality of data lines and is configured to simultaneously program memory cells in multiple cell strings of the memory array. The memory also comprises bit line select gates that selectively connect each data line of the page buffer to two or more bit lines of the memory array.

In an embodiment, a method is provided for programming a NAND flash memory. The method includes precharging selected bit lines of selected memory cells with a bias voltage level while unselected bit lines maintain the inhibit voltage, applying a verify voltage to a selected word line that is coupled to the selected memory cells, and discharging the selected bit lines that are coupled to on-cells over a first time interval. The method also includes sensing a sensed voltage level on a selected bit line, loading the selected bit line with the inhibit voltage level when the sensed voltage level is above a threshold level and a program voltage when the sensed voltage level is equal to or below the threshold level, and repeating the operations of sensing and loading for each of the selected bit lines.

In an embodiment, a method is provided for reading a multiple level cell NAND flash memory. The NAND flash memory comprises strings of memory cells that are coupled to bit lines and word lines and a single bit data latch coupled to the bit lines. The method comprises reading a bit of the cell by performing operation of: applying a selected word line voltage level to the cell to sense an output of the cell; flipping the latch to a first data value when the output indicates that the cell is an off-cell; and repeating the operations of applying and flipping until all word line voltages have been applied to the cell so that the value of the bit is stored in the latch. The method also comprises repeating the operation of reading for each bit of the cell to be read.

In an embodiment, a bit line select gate circuit is provided for reading and programming cells on multiple bit lines under the control of one page buffer. During read operations, the bit line select gate circuit comprises multiple load devices to provide load current to each bit line for current sensing operations. The bit line select gates are sequentially turned on for a period time to enable the page buffer to sense the voltage of each bit line to determine the cell's data. Additionally, for half bit line (HBL) operation, the load devices provide a shielding voltage to the unselected bit lines.

During program operations, the bit line select gates are sequentially turned on for a period of time to enable the page buffer to load program data to each bit line. For half bit line (HBL) operation, the load devices provide an inhibit voltage to the unselected bit lines.

In an embodiment, a NAND flash memory is provided that includes a plurality of bit lines connected to a plurality of bit line select gates, respectively, and a page buffer connected to the plurality of bit line select gates. The NAND flash memory also includes a plurality of load devices connected to the plurality of bit lines, respectively. The plurality of load devices are configured to provide load current during read operations.

In an embodiment, a method is provided for reading a NAND flash memory comprising strings of cells connected to a plurality of bit lines. The plurality of bit lines are connected to a plurality of bit line select gates and a plurality of load devices, respectively. The plurality of bit line select gates are connected to a page buffer, and the method comprises applying a read voltage to a selected word line to generate cell current, and applying load current from the load devices to the bit lines so that bit line voltages are generated based on a ratios of the cell current and the load current for each bit line. The method also comprises selectively enabling the bit line select gates so that the page buffer senses a bit line voltage for each bit line to determine data for that bit line.

In an embodiment, a method is provided for programming multiple-level cells in a memory array. The memory array includes a plurality of planes and each plane includes a plurality of bit lines. The method includes storing multiple data bits in a first group of planes, one data bit per plane. The multiple data bits are stored in bit line capacitances of the first group of planes. The method also includes programming a selected multiple-level cell in a selected plane according to the multiple data bits that are stored in the bit line capacitances of the first group of planes. The selected plane is not one of the first group of planes.

In an embodiment, a method is provided for programming multiple-level cells in a memory array that comprises a plurality of banks, and each bank comprises a plurality of multiple-level cells. The method comprises storing first data bits in a first selected bank using single level cell programming, and reprogramming the first data bits in the first selected bank to a multiple-level cell in a second selected bank using multiple level cell programming during a first reprogramming time interval. The method also comprises storing second data bits in a third selected bank during the first reprogramming time interval using single level cell programming.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 37A-C show methods for reading a bit using the single latch page buffer shown in FIG. 36.

FIG. 49D shows a table of exemplary bias conditions for the signals VG1, VG2, VS1, and VS2 used during programming operations of the circuit shown in FIG. 49C.

FIG. 53A shows an exemplary embodiment of bias conditions for on-cell charging current sensing operations for the embodiment shown in FIG. 50A.

FIG. 53B shows an exemplary embodiment of bias conditions for the embodiment shown in FIG. 49A.

FIG. 53C shows an exemplary embodiment of bias conditions for the embodiment shown in FIG. 51A.

DETAILED DESCRIPTION

In various exemplary embodiment, methods and apparatus for the design and operation of NAND flash memory architectures are provided that can be used with two-dimensional (2D) or three-dimensional (3D) NAND arrays. Embodiments can also be applied to single-level cell (SLC), multi-level cell (MLC), triple-level cell (TLC), quad-level cell (QLC), or any number of bits per cell technology.

Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

Figure 1A:
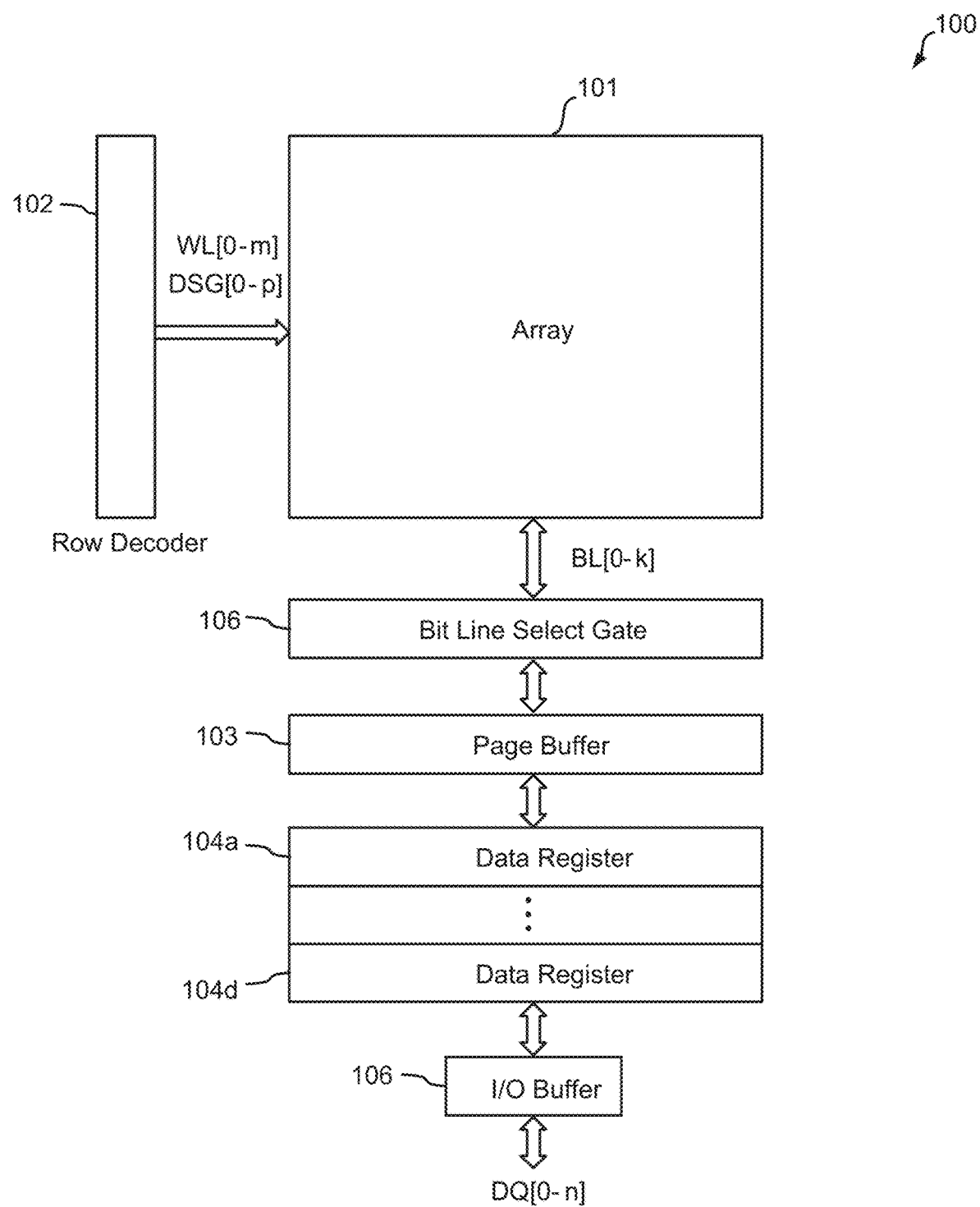
FIG. 1A shows an exemplary block diagram of NAND flash memory architecture in accordance with embodiments of the invention.

FIG. 1A shows an exemplary block diagram of NAND flash memory architecture 100 in accordance with embodiments of the invention. The architecture 100 includes a 2D or 3D NAND flash memory array 101 that that can be accessed using multiple word lines (WL[0-$m$]), and bit lines (BL[0-$k$]). The architecture 100 includes row decoder 102 and page buffer 103. The page buffer 103 contains multiple page buffers, such as page buffers 200 shown in FIG. 2A and FIG. 3A. The page buffer 103 performs both functions of a program buffer for program operations and a sense amplifier for read operations. In a conventional NAND flash memory, each page buffer is connected to one-bit line, which is referred to as an all bit line (ABL) structure, or two-bit lines, which is referred to as a half bit line (HBL) structure. In either case, the number of the bit lines that can be program and read together is equal to the number of page buffers. This is referred to as 'page-programming' or 'page-read'. Increasing the number of page buffers may increase the data read/write throughput, to enhance the memory performance. However, the page buffer's circuit size is quite large. It typically occupies about 20% to 40% of the die size. Therefore, the typical number of page buffers is limited to a range of 16 KB to 64 KB in today's 512 Gb to 1 Tb products, which limits the read/write performance of the NAND flash memory.

In an exemplary embodiment, the architecture 100 comprises a bit line select gate block 106. The bit line select gate block 106 contains multiple bit line select gates, such as select gate 210 shown in FIG. 2A and FIG. 2B. The bit line select gates allow a page buffer to be coupled to multiple bit lines. By using a novel architecture disclosed, multiple bit lines may be programmed and read together. This is called 'multiple-page programming' and 'multiple-page read'. This can significantly increase the data read/write throughput without increasing the number of page buffers.

In an embodiment, data registers 104$a$-$d$ are provided and may also be referred to as data cache. Although four data registers are shown, there can be any desired number of data registers. The data registers allow for parallelism between the operations of the array 101 and the data input/output (I/O). During operation, when the array 101 performs a read or write operation using the page buffer 103, the new data may be loaded into the data registers 104$a$-$d$ or output from the data registers. This can enhance the performance of the memory. In an embodiment, the architecture 100 includes an input/output (I/O) buffer 106 that connects to an external data bus DQ[0-$n$].

Figure 1B:
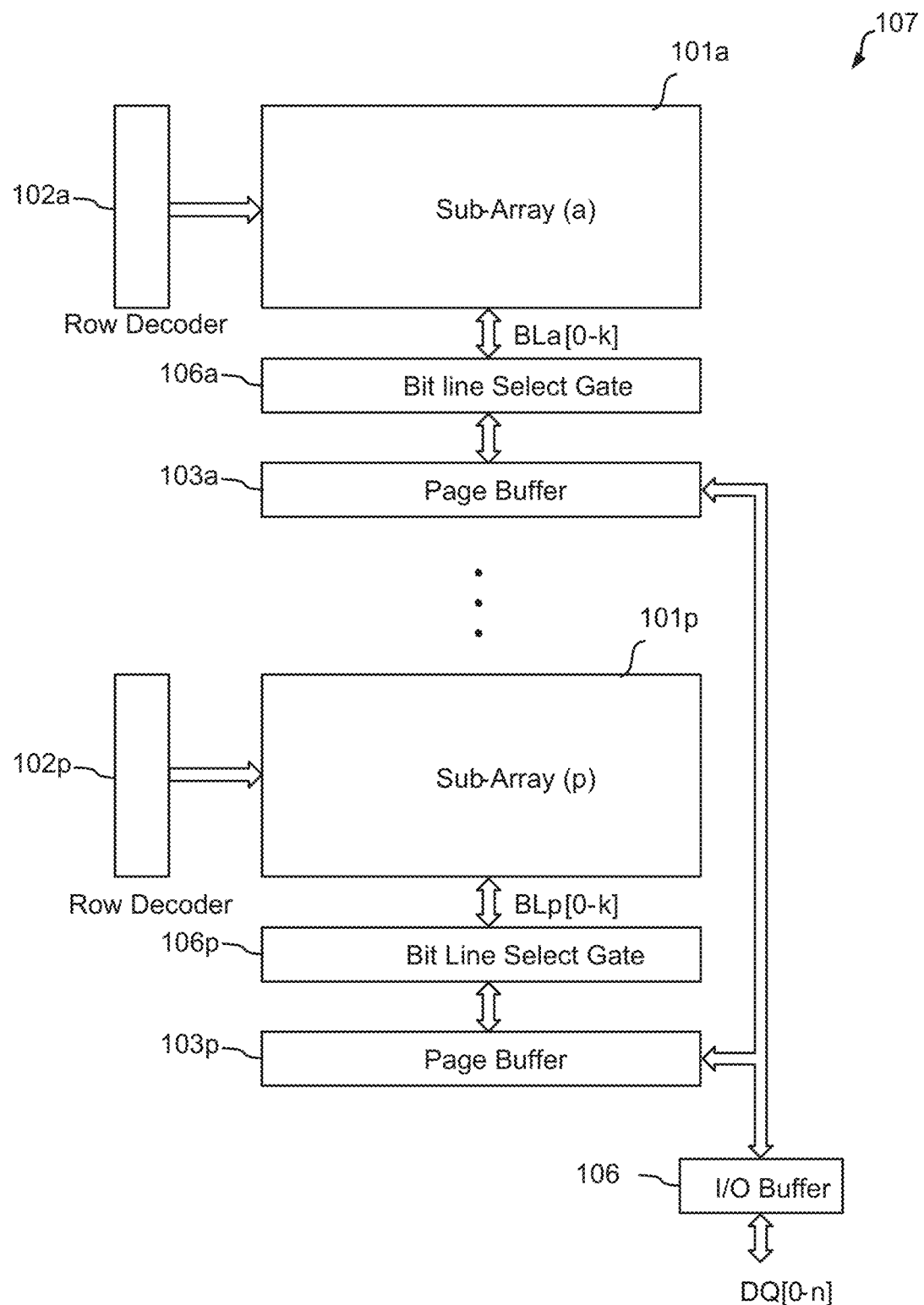
FIG. 1B shows another embodiment of a NAND flash memory architecture constructed in accordance with embodiments of the invention.

FIG. 1B shows another embodiment of a NAND flash memory architecture 107 constructed in accordance with embodiments of the invention. In this embodiment, the array is divided into multiple sub-arrays 101$a$ to 101$p$. Each sub-array has its own row decoders 102$a$ to 102$p$, bit line select gates 106$a$ to 106$p$, and page buffers 103$a$ to 103$p$. In an embodiment, each sub-array has the same number of bit lines as the array 101 shown in FIG. 1A, such as BLa[0-$k$] for sub-array 101$a$ and BLp[0-$k$] for sub-array 101$p$. In an embodiment, the total number of the page buffers is the same as the embodiment shown in FIG. 1A to keep the die size the same. Assuming that the number of the sub-arrays is P, the number of the page buffers 103$a$ to 103$p$ for each sub-array 101$a$ to 101$p$ will be reduced to 1/P. As a result, the number of the bit lines connected to each page buffer is increased P times.

Figure 1C:
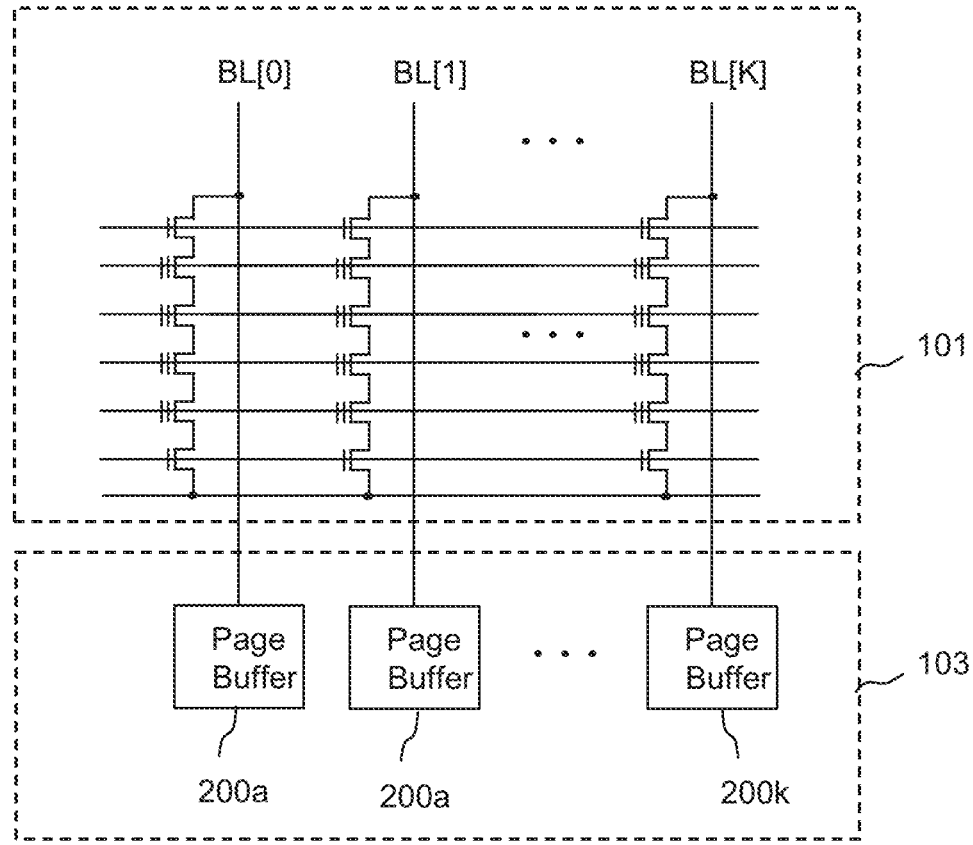
FIG. 1C shows a detailed embodiment of a conventional 3D NAND flash memory cell array and page buffers.

FIG. 1C shows a detailed embodiment of a conventional 3D NAND flash memory cell array 101 and page buffers 103. The memory array 101 contains bit lines BL[0-K]. Each bit line is connected to one of the page buffers 200$a$ to 200$k$.

Figure 1D:
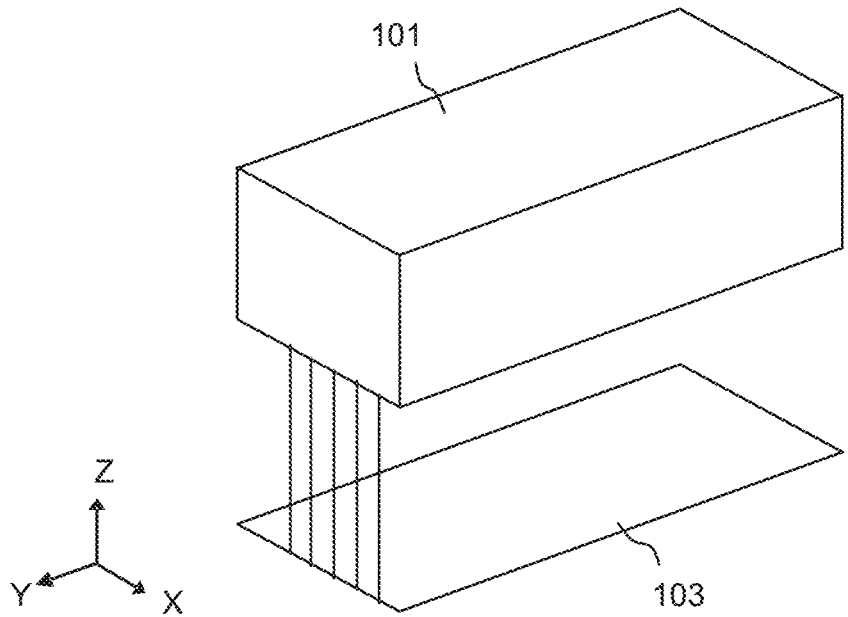
FIG. 1D shows a configuration of the conventional structure of a 3D NAND memory array.

FIG. 1D shows a configuration of the conventional structure of a 3D NAND memory array. The 3D memory cell array 101 is located on top of the page buffer circuits 103 to save silicon area.

Figure 1E:
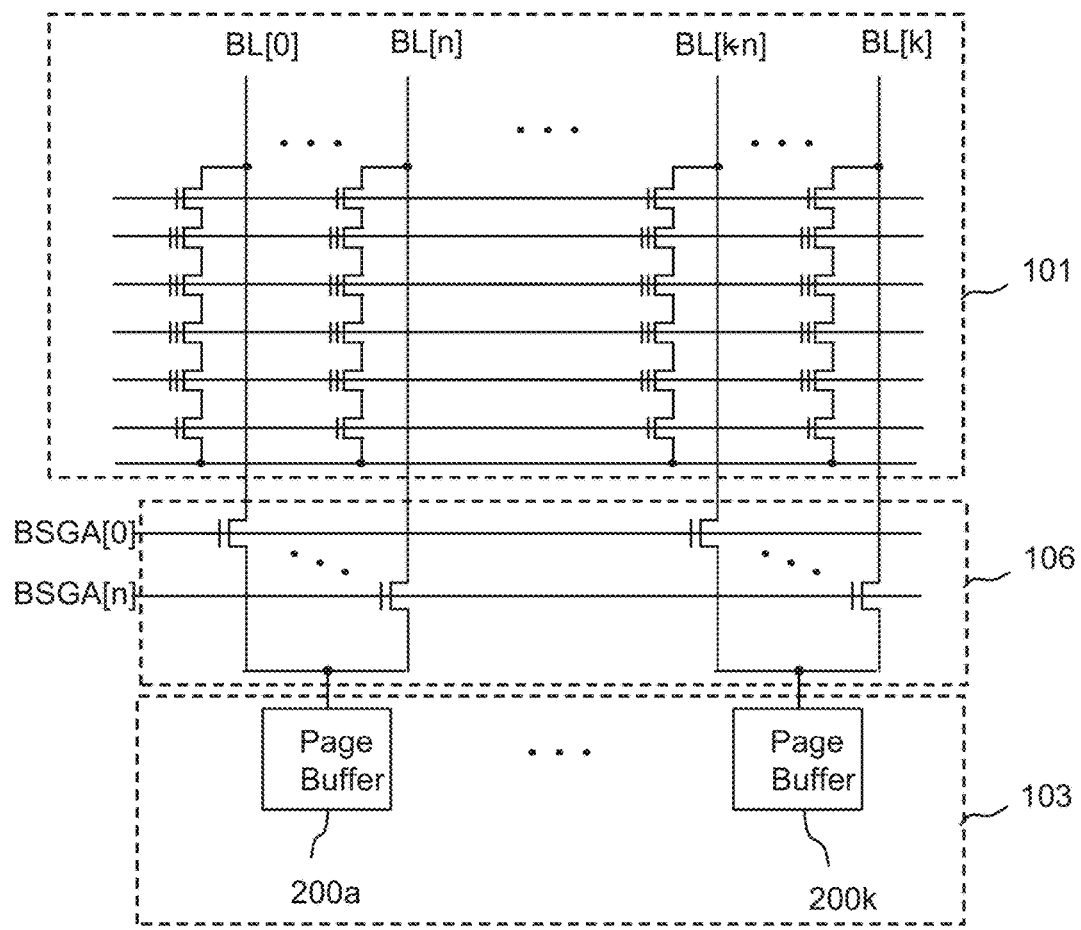
FIG. 1E shows an embodiment of an array structure in accordance with the invention.

FIG. 1E shows an embodiment of an array structure in accordance with the invention. The bit lines BL[0-$k$] are connected to the page buffers 103 through bit line select gates 106. Therefore, the number of the page buffers 103 can be reduced when compared to a conventional architecture. For example, two bit-lines are connected to each page buffer, which reduces the number of page buffers that are used.

Figure 1F:
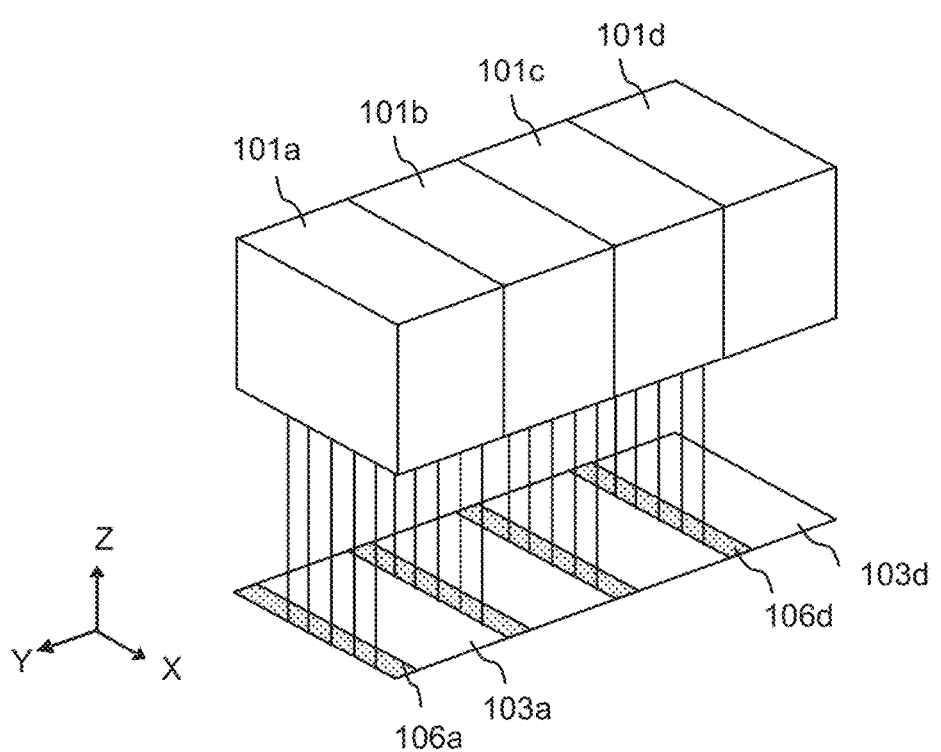
FIG. 1F shows an embodiment of a 3D array structure in accordance with the invention.

FIG. 1F shows an embodiment of a 3D array structure in accordance with the invention. The 3D cell array is divided into sub-arrays 101a to 101d that are located on top of the page buffers 103a to 103d. The sub-arrays 101a to 101d are accessed through the bit line select gates 106a to 106d. Each sub-array is connected to one page buffer.

Figure 2A:
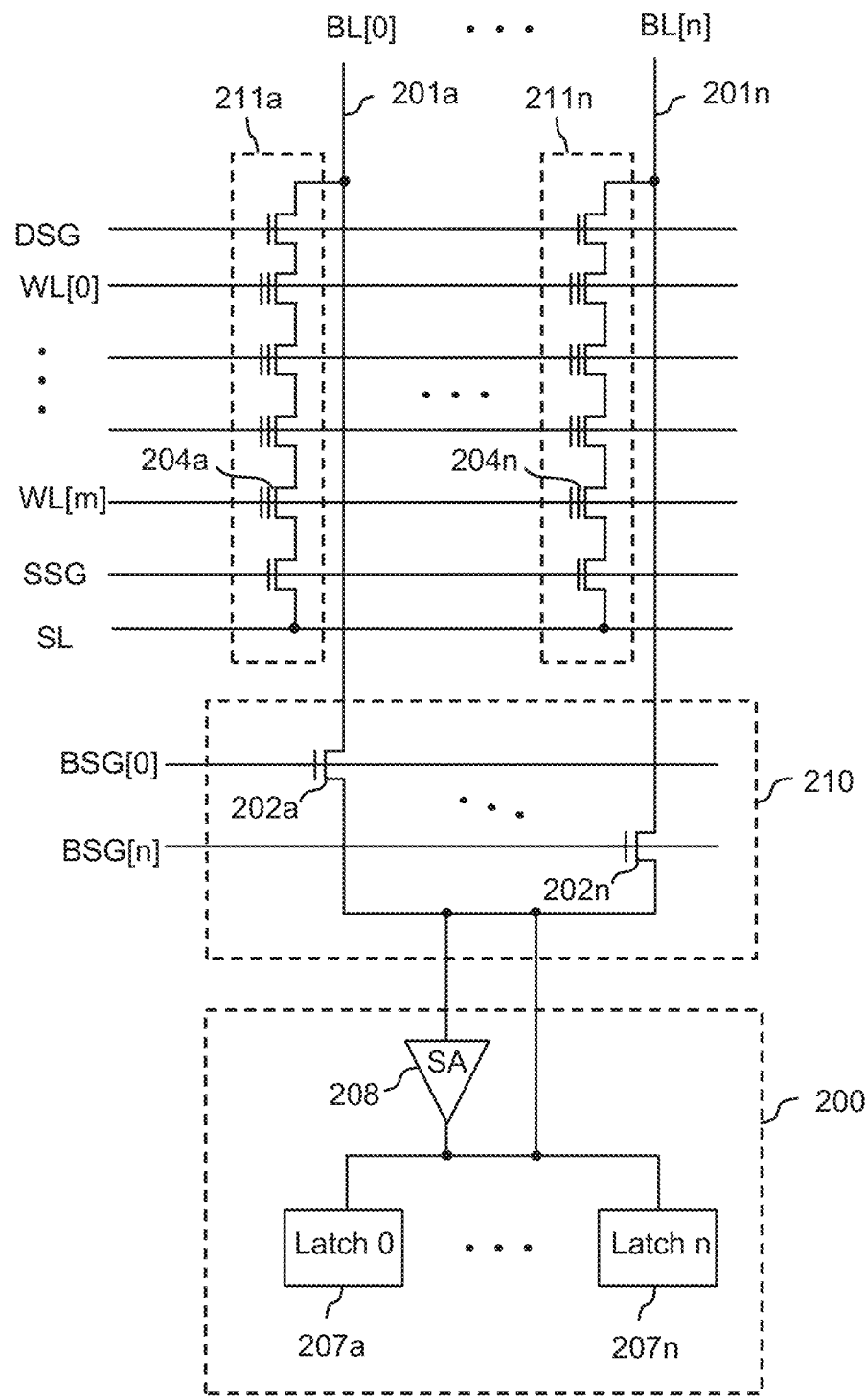
FIG. 2A shows an embodiment of a page buffer and bit line select gate configuration in accordance with embodiments of the invention.

FIG. 2A shows an embodiment of a page buffer and bit line select gate configuration in accordance with embodiments of the invention. The bit lines 201a to 201n are multiple bit lines BL[0] to BL[n] in an array or sub-array. The bit line may contain multiple strings of NAND flash memory cells such as strings 211a to 211n. The strings may be formed using 2D or 3D array architectures. The bit lines are connected to a page buffer 200 through a bit line select gates 210 that comprises individual select gates 202a to 202n. Each of the bit line select gates 202a to 202n can be selectively enabled or disabled by select gate signals BSG[0] to BSG[n], respectively. The number of the bit lines connected to one page buffer may be any number, such as 2, 4, 8, 16, etc. There is no limitation for the number of the bit lines that can be connected to one page buffer.

The page buffer 200 functions as both a program buffer and a sense amplifier. The page buffer 200 contains multiple latches 207a to 207n to store program data. A sense amplifier 208 operates to read the data from the cells. In program mode, the latches 207a to 207n apply the program data to the bit lines. In program-verify mode, the sense amplifier 208 reads the data from the cells, and updates the program data stored in the latches 207a to 207n. In read mode, the sense amplifier 208 reads the data from the cells and stores the data in the latches 207a to 207b, and then the data may be transferred to an output buffer.

In conventional systems during programming, one page buffer may only provide one data value to one bit line at one time. During read and program-verification, one page buffer may only read data from one bit line at one time. Therefore, the total bit lines in programming, verification, and read are equal to the number of page buffers. For example, in one conventional system, each bit line is connected to one page buffer. This is called an All Bit Line (ABL) architecture. In another conventional design, two bit lines are shared with one page buffer. This architecture is referred to as a Half Bit Line (HBL) architecture. This architecture reduces by half number of the page buffers. However, during read and write mode, only half of the bit lines may be connected to the page buffers, and therefore the data throughput is reduced by ½.

In various exemplary embodiments, a novel architecture is disclosed to read and write multiple bit lines with one page buffer simultaneously, and therefore the data throughput may be significantly increased. For example, in FIG. 2A, assuming the word line WL[m] is selected, the cells 204a to 204n may be read and programmed simultaneously by one page buffer 200. Thus, the number of page buffers may be reduced and the read and write data throughput may be increased. A more detailed description of the design and operation of the novel NAND flash memory architecture is provided below.

It should also be noted that the cells 204a to 204n may belong to different pages. The pages may be selected by the bit line select gate signals BSG[0] to BSG[n]. Therefore, the architecture may provide multiple bit-line read and write operations, or multiple-page read and write operations.

In traditional page buffer design, the number of the latches in a page buffer is determined by the number of bits stored in one cell. For example, for an SLC design, the page buffer may have only one latch to store 1-bit of data. For MLC design, the page buffer may have two latches to store 2-bits of data. For TLC, the page buffer may have 3 latches to store 3-bits of data. For QLC, the page buffer may have 4 latches to store 4-bits of data. However, in accordance with embodiments of the invention, extra latches may be added to further enhance the advantages of the multiple-page read and write operations.

Figure 2B:
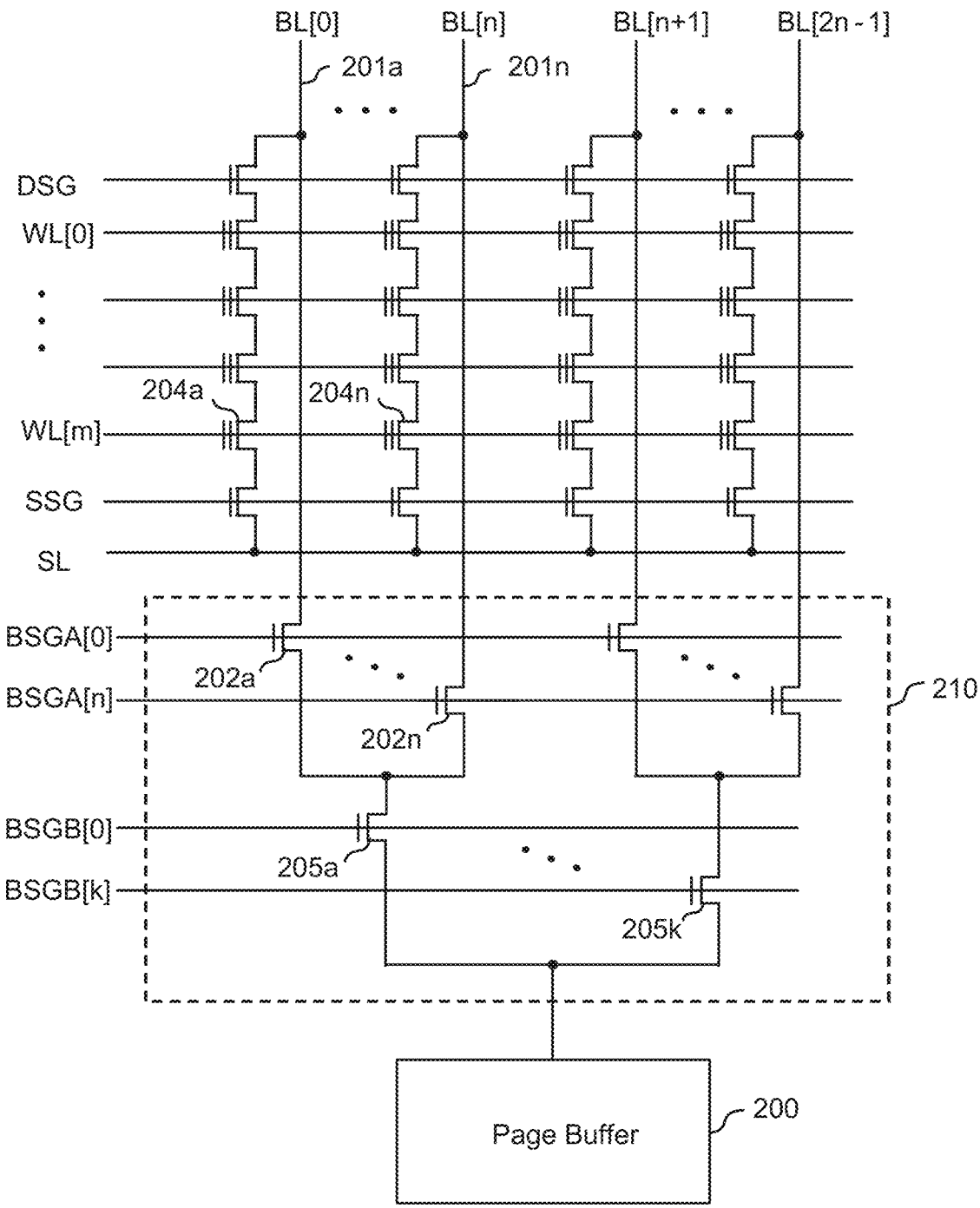
FIG. 2B shows another embodiment of the page buffer configuration in accordance with embodiments of the invention.

FIG. 2B shows another embodiment of the page buffer configuration in accordance with embodiments of the invention. As illustrated in FIG. 2B, the array may have multiple layers of bit line select gates, such as 202a to 202n and 205a to 205k. In this case, the select gates 202a to 202n are the first layer of bit line select gates that are connected to control signals BSGA[0] to BSGA[n]. The select gates 205a to 205k are the second layer of bit line select gates that are connected to control signals BSGB[0] to BSGB[k]. Compared with the embodiment shown in FIG. 2A, this embodiment reduces the number of control signals. For example, assuming 16 bit lines share one page buffer, the embodiment in FIG. 2A uses 16 control signals, while the embodiment in FIG. 2B uses 8 control signal, (e.g., 4 for the first layer and 4 for the second layer). In various embodiments, there is no limitation on the number of the layers of bit line select gates that can be used. For example, the array may have 2, 3, 4, etc. layers of bit line select gates. In an embodiment, the bit line select gates may be implemented using any suitable devices. They are not limited to only NMOS devices.

Figure 2C:
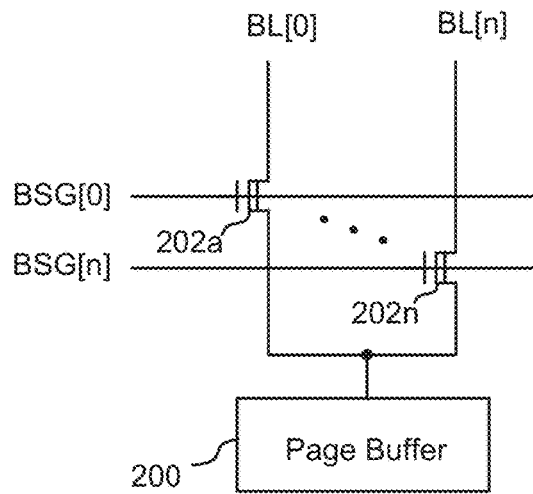
FIGS. 2C-E show embodiments illustrating bit line select gates in accordance with the invention.
Figure 2D:
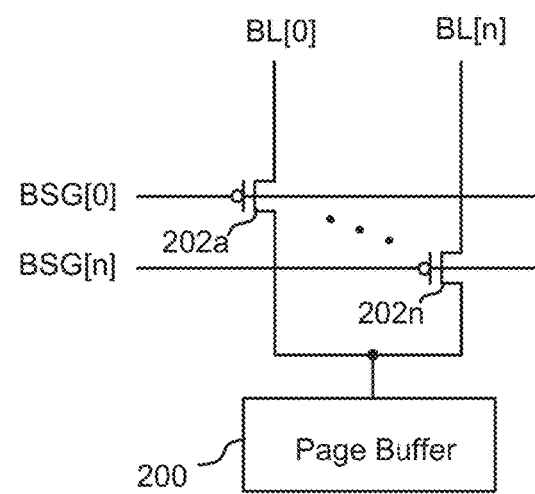
Figure 2E:
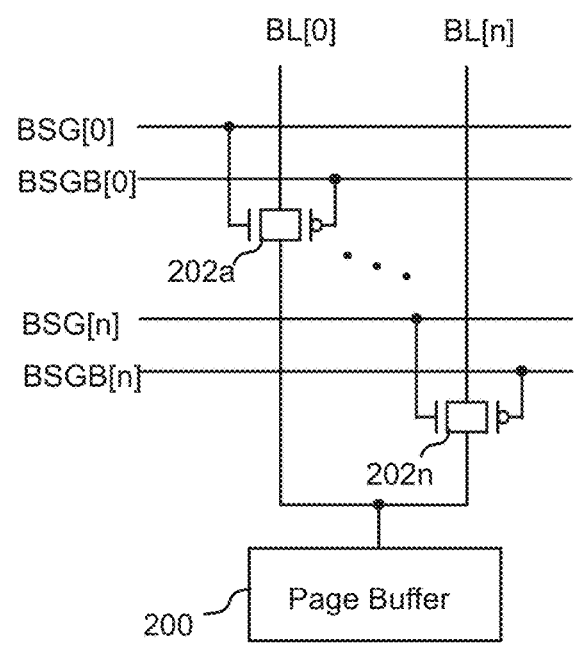

FIGS. 2C-E show embodiments illustrating bit line select gates in accordance with the invention.

FIG. 2C shows a circuit that illustrates how the bit line select gates 202a to 202n may be implemented by native devices or depletion-mode devices to increase the bit line pre-charged voltage and current.

FIG. 2D shows a circuit that illustrates how the bit line select gates 202a to 202n may be implemented by PMOS devices.

FIG. 2E shows a circuit that illustrates how the bit line select gates 202a to 202n may be implemented by PMOS-NMOS pairs. Moreover, the bit line select gates may be implemented by high voltage (HV) devices or low voltage (LV) devices. These modifications and variations are within the scope of the embodiments.

Figure 3A:
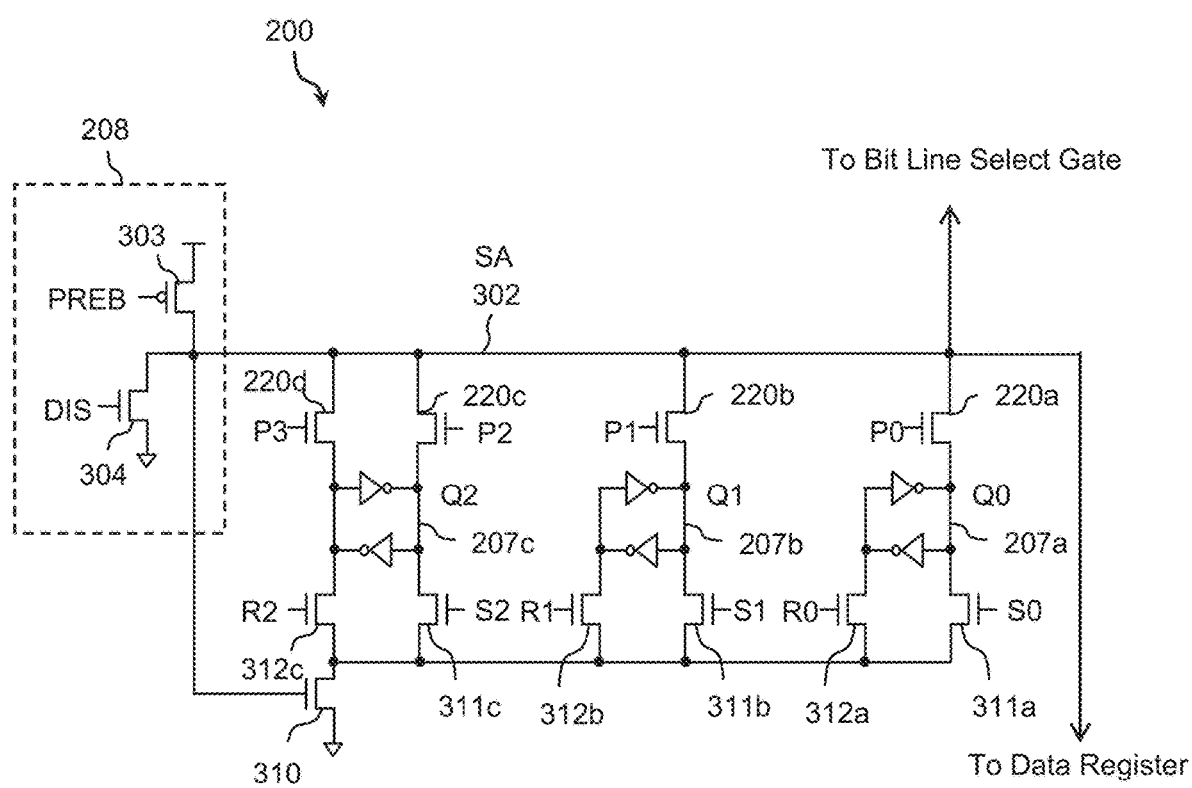
FIGS. 3A-D shows embodiments of a page buffer circuit.

FIG. 3A shows an embodiment of the page buffer circuit 200. The page buffer 200 circuit is configured both as a program buffer and a sense amplifier. The program buffer comprises three latches 207a to 207c. The latches 207a to 207c store the data in Q0, Q1, and Q2 nodes as shown. The data of the latches 207a to 207c can be set to 0 (0V) by turning on the set devices 311a to 311c, and reset to 1 (VDD) by turning on the reset devices 312a to 312c. Latch pass gates 220a to 220d are also shown. During program mode, 3 bits of data, D0, D1, and D2, are first loaded into the three latches 207a to 207c. The signals P0 to P3 select and turn on one of the pass gates 220a to 220d to pass the data of the latches 207a to 207c to the selected bit line according to the programmed Vt level to program the selected cell. Also shown is sense amplifier 208.

During read mode, the data may be read from the cells by the sense amplifier 208, and then latched in the three latches 207a to 207c. The sense amplifier's sensing node 302 is denoted by (SA). The sensing node 302 is connected to the gate of a sensing device 310. The sense amplifier 208 includes a pre-charge device 303 and a discharge device 304.

During bit line pre-charging, the pre-charge device 303 is turned on to precharge SA node 302 and the bit line to VDD. During read mode, the signal PREB is applied with VDD to turn off the pre-charge device 303, or a reference voltage, Vref, to limit the pull-up current of the pre-charge device 303. The pull-up current is designed to be lower than the on-cell current, thus the on-cell can discharge the bit line to pull low the SA node 302.

After the on-cell discharges the bit line voltage to below Vt of the sensing device 310, depending on which D0 to D2 bit is read, the selected signal of S0 to S2 is applied with a pulse to turn on the set devices 311a to 311c to set the latch 207a to 207c. The latches 207a to 207c are previously reset to data 1 (VDD). For on-cell, the bit line and SA node 302 are discharged to below Vt of the sensing device 310, which turns off the sensing device 310, thus the data of the latch remain at 1 (VDD). For off-cell, because the SA node 302 remains at VDD, which turns on the sensing device 310 and allow the latches to be set to data 0 (VDD).

A more detailed operation of the operation of the sense amplifier 208 is described below with reference to FIGS. 6A-C.

Figure 3B:
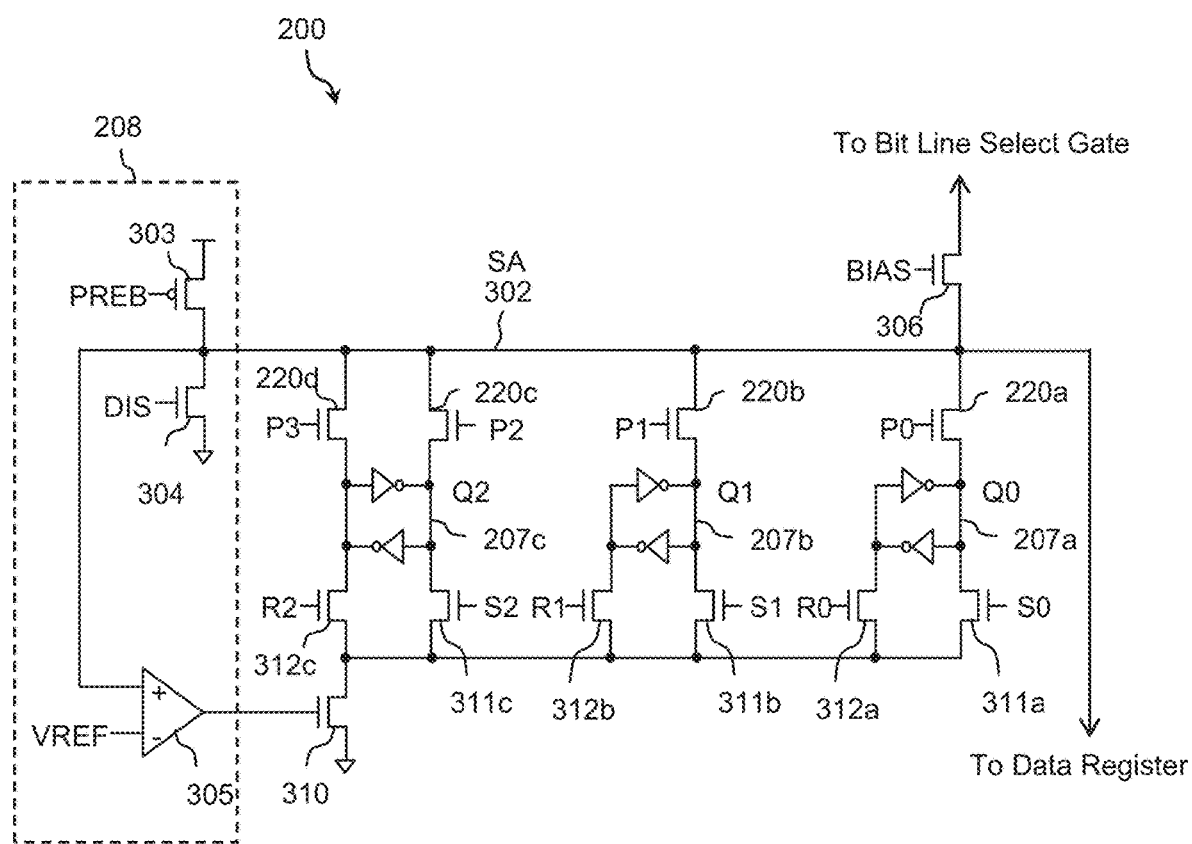

It should be noted that the exemplary circuit shown in FIG. 3A does not have a bias device. However, FIG. 3B illustrates an alternative circuit that includes bias device 306. The bias device 306 is used as a cascade stage to control the pre-charge voltage of the bit line. In the embodiment shown in FIG. 3A, the function of the bias device is performed by the bit line select gates, which is illustrated by the read operation waveforms shown in FIG. 7D and FIGS. 20A-B.

Figure 3C:
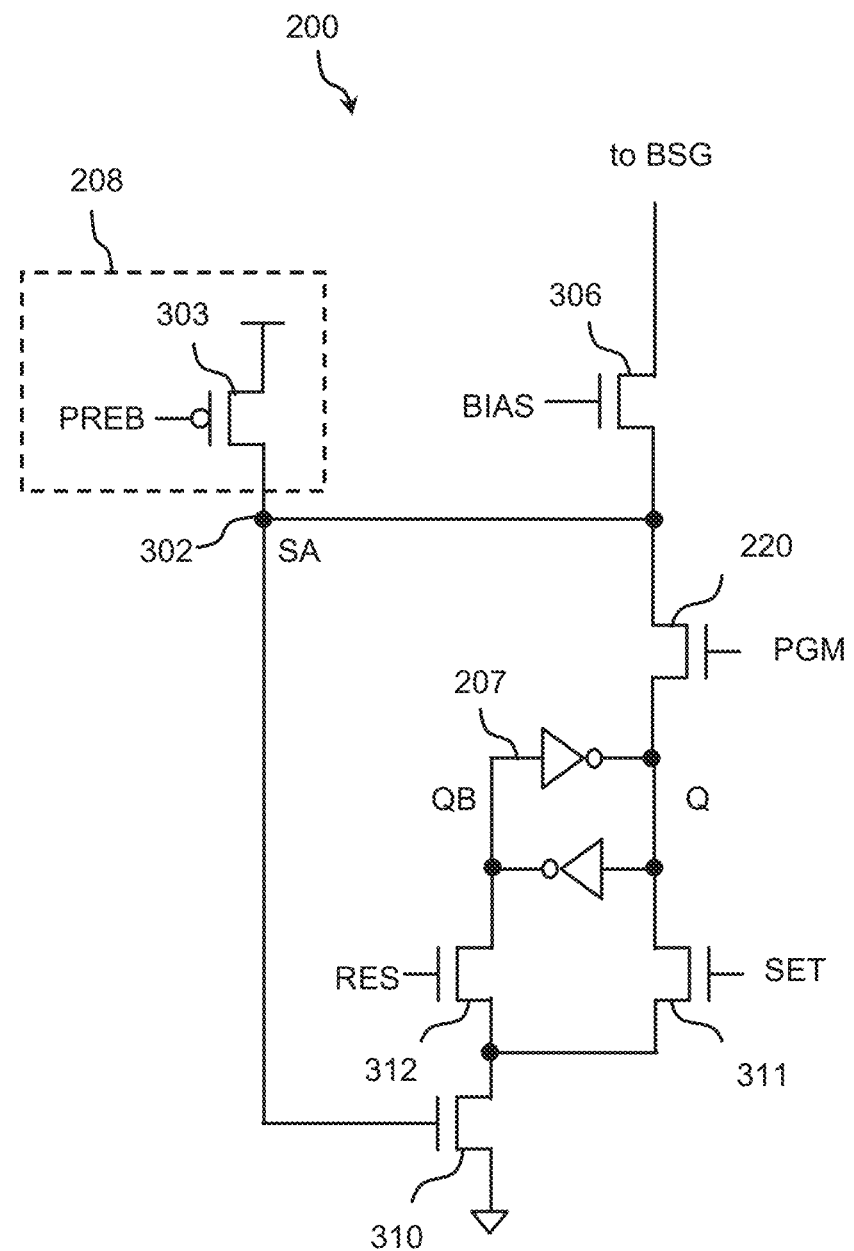
Figure 3D:
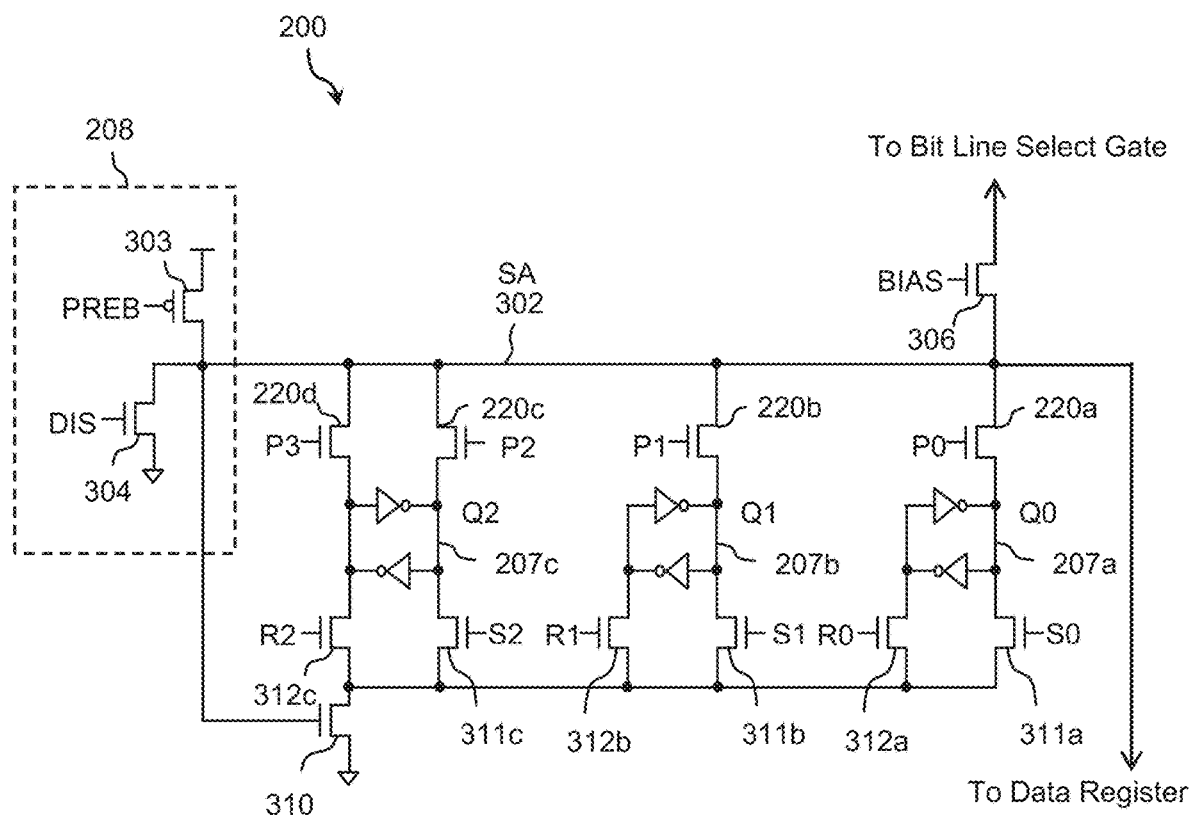

In another embodiment, the page buffer circuit shown in FIG. 3A can be modified as shown in FIG. 3D to include bias device 306. In the embodiment shown in FIG. 3D, a BIAS signal applies a bias voltage to the bias device 306 to control the bit line precharge voltage. Thus, the signals of the bit line select gates may be supplied with VDD level.

FIG. 3B shows another embodiment of the page buffer circuit 200. The page buffer 200 shown in FIG. 3B is used for current-sensing, while the embodiment shown in FIG. 3A is used for voltage-sensing. In this embodiment, a gain stage, such as comparator 305, is added to the sense amplifier 208 to amplify the voltage of sensing node 302. In another embodiment, the comparator 305 is replaced by invertor. Moreover, a bias device 306 may be added to become a cascade stage. The bias device 306 limits the bit line's pre-charge voltage to (BIAS–Vt) rather than VDD, thus it reduces the pre-charging time.

FIG. 3C shows another embodiment of the page buffer circuit 200 that uses a single data latch for SLC applications. The page buffer 200 circuit is configured both as a program buffer and a sense amplifier. The program buffer comprises a data latch 207. Latch pass gate 220 is also shown. During program mode, the signal PGM turns on the pass gate 220 to pass the data of the latch 207 to the selected bit line to program the selected cell. Also shown is sense amplifier 208. During read mode, the data may be read from the cell by the sense amplifier 208, and then latched in the data latch 207. The sense amplifier's sensing node 302 is denoted by (SA). The sense amplifier 208 includes a pre-charge device 303. During read and program-verify modes, the signal PREB turns on the pre-charge device 303 to charge up the SA node to VDD, and also charges up the selected bit line through the bias device 306. The signal BIAS is applied to the bias device 306 to control the pre-charge voltage of the selected bit line. The bit line will be precharged to BIAS-Vt, where Vt is the threshold voltage of the bias device 306. After the bit line is pre-charged, the selected cell is read by applying a read voltage to the selected word line. If the selected cell is an on-cell, it will discharge the bit line voltage. When the bit line voltage is discharged to below BIAS-Vt, the bias device 306 will be turned on and will pull down the SA node to the same voltage as the bit line. When the bit line voltage is discharged to below Vt of the sensing device 310, the sensing device 310 is turned off. If the cell is an off-cell, the bit line will remain at the pre-charge voltage and the SA node will remain at VDD. The SA node voltage will turn on the sensing device 310. Set 311 and reset 312 devices are used to set and reset the Q and QB nodes of the latch 207. When the device 310 is turned on, the signals SET or RES can be supplied with a VDD level pulse to turn on the devices 311 or 312 to set the Q node of the latch 207 to data 0 (0V) or data 1 (VDD), respectively.

FIGS. 4A-D show the operation of the page buffer and bit line select gates in accordance with the invention.

Figure 4A:
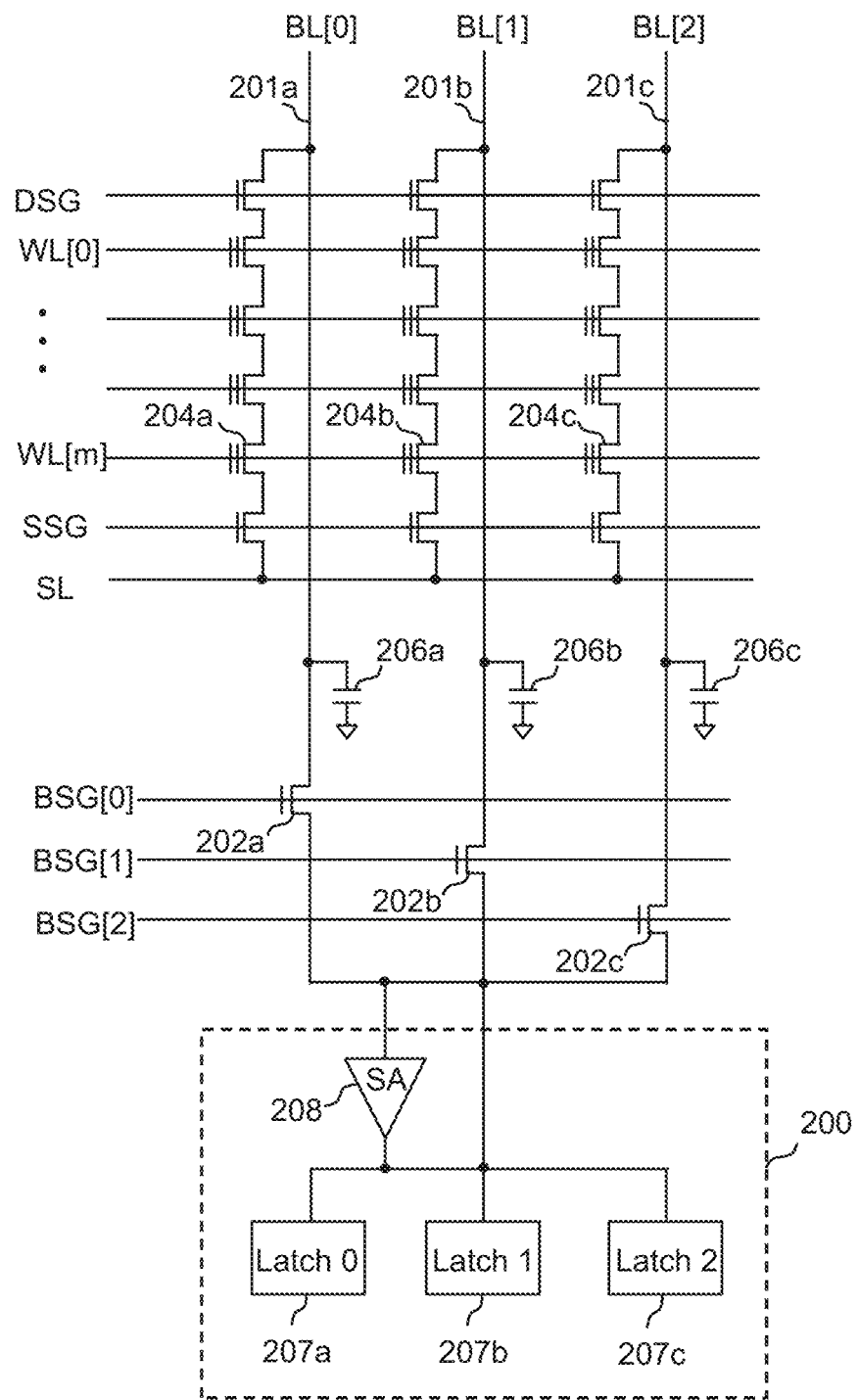
FIGS. 4A-D show the operation of a page buffer and bit line select gates in accordance with the invention.

FIG. 4A shows an exemplary embodiment that uses a TLC page buffer 200. The TLC page buffer 200 comprises three data latches 207a to 207c and a sense amplifier 208. For embodiments using MLC and QLC, the page buffer may contain two and four data latches, respectively. The page buffer 200 is connected to multiple bite lines 201a to 201c through the bit line select gates 202a to 202c. Bit line capacitances 206a to 206c represents the bit line capacitance of the bit lines 201a to 201c, respectively.

Figure 4B:
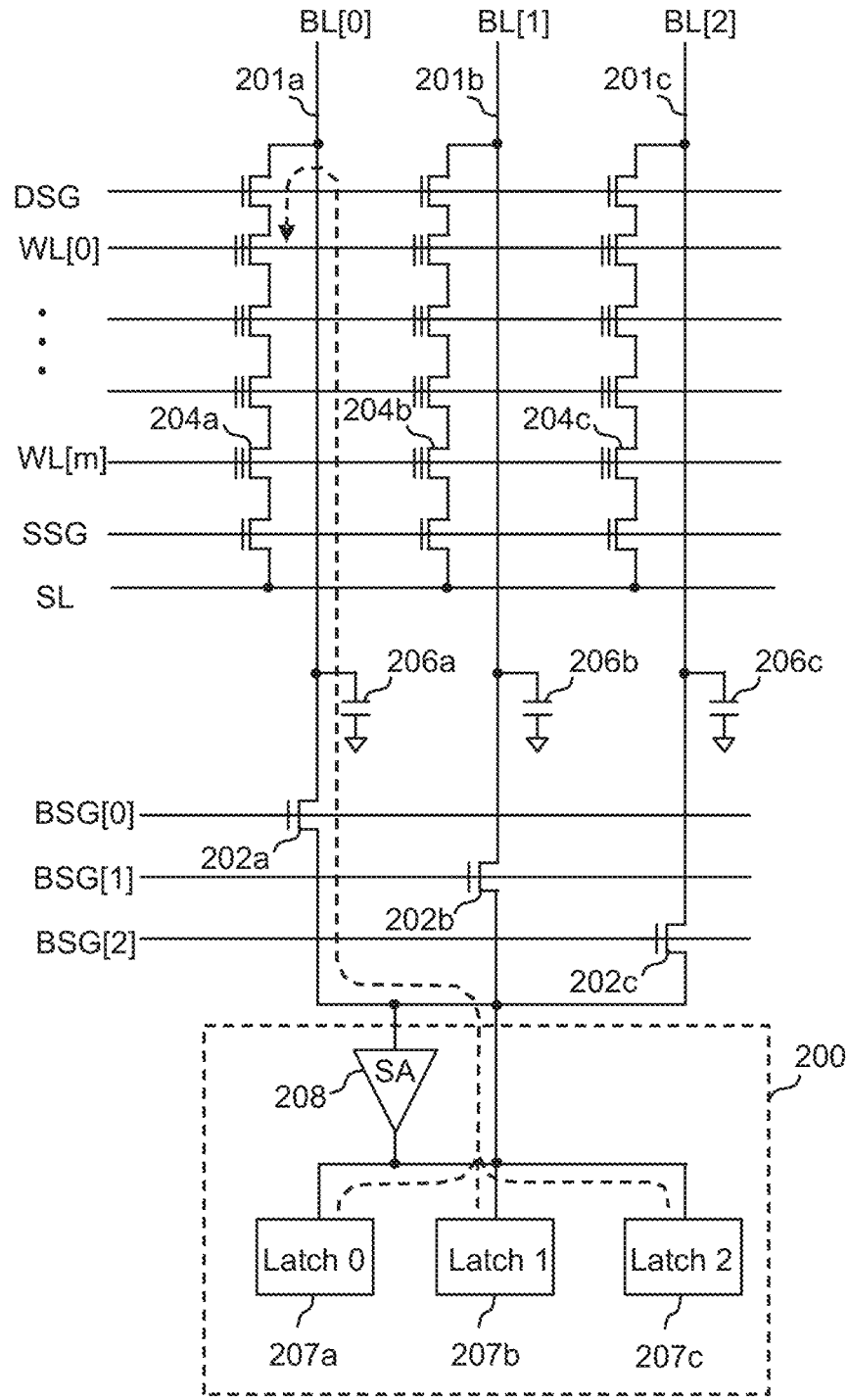

FIG. 4B illustrates basic TLC program operations. The TLC programming operations program three bits of data into one selected cell. The TLC programming may contain multiple program steps to program the cell from the erased Vt into eight Vt levels to represent the three bits of data. Assume that the cell 204a is selected. In each program step, one of the data latches 207a to 207c may be selected to load data to the selected bit line 201a to program the cell 204a, depending on which Vt level is programed. For example, when programming the D0 bit, the data stored in the Latch 0 207a is loaded to the selected bit line 201a to program the selected cell 204a. When programming the D1 bit, the data stored in the Latch 1 207b may be loaded to the selected bit line 201a to program the selected cell 204a. When programming the D2 bit, the data stored in the Latch 2 207c may be loaded to the selected bit line 201a to program the selected cell 204a, etc. In this operation, the number of cells being programmed equals to the number of page buffers. Therefore, it is referred as 'single-page programming'.

Figure 4C:
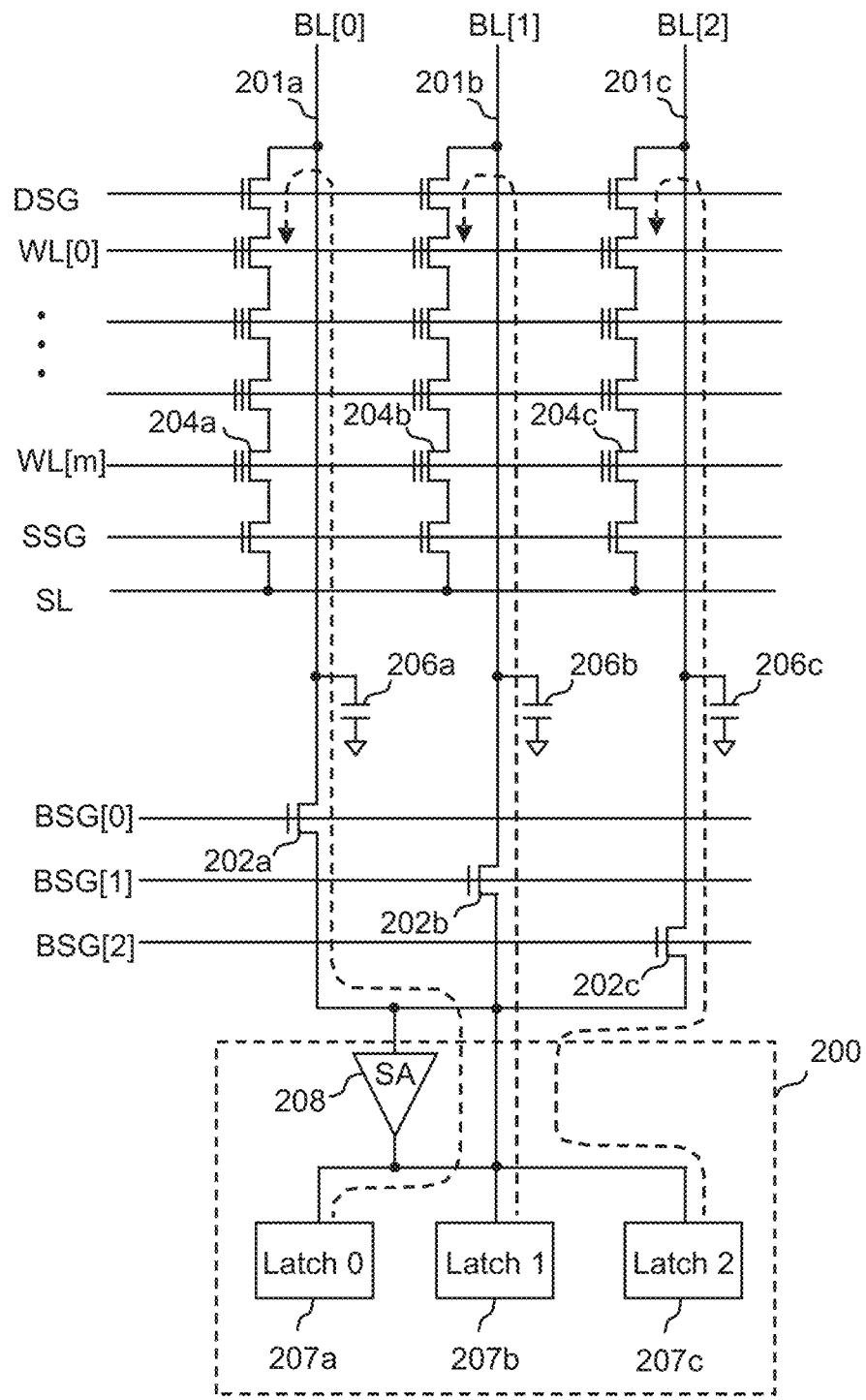

FIG. 4C shows multiple-page programing operations in accordance with the invention. In an embodiment, the data stored in the latches 207a to 207c are programmed to multiple cells 204a to 204c on multiple bit lines 201a to 201c simultaneously. If the page buffer has N data latches, it may program N cells simultaneously. This significantly increases the program data throughput N times.

To load the multiple-page data, the bit line select gates 202a to 202c may be sequentially turned on to load the data from the latches 207a to 207c to the bit lines 201a to 201c, respectively, as shown by the arrowed lines. After the data is loaded to the bit lines 201a to 201c, the bit line select gates 202a to 202c are turned off, then the data is held by the bit line capacitance 206a to 206c. After that, a program condition is applied to the selected word line, WL[m], to program the selected cells 204a to 204c according to the data stored in the bit line capacitance 206a to 206c. By using these operations, the data of the multiple bit lines may be programmed simultaneously.

In an exemplary embodiment, the page buffer performs two programming function modes. One is TLC programming and the other is SLC programming. When the page buffer performs TLC programing, the data latches 207a to 207c are used to store three bits data, D0, D1, and D2 for one cell, and the three data bits are programmed into a single cell. In SLC programming, the three data latches may be used to store three single-bit data, and then this data is programmed into three cells. This is referred as 'multiple-page programming'.

By using the above-described multiple-page SLC programming, the data throughput may be significantly increased. Therefore, this mode may be used to program the data into the cells at high speed. Later in idle time, the data may be read out from the SLC cells and re-programmed to other cells using TLC mode, and then the SLC cells may be erased to increase the storage capacity of the memory.

The disclosed multiple-page programming operations may be applied not only to SLC, but also to multiple level cells such as MLC, TLC, and QLC, etc. For example, referring to FIG. 4C, assume three pages' data is programmed into the selected cells 204a to 204c using TLC mode. Each cell may store one of eight Vt levels to represent three data bits, D0, D1, and D2. In the first step, the first page's data is loaded into the data latches 207a to 207c. Then, the data are sequentially loaded to the bit lines 201a to 201c using the previously described operation, and then the program condition is applied to the cells 204a to 204c to program each cell according to the bit line data. The cells will be programmed to the Vt levels corresponding to D0 bit. A program-verify operation may be performed to check the cells' Vt. The program-verify operation will be described later in reference to FIGS. 6A-C. After the data is successfully programmed, the data in the latches 207a to 207c may be cleared.

In the second step, the second page's data is loaded into the three latches 207a to 207c, then sequentially loaded to the bit lines 201a to 201c to program the cells 204a to 204c to the Vt levels corresponding to D1 bit. After the second page's data is successfully programmed, the data in the latches 207a to 207c may be cleared. In the third step, the third page's data is loaded to the latches 207a to 207c, and then applied to the bit lines 201a to 201c to program the cells 204a to 204c to the Vt levels corresponding to D2 bit. By repeating the sequence, the cells may be programmed to any number of multiple-level cells such as MLC, TLC, QLC, etc.

Figure 4D:
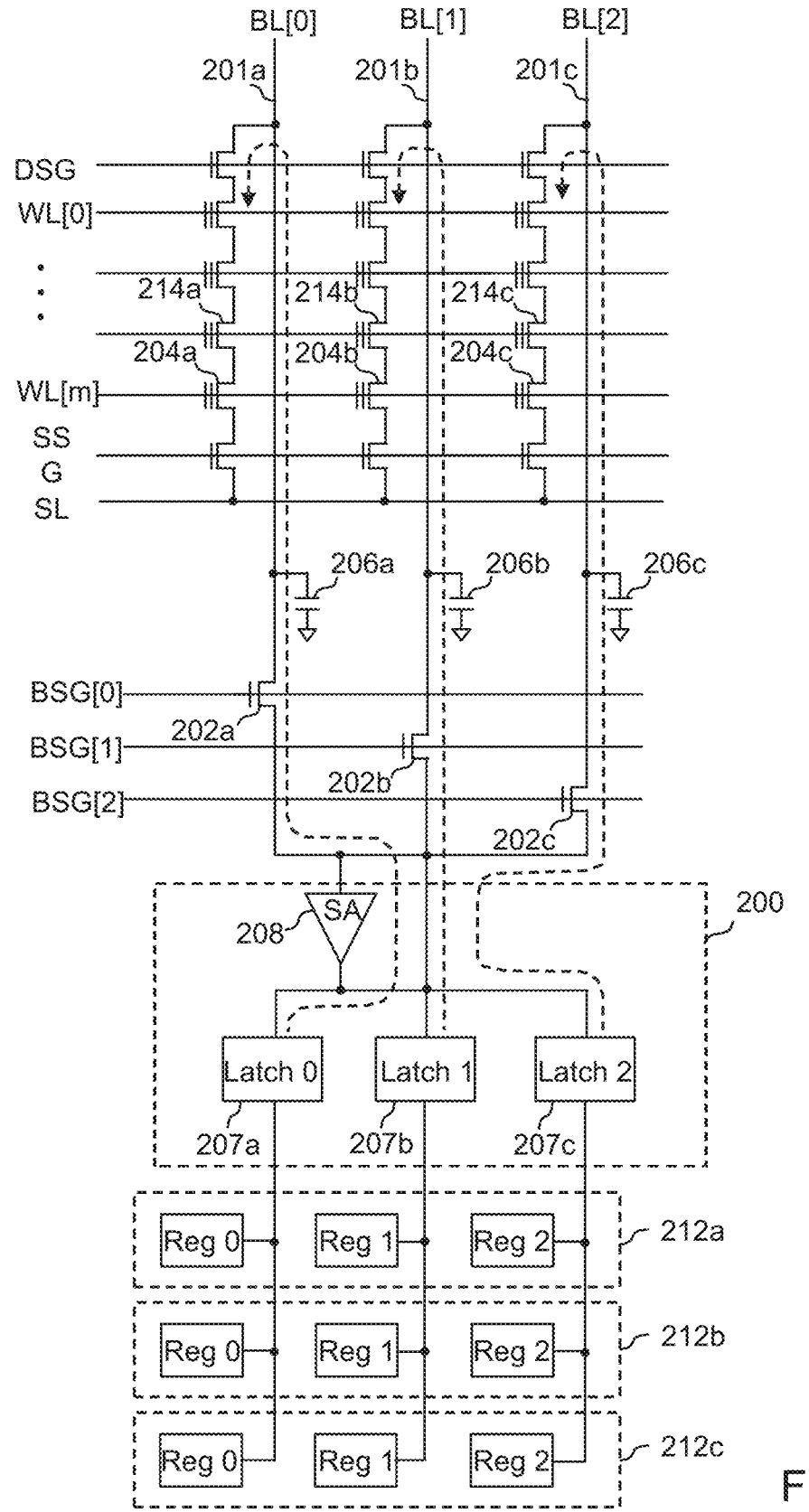

FIG. 4D shows another exemplary programming embodiment in accordance with the invention. Assuming the chip has multiple data registers 212a to 212c. Each data register contains multiple-bit latches such as Reg 0 to Reg 2. During SLC programming mode, the data of the first data register 212a is loaded to the latches 207a to 207c, and then loaded to the bit lines 201a to 201c to program the cells 204a to 204c, respectively. After the data is successfully programmed, the data of the next register 212b may be loaded to the latches 207a to 207c, and then loaded to the bit lines 201a to 201c to program another page such as cells 214a to 214b, respectively. In this way, the multiple pages' data can be programmed simultaneously to increase program data throughput.

For the TLC programming mode, the data stored in the first data register 212a may be transferred to the latches 207a to 207c, and then programmed to the Vt levels corresponding to D0 bit of the selected cells 204a to 204c. Then, the data stored in the second data register 212b may be transferred to the latched 207a to 207c, and then programmed to the Vt levels corresponding to the D1 bit of the selected cells 204a to 204c. The operation may be repeated to program the data of the third data register 212c to the D2 bit of the selected cells 204a to 204c.

In an embodiment, the data in the data registers 212a to 212c may be programmed to the cells in any suitable orders. For example, in another embodiment, in the first step, the data stored in the Reg 0 of the data registers 212a to 212c may be sequentially transferred to the data latch 207a, then loaded to the bit lines 201a to 201c, and then programmed to the Vt level for the D0 bit of the cells 204a to 204c. In the second step, the data stored in the Reg 1 of the data registers 212a to 212c may be sequentially transferred to the data latch 207b, then loaded to the bit lines 201a to 201c, and then programmed to the Vt level for the D1 bit in the cells 204a to 204c. In the third step, the data stored in the Reg 2 of the data registers 212a to 212c may be sequentially transferred to the data latch 207c, then loaded to the bit lines 201a to 201c, and then programmed to the Vt level for the D2 bit in the cells 204a to 204c.

Figure 5A:
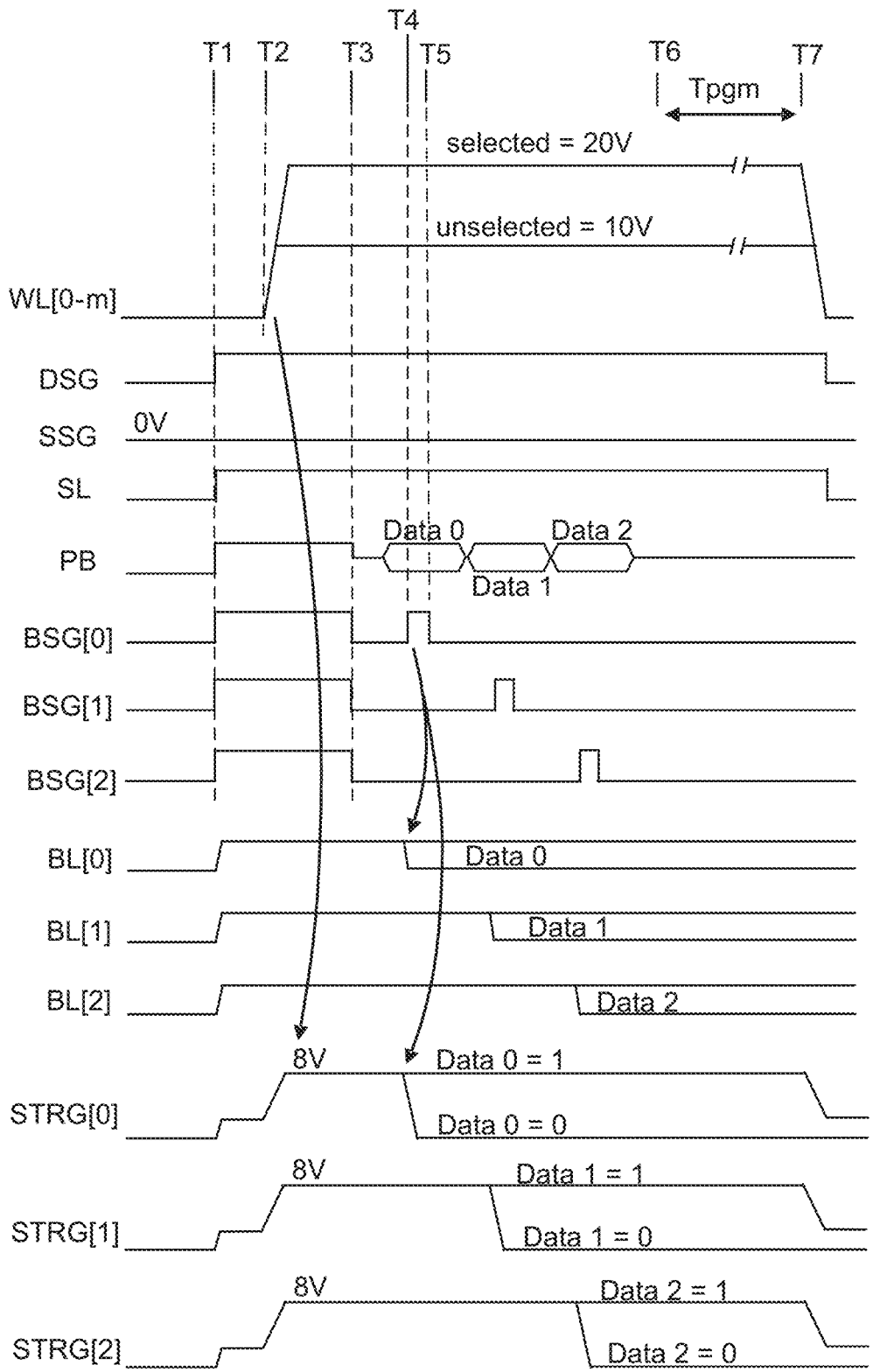
FIGS. 5A-E shows exemplary waveforms for multiple-page programming in accordance with the invention.

FIG. 5A shows exemplary waveforms for multiple-page programming of the circuit as shown in FIG. 4C. Referring now to both FIG. 4C and FIG. 5A, at time T1, BSG[0] to BSG[2] may go high to turn on the bit line select gates 202a to 202c. Assume the page buffer's output data is called PB. The page buffer (PB) may apply VDD to all the bit lines BL[0] to BL[2]. The selected cell strings' drain select gate (DSG) is supplied with VDD. The source select gate (SSG) is supplied with 0V. Therefore, the channel region of the strings STRG[0] to STRG[2] may be charged to VDD-Vt of the drain select gate.

At time T2, the selected word line, WL[m], and the other unselected word lines are supplied with the program voltage, such as 20V, and an inhibit voltage such as 10V, respectively. The word lines' voltage may couple the channel region of all the strings STRG[0] to STRG[2] to a voltage of about 8V. This voltage may inhibit the programming of the cells. Due to the bit lines being supplied with VDD, the drain select gates are reverse-biased. Thus, the drain select gates will be turned off to prevent the channel voltage from leaking to the bit lines.

At time T3, the bit line select gates BSG[0] to BSG[2] are turned off. The bit line capacitance, such as 206a to 206c shown in FIG. 4C, holds the bit lines' voltage at VDD.

At time T4, the first bit line select gate BSG[0] is turned on, and the page buffer (PB) applies the first data to the first bit line BL[0]. If the data is '1' (VDD), the channel of the string STRG[0] will remain at the inhibit voltage such as 8V. If the data is '0' (0V), it will turn on the drain select gate and discharge the string STRG[0] to 0V. This will cause the first selected cell 204a to be programmed. After the first bit line select gate BSG[0] is turned off at T5 time, the bit line BL[0] and the string STRG[0] may remain at 0V due to the bit line capacitance 206a.

The steps may be repeated to sequentially turn on the bit line select gates BSG[1] to BSG[2] to load the data from the page buffer (PB) to bit lines BL[1] and BL[2] and their strings STRG[1] and STRG[2].

After all the data is loaded, at time T6, a timer may start to count the program pulse, Tpgm, over a time interval from 10 us to 30 us. Then, the program pulse is ended. By using the above processes, multiple bit lines may be loaded with different data and programmed simultaneously.

It should be noted that the waveform of FIG. 5A is for illustration and not drawn on scale. In reality, the total program time is dominated by Tpgm. The data loading time may be negligible. Therefore, the multiple-page programming may significantly reduce the total programming time and increase the program data throughput.

Figure 5B:
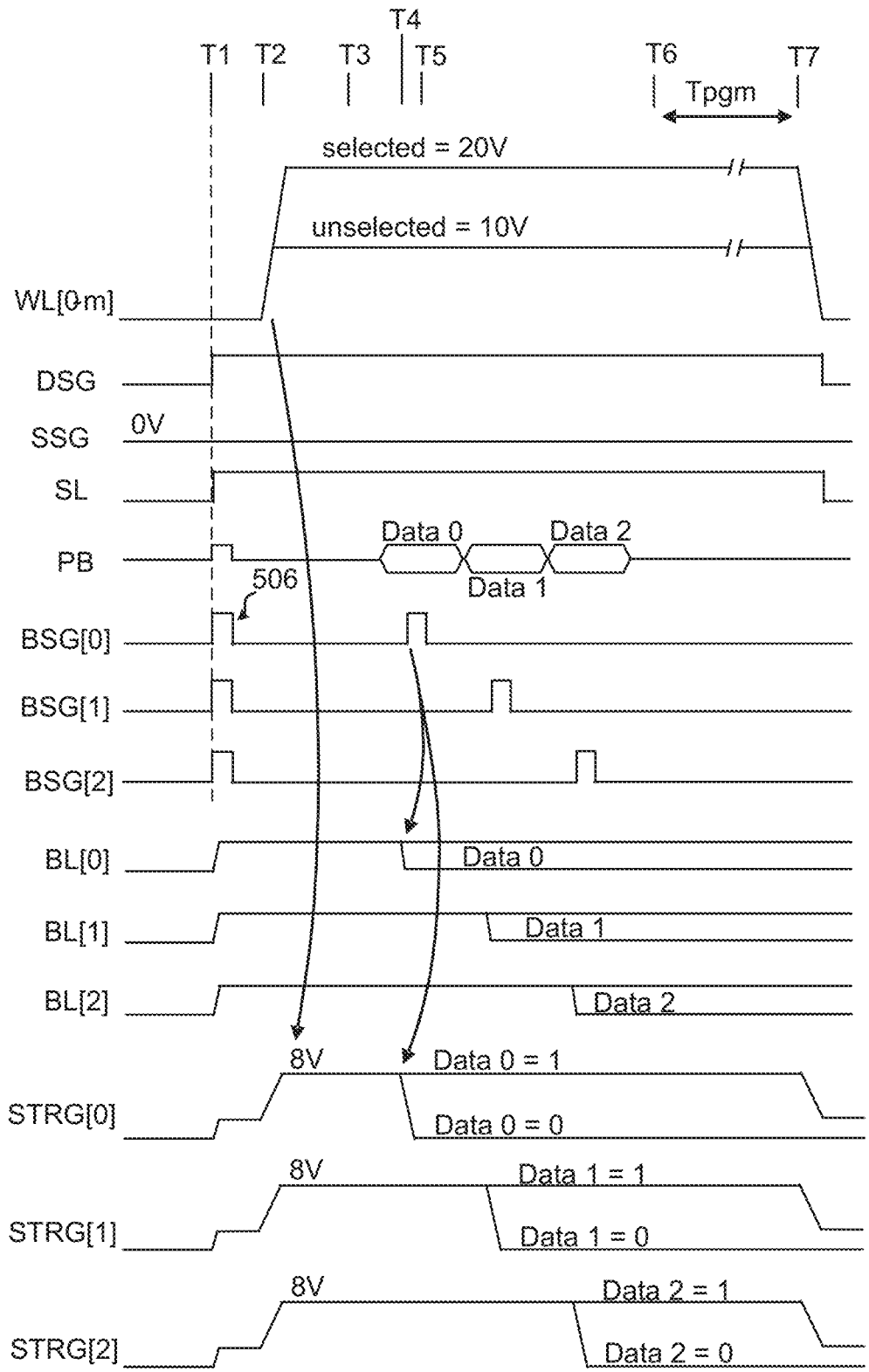

FIG. 5B shows another embodiment of waveforms for multiple-page programming in accordance with the invention. These waveforms are similar to the waveforms shown in FIG. 5A except that the bit line select gates BSG[0] to BSG[2] may be turned off (as illustrated at 506) after pre-charging the bit lines to VDD at time T1. Therefore, the bit lines' voltage is held by the bit line capacitance.

Figure 5C:
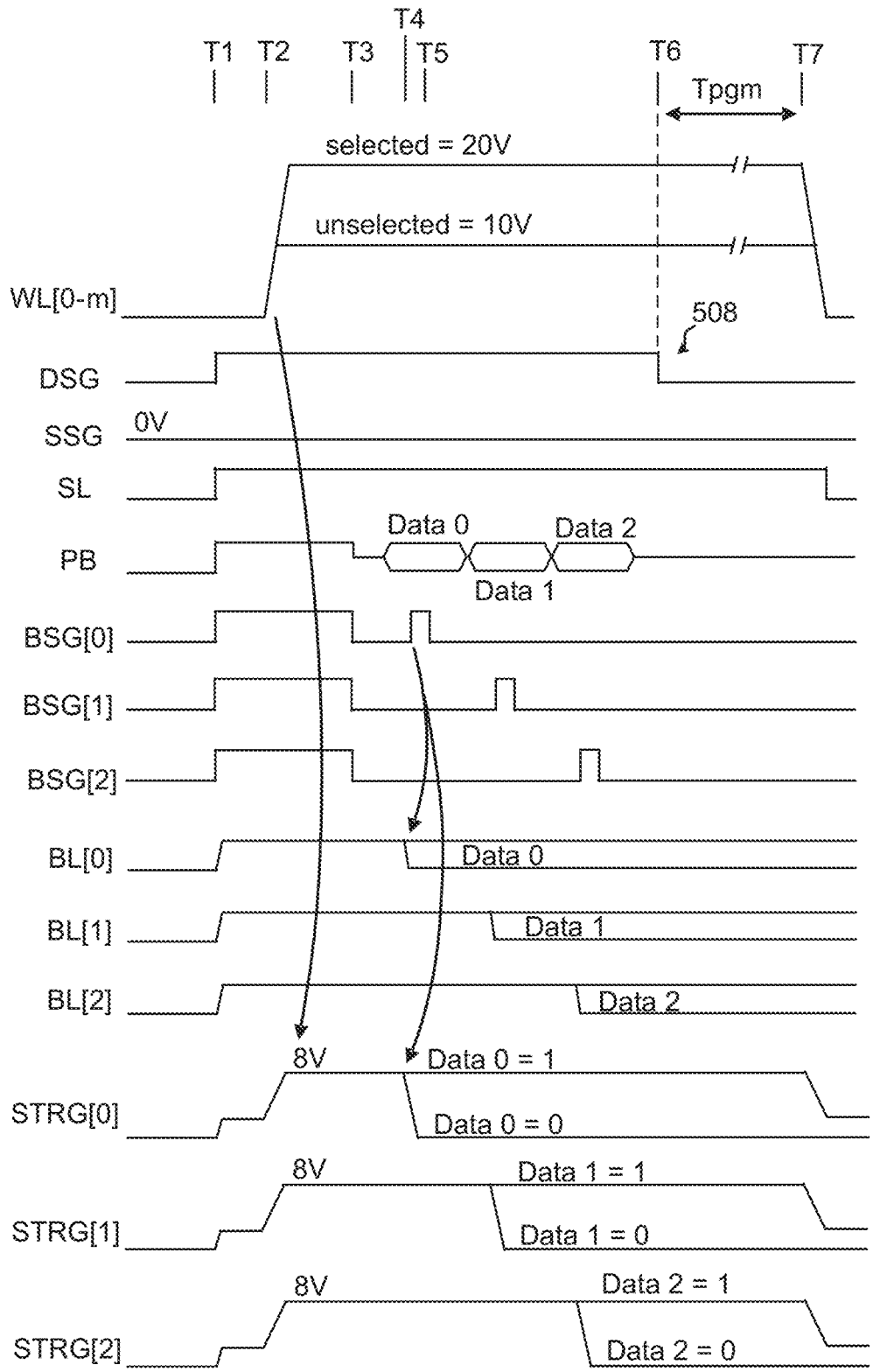

FIG. 5C shows another embodiment of waveforms for multiple-page programming in accordance with the invention. These waveforms are similar to FIG. 5A except that the drain select gate (DSG) of the selected string may be turned off after the data is loaded to the multiple bit line (as illustrated at 508) at T6 time. In this way, if the floating bit lines have leakage, the bit line voltage needs to be drop from VDD to lower than Vt of the drain select gate to turn on the drain select gate. Therefore, this approach provides a higher margin of failure for the string's inhibit voltage.

Figure 5D:
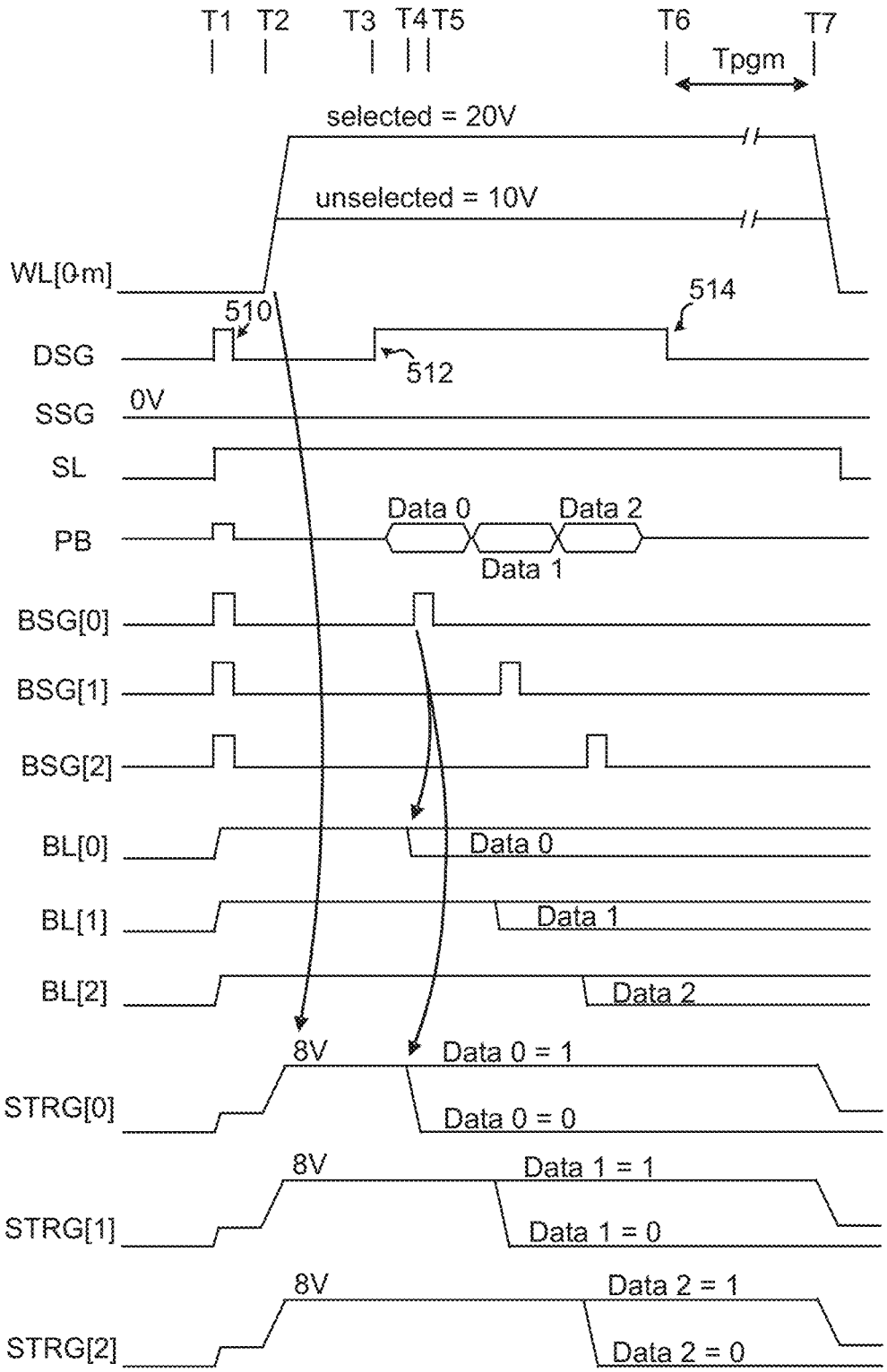

FIG. 5D shows another embodiment of waveforms for multiple-page programming wherein the operations shown in FIG. 5C are applied to the waveforms shown in FIG. 5B to produce the waveforms shown in FIG. 5D. In an embodiment, the selected string's drain select gate (DSG) is turned off after the strings are pre-charged (as illustrated at 510) at T1 time. The DSG can be turned on (as illustrated at 512) at T3 time to load the multiple pages' data into the stings, and then turned off (as illustrated at 514) at T6 time to increase the floating bit lines' leakage margin.

Figure 5E:
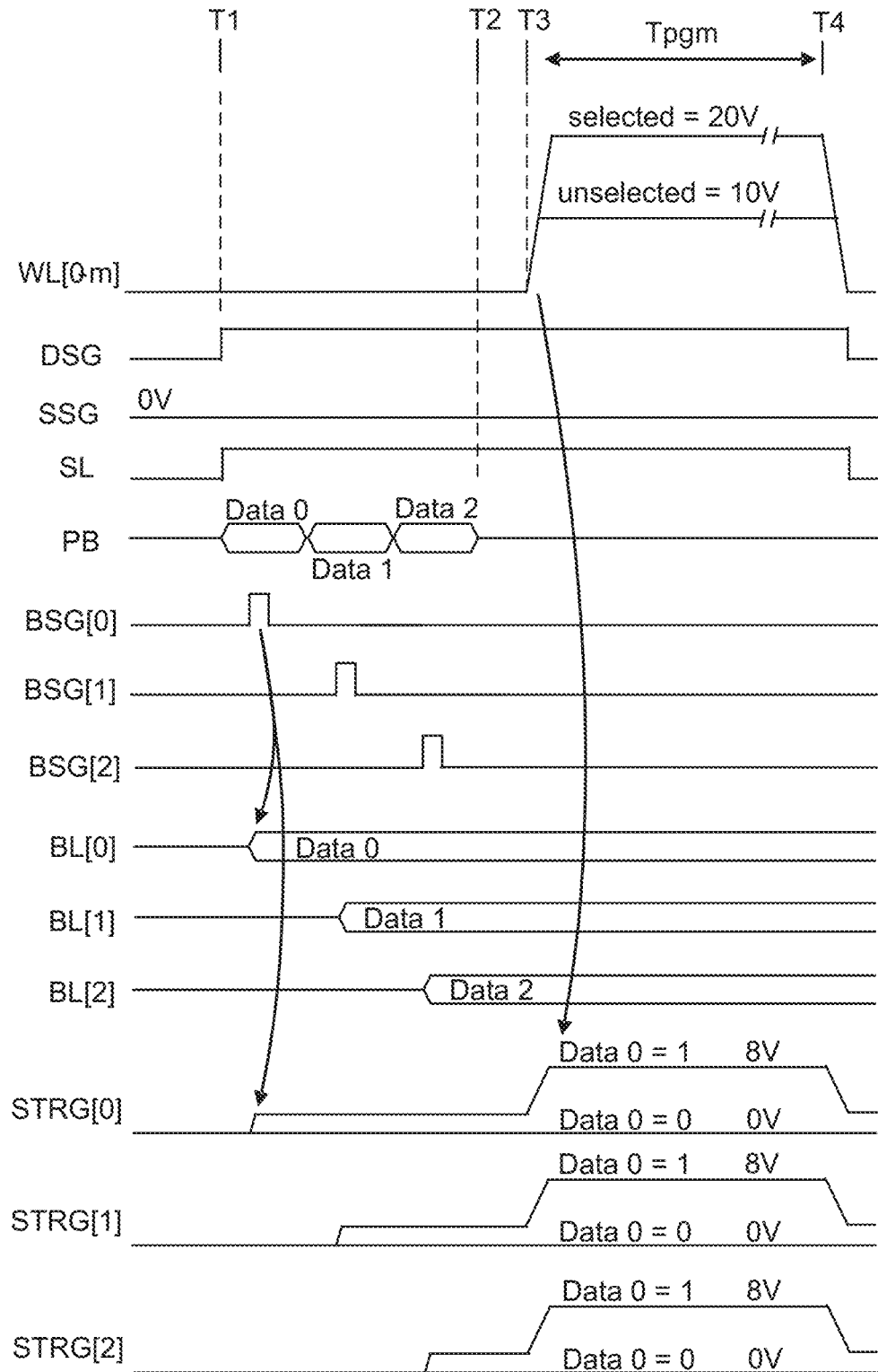

FIG. 5E shows another embodiment of waveforms for multiple-page programming in accordance with the invention. At time T1, the selected drain select gate (DSG) is turned on, and the source select gate (SSG) is off. From T1 to T2 time, the page buffer (PB) supplies multiple-page data, Data 0, Data 1, and Data 2. The bit line select gates BSG[0] to BSG[2] are turned on sequentially to load the data into BL[0] to BL[2] and STRG[0] to STRG[2]. At time T3, the selected word line and unselected word lines are supplied with the program voltage 20V and the inhibit voltage 10V, respectively. The word lines' voltage will couple the channel region of STRG[0] to STRG[2] with data value of '1' to a voltage about 8V, to inhibit the programming of the cells. For the strings storing a data value of '0' (0V), the drain select gate is on, thus it will cause charge-sharing between the string's capacitance and the bit line capacitance. Since the bit line capacitance is much higher than the string's capacitance, as a result, the string's voltage is very closed to 0V. This will cause the selected cell to be programmed.

In an embodiment, the circuit shown in FIG. 2A allows multiple-page cells to be program-verified and read simultaneously by using the page buffer 200.

Figure 6A:
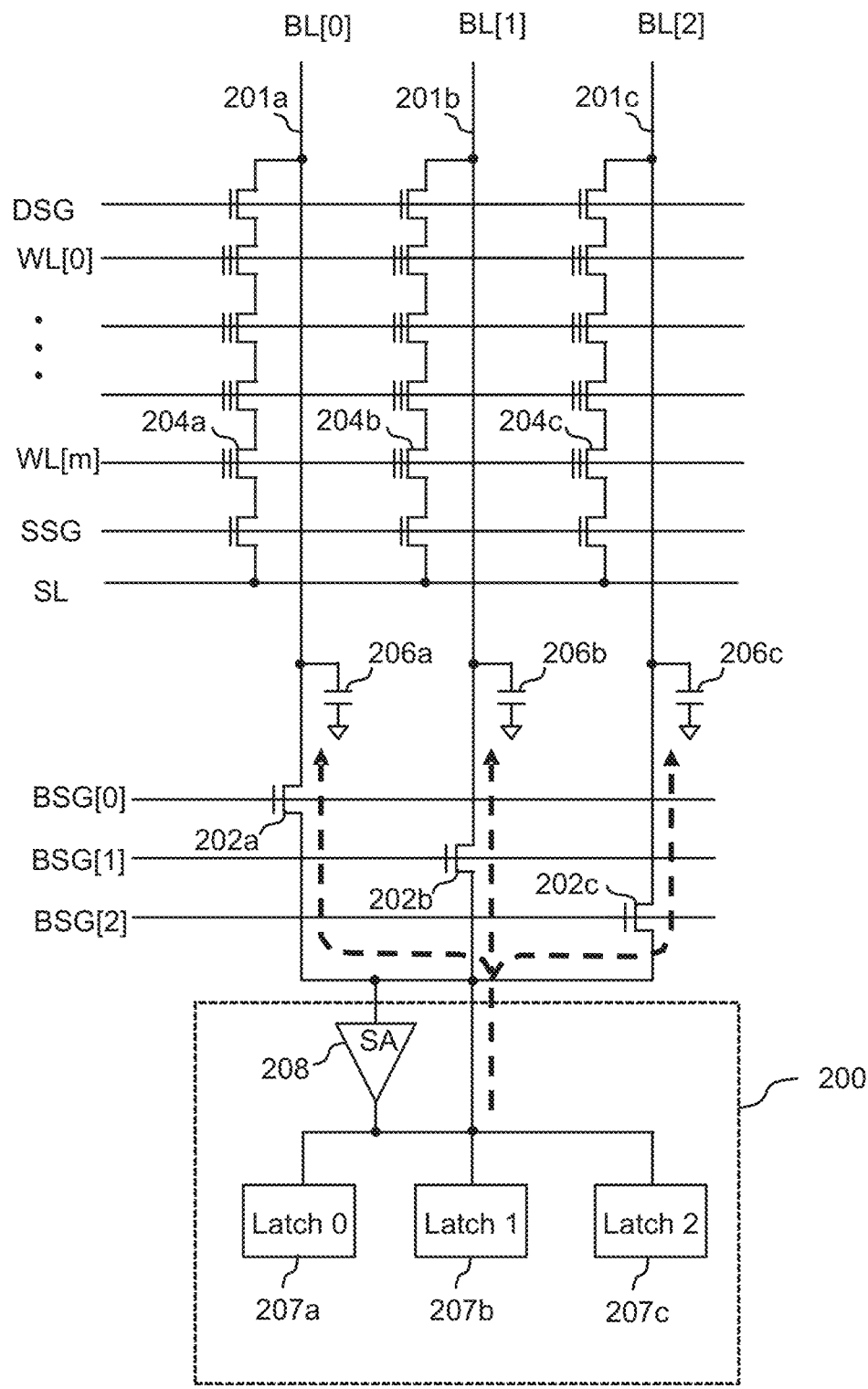
FIGS. 6A-C show multiple-page read operations in accordance with embodiments of the invention.
Figure 6B:
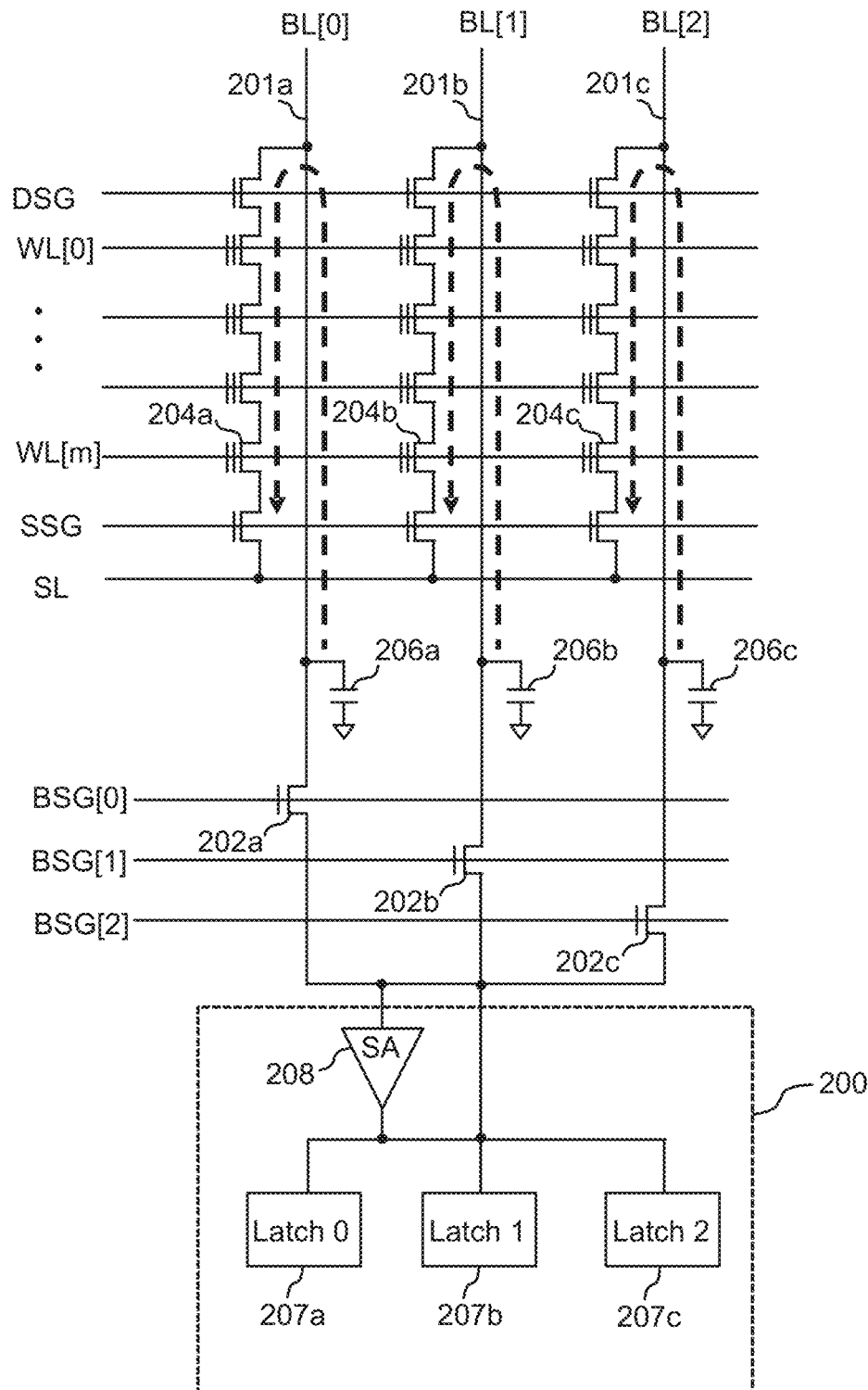
Figure 6C:
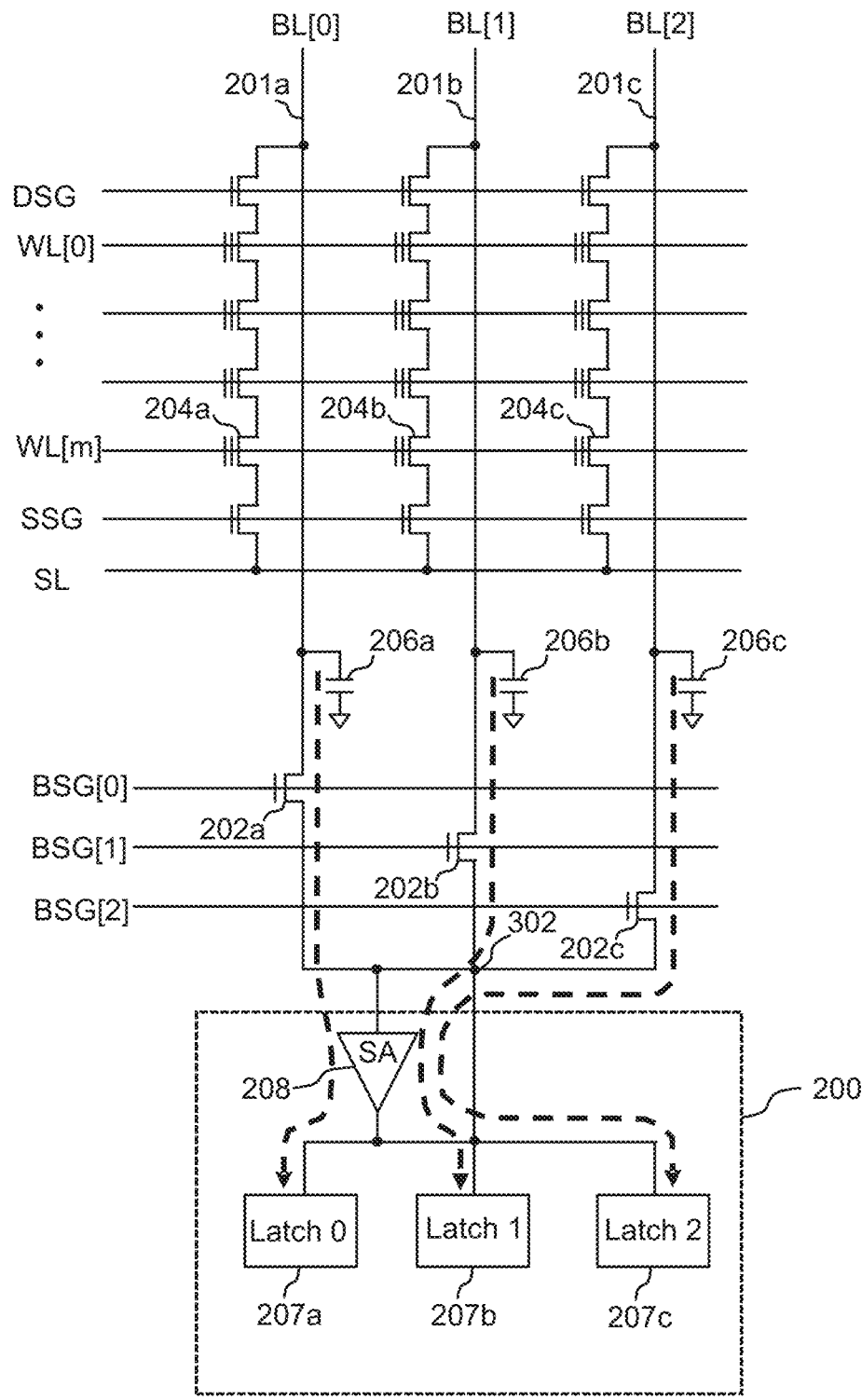

FIGS. 6A-C show multiple-page read operations in accordance with embodiments of the invention. In an embodiment, the multiple-page read operations comprise three steps. The three steps are pre-charging the bit line, discharging the bit line, and sensing.

FIG. 6A shows an exemplary circuit that performs the pre-charge bit line step. During operation all the bit line select gates 202a to 202c are turned on, and a pre-charge device, such as device 303 in the sense amplifier 208 as shown in FIG. 3A, is turned on to pre-charge the bit line capacitances 206a to 206c to a pre-charge voltage such as VDD or Vbias-Vt, for example, as shown by the dashed lines.

FIG. 6B shows an exemplary circuit that performs the discharge bit line step. During operation, the bit line select gates 201a to 202c are turned off. The read bias conditions are applied to the selected cells 204a to 204c. The selected word line, such as WL[m], is supplied with a read voltage to turn on or off the cells 204a to 204c according to the cells' Vt. The on-cells will discharge the bit lines simultaneously. It will be assumed that the cells 204a and 204b are an on-cell and an off-cell, respectively. The on-cell 204a will discharge the bit line capacitance 206a to 0V. The off-cell 204b will not discharge the bit line, and thus the bit line capacitance 206b will remain at the pre-charged voltage. Since the on-cell current is very low (e.g., only about 1 uA), and the bit line capacitance is high due to its connection to many strings, this bit line discharging step may take about 25 us to 35 us. Thus, the read time is dominated by the bit line discharging time. Thus, by using multiple bit lines discharging according to the invention, the total read time is reduced and the read data throughput is significantly increased.

FIG. 6C shows an exemplary circuit that performs the sensing step. In this step, the bit line select gates 202a to 202c are sequentially turned on to allow the data stored by the bit line capacitance 206a to 206c to be sensed by the sense amplifier 208 of the page buffer, as shown by the dashed lines. When a bit line select gate is turned on, it will cause charge-sharing between the bit line capacitance and the sensing node 302 of the page buffer circuit as shown in FIG. 3A. Because the capacitance of the sensing node 302 is much lower than the bit line capacitance, the sensing node 302 will be pull up or down in very short time. Therefore, each bit line's data may be read in very short time.

After the data is stored in the data latches 207a to 207c, the data may be transferred to the data register, and then the data register may start to output the data. Meanwhile, the page buffer may start to read the next page's data from the cells. If the chip does not have data register, the data may be output directly from the data latches of the page buffer, and then the page buffer may start to read the next page's data from the cells.

In an embodiment, the operations illustrated in FIGS. 6A-C may be also used for multiple-page program-verification. The program-verify operation is very similar to the read operation. The only differences are the word line voltage and the data latches' operation. In read mode, the data read from the cells are stored in the data latches directly. In program-verify mode, the data read from the cells are used to update the data in the data latches.

Referring to FIG. 6B, for program-verify condition the selected word line may be supplied with a program-verify voltage instead of a read voltage in order to check the cells' Vt. In FIG. 6C, after the cells' data is read by the sense amplifier 208, the data will be used to update the data stored in the latches 207a to 207c for the next program pulse. The logic operation of updating the latches is well known, thus it is not described here.

Figure 6D:
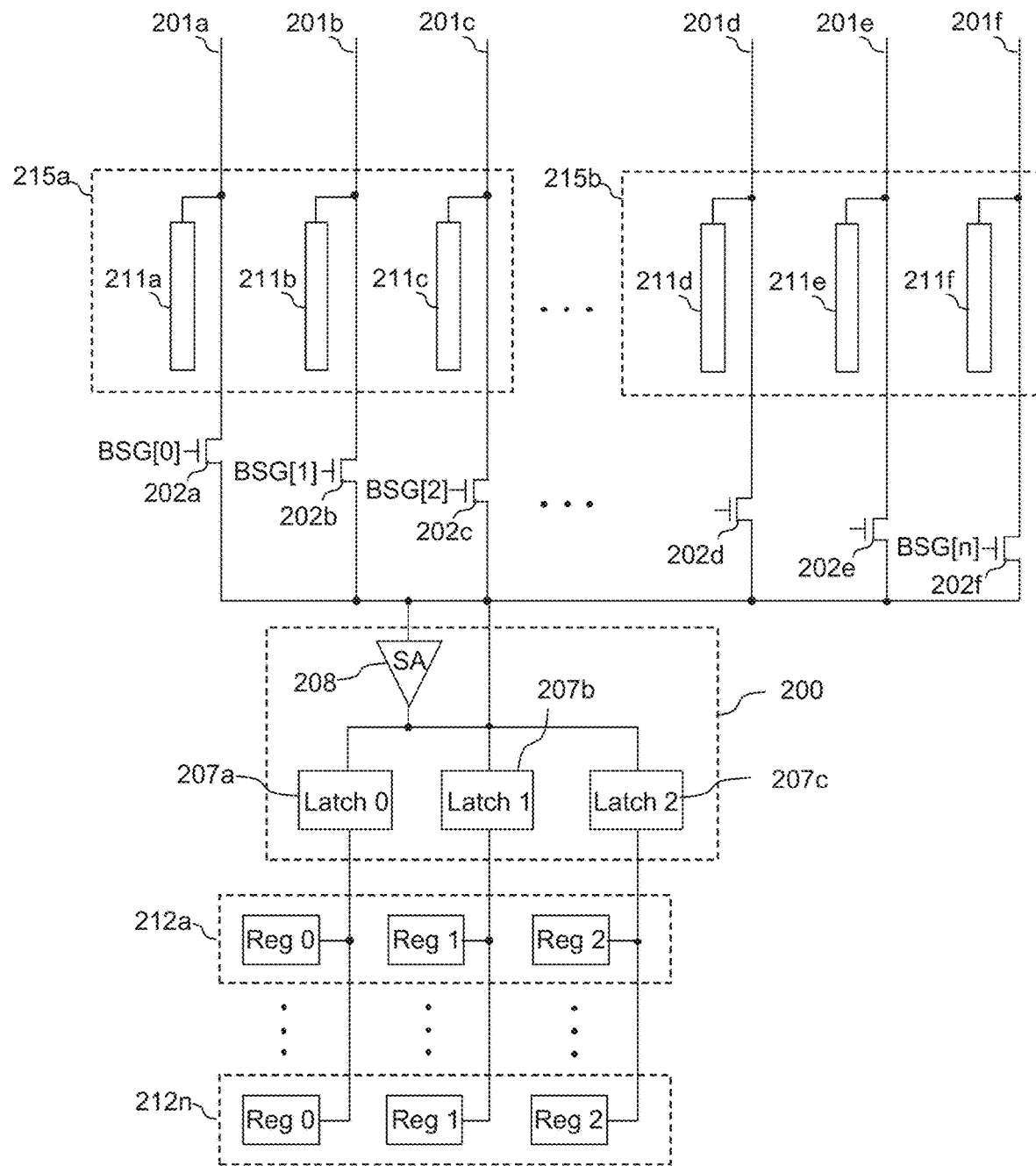
FIG. 6D shows an exemplary embodiment of a page buffer, bit line select gates, and data registers in accordance with the invention.

FIG. 6D shows an exemplary embodiment of a page buffer, bit line select gates, and data registers in accordance with the invention. In an embodiment, the page buffer 200 and bit line select gates 202 increase program and read data throughput in accordance with the invention. In this embodiment, the chip contains multiple data registers 212a to 212n. Also shown are NAND flash memory cell strings 211a to 211f; the page buffer 200 that comprises a sense amplifier 208 and multiple data latches 207a to 207c, and bit line select gates 202a to 202f. During operation, the data of first data register 212a is transferred to the data latches 207a to 207c and then loaded to bit lines 201a to 201c through the bit line select gates 202a to 202c to program the first group of strings 215a, and the data of the second data register 212n is transferred to the data latches 207a to 207c and then loaded to bit lines 201d to 201f through the bit line select gates 202d to 202f to program the second group of strings 215b.

During read operation, the data of the first group of strings 215a is read and stored in the capacitance of the bit lines 201a to 201c. The data is sensed by the sense amplifier 208 through the bit line select gates 202a to 202c and latched in the data latches 207a to 207c. Then, the data of the data latches 207a to 207c are transferred to the first data register 212a. Similarly, the data of the second group of strings 215b are read and transferred to the second data register 212n. Then, the data can be output from the data registers 212a to 212n to an I/O circuit.

Figure 6E:
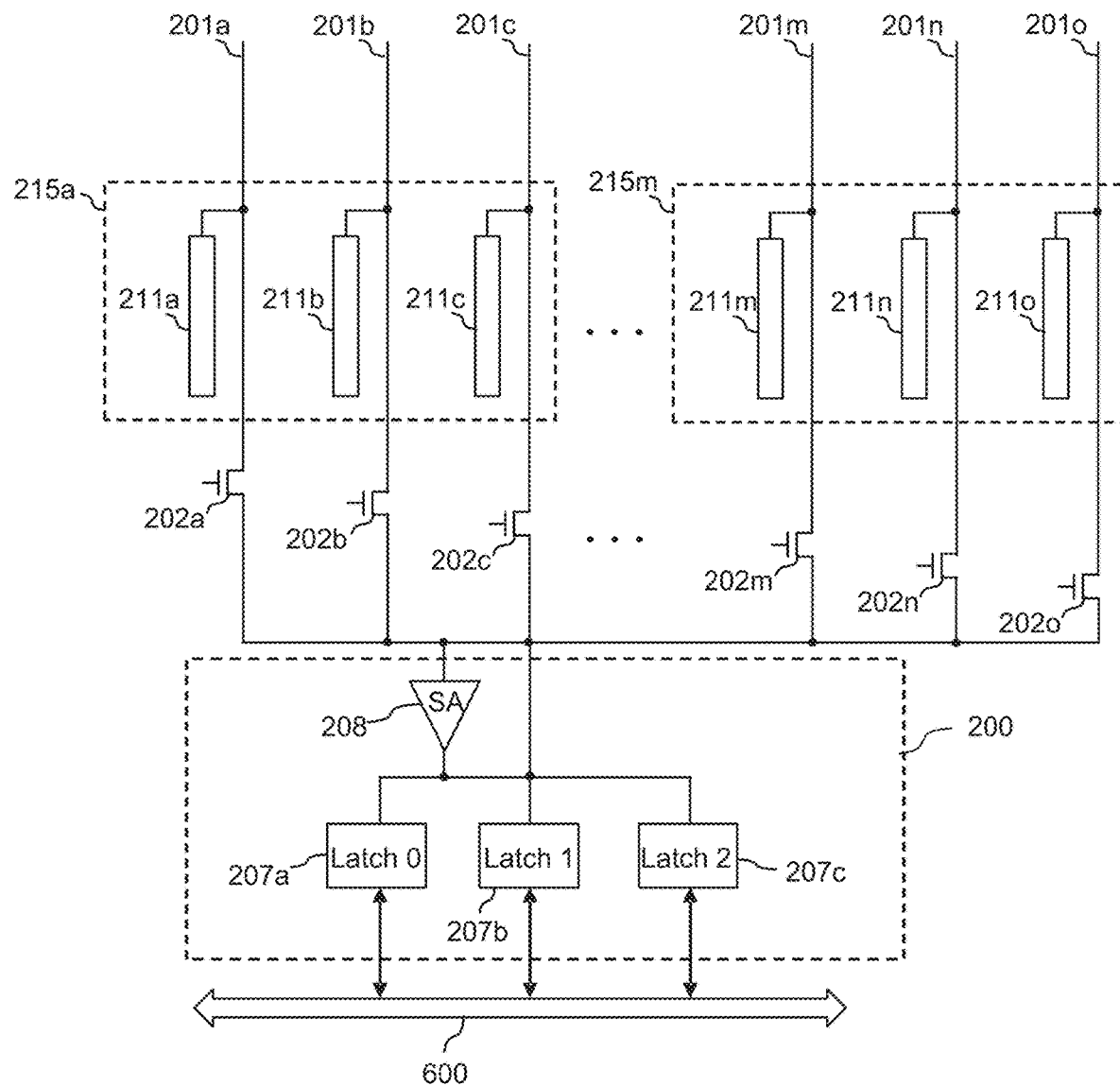
FIG. 6E shows an exemplary embodiment of a page buffer and bit line select gates in accordance with the invention.

FIG. 6E shows an exemplary embodiment of a page buffer and bit line select gates in accordance with the invention. The page buffer 200 and bit line select gates 202 operate to increase program and read data throughput in accordance with the invention. This embodiment is similar to the embodiment shown in FIG. 6D except that the data registers 212a to 212n are eliminated. The page buffer 200 includes multiple data latches 207a to 207c. The data latches 207a to 207c are directly connected to I/O (input/output) bus 600. During program operation, data is sequentially loaded from the I/O bus 600 to the data latches 207a to 207c, and then loaded to the bit lines 201a to 201o and string groups 215a to 215m. During read operation, the data of the string groups 215a to 215m is read from the bit lines 201a to 201o and sequentially loaded to the data latches 207a to 207c, and then output to the I/O bus 600.

Figure 6F:
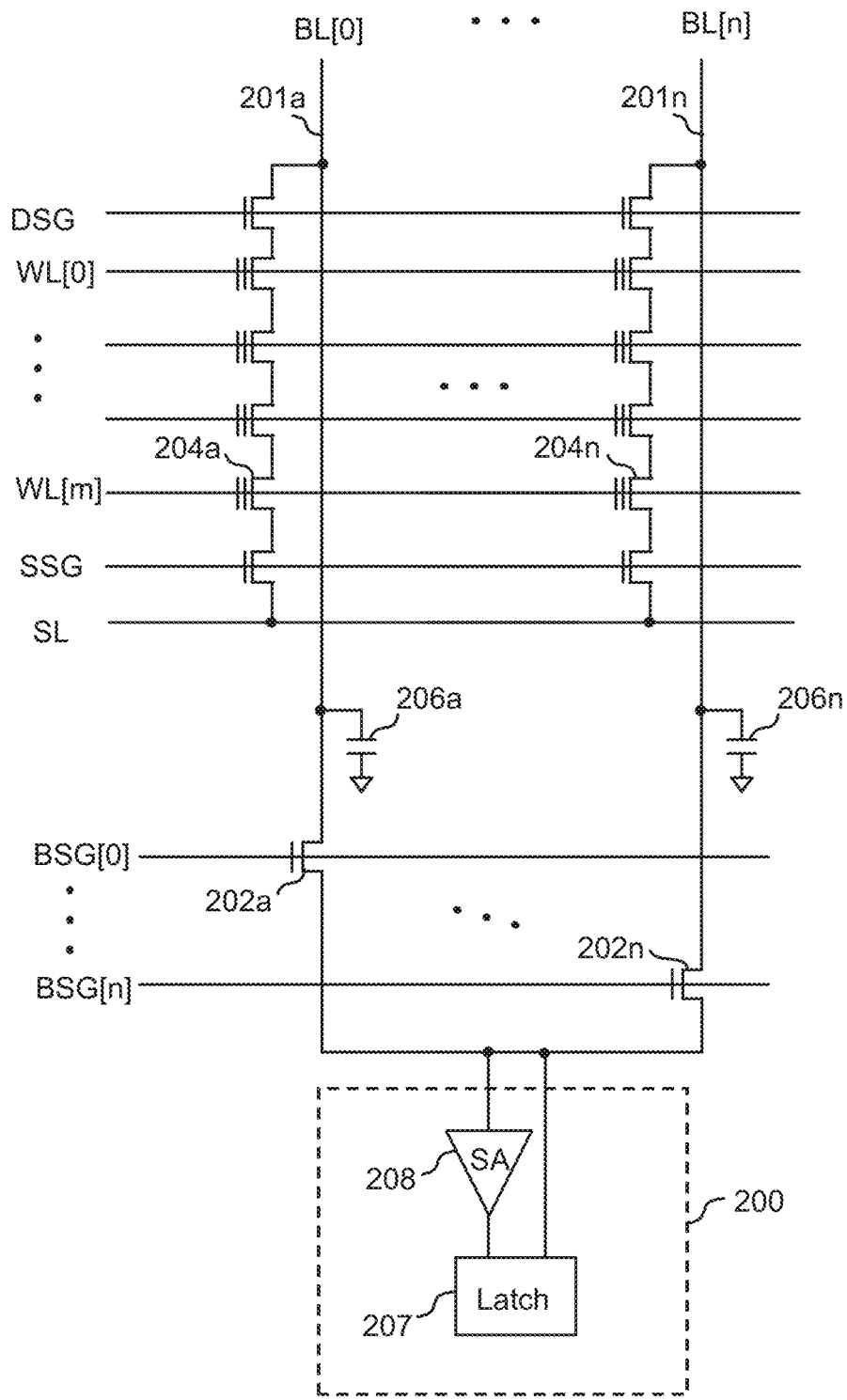
FIG. 6F shows an exemplary embodiment of a single-level-chip page buffer and bit line select gates in accordance with the invention.

FIG. 6F shows an exemplary embodiment of a single-level-cell (SLC) page buffer and bit line select gates in accordance with the invention. The page buffer 200 and bit line select gates 202 operate to increase program and read data throughput in accordance with the invention. This embodiment is similar to the embodiment shown in FIG. 6A except the page buffer 200 has single data latch 207 for SLC applications. The page buffer 200 is connected to multiple bit lines 201a to 201n through the bit line select gates 202a to 202n. During program operation, the bit line select gates 202a to 202n can be sequentially turned on by the signals BSG[0] to BSG[n] to load program data from the page buffer 200 to the bit lines 201a to 201n, respectively. The data is stored in the bit line capacitances 206a to 206n, and programmed to the selected cells 204a to 204n, respectively. Because multiple cells 204a to 204n can be simultaneously programmed by using one program pulse, this embodiment significantly increases program throughput.

During read operation, data of the cells 204a to 204n can be read and stored in the bit line capacitances 206a to 206n. The bit line select gates 202a to 202n can be sequentially turned on to sense the data of the bit line capacitances 206a to 206n, respectively, by the sense amplifier 208 of the page buffer. Because multiple cells 204a to 204n can be simultaneously read by using one bit line discharging cycle, this embodiment significantly increases read throughput.

Figure 7A:
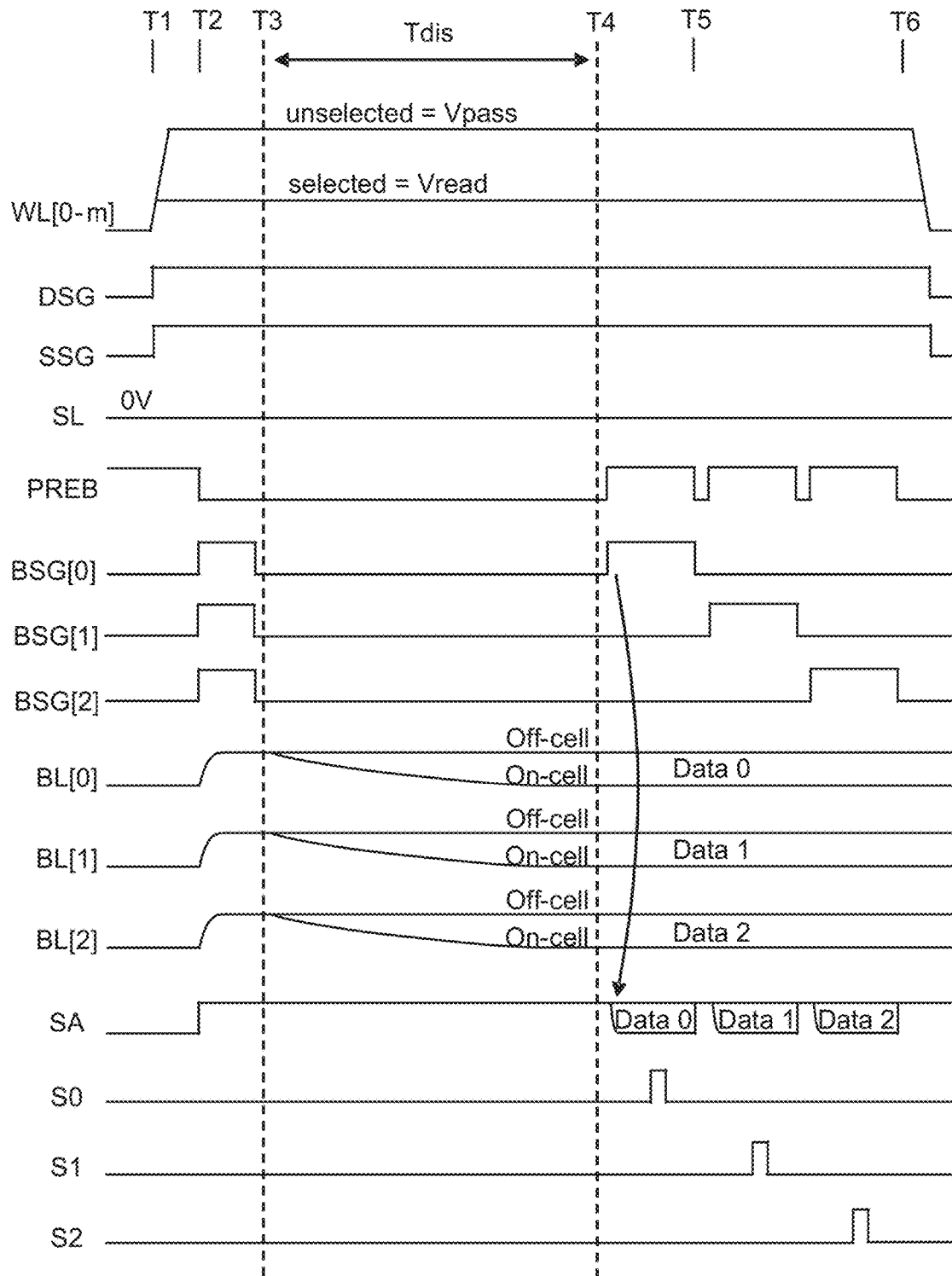
FIGS. 7A-D show embodiments of read operation waveforms in accordance with the invention.

FIG. 7A shows an embodiment of read operation waveforms for the embodiments shown in FIG. 6A-C in accordance with the invention. The detailed circuit of the page buffer 200 is shown in FIG. 3A. At time T1, a selected word line is supplied with a read voltage, Vread, to read the selected cell and the unselected word lines are supplied with a pass voltage, Vpass, that is higher than the Vt of unselected cells in the NAND cell string to turn on the unselected cells. The drain select gate (DSG) and the source select gate (SSG) are turned on. The source line (SL) is supplied with 0V. These conditions turn on on-cells and turn off off-cells.

At time T2, the bit line select gates BSG[0] to BSG[2] are turned on and a pre-charge signal PREB, as shown in the page buffer circuit in FIG. 3A, is activated to pre-charge BL[0] to BL[2] to VDD-Vt (of the bit line select gate) or a pre-determined voltage.

At time T3, the bit line select gates BSG[0] to BSG[2] are turned off. The bit lines BL[0] to BL[2] will become floating and the selected cells will start to discharge the bit lines. For on-cells, the cell will conduct current to discharge the cell string and the bit line to 0V. For off-cells, the bit line will remain at the pre-charged voltage due to the cell being turned off.

Because the on-cell current is very low, which may be only 1 uA to 5 uA, and the bit line capacitance is large, it may take long time to discharge the bit line. A time to discharge the bit line is in a range of about 25 us to 35 us. As a result, the bit line discharge time, shown Tdis, may dominate the entire read time. However, in accordance with the invention, all the BL[0] to BL[2] are discharged simultaneously, thus the total read time is significantly reduced.

After a pre-determined discharge time, Tdis, at time T4, the first bit line select gate BSG[0] may be turned on. This causes charge-sharing to occur between the sensing node (SA) and BL[0]. Because BL[0] has much higher capacitance than the Sense Amplifier's sensing node (SA), the sensing node (SA) may be charged to almost VDD or discharged to almost 0V in very short time. Then, a first set signal S0 is activated to latch the data to the first data latch of the page buffer. After the data is latched, the BSG[0] may be turn off to isolate BL[0] from the sensing node (SA).

Referring to the page buffer circuit shown in FIG. 3A, the latches 207a to 207c are reset to data 1 at beginning of the read operation. At time T4, the set signal S0 turns on the set device 311a. If the sensing node (SA) voltage is near VDD, it will turn on the sensing device 310 and allow the signal S0 to set the latch 207a to data 0 (off-cell). If the sensing node (SA) voltage is near 0V, it will turn off the sensing device 310, thus the set signal S0 will not set the latch 207a and the latch 207a remain at data 1 (on-cell).

At time T5, the pre-charge signal PREB is activated to pre-charge the sensing node (SA) to VDD. Then, the second bit line select gate BSG[1] is turned on to read the data of the second bit line BL[1]. The steps from T4 to T5 are repeated to read the data from BL[1] and BL[2], and using set signals S1 and S2 to latch the data in data latches 207b and 207c, respectively.

If the chip does not have data register, after the data is latched in to the page buffer, the data may be output from the page buffer directly. If the chip has data registers, as shown at 212a to 212c in FIG. 4D, the data may be transferred from the page buffer to the data register. Thus, the data register may output the data to the I/O buffer while the next bit line's data is read by the page buffer.

In this embodiment, the multiple bit lines may be read by using only one page buffer circuit. Since the bit lines BL[0] to BL[2] are discharged simultaneously, the total read time and the read data throughput are increased by three times.

The waveforms shown in FIG. 7A are for reading one Vt level. For multiple level cells such as MLC, TLC, and QLC, the waveforms may be repeated multiple times with different selected word line voltages to read the multiple bits of the selected cells.

The waveforms shown in FIG. 7A demonstrate the fundamental concepts of the embodiments. The waveforms may be modified according to many design considerations or requirements. For example, in another embodiment, the word lines' voltage may be applied after T3 instead of at T1. These modifications and variations shall remain in the scope of the embodiments.

In another embodiment, again referring to FIG. 7A, at time T2, the signals BSG[0] to BSG[2] are supplied with a bias voltage, Vbias, to limit the pre-charge voltage of the bit lines. The bit lines BL[0:2] will be pre-charged to Vbias-Vt of the bit line select gates. Because the bit line is precharged to lower voltage, this reduces the bit line discharge time, Tdis. In an exemplary embodiment, Vbias may be slightly higher than Vt of the sensing device 310 shown in FIG. 3A. This condition reduces the time for an on-cell to discharge the bit line voltage to below Vt of the sensing device 310. For an off-cell, because the bit line pre-charge voltage is higher than the Vt of the sensing device 310, the sensing device will turn on to allow the signal S0 to set the latch 207a.

In another exemplary embodiment using the page buffer circuit shown in FIG. 3D, the precharge voltage of the bit line may be limited by the bias device 306. During pre-charging, the signal BIAS are supplied with a bias voltage, Vbias, to precharge the bit lines BL[0] to BL[2] to Vbias-Vt of the bias device 306. The signals BSG[0] to BSG[0] are supplied with a VDD level. This reduces the bit line discharge time, Tdis. In an exemplary embodiment, Vbias may be slightly higher than Vt1+Vt2, where Vt1 and Vt2 are the threshold voltage of the bias device 306 and sensing device 310, respectively. In this way, the bit line is precharged to slightly higher than the Vt of the sensing device 310, thus reducing the bit line discharge time.

Figure 7B:
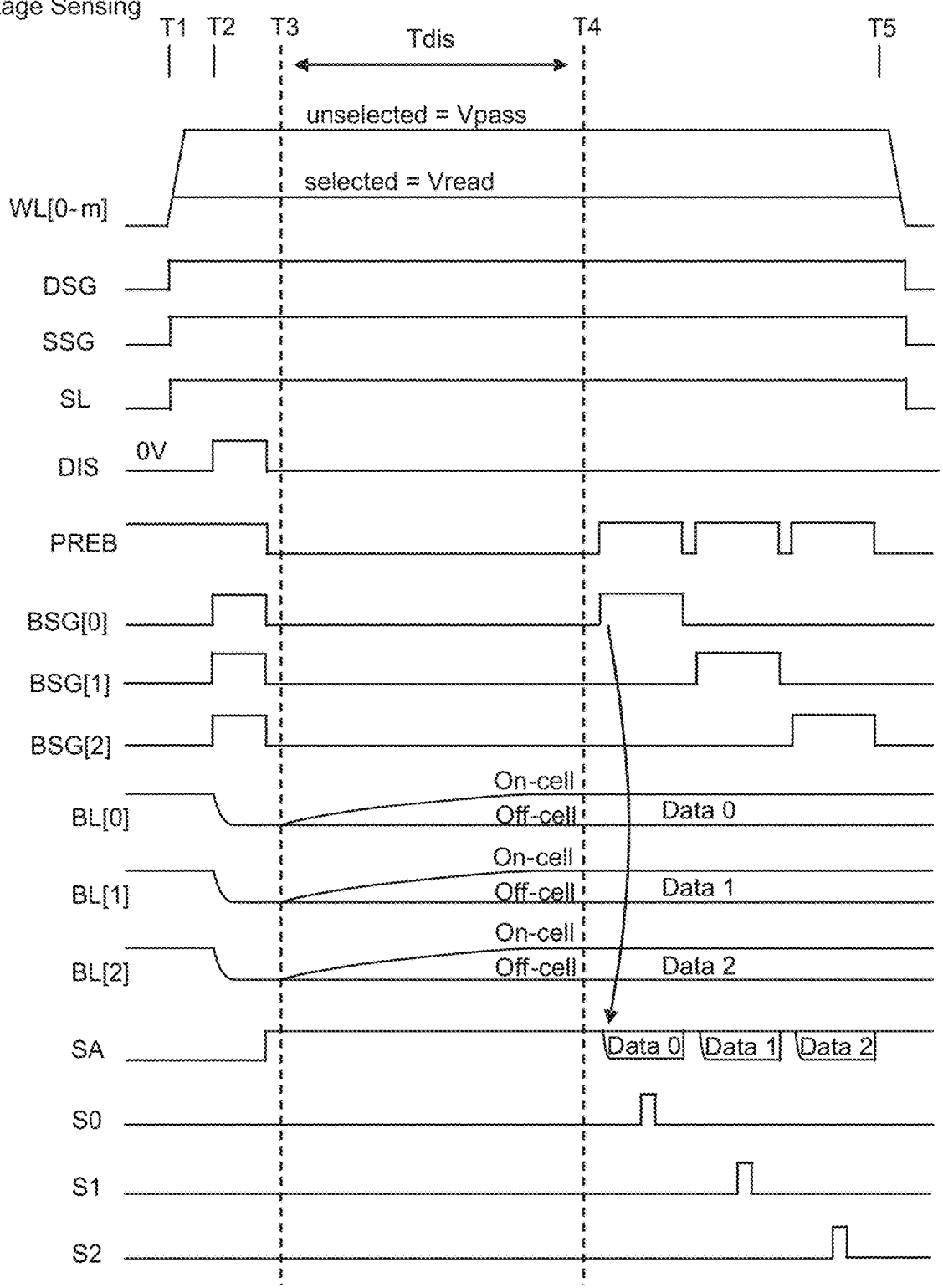

FIG. 7B shows another embodiment of read operation waveforms in accordance with the invention. This embodiment is similar to the embodiment shown in FIG. 7A except that at time T1, the source line (SL) is supplied with a positive voltage such as VDD.

At time T2, a discharge signal (DIS), as shown in the page buffer circuit in FIG. 3A, is activated to discharge the sensing node (SA) and the bit lines BL[0] to BL[2] to 0V.

At time T3, the bit line select gates BSG[0] to BSG[2] are turned off, and thus the bit lines BL[0] to BL[n] become floating. The on-cells may start to charge up the bit lines. The bit line may be charged to Vread-Vt (of on-cells).

At time T4, a pre-charge signal PREB is activated to pre-charge the sensing node (SA) to VDD. Then, the bit line select gate BSG[0] is turned on. The voltage of BSG[0] may not be higher than the bit line voltage+Vt (of the bit line select gate). Therefore, for on-cells, the bit line select gate will be turned off. The sensing node (SA) will remain at VDD. For off-cells, because the BL remains at 0V, the bit line select gate will be turned on. The sensing node (SA) will be discharged to almost 0V due to the charge-sharing between the bit line and the sensing node. Then, a latch signal LAT is activated to latch the data of the sensing node in the page buffer. Then, the steps from times T4 to T5 may be repeated to read the data from the next bit line.

Figure 7C:
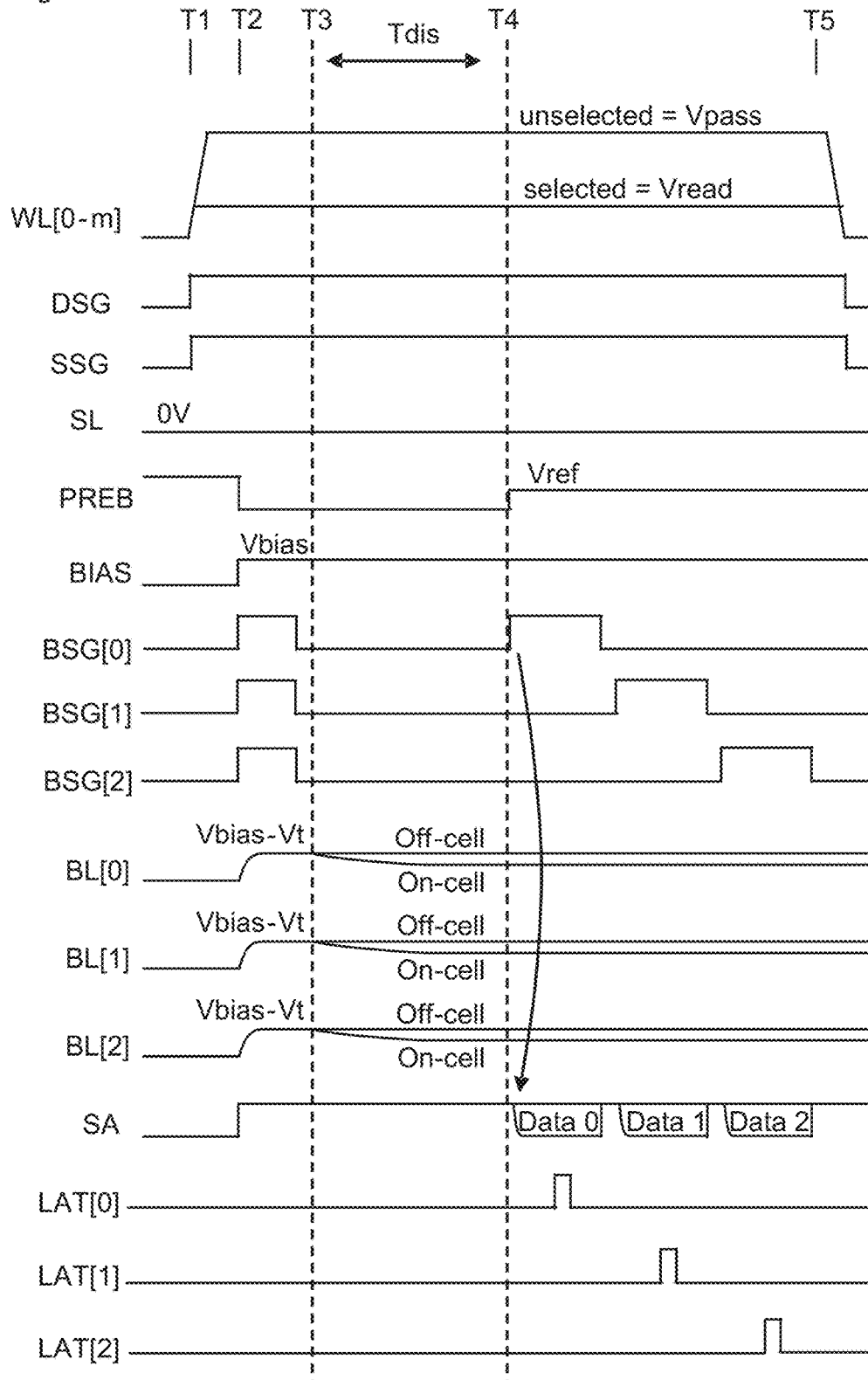

FIG. 7C shows another embodiment of read operation waveforms in accordance with the invention. This embodiment uses current-sensing operations. For example, the page buffer circuit shown in FIG. 3B may be used to perform current-sensing. The operations shown in FIG. 7C are similar to those shown in FIG. 7A except that at time T1, the pre-charge signal PREB is activate to pre-charge the sensing node (SA) and bit lines BL[0] to BL[2]. A BIAS voltage is applied to the bias device 306 shown in FIG. 3B to limit the bit line pre-charge voltage to Vbias-Vt (of the bias device). The bit line discharge time between times T3 and T4 is much shorter, because current-sensing does not require the bit line voltage to discharge to near 0V. It only needs to discharge the bit line voltage to lower than Vbias-Vt to turn on the bias device. At time T4, the pre-charge signal PREB is supplied with a reference voltage, Vref, to limit the pull-up current of the pre-charge device 303 shown in FIG. 3B. The pull-up current is lower than the on-cells' current. Thus, for on-cells, the sensing node (SA) may be discharged to the same bit line voltage as the on-cells' voltage. For off-cells, the sensing node (SA) remains at VDD. As a result, the gain stage of the comparator 305 amplifies the SA voltage to full VDD and 0V. Then, the operations as described in FIG. 7A are performed.

Figure 7D:
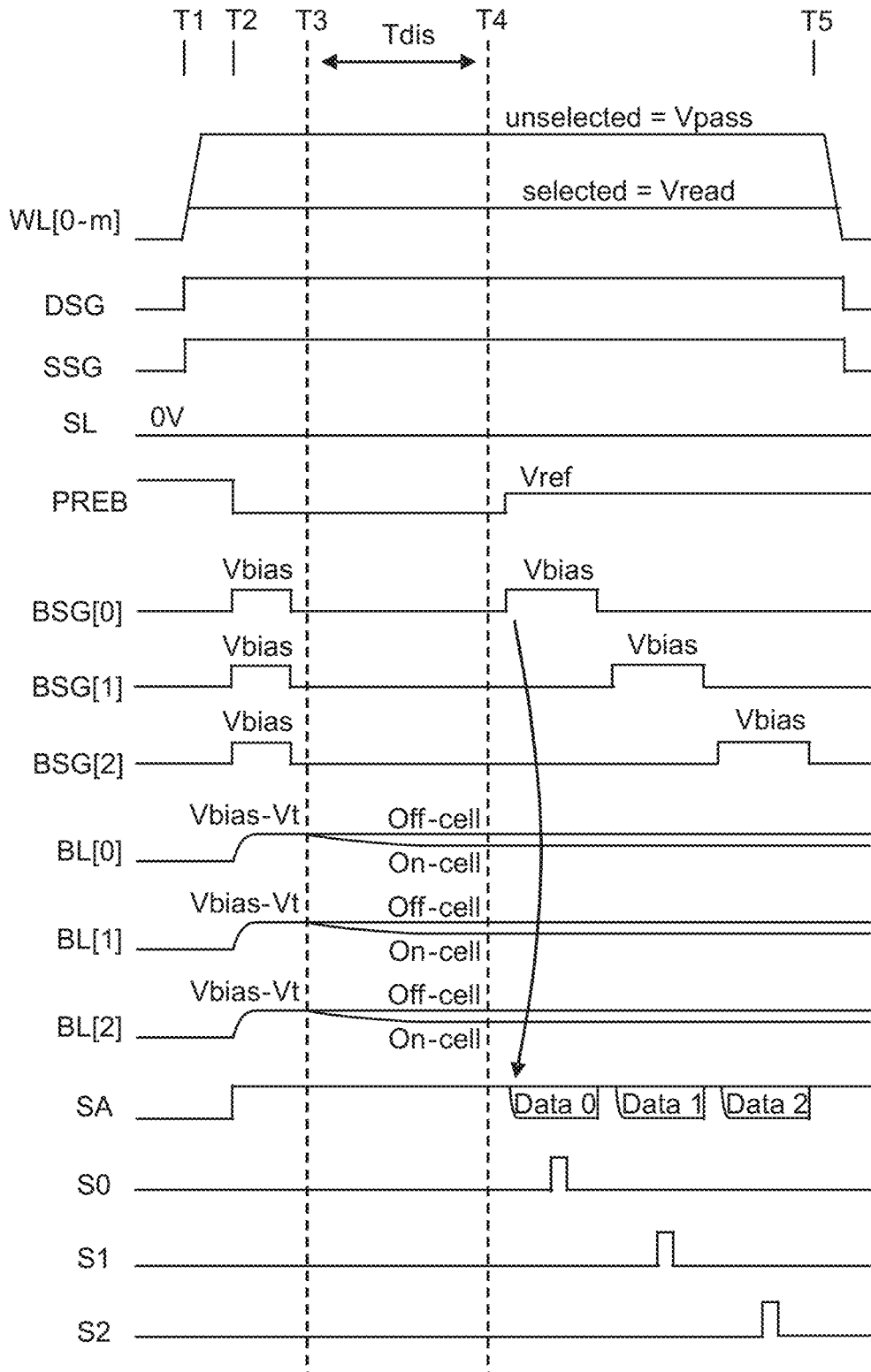

FIG. 7D shows another embodiment of read operation waveforms in accordance with the invention that utilize current-sensing. This embodiment is similar to the embodiment shown in FIG. 7C except that the bias device 306 shown in FIG. 3B is removed. Therefore, the function of the bias device is performed by the bit line select gates 202a to 202n. During pre-charging and sensing, the bit line select gates BSG[0] to BSG[n] are supplied with a bias voltage, Vbias, as shown in FIG. 7D.

Figure 8A:
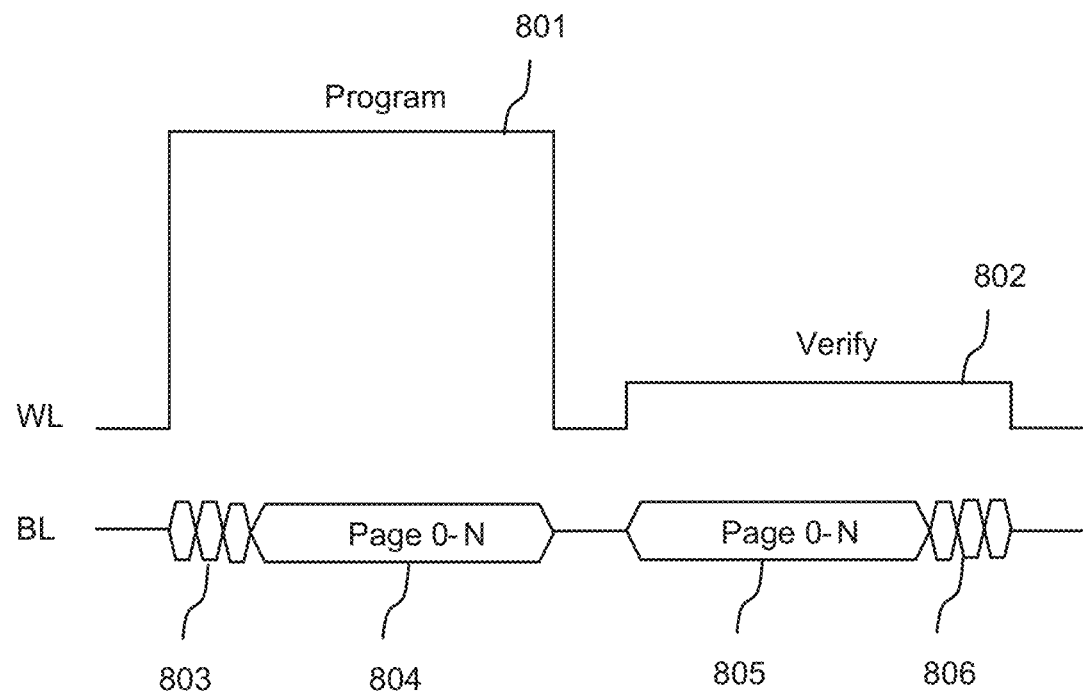
FIGS. 8A-C show embodiments of program and program-verify operations.

FIG. 8A shows an embodiment of program and program-verify pulses. As shown in FIG. 8A, the word line (WL) experiences a program pulse 801 and a program-verify pulse 802. The word line is supplied with a program voltage and verify voltage during these times accordingly. For program pulse 801, the data of multiple pages are loaded sequentially (as shown at 803) and then programmed simultaneously (as shown at 804). For the verify pulse 802, the bit lines of multiple pages are discharged simultaneously (as shown at 805), and then the bit lines' data is sensed sequentially (as shown at 806).

Figure 8B:
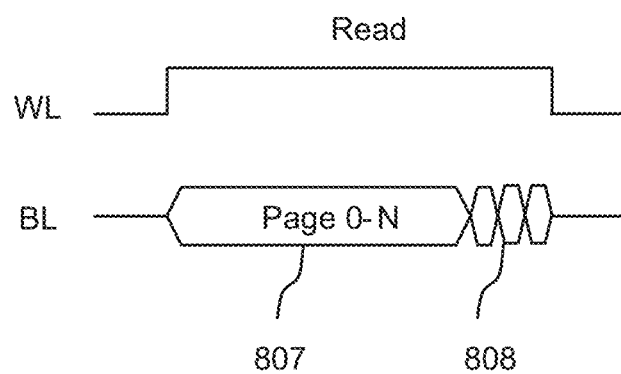

FIG. 8B shows an embodiment of a read operation. As shown in FIG. 8B, the bit lines of multiple pages are discharged simultaneously (as shown at 807), and then the bit lines' data is sensed sequentially (as shown at 808).

Figure 8C:
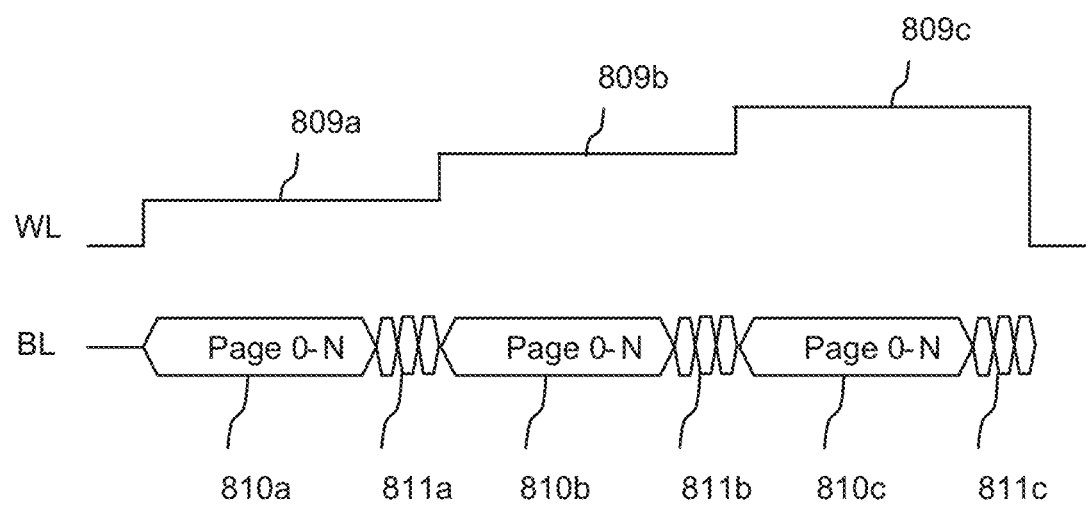

FIG. 8C shows an embodiment of MLC read or program-verify operations. As shown in FIG. 8C, the word line is supplied with multiple-level voltages 809a to 809c. For each level, multiple bit lines are discharged simultaneously, as shown at 801a to 801c, and sequential sensed, as shown at 811a to 811c.

Figure 9A:
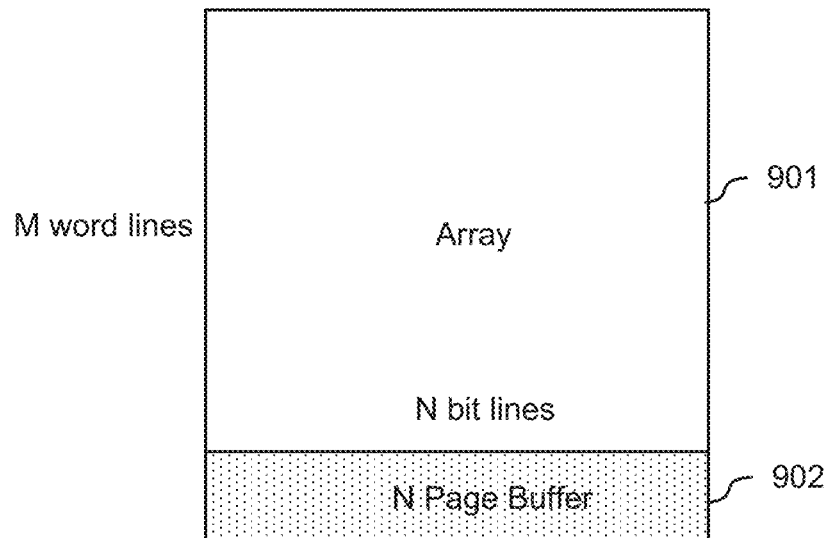
FIGS. 9A-D show NAND flash memory array architectures that are divided into sub-arrays.

FIG. 9A shows a traditional NAND flash memory array architecture. A shown in FIG. 9A, an array 901 is accessed using M word lines and N bit lines. A page buffer 902 is provided that contains the same number of buffers as the number of the bit lines.

Figure 9B:
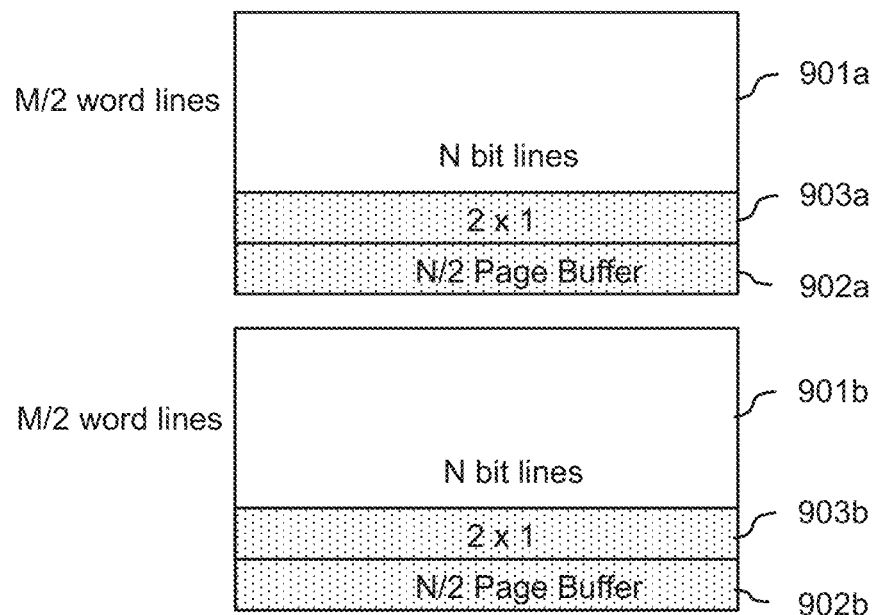

FIG. 9B shows an embodiment of an array architecture in accordance with the invention. As shown in FIG. 9B, the array is divided into two sub-arrays 901a and 901b. Each sub-array is accessed using M/2 word lines and N bit lines. Each sub-array is connected to one of the page buffers 902a and 902b through 2-to-1 bit line select gates 903a and 903b. Therefore, the number of the page buffers 902a and 902b each may be N/2. As a result, the number of total page buffers is N, which is the same as in the array shown in FIG. 9A. Therefore, the silicon area of the array architectures shown in FIGS. 9A-B are similar. However, as described above, the array architecture in FIG. 9B may double the read data throughput, compared with the array shown in FIG. 9A. Furthermore, the bit line length of the array architecture shown in FIG. 9B is ½ of the BL length of the array shown in FIG. 9A, and thus its BL capacitance is ½ as much. Therefore, the BL discharge time may be reduced to ½. Because the BL discharge time dominates the total read time, the total read time may be reduced by about ½. Please notice, this read time reduction may benefit both random read and sequential read operations. Moreover, the sub-arrays 901a and 901b may be read and programmed independently. This results in 2-plane operations.

Figure 9C:
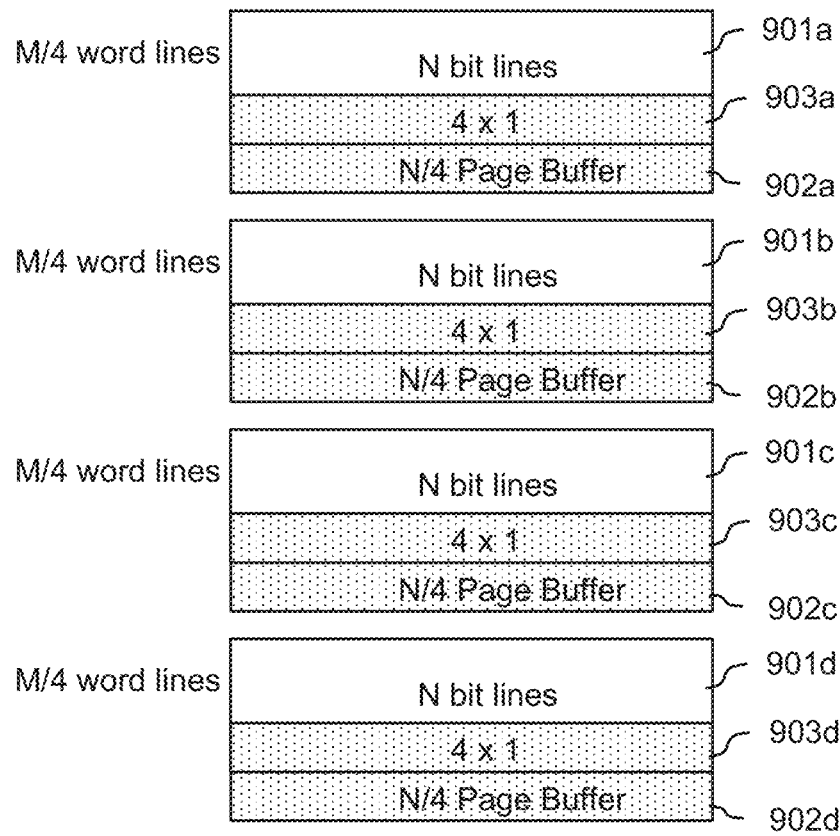

FIG. 9C shows another embodiment of an array architecture that uses 4 sub-arrays 901a to 901d. Each sub-array utilizes N/4 page buffers, such as 902a to 902d. The bit lines are connected to the page buffer through 4-to-1 BL select gates, such as 903a to 903d. As a result, the total page buffer number is the same as the array shown in FIG. 9A. Thus, the silicon area of this array architecture is similar to the array shown in FIG. 9A. However, in accordance with the invention, this array has 4 times the read data throughput compared with the array of FIG. 9A. Furthermore, the bit line length becomes ¼ for this array architecture, its bit line capacitance as well as the bit line discharge time become ¼ as well. As a result, the read latency also becomes ¼. Moreover, the 4 sub-arrays 901a to 901d can be read and programmed independently, resulting in 4-plane operations.

In various exemplary embodiments, the array is divided into any number of sub-arrays. The more sub-arrays, the shorter read latency, and higher data throughput may be obtained.

Figure 9D:
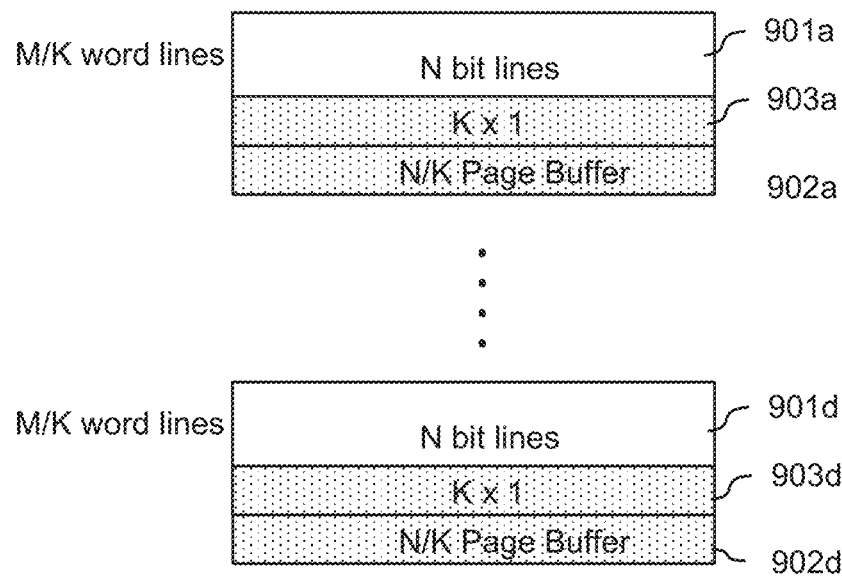

FIG. 9D assumed that array is divided into K sub-arrays. The read latency becomes 1/K and the data throughput become K times the array as shown in FIG. 9A. For example, typical SLC NAND flash memory read latency is about 25 us and data throughput is about 640 MB/s. Assuming the array is divided into 32 sub-arrays, the read latency may be reduced to 25 us/32=0.8 us, and the data throughout may be increased to 640 MB/s×32=20.5 GB/s, while the die size remains about the same. This high data throughput may saturate the I/O speed when using a low I/O pin count such as 8 or 16. Therefore, it may be most advantageous for use with products having high I/O pin counts, such as Hybrid Memory Cube (HMC) and High Bandwidth Memory (HBM), etc.

FIGS. 10A-E show embodiments of 3D array architectures.

Figure 10A:
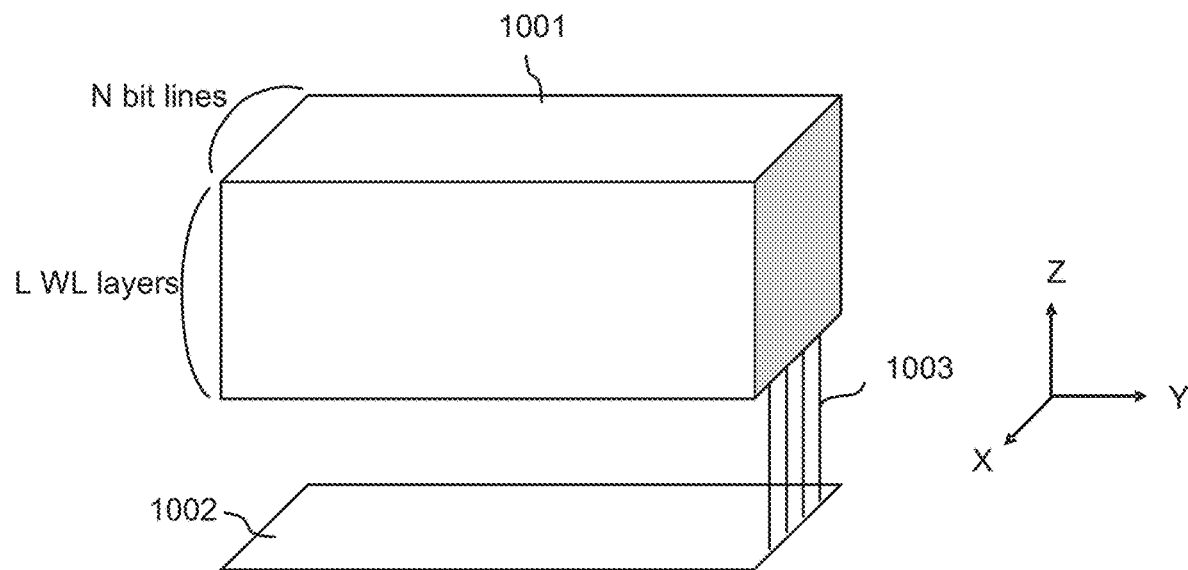
FIGS. 10A-E show embodiments of 3D array architectures in accordance with the invention.

FIG. 10A shows an array architecture having a 3D array 1001 that contain multiple WL layers and bit lines that run in the Y direction. A page buffer circuit 1002 is located under the array 1001. This configuration may reduce the die size and also allow more page buffers to be integrated. The page buffers may be connected to the bit lines through the bit line contacts 1003.

Figure 10B:
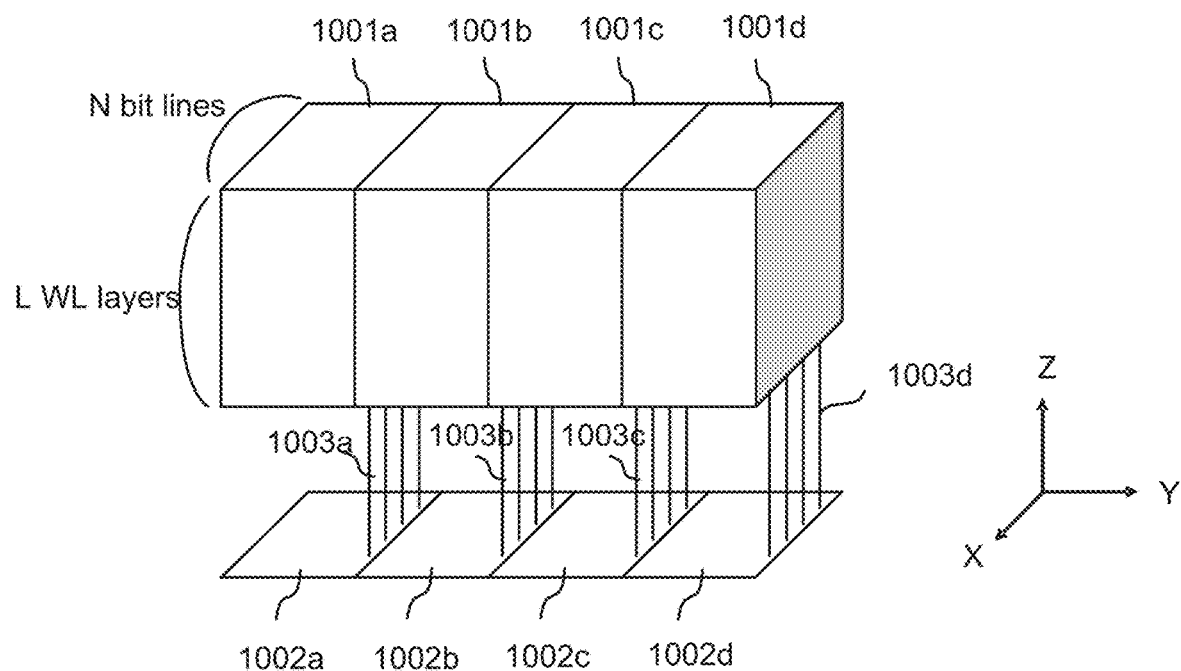

FIG. 10B shows an embodiment of a 3D array architecture that comprises 4 sub-arrays 1001a to 1001d. The page buffers may be divided into 4 groups 1002a to 1002d. Each page buffer group may be connected to a corresponding sub-arrays through the bit line contacts 1003a to 1003d as shown. The die size for this architecture remains about the same as the array shown in FIG. 10A, however, the read latency may be reduced by ¼ and the read data throughput may be increased by 4 times.

Figure 10C:
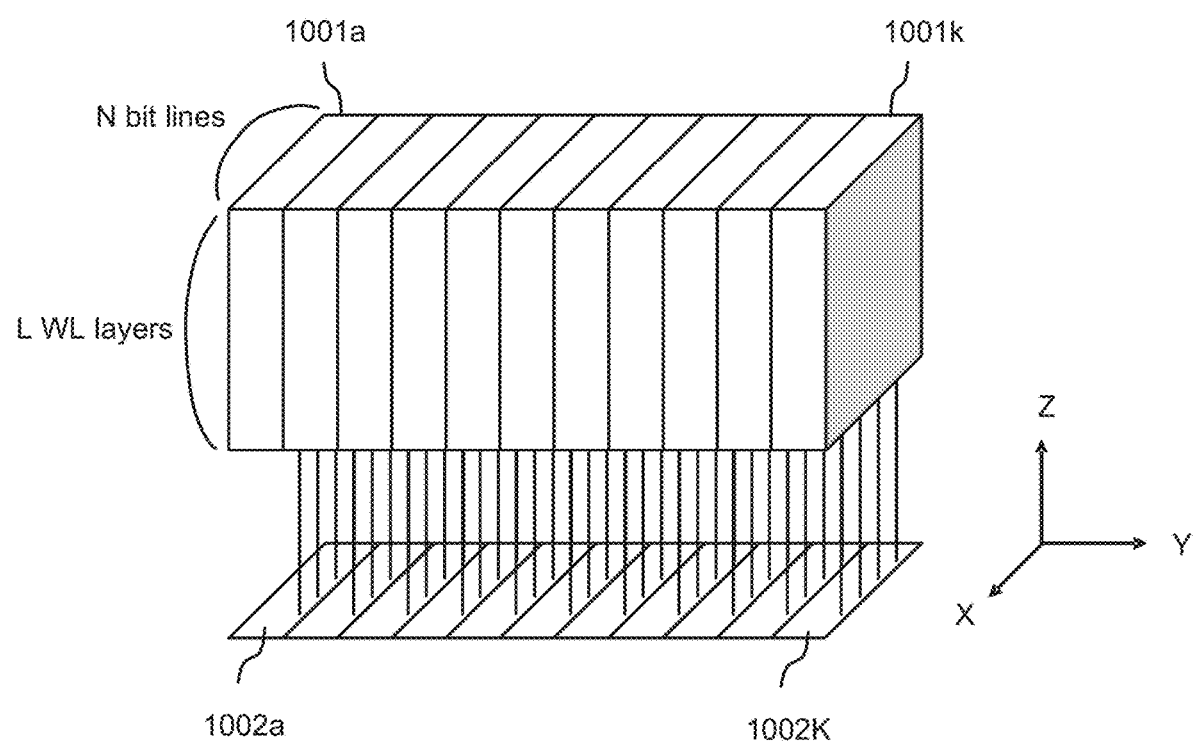

FIG. 10C shows another embodiment of a 3D array architecture in accordance with the invention. The array in FIG. 10C is divided into K sub-arrays 1001a to 1001k. The page buffers are also divided into K groups 1002a to 1002k. By using this architecture, the die size may remain about the same as the array in FIG. 10A, however, the read latency may be reduced by 1/K and the read data throughput may be increased by K times.

Figure 10D:
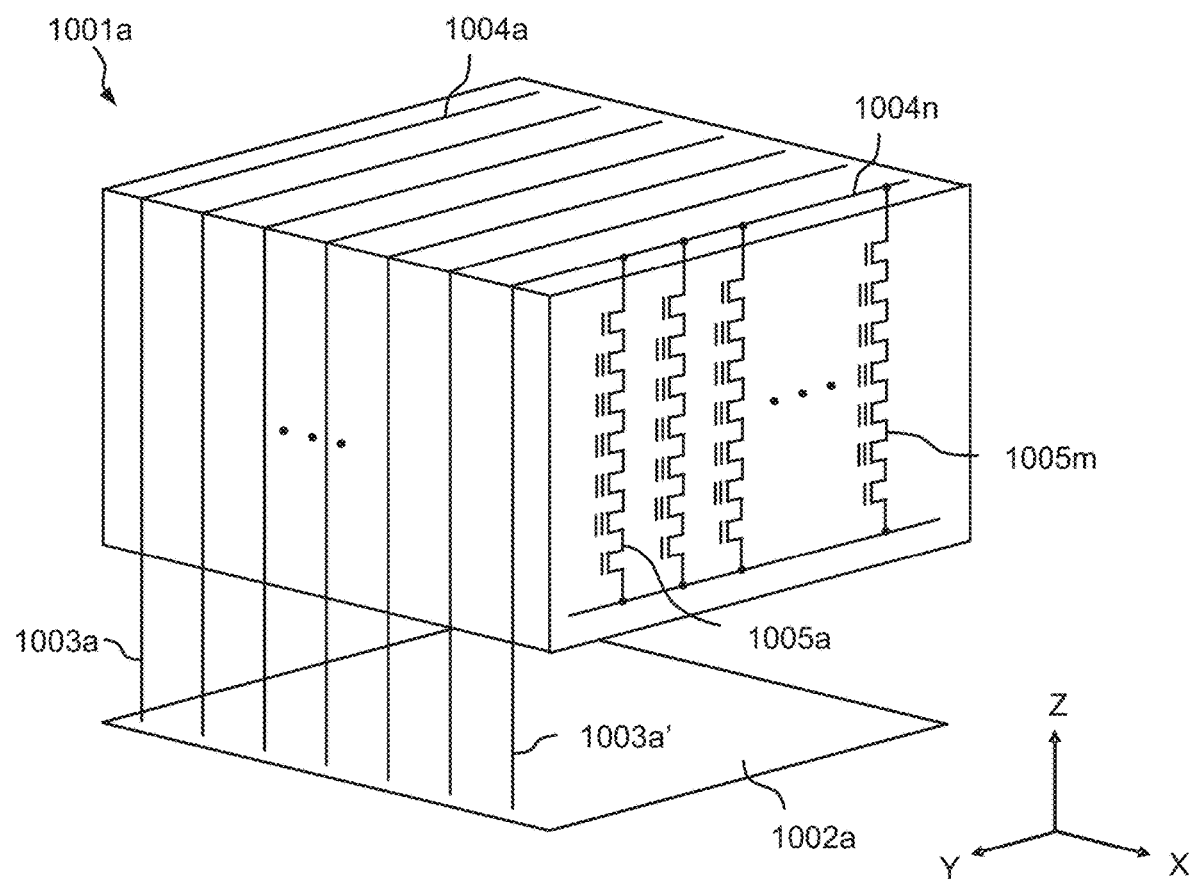

FIG. 10D shows an embodiment of the 3D sub-array 1001a and its page buffer circuit 1002a as shown in FIG. 10C. The sub-array 1001a includes multiple bit lines 1004a to 1004n and each bit line is coupled to strings, for instance, bit line 1004n is coupled to strings 1005a to 1005m. Also shown are page buffer circuit 1002a that includes bit line decoders. The page buffer and bit line decoder 1002a are located under the 3D sub-array 1001a to save silicon area. The bit lines 1004a to 1004n are connected to the page buffer and bit line decoders 1002a through contacts 1003a to 1003a'.

In the conventional arrays, the number of the page buffers must be equal to the number of bit lines to perform all-bit-line (ABL) programing and read, of half number of the bit lines to perform half-bit-line (HBL) programming and read. In various exemplary embodiments, the number of the page buffers may be 1/K of the bit lines, where, K is the number of bit line select gate signals, such as BSG[0:K−1]. However, all the bit lines still can be programmed and read simultaneously. By using this approach, the array can be divided into K sub-arrays as shown in FIG. 10D. The sub-arrays may be arranged as shown in FIG. 10C. This results in the same die size as the conventional array, while the data throughput may be increased by K times, and the bit line length for each sub-array may be reduced by 1/K which reduces the bit line discharging time by 1/K. As a result, a total of $K^2$ (K×K) read data throughput improvement can be achieved.

Figure 10E:
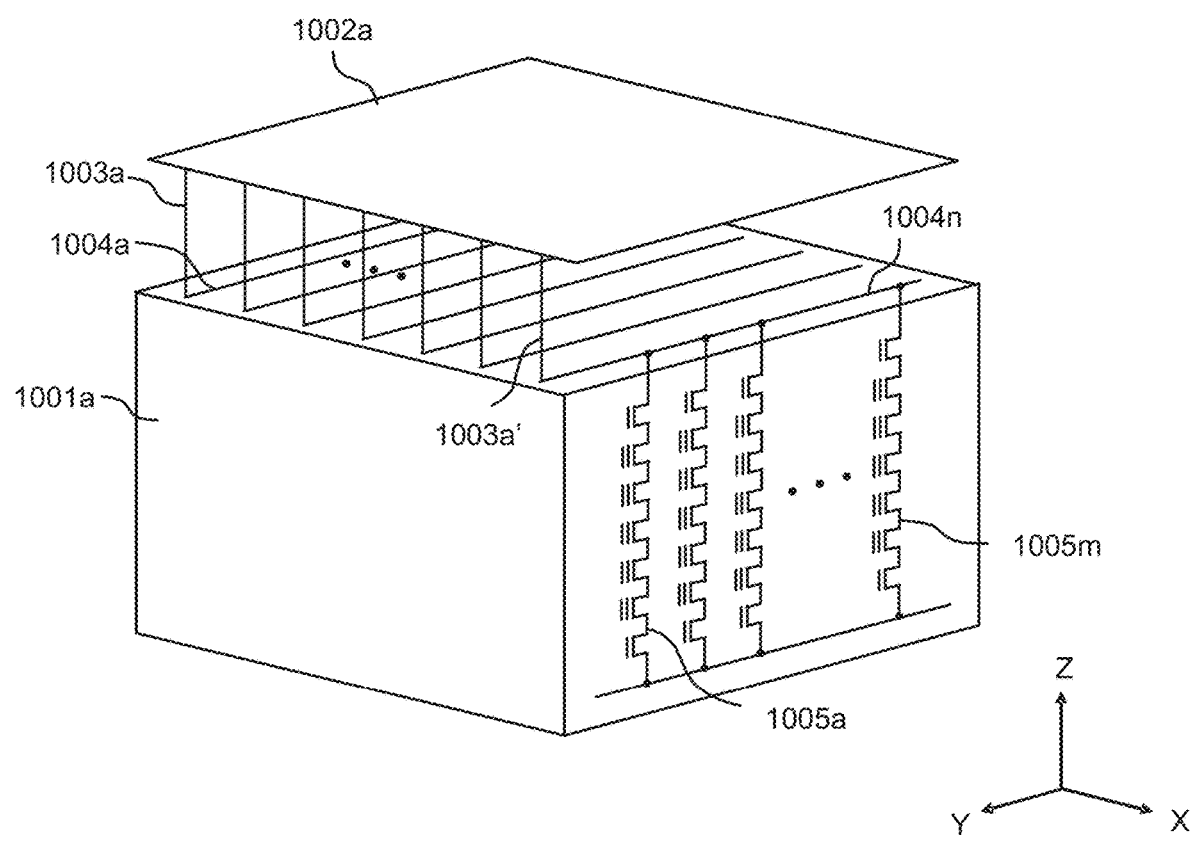

FIG. 10E shows another embodiment of the 3D sub-array 1001a and its page buffer circuit 1002a. As shown in FIG. 10E, the page buffer and bit line decoder 1002a is located on top of the 3D sub-array 1001a. In one embodiment, the page buffer and bit line decoder 1002a is formed by using a 3D process such as Silicon-on-Insulator (SOI), etc. In another embodiment, the page buffer and bit line decoder 1002a are formed on another die or wafer. The die or wafer can be connected to the 3D sub-array 1001a by using a 3D integration process, such as copper pillar, micro-bump, Cu—Cu bond, through-silicon via (TSV), and other suitable technologies.

Figure 11A:
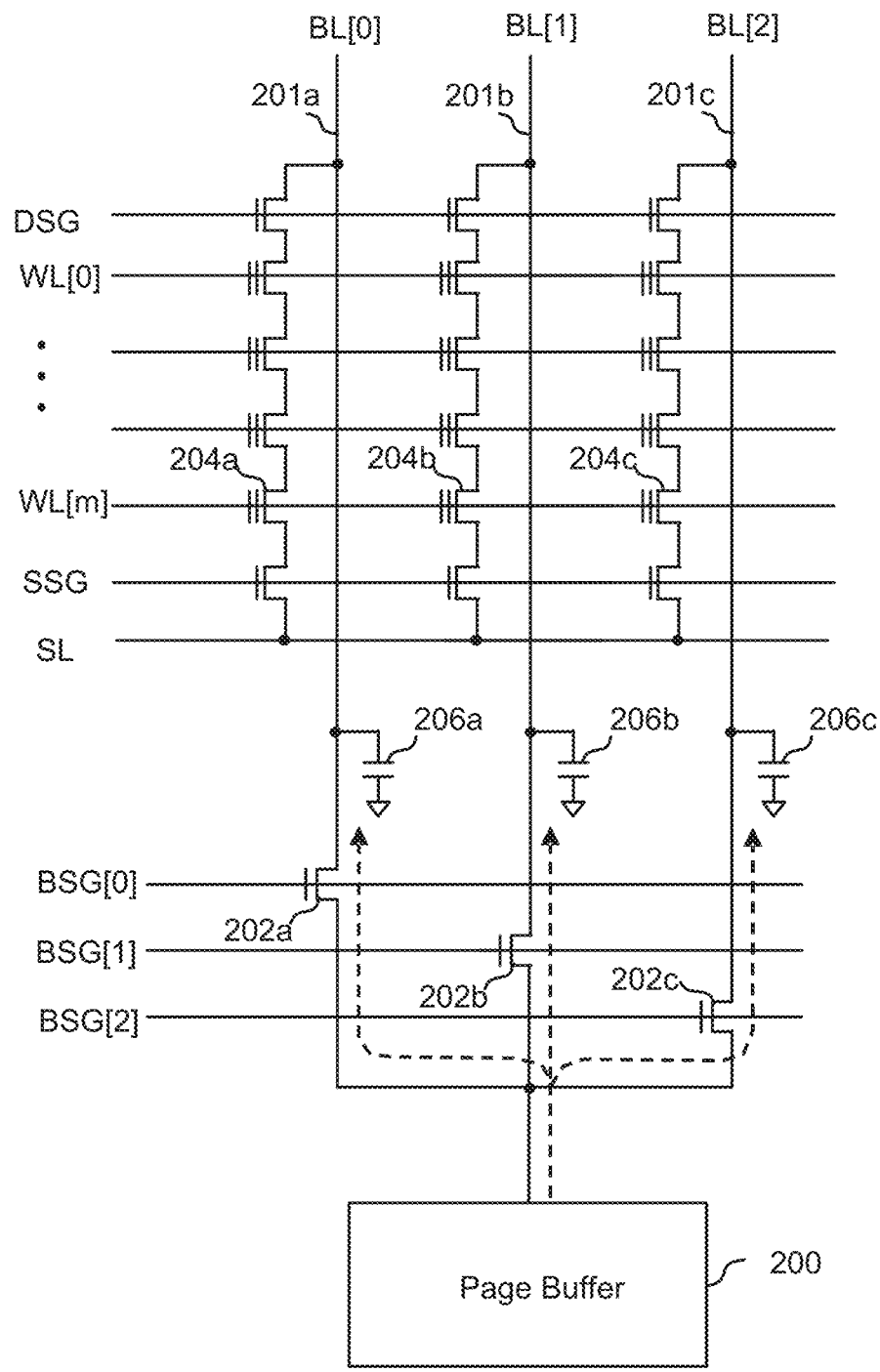
FIG. 11A shows an embodiment of a 3D array wherein the bit lines are used as temporary data storage in accordance with the invention.

FIG. 11A shows another embodiment of a 3D array in accordance with the invention. In this embodiment, the bit line is used as temporary data storage. As described above, data may be loaded from the page buffer 200 into multiple bit lines, such as 201a to 201c and held by the bit line capacitance, such as 206a to 206c.

Figure 11B:
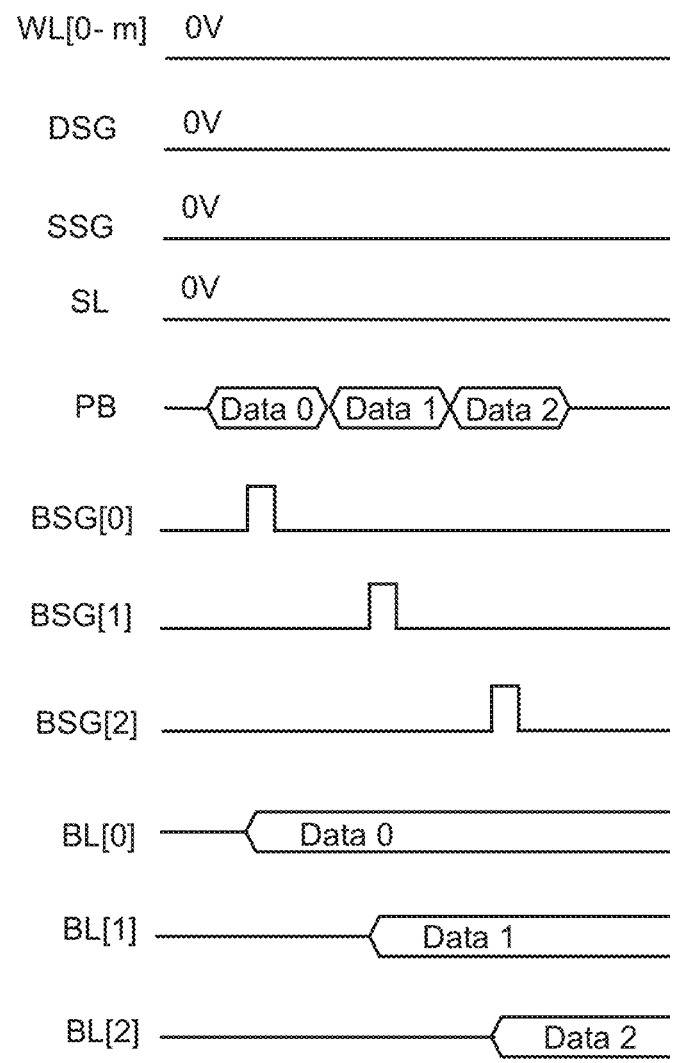
FIG. 11B shows an embodiment of waveforms that illustrate how data is loaded into multiple bit lines in accordance with the invention.

FIG. 11B shows waveforms that illustrate how data is loaded into multiple bit lines BL[0] to BL[2] as illustrated in FIG. 11A. In this embodiment, the drain select gates (DSG) may be turned off to isolate the strings from the bit lines.

Figure 11C:
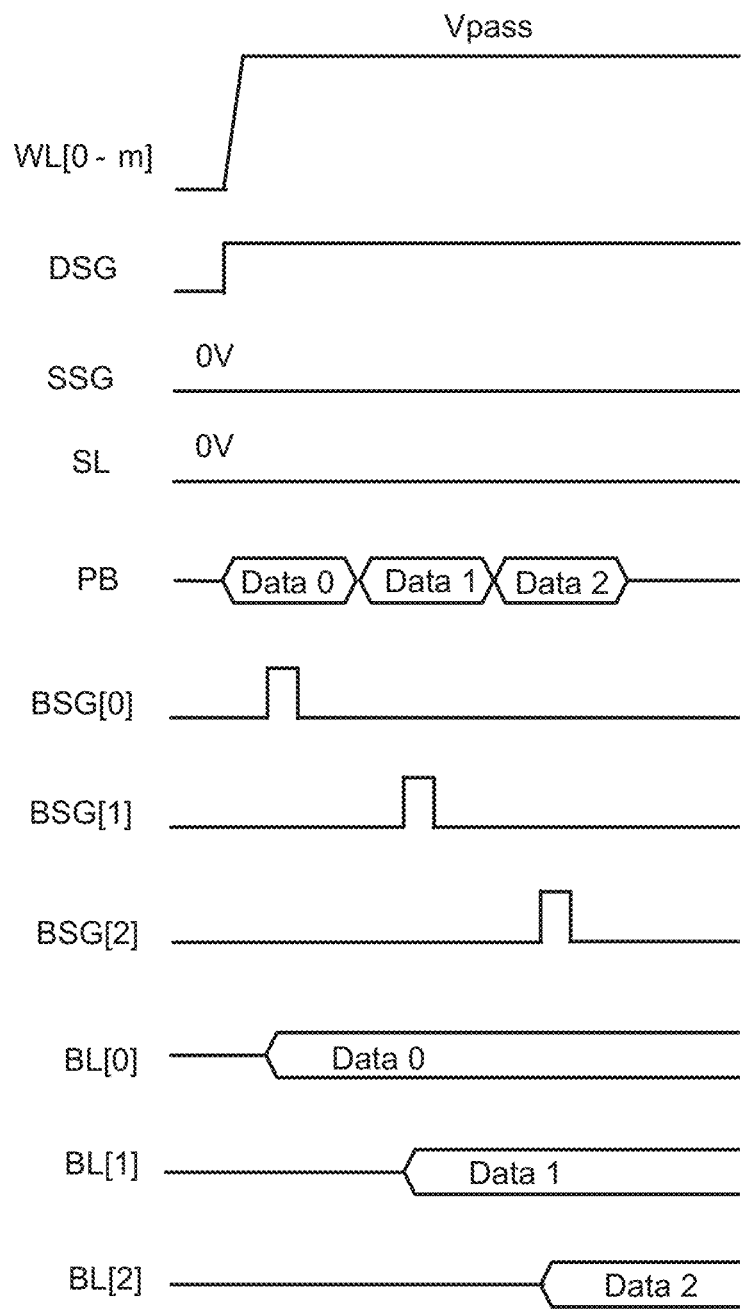
FIG. 11C shows another embodiment of waveforms to load data to multiple bit lines in accordance with the invention.

FIG. 11C shows another embodiment of waveforms to load data to multiple bit lines. In this embodiment, the drain select gates (DSG) of multiple or all strings on the bit lines are turned on, and the word lines of multiple or all strings on the bit lines are supplied with a pass voltage (Vpass), such as 6V, to turn on all the cells. The source select gates (SSG) are turned off. By using these operations, the bit line's capacitance may be increased by adding the strings' channel capacitance.

Figure 11D:
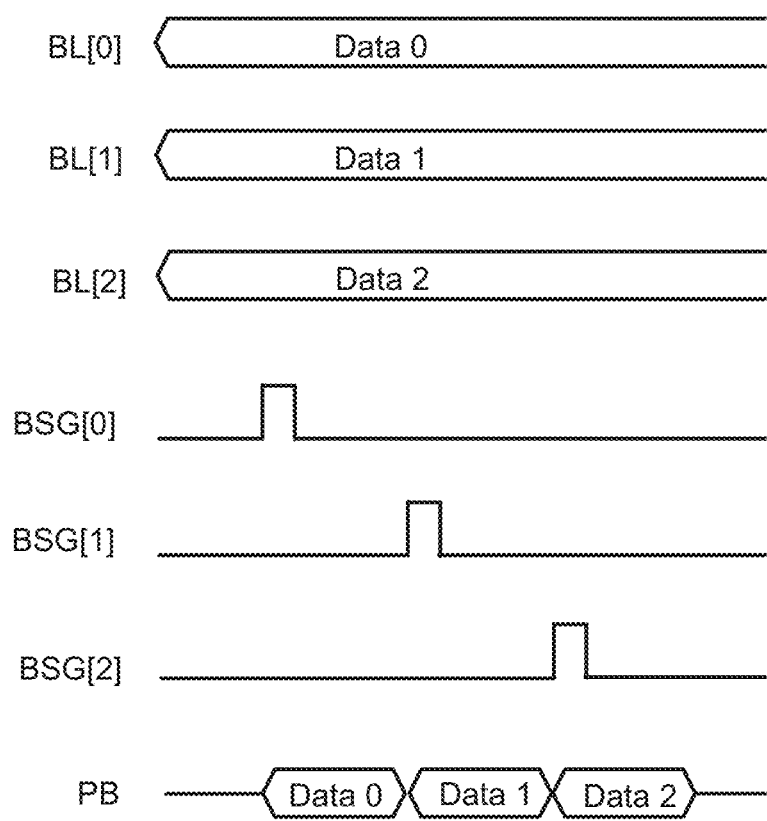
FIG. 11D shows exemplary waveforms illustrating data reads from the bit line capacitors in accordance with the invention.

FIG. 11D shows waveforms illustrating data reads from the bit line capacitors (e.g., 206). Assume the bit lines BL[0] to BL[2] store Data 0 to Data 2 in their bit line capacitance. By sequentially turning on the bit line select gates, BSG[0] to BSG[2], charge sharing may occur between the bit line capacitance and the sensing node 302 of the page buffer circuit 200, as shown in FIG. 3A. Because the bit line capacitance is much larger than the sensing node 302, the sensing node 302 will become almost the bit line voltage in a very short time. Therefore, the bit line select gates BSG[0] to BSG[2] may be switched very fast to read the data of BL[0] to BL[2] in very high speed.

The data held by the bit line capacitance 206a to 206c may be read by using the sensing operation as described in FIG. 6C. Therefore, the bit line capacitors may be used to store the data. Referring to FIG. 9D, assume an array is divided into K sub-arrays. Each array contains N bit lines. Thus, the entire array contains K×N bit lines. In accordance with the invention, storage of K×N bits of data using the bit line capacitors can be achieved.

In one embodiment, the array stores data in the bit line capacitance which may be used as working memory, such as DRAM. The system may read, write, and refresh the data like DRAM. When the data is ready to be stored to NAND flash memory cells for non-volatile storage, the data may be read from the bit line capacitors to the page buffer, as shown in FIG. 6C, and then programmed to NAND flash memory cells, as described in FIGS. 4B-5C.

In another embodiment, the bit lines may be used as data registers to temporary store the input data. The data may be read from the bit lines using the operations of FIG. 6C, and then programmed to selected page of NAND flash memory cells. For example, referring to FIG. 9C, the input data may be temporarily stored to the bit lines in the sub-arrays 901a to 901c. Next, the data may be read from the bit lines of these sub-arrays and programmed to the sub-array 901d. This storage operation provides a large capacity of 'free' data registers without increasing the area of the circuits.

Figure 12A:
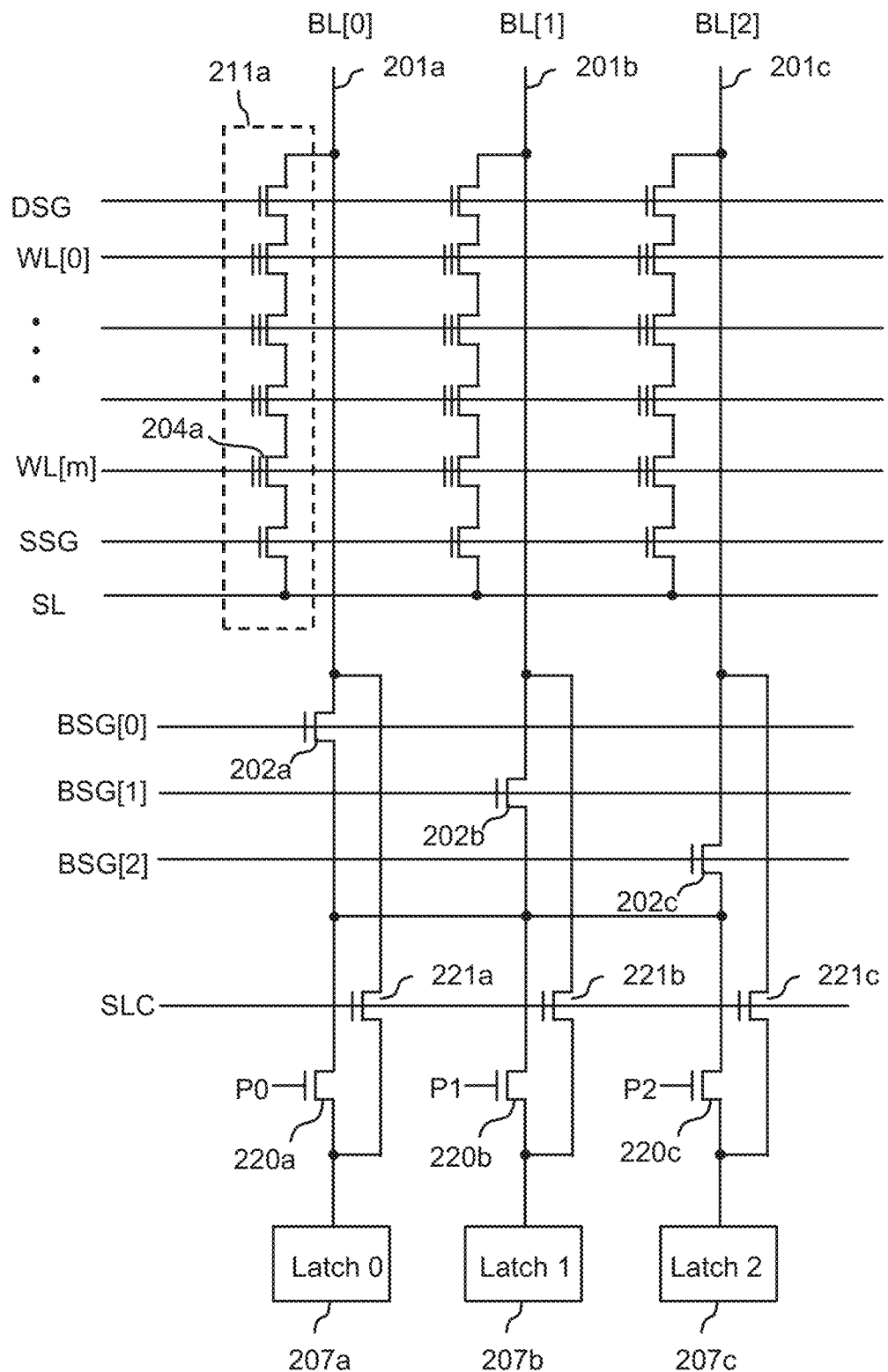
FIGS. 12A-B shows embodiments of a 3D array that provide SLC and TLC programming in accordance with the invention.

FIG. 12A shows another embodiment of a 3D array in accordance with the invention. This circuit is capable to perform both TLC and SLC programming modes. The array in FIG. 12A comprises bit line select gates 202a to 202c and data latches 207a to 207c that store data bits D0, D1, and D2 for TLC programming, respectively. Also shown are latch pass gates 220a to 220c, which are also shown in FIGS. 3A-B. During TLC mode, the page buffer will program three bits data, D0 to D2, to single cell. During SLC mode, the page buffer will program the three bits data, D0 to D2, to three different cells located in three bit lines. During TLC programming, the SLC signal turns off the pass gates 221a to 221c. The bit select gate signals BSG[0] to BSG[2] selectively turn on one of the bit line select gates 202a to 202c. The signals P0 to P2 selectively turn on one of the pass gates 220a to 220c to pass the data of the latches to the selected bit line according to the programmed Vt level.

During SLC programming, the bit line select gates 202a to 202c and the latch pass gates 220a to 220c may be all turned off. The signal SLC turns on the pass gates 221a to 221c. Thus, the data of the latches 207a to 207c is passed to the bit lines 201a to 201c, respectively. In this way, the multiple bit lines may be programmed by using the data stored in the multiple latches in the page buffer simultaneously.

Figure 12B:
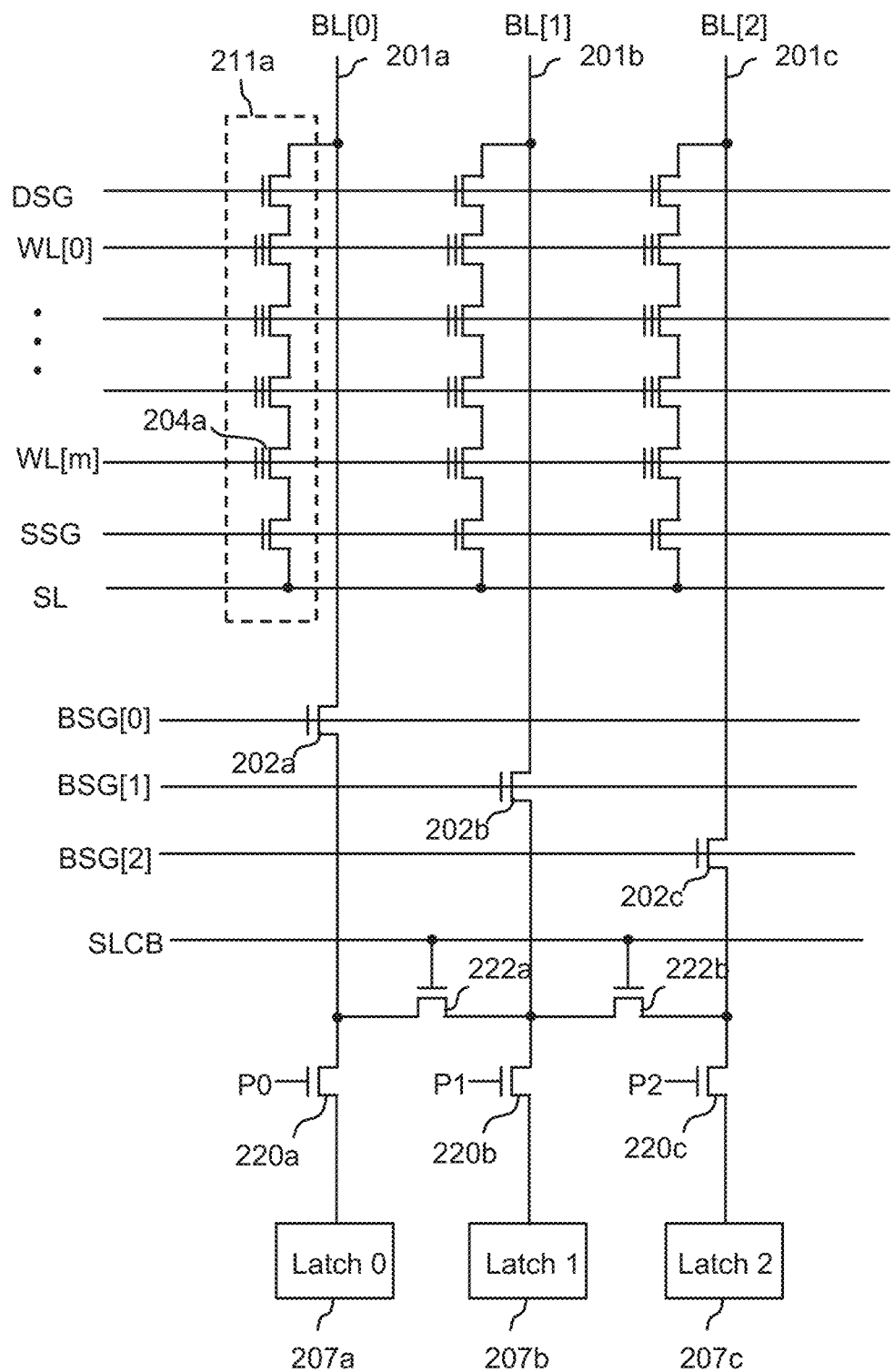

FIG. 12B shows another embodiment of a 3D array in accordance with the invention. As shown in FIG. 12B, the array comprises bit line select gates 202a to 202c and data latches 207a to 207c that store data bits D0, D1, and D2 for TLC programming, respectively. Also shown are latch pass gates 220a to 220c, which are also shown in FIGS. 3A-B. During TLC programming, the SLCB signal turns on the pass gates 222a and 222b. The signals BSG[0] to BSG[2] selectively turn on one of the bit line select gates 202a to 202c. The signals P0 to P2 selectively turn on one of the pass gates 220a to 220c to pass the data of the latches to the selected bit line according to the programmed Vt level.

During SLC programming, the bit line select gates 202a to 202c and the latch pass gates 220a to 220c may be all turned on. The SLCB signal turns off the pass gates 222a and 222b. Thus, the data of the latches 207a to 207c may be passed to the bit lines 201a to 201c, respectively. In this way, multiple bit line may be programmed by using the data stored in the multiple latches in the page buffer simultaneously.

Figure 13:
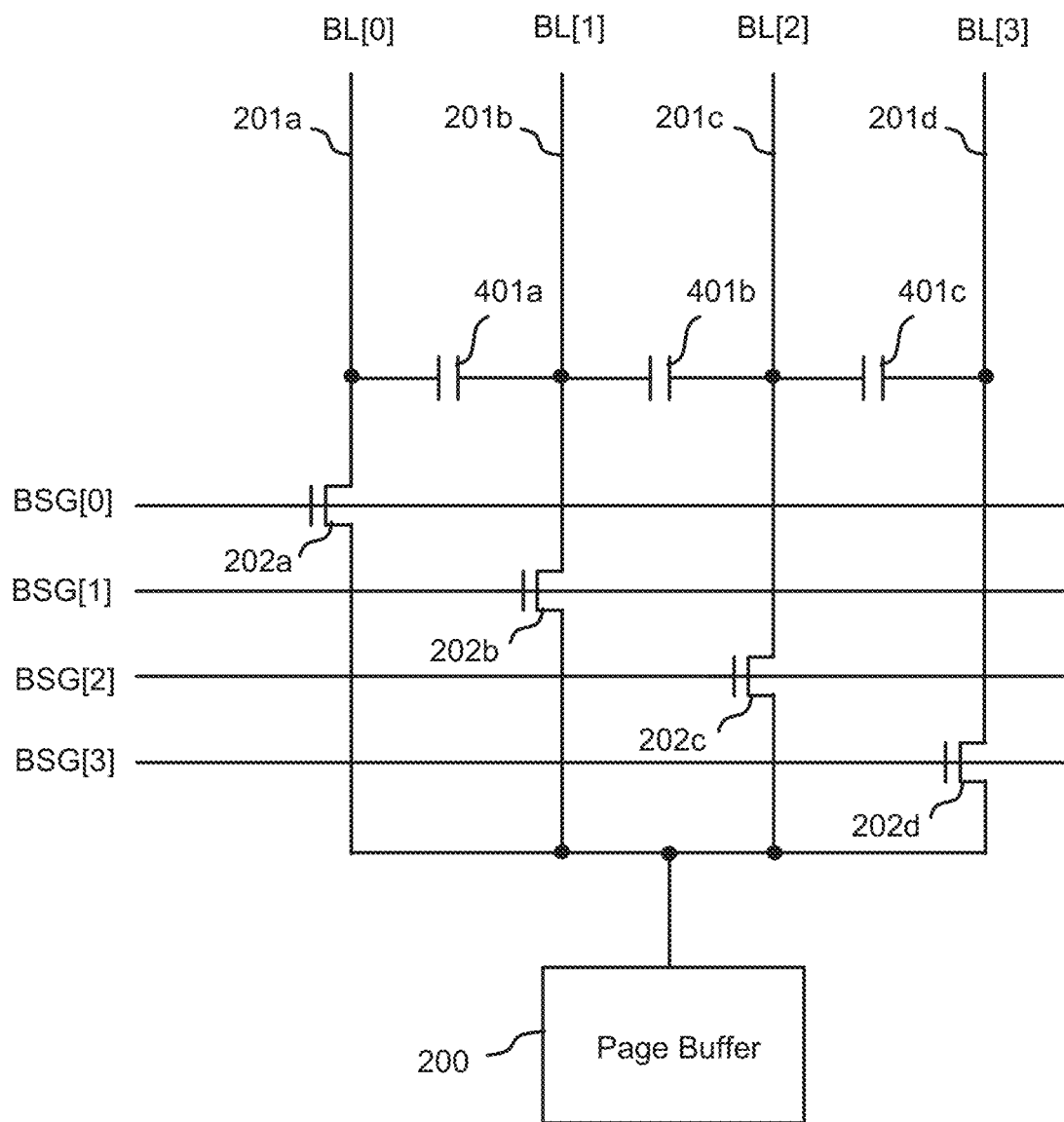
FIG. 13 shows an embodiment of a NAND flash memory array that illustrates bit line to bit line capacitance.

FIG. 13 shows an embodiment of a NAND flash memory array. In the array shown in FIG. 13, the bit line-to-bit line capacitance, such as 401a to 401c may dominate the parasitic capacitance of bit lines. Especially for a high density array, the bit lines may be very long and the bit line pitch may be very tight. This may cause bit line-to bit line coupling problems when loading the data to the multiple bit lines.

As an example, after the bit line select gate 202a is turned on to load data from the page buffer 200 to the bit line BL[0] 201a, the select gate 202a is turned off. Next select gate 202b is turned on to load the next data from the page buffer 200 to BL[1] 201b. During loading, BL[0] is floating with the previously loaded data. Therefore, the data of BL[1] 201b may couple the BL[0] 201a through the capacitance 401a. As a result, the data of BL[0] 201a may be changed due to this coupling. Similarly, after the data of BL[1] 201b is loaded, the select gate 202b is turned off. The select gate 202c is turned on to load the next data from the page buffer 200 to BL[2] 201c. The data of BL[2] 201c may couple to BL[1] 201b to change the data of BL[1].

Figure 14:
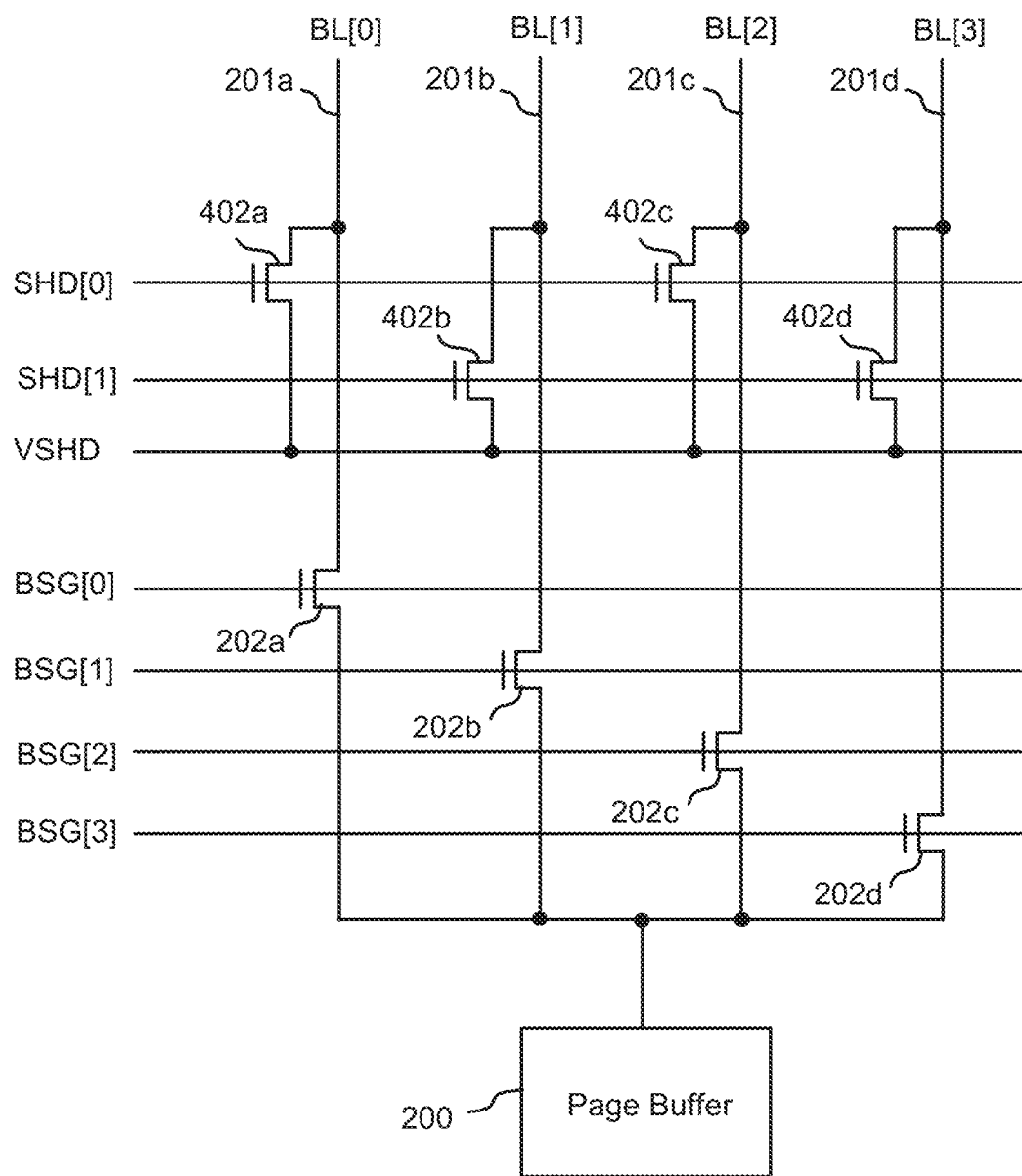
FIG. 14 shows an array having bit line shielding that is used to prevent bit line coupling.

FIG. 14 shows an array having bit line shielding that is used to prevent bit line coupling as described above. The array comprises shielding devices 402a to 402d that are added to the bit lines. The page buffer 200 operates to only load data to the even bit lines, such as BL[0] and BL[2] or the odd bit lines such as BL[1] and BL[3]. When even bit lines are loaded, the signal SHD[1] turns on the devices 402b and 402d, to pass VDD from the VSHD signal to the odd bit lines BL[1] and BL[3]. In this way, when the data is loaded to even bit lines, such as BL[0] and BL[2], they are shielded by the odd bit lines BL[1] and BL[3], and thus no coupling will occur between the bit lines. Meanwhile, because the odd bit lines BL[1] and BL[3] are supplied with the inhibit data, VDD, the cells on the odd bit lines may not be programmed. Thus, in an embodiment, only half of the bit lines may be programmed at one time, which may reduce the program throughput by half. However, by using the array architectures described herein, the program throughput may be increased many times, so that using the bit line shielding described above may be acceptable.

Figure 15A:
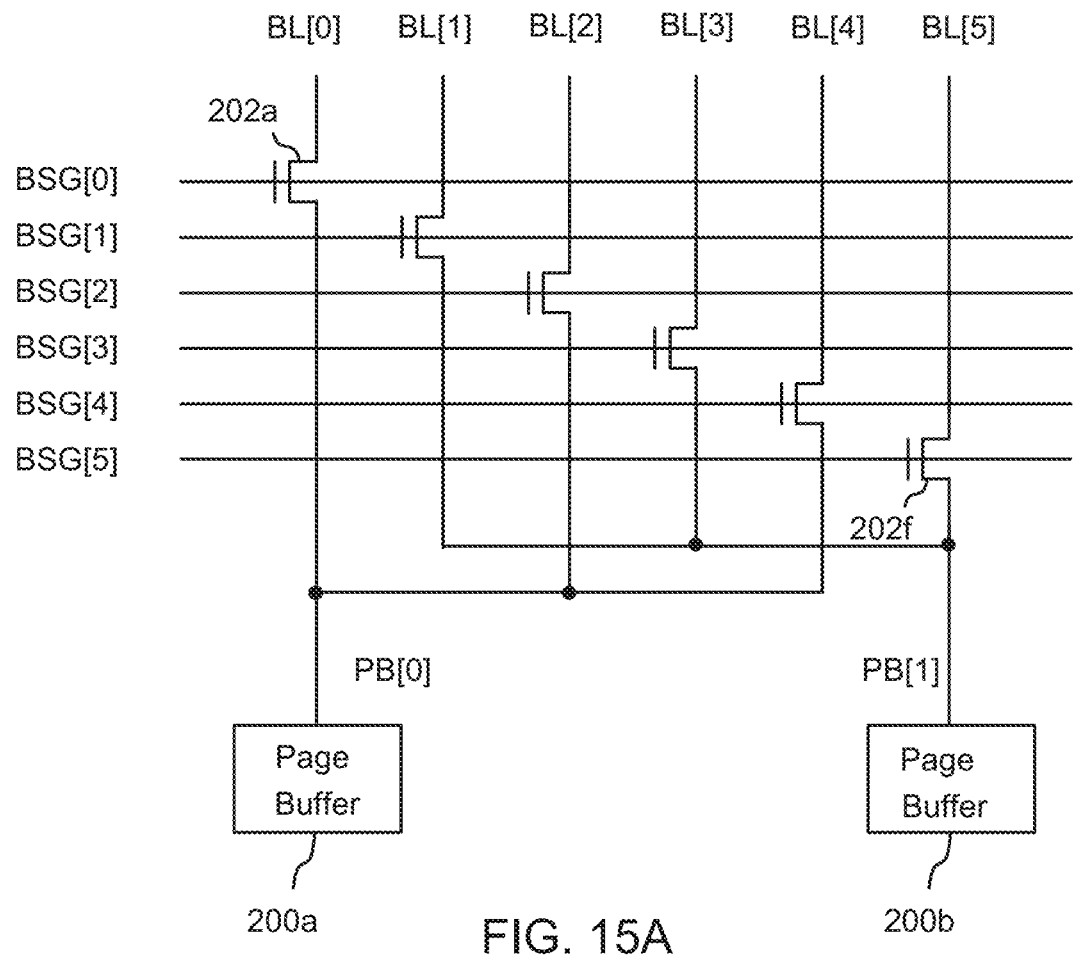
FIGS. 15A-B show another embodiment of a circuit and corresponding waveforms for mitigating bit line-to-bit line coupling.

FIG. 15A shows another embodiment of a circuit for mitigating bit line-to-bit line coupling. In the circuit shown in FIG. 15A, multiple bit lines BL[0] to BL[5] are alternatively connected to page buffers 200a and 200b through the bit line select gates 202a to 202f as shown. Each page buffer comprises three data latches as described above. The page buffers provide data to either odd or even bit lines so that when one set of bit lines is in use, shielding is provided by the other set of bit lines. It should be noted that the number of the bit lines and bit line select gates shown in FIG. 15A are exemplary. The invention may be applied to any number of bit lines and bit line select gates.

Figure 15B:
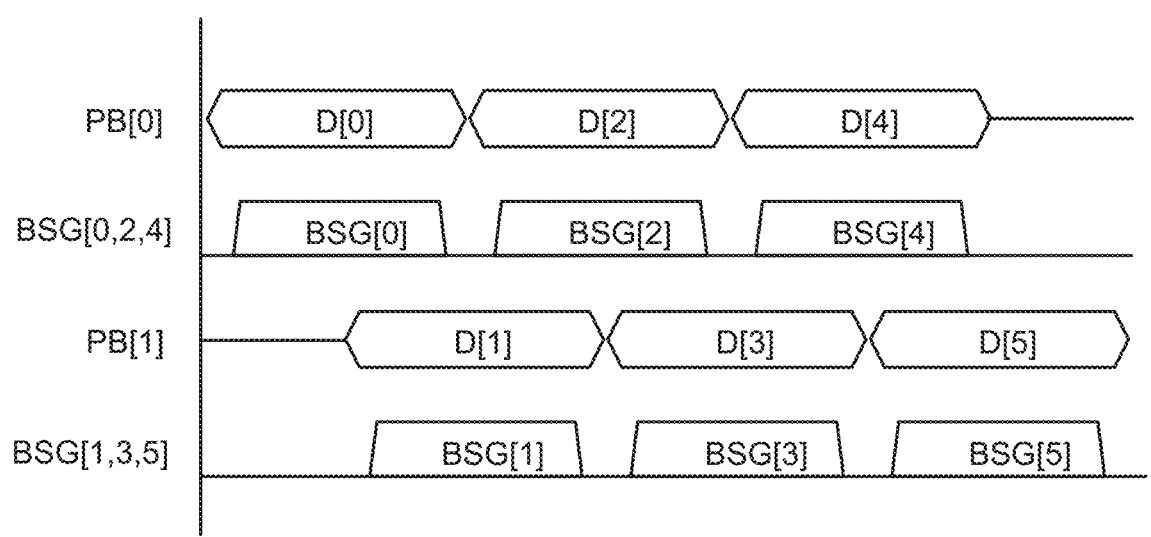

FIG. 15B shows waveforms illustrating how data is loaded into the bit lines of FIG. 15A to mitigate coupling. During operation, the signals BSG[0], BSG[2], and BSG[4] are sequentially turned on to load data D[0], D[2], and D[4] to the bit lines BL[0], BL[2], and BL[4]. The signals BSG[1], BSG[3], and BSG[5] are sequentially turned on to load data D[1], D[3], and D[5] to the bit lines BL[1], BL[3], and BL[5]. The timing of the lines BSG[0] to BSG[5] should be noted. When BSG[1] is turned on to load D[1] to BL[1], BSG[0] is still on, and therefore BL[0] is not floating. When BL[1] couples BL[0], the page buffer 200a maintains the data of BL[0]. Therefore, the coupling problem is mitigated or resolved. Similarly, when BSG[2] is turned on to load D[2] to BL[2], BSG[1] is still on, and therefore BL[1] is not floating. When BL[2] couples BL[1], the page buffer 200b maintains the data of BL[1]. Thus, by using the circuit of FIG. 15A the bit line coupling problem can be reduced or eliminated. However, when loading the last bit line of the group, BL[5], although it may not couple BL[4], it may couple the adjacent bit line in the next group (not shown). To solve this problem, the data of BL[0] may be loaded one more time. This recovers the adjacent bit line's data.

Figure 16:
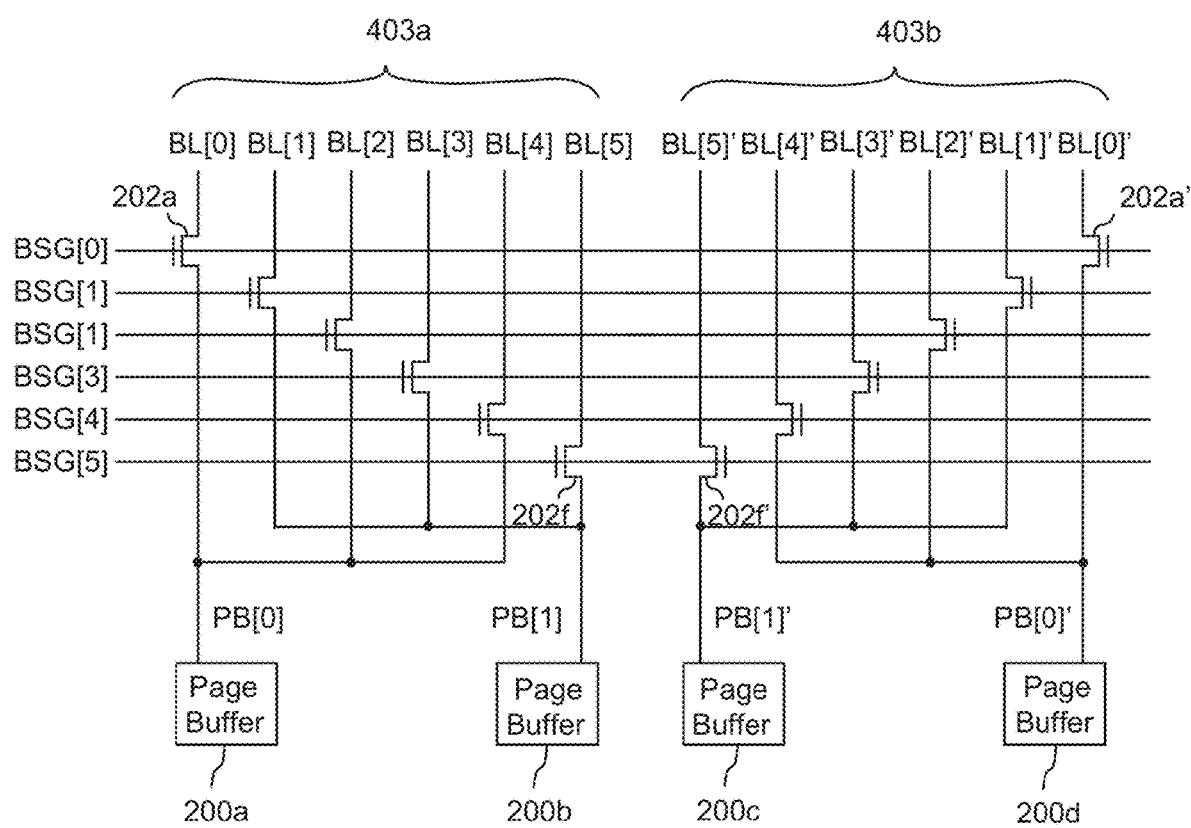
FIG. 16 shows an exemplary embodiment of a circuit that resolves the last bit-line coupling issue as described with reference to FIGS. 15A-B.

FIG. 16 shows an exemplary embodiment of a circuit that resolves the last bit line coupling issue as described with reference to FIGS. 15A-B. The circuit of FIG. 16 comprises two adjacent groups 403a and 403b of bit lines. For these groups, their bit line select gates 202a to 202f and 202a' to 202f' are mirrored. When the group 403a is loading data from BL[0] to BL[5], the group 403b is loading data from BL[0]' to BL[5]'. For example, the data of BL[5] and BL[5]' are loaded at the same time, which resolves the coupling problem between BL[5] and BL[5]'.

Figure 17A:
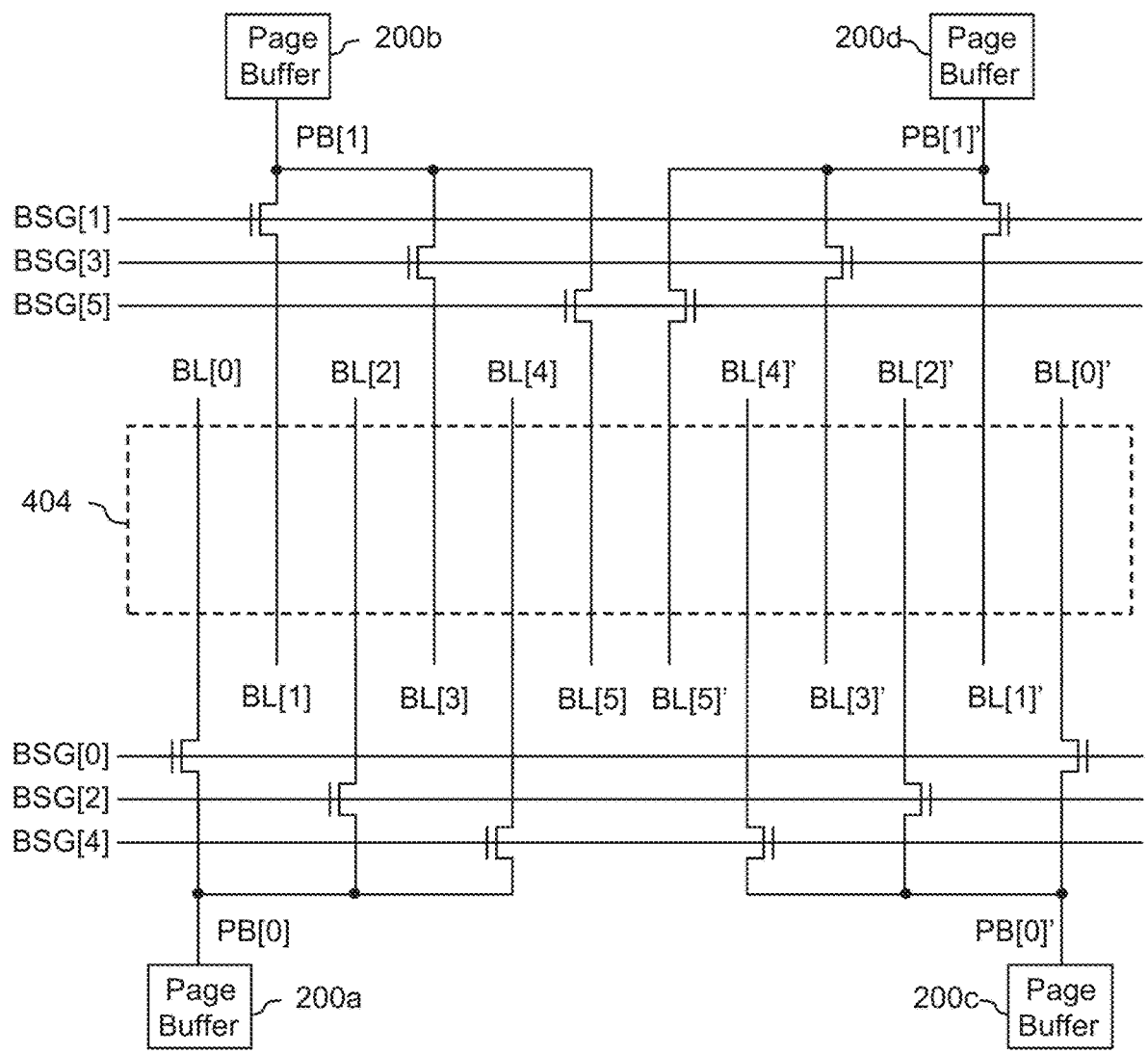
FIG. 17A shows an embodiment of a circuit that comprises even and odd page buffers as illustrated in FIG. 16.

FIG. 17A shows an embodiment of a circuit that comprises even and odd page buffers 200a-d, as illustrated in FIG. 16, and that are placed on both side of an array 404. For example, the array 404 may also be a sub-array as shown at 901a in FIG. 9D.

Figure 17B:
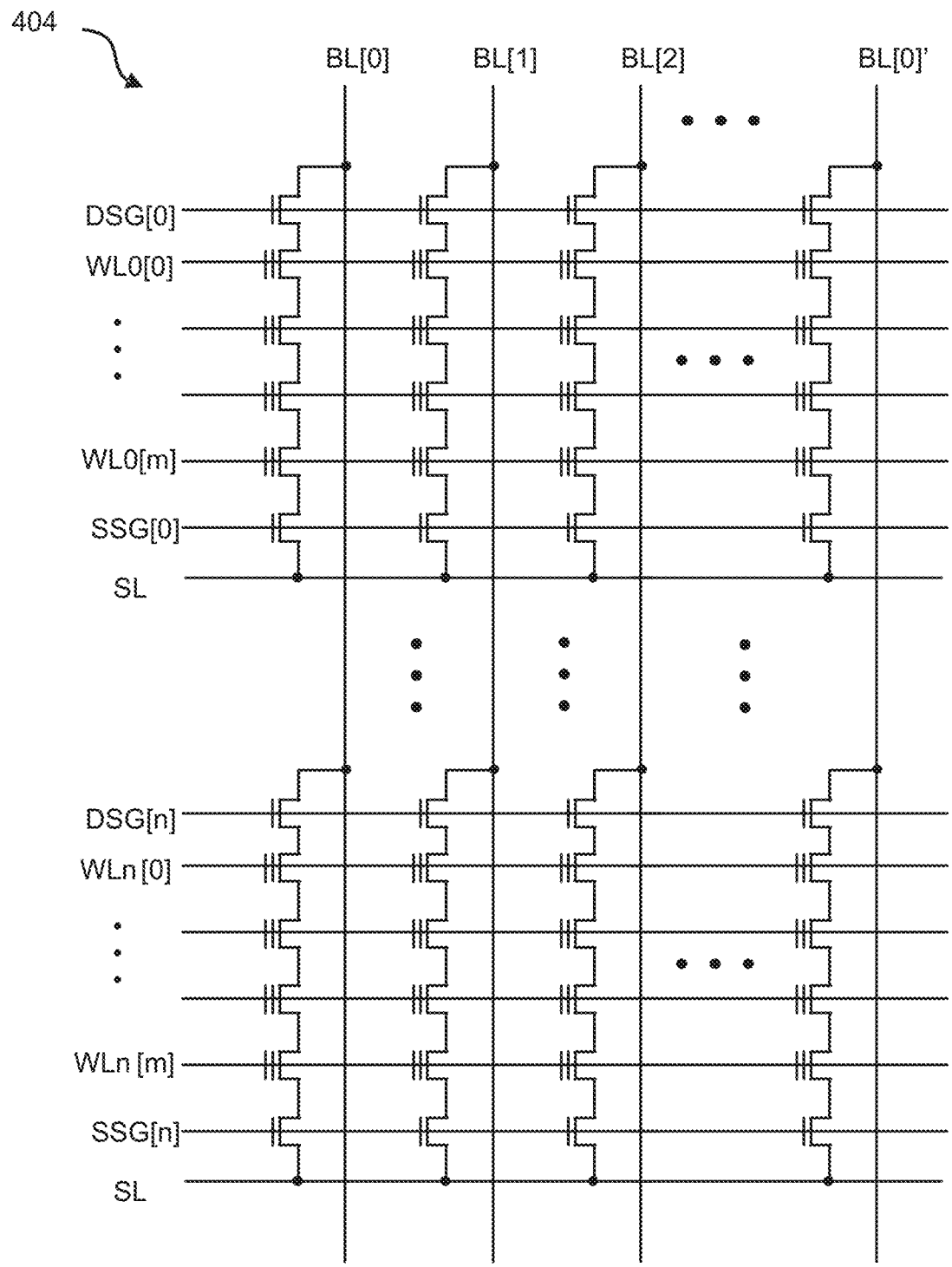
FIGS. 17B-C show embodiments of 2D and 3D versions of an array (or sub-array) for use in the circuit of FIG. 17A.
Figure 17C:
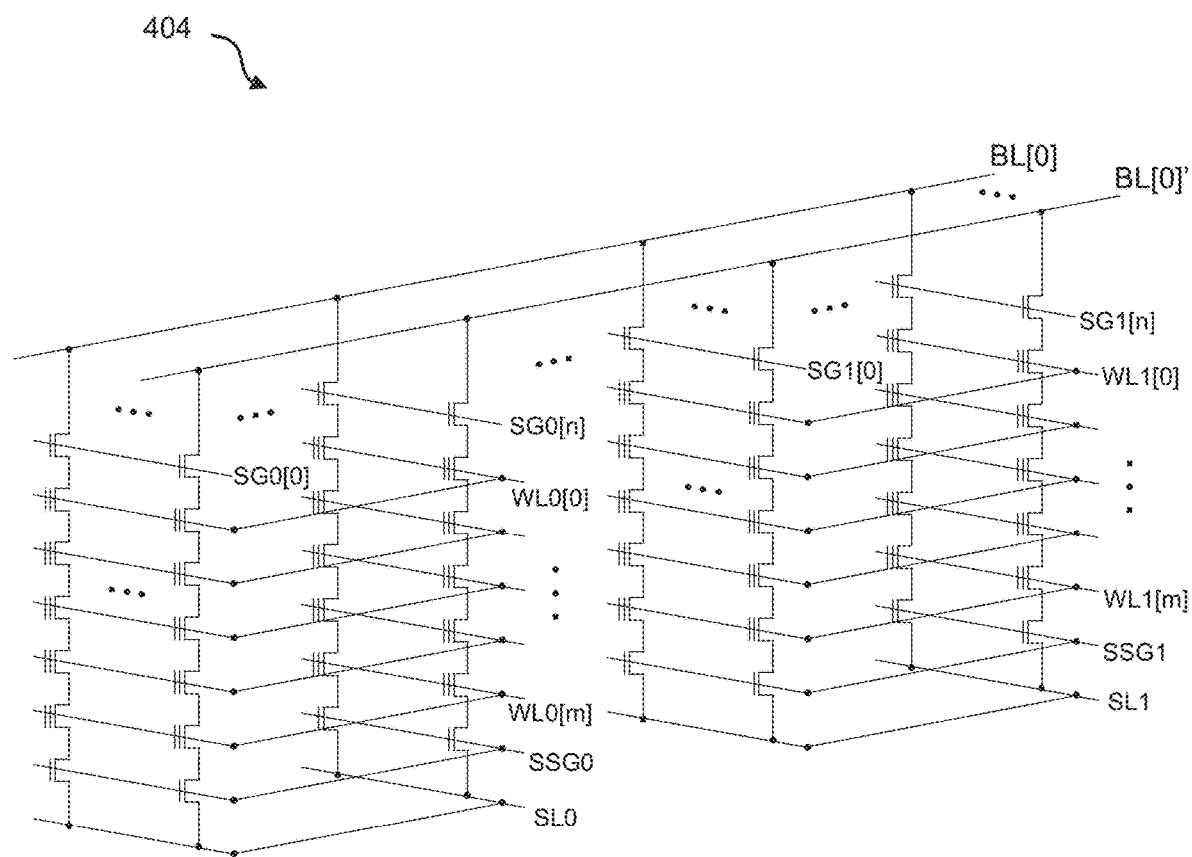

FIGS. 17B-C show embodiments of 2D and 3D versions of an array (or sub-array) 404 for use in the circuit of FIG. 17A.

Figure 18A:
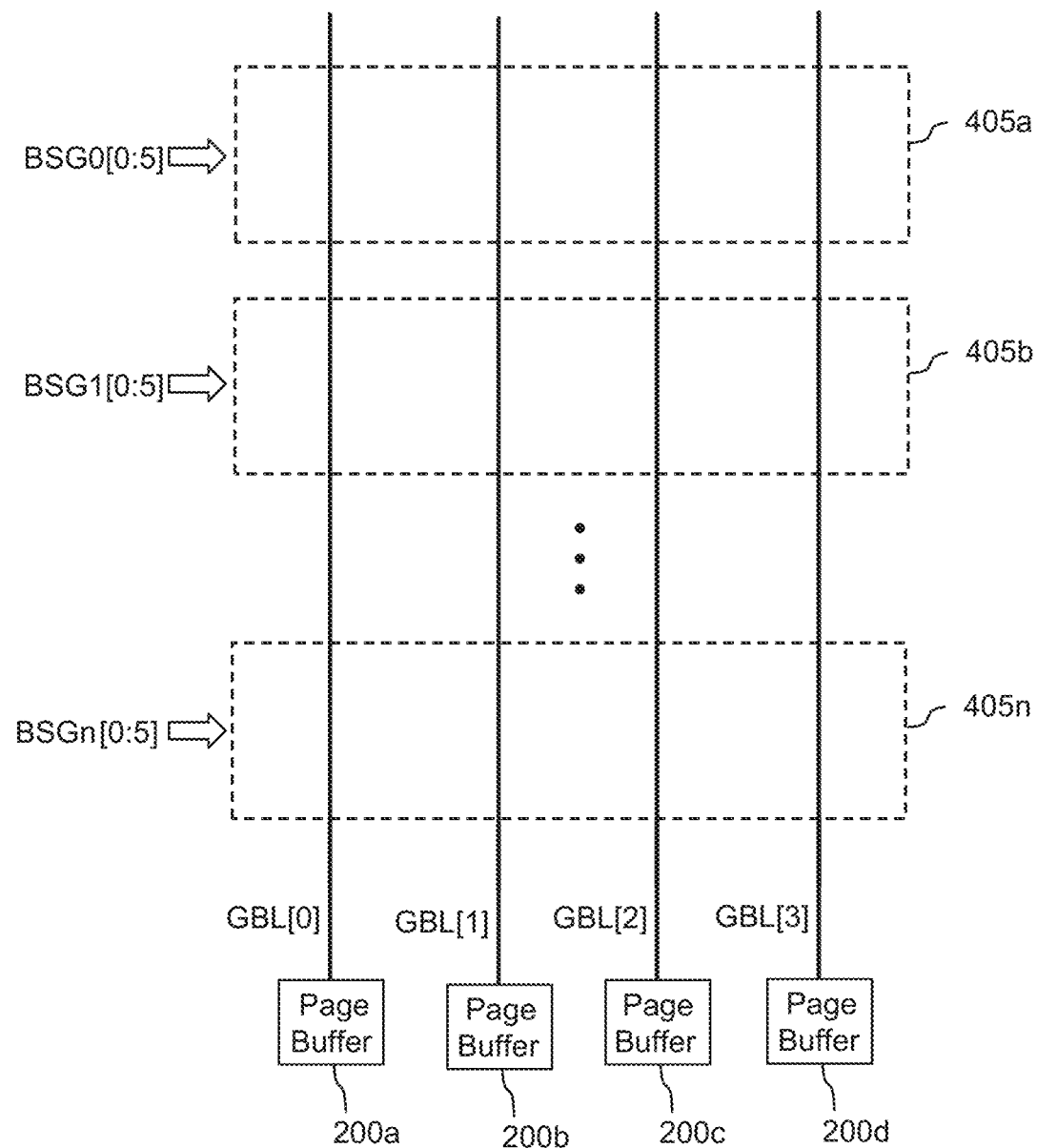
FIGS. 18A-B show circuits having a divided bit line structure.
Figure 18B:
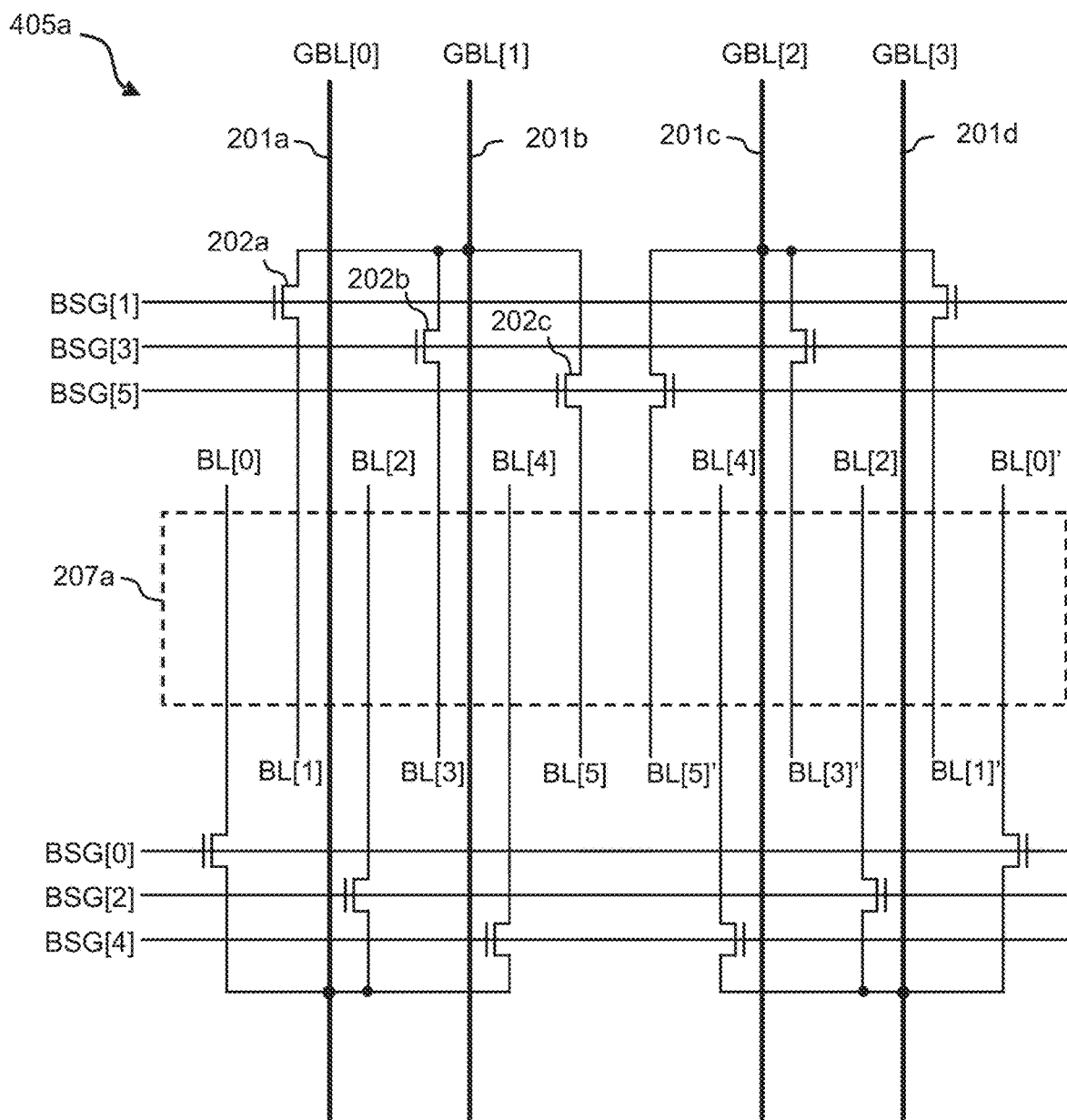

FIGS. 18A-B show circuits having a divided bit line structure.

FIG. 18A shows the circuit comprising multiple page buffers 200a to 200d that are connected to global bit lines, GBL[0] to GBL[3]. The global bit lines are connected to multiple blocks 405a to 405n. Each block receives bit line select gate signals, such as BSG0[0:5] to BSGn[0:5].

FIG. 18B shows an embodiment of a circuit of one block, such as block 405a, shown in FIG. 18A. As illustrated in FIG. 18A, the global bit line, such as GBL[1] for example, is connected to sub-bit lines, BL[1], BL[3], and BL[5] through the bit line decoders 202a to 202c. The bit line select gates' structure is similar to the one shown in FIG. 17A. Therefore, the data may be applied to the sub-bit lines, BL[0] to BL[5] and BL[0]' to BL[5]', using the waveform shown in FIG. 15B to solve the bit line coupling issue.

Figure 19A:
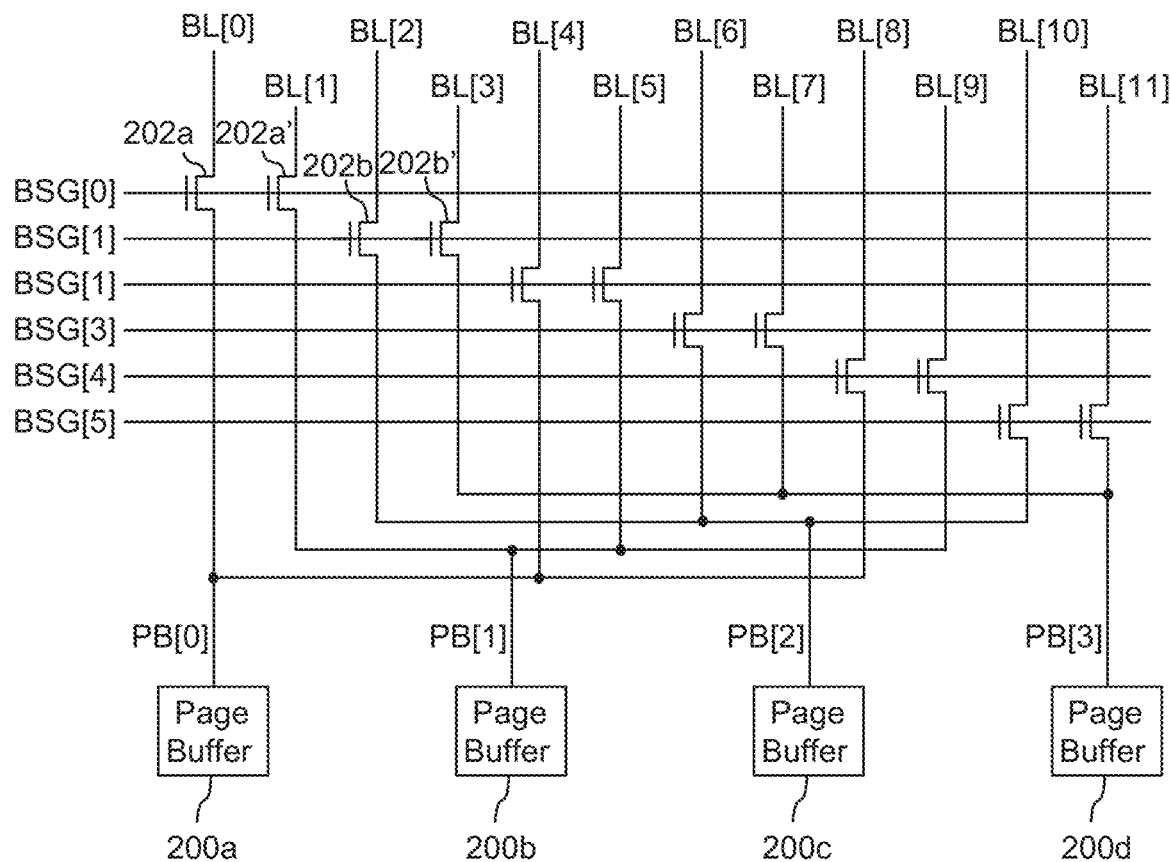
FIGS. 19A-B show another embodiment of a bit line select gate circuit and its corresponding operating waveforms in accordance with the invention.

FIG. 19A shows another embodiment of a bit line select gate circuit according to the invention. The circuit in this embodiment is similar to the one shown in FIG. 15A except that four page-buffers 200a to 200d are used, and data for two bit-lines may be loaded at one time.

Figure 19B:
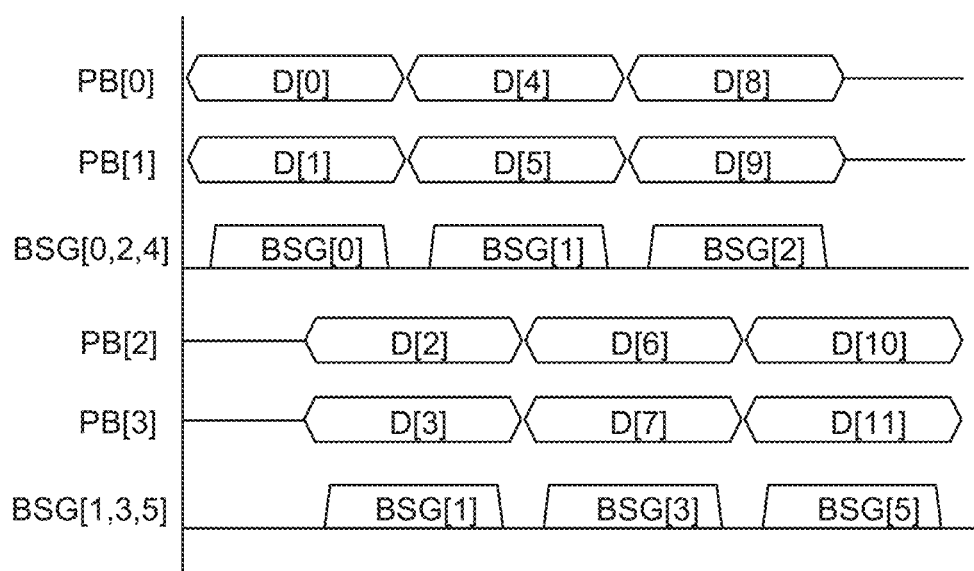

FIG. 19B shows waveforms illustrating the operation of the circuit of FIG. 19A. During operation, when BSG[0] goes high, it will turn on two bit line select gates 202a and 202a' to load data D[0] and D[1] from the page buffers 200a and 200b to BL[0] and BL[1], respectively. When BSG[1] goes high, it will turn on two bit line select gates 202b and 202b' to load data D[2] and D[3] from the page buffers 200c and 200d to BL[2] and BL[3], respectively. It should be noted that when BSG[1] is turned on, BSG[0] is still turned on. Therefore, the coupling between the BL[1] and BL[2] is eliminated. This same mechanism is applied to all the other select gates. As a result, the bit line coupling problem is resolved.

Please notice, the bit line coupling issue described in FIG. 13 may not only occur when loading data in a write operation, but also in a read operation. Referring to the read waveforms shown in FIG. 7A, during times T3 to T4, when multiple bit lines such as BL[0] to BL[2] are discharged together, the bit line with on-cell will be discharged by the on-cell. It may couple the adjacent bit line with off-cell through the bit line-to-bit line capacitance, as 401a to 401c shown in FIG. 13. Therefore, the adjacent bit line's voltage may be pulled low and cause the off-cell being mistakenly read as an on-cell. To solve this problem, the shielding device as shown in FIG. 14 may be implemented, where, the shielding voltage, VSHD, may be 0V for read operation. However, the shielding read operation may only read the even or odd bit lines, thus it reduces the read data throughput by half. To solve this problem, the solutions shown in FIG. 15A to FIG. 17C are provided.

Figure 20A:
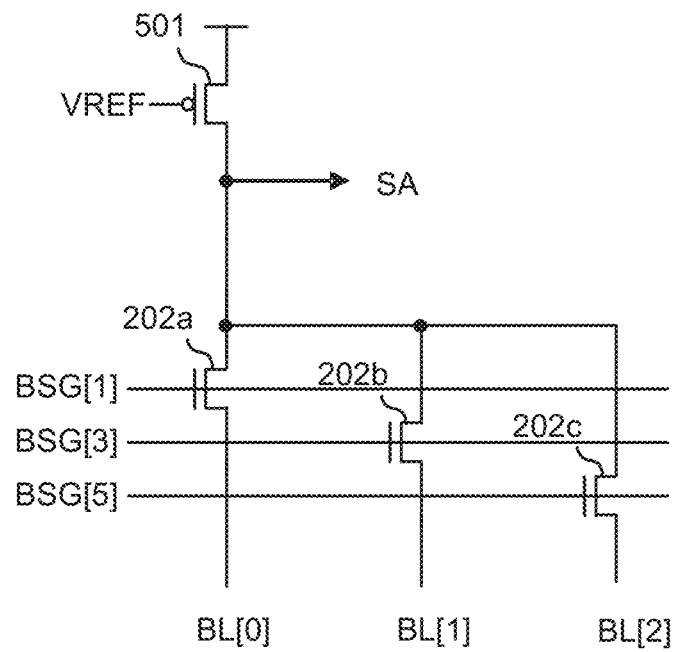
FIGS. 20A-B show an embodiment of a circuit and associated read waveforms that address bit line coupling without sacrificing read data throughput.

FIG. 20A shows an embodiment of a circuit that addresses bit line coupling without sacrificing the read data throughput. The circuit of FIG. 20A comprises bit line select gates 202a to 202c that are connected to bit lines, BL[0] to BL[2]. A pull-up device 501 is a PMOS pull-up device that is coupled to the bit line select gates 202a to 202c. In another embodiment, the pull-up device 501 may be a NMOS.

Figure 20B:
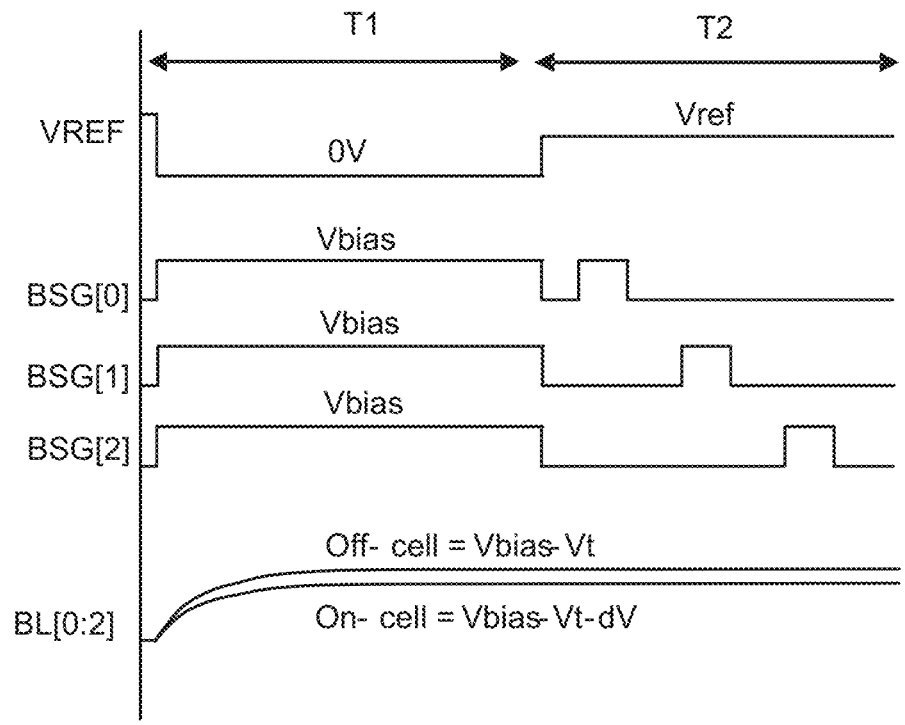

FIG. 20B shows waveforms to perform read operations by the circuit shown in FIG. 20A. The time interval T1 is a "developing phase" and the time interval T2 is an "evaluating phase." During the developing phase (T1), VREF is supplied with 0V and the bit line select gates, BSG[0] to BSG[2], are supplied with Vbias. This charges up the bit lines, BL[0] to BL[2], to a predetermined voltage, Vbias−Vt. where Vt is the threshold voltage is the select gates 202a to 202c.

During evaluating phase (T2), the signal VREF may be supplied with a voltage that limits the current of the pull-up device 501 to below the on-cell current, such as 10 nA to 100 nA. BSG[0] to BSG[2] are turned off and then sequentially turned on to connect the bit lines BL[0] to BL[2] to the sensing node SA, respectively. If the bit line has an on-cell, the bit line voltage may below Vbias−Vt, due to the on-cell current. Therefore, the sensing node SA may be pulled low to be the same as the bit line voltage. On the other hand, if the selected bit line has an off-cell, the bit line will be fully charged to Vbias−Vt, and the bit line select gate will be turned off. Therefore, the sensing node SA will go to VDD. The signal SA may be sent to the input of a comparator or the gate of a PMOS transistor to determine the data.

Figure 21A:
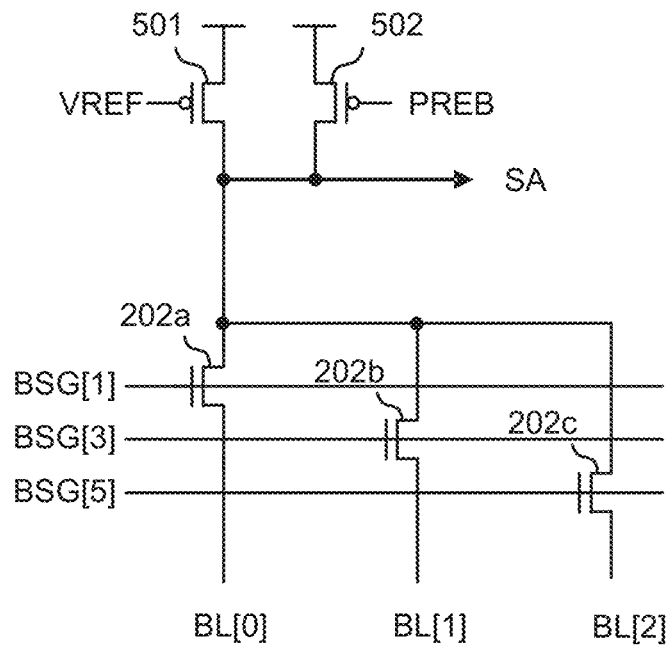
FIGS. 21A-B show embodiments of a sensing circuit and associated operating waveforms in accordance with the invention.

FIG. 21A shows another embodiment of the sensing circuit according to the invention. This embodiment is similar to FIGS. 20A-B except that a large pull-up device 502 may be used to pre-charge the bit lines.

Figure 21B:
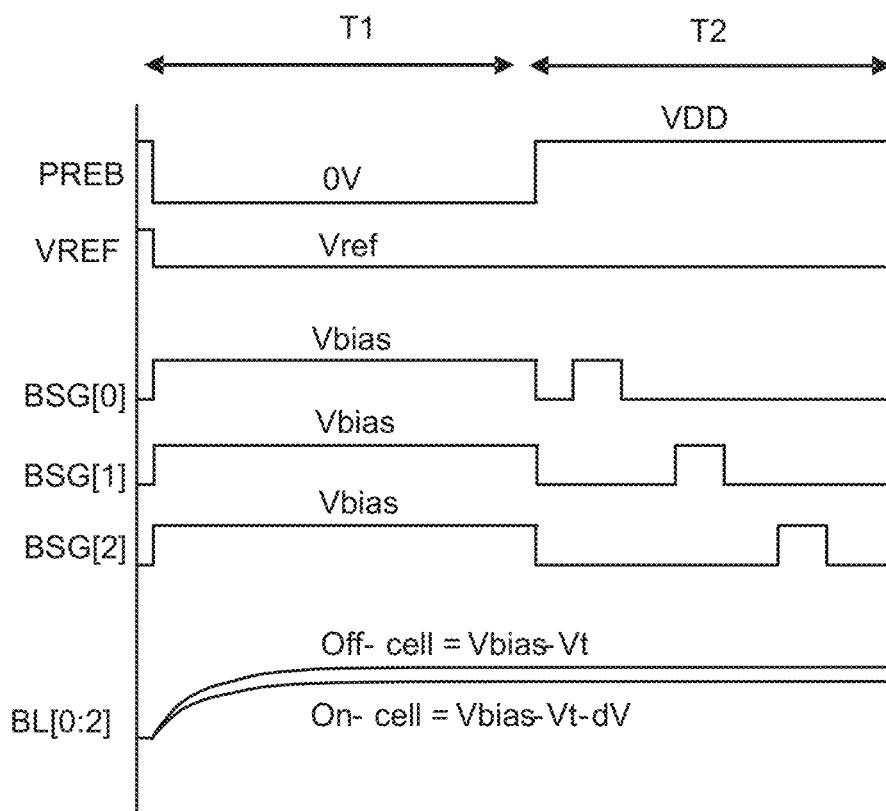

FIG. 21B shows waveforms that illustrate the operation of the circuit of FIG. 21A.

Figure 22A:
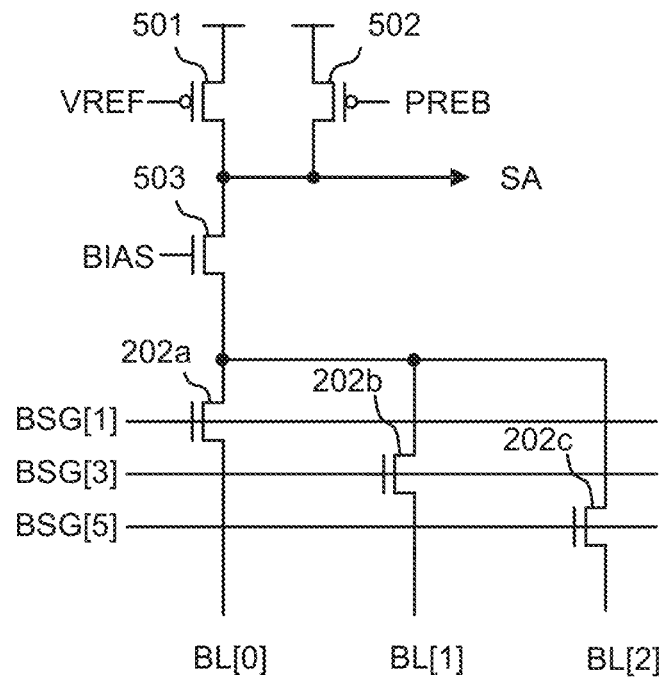
FIGS. 22A-B show exemplary embodiments of a sensing circuit and associated waveforms in accordance with the invention.

FIG. 22A shows another embodiment of the sensing circuit according to the invention. This embodiment is similar to FIGS. 21A-B except that a bias device 503 is used to limit the pre-charge voltage of the bit lines. Thus, the bit line select gate signals, BSG[0] to BSG[2], are supplied with digital signals VDD and 0V.

Figure 22B:
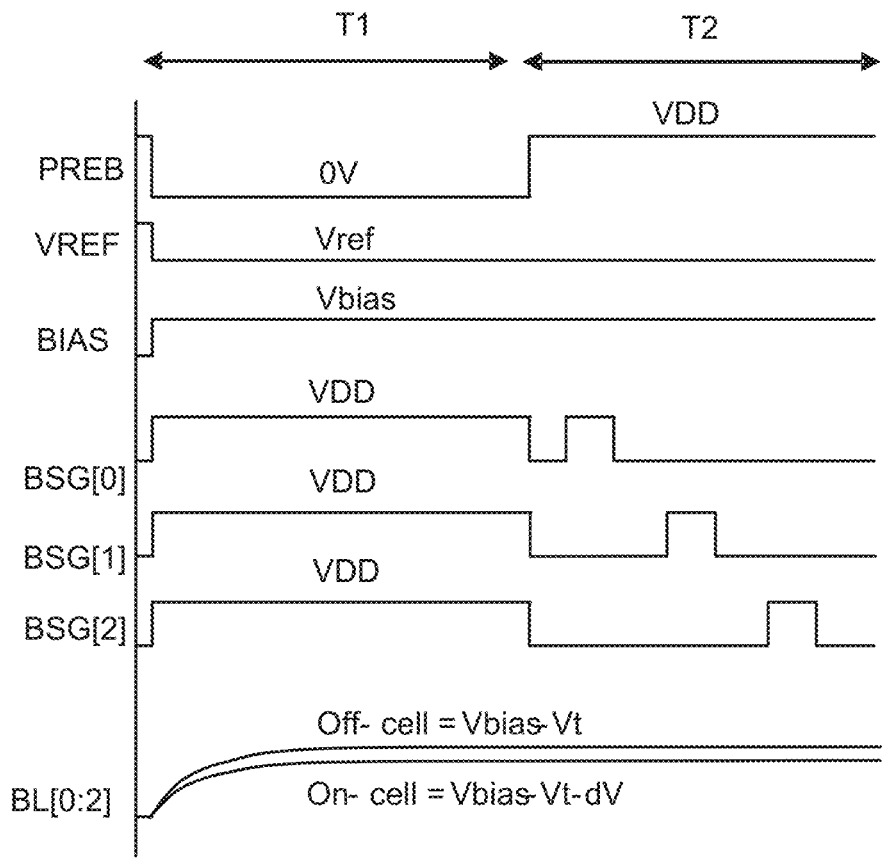

FIG. 22B shows waveforms that illustrate the operation of the circuit of FIG. 22A.

Figure 23A:
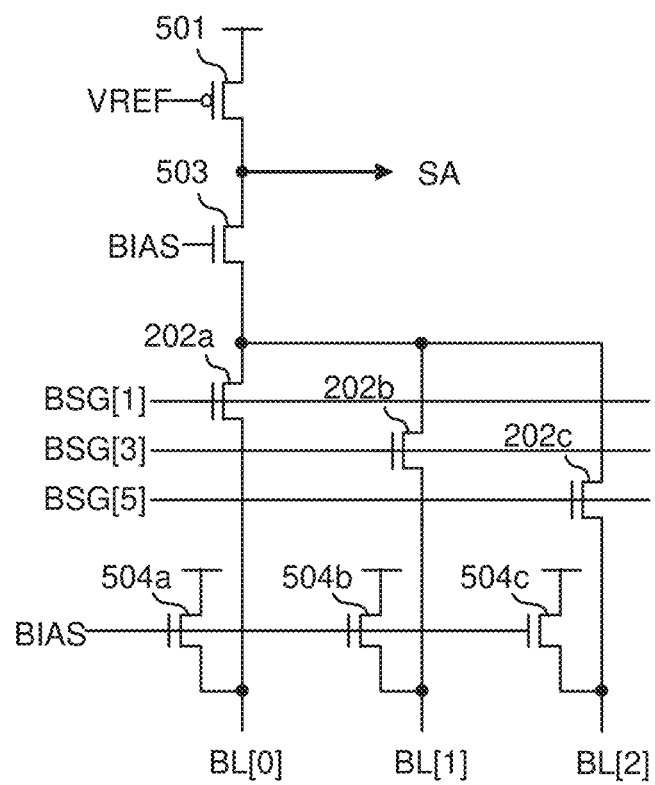
FIGS. 23A-B show exemplary embodiments of a sensing circuit and associated waveforms in accordance with the invention.

FIG. 23A shows another embodiment of the sensing circuit according to the invention. This embodiment is similar to FIGS. 22A-B except that the bit lines are pre-charged by using pull-up device 504a to 504c.

Figure 23B:
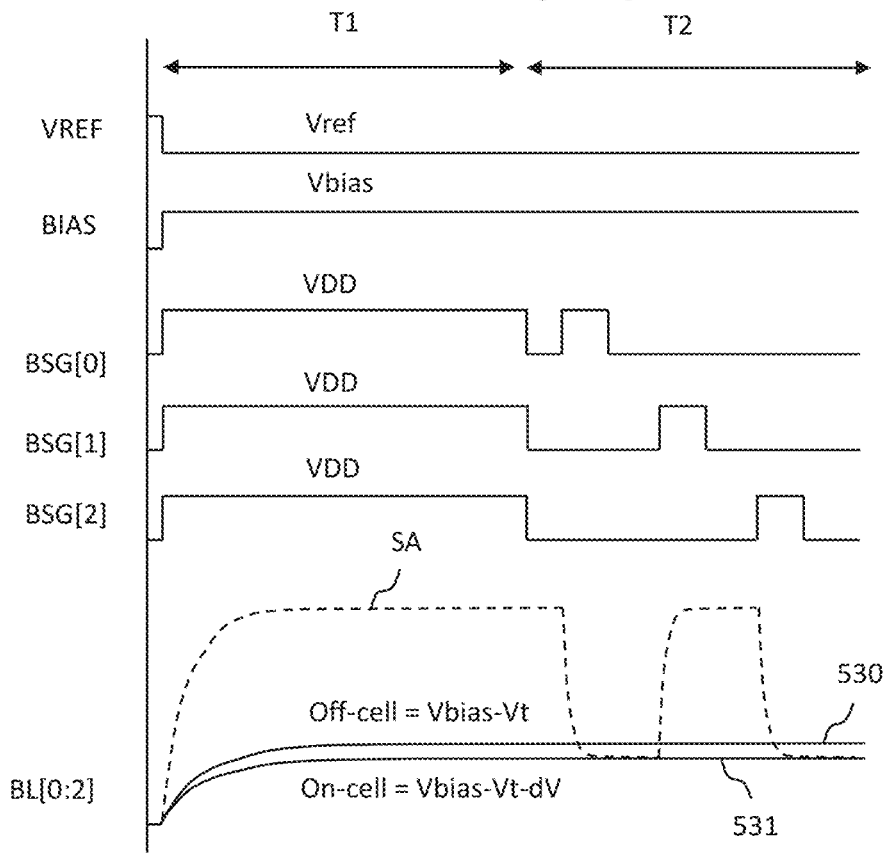

FIG. 23B shows waveforms that illustrate the operation of the circuit of FIG. 23A.

Figure 24A:
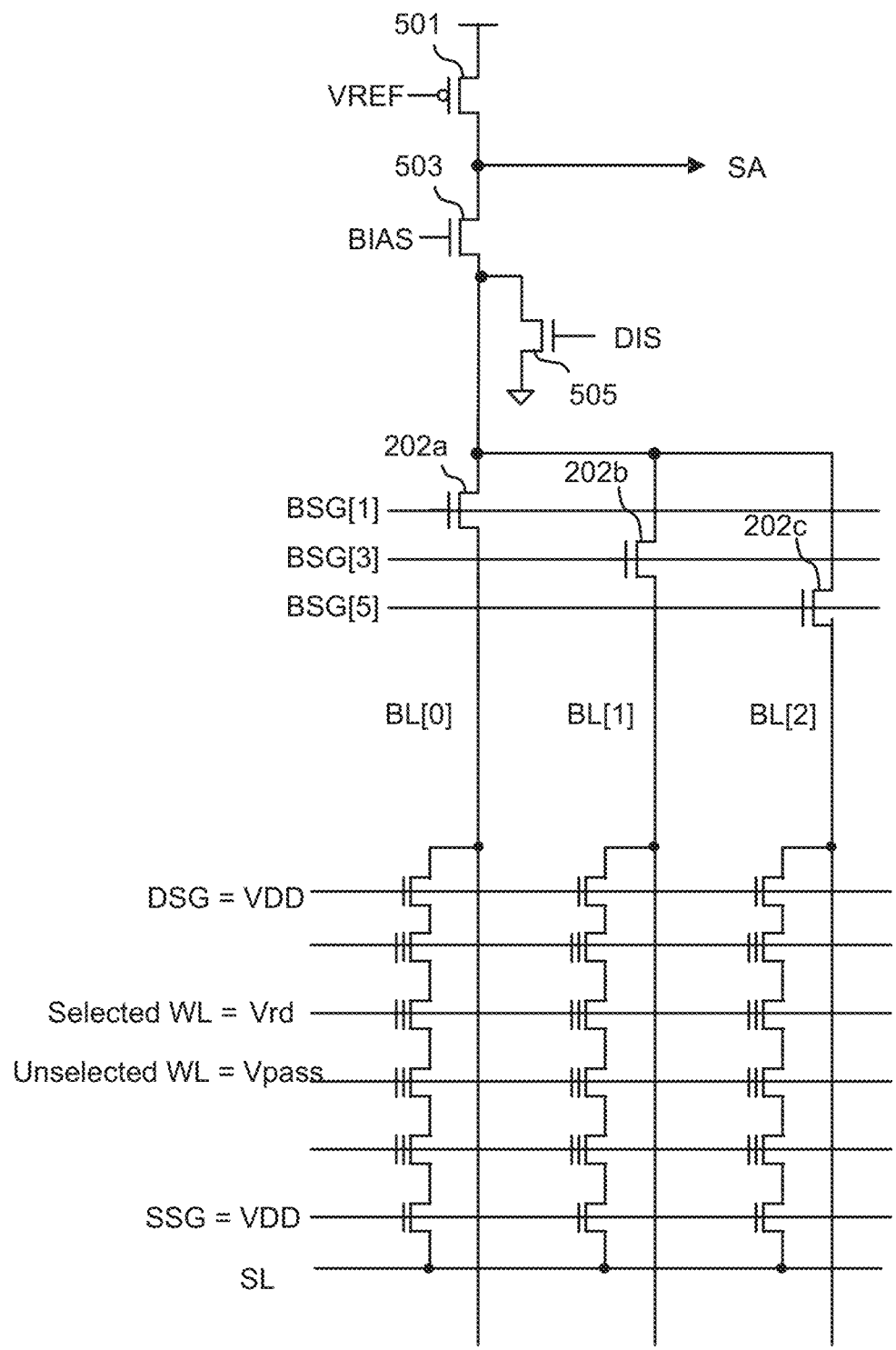
FIGS. 24A-B show exemplary embodiments of a sensing circuit and associated waveforms in accordance with the invention.

FIG. 24A shows another embodiment of the sensing circuit according to the invention. This embodiment uses 'source sensing'.

Figure 24B:
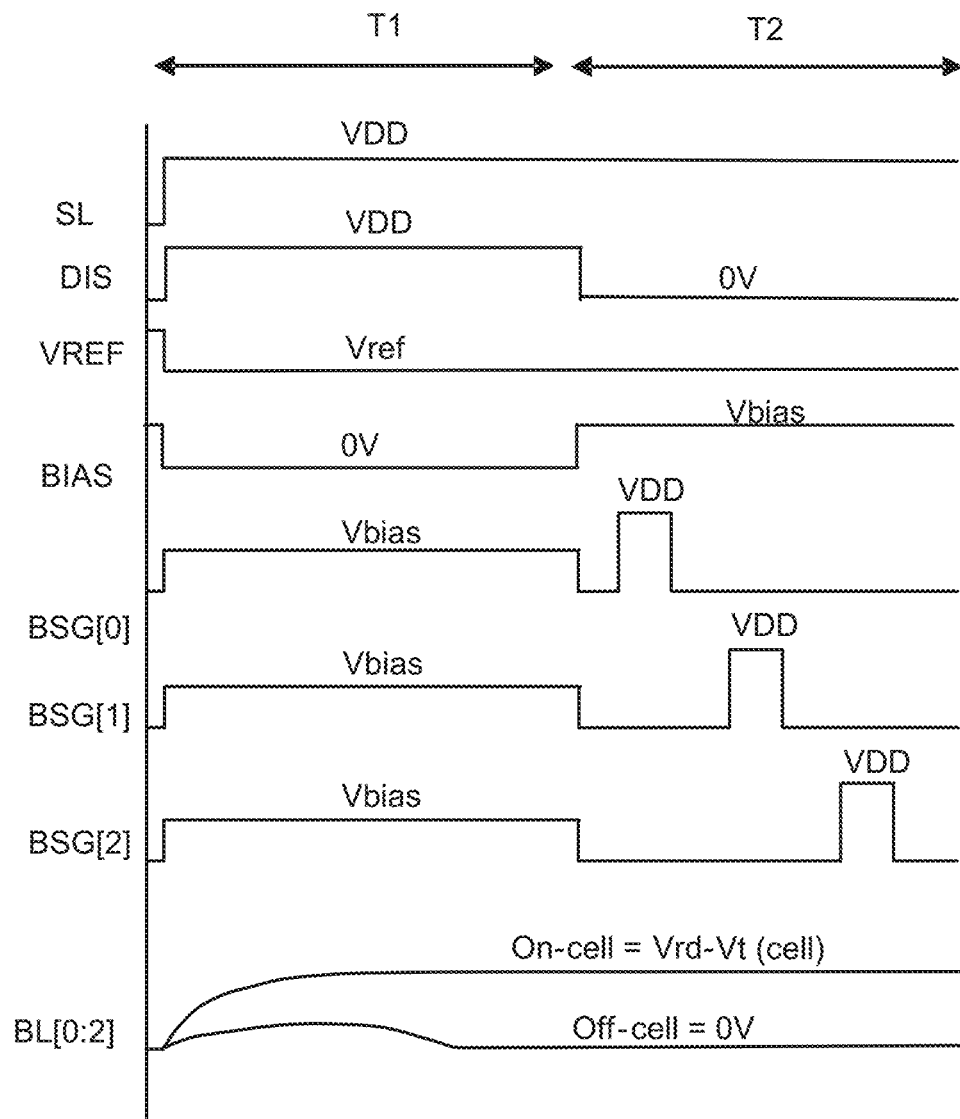

FIG. 24B shows waveforms illustrating the operation of the sensing circuit shown in FIG. 24A, where T1 is the "developing" phase and T2 is the "evaluating" phase. During operation the selected word line is supplied with a read voltage (Vrd) and the unselected word line is supplied with a pass voltage (Vpass). The selected cell string's source line (SL) is supplied with VDD. A discharge device 505 is added to discharge the bit lines. The bit line select gates, BSG[0] to BSG[2], are supplied with a bias voltage (Vbias) to limit the discharge current to below the on-cell's current, such as 10 nA to 100 nA. The on-cell conducts current from the source line SL to the bit line and charges the bit line up to about Vrd−Vt (cell), where Vt (cell) is the on-cell's threshold voltage. For the off-cell, the bit line will be discharged to 0V. As shown in FIG. 24B, when on-cell's bit line is charged up, it may couple to the off-cell's bit line. However, after the coupling stops, the off-cell's bit line will be discharged to 0V by the discharge device 505. In an evaluating phase (T2), the discharge device 505 is turned off. The bias device 503 is turned on. The bit line select gates, BSG[0] to BSG[2] are sequentially tuned on to connect bit lines to the sensing node SA to determine the data according to the bit line voltage.

Figure 25A:
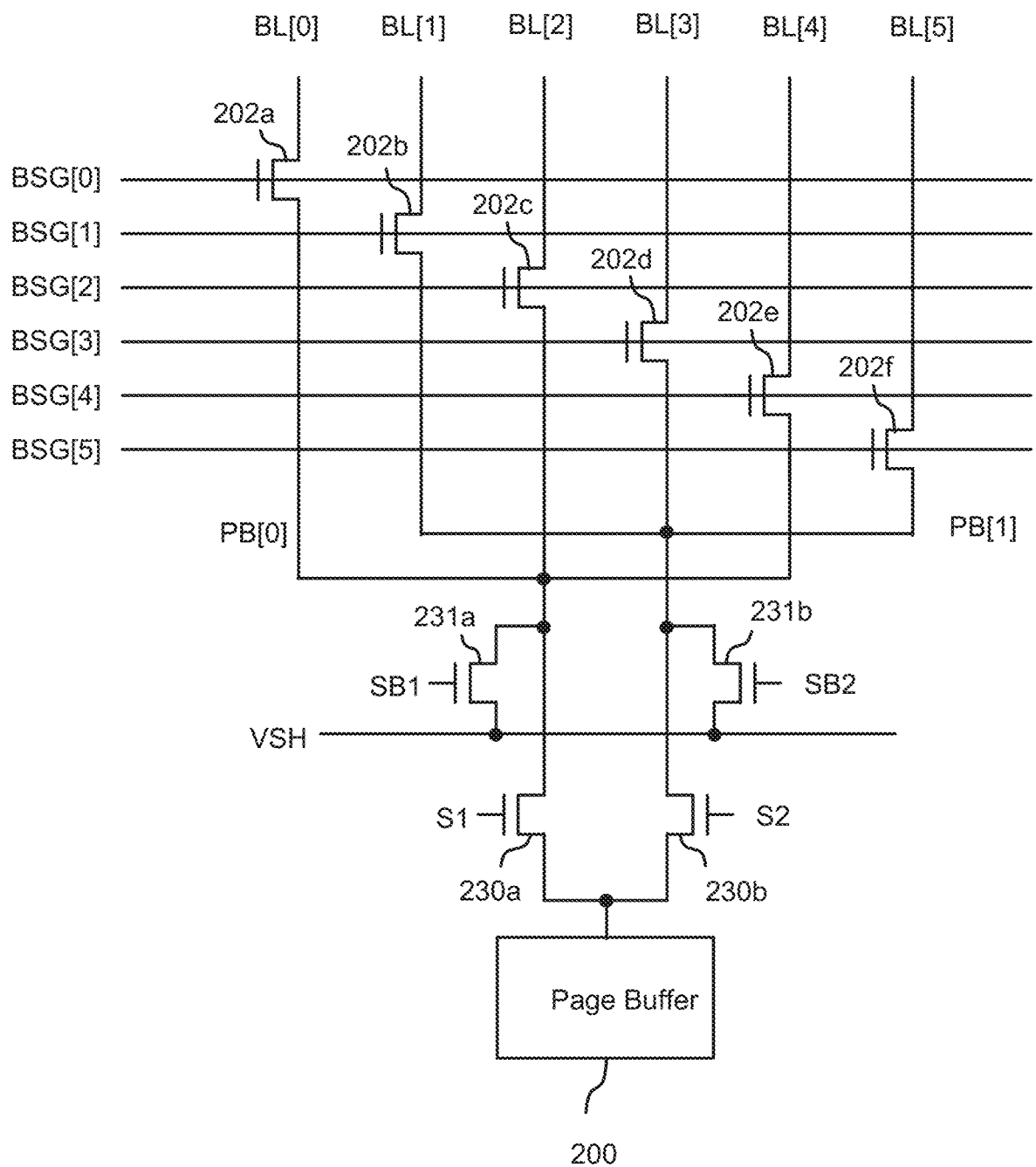
FIGS. 25A-C show exemplary embodiments of a page buffer and bit line decoder circuit in accordance with the invention.

FIG. 25A shows another embodiment of the page buffer and bit line decoder circuit according to the invention. FIG. 25A shows the page buffer circuit 200 and bit line select gates 202a to 202f. The even bit line select gates 202a, 202c, and 202e are connected to PB[0], and the odd bit line select gates 202b, 202d, and 202f are connected to PB[1]. The page buffer 200 is coupled to PB[0] and PB[1] through the shielding voltage select gates 230a and 203b, respectively. The shielding voltage select gates 230a and 230b control the page buffer 200 to load data to or read data from PB[0] or PB[1], respectively. PB[0] and PB[1] are coupled to a 'shielding' voltage source (VSH) through the select gates 231a and 231b, respectively. The shielding voltage may be 0V, VDD, or any other suitable voltage. When the page buffer 200 read data from or load data to even (or odd) bit lines, the shielding voltage is applied to the odd (or even) bit lines. This eliminates the bit line capacitance coupling problem as described with reference to FIG. 13.

As an example, to perform multiple-page read or write operation to the even bit lines, the shielding voltage select gate 230a is turned on and 230b is turned off. The even bit line select gates, BSG[0], BSG[2], and BSG[4] are sequentially turned on to read data from the even bit lines, BL[0], BL[2], and BL[4] to the page buffer 200, or to load data from the page buffer 200 to the even bit lines. Meanwhile, the select gate 231a is turned off and 231b is turned on. This applies the shielding voltage, VSH, to PB[1]. The odd bit line select gates, BSG[1], BSG[3], and BSG[5] are all turned on to pass the shielding voltage, VSH, to the odd bit lines, BL[1], BL[3], and BL[5]. Using these operations, the even bit lines are shielded from each other by the odd bit lines, thus bit line capacitance coupling is eliminated.

Figure 25B:
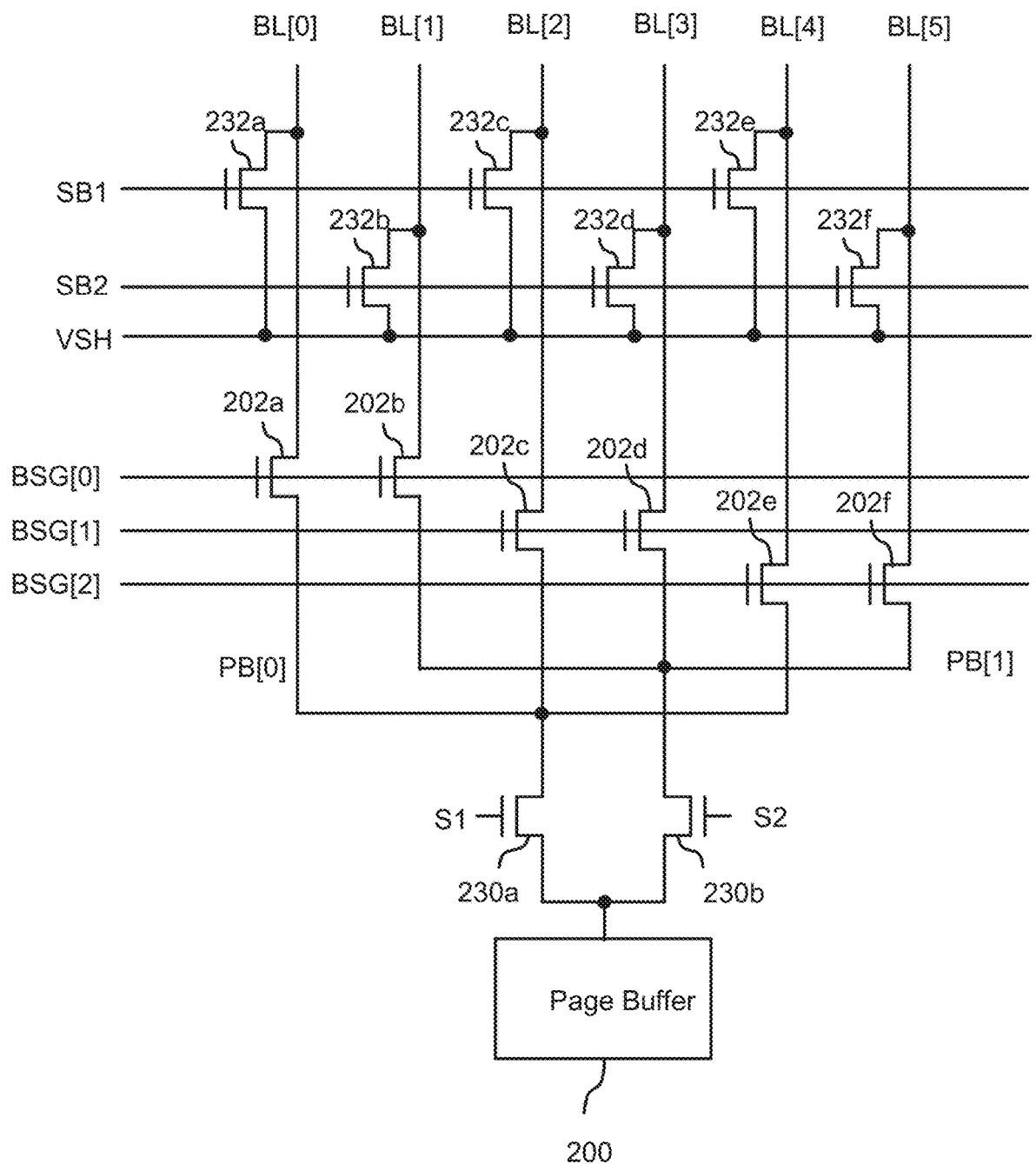

FIG. 25B shows another embodiment of the page buffer and bit line decoder circuit according to the invention. This embodiment is similar to the embodiment shown in FIG. 25A except that the bit line shielding voltage, VSH, is applied by the select gates 232a to 232f. The even select gates 232a, 232c, and 232e are connected to a control signal SB1, and the odd select gates 232b, 232d, and 232f are connected to a control signal SB2. When the page buffer 200 reads data from or loads data to the even bit lines, BL[0], BL[2], and BL[4], the shielding voltage select gate 230a is turned on and the gate 230b is turned off. The control signal SB1 will turn off the even select gates 232a, 232c, and 232e. The control signal SB2 will turn on the odd select gates 232b, 232d, and 232f to pass the shielding voltage, VSH, to the odd bit lines, BL[1], BL[3], and BL[5]. Similarly, when the odd bit lines are read or loaded with data, the even bit lines can be supplied with a shielding voltage.

Figure 25C:
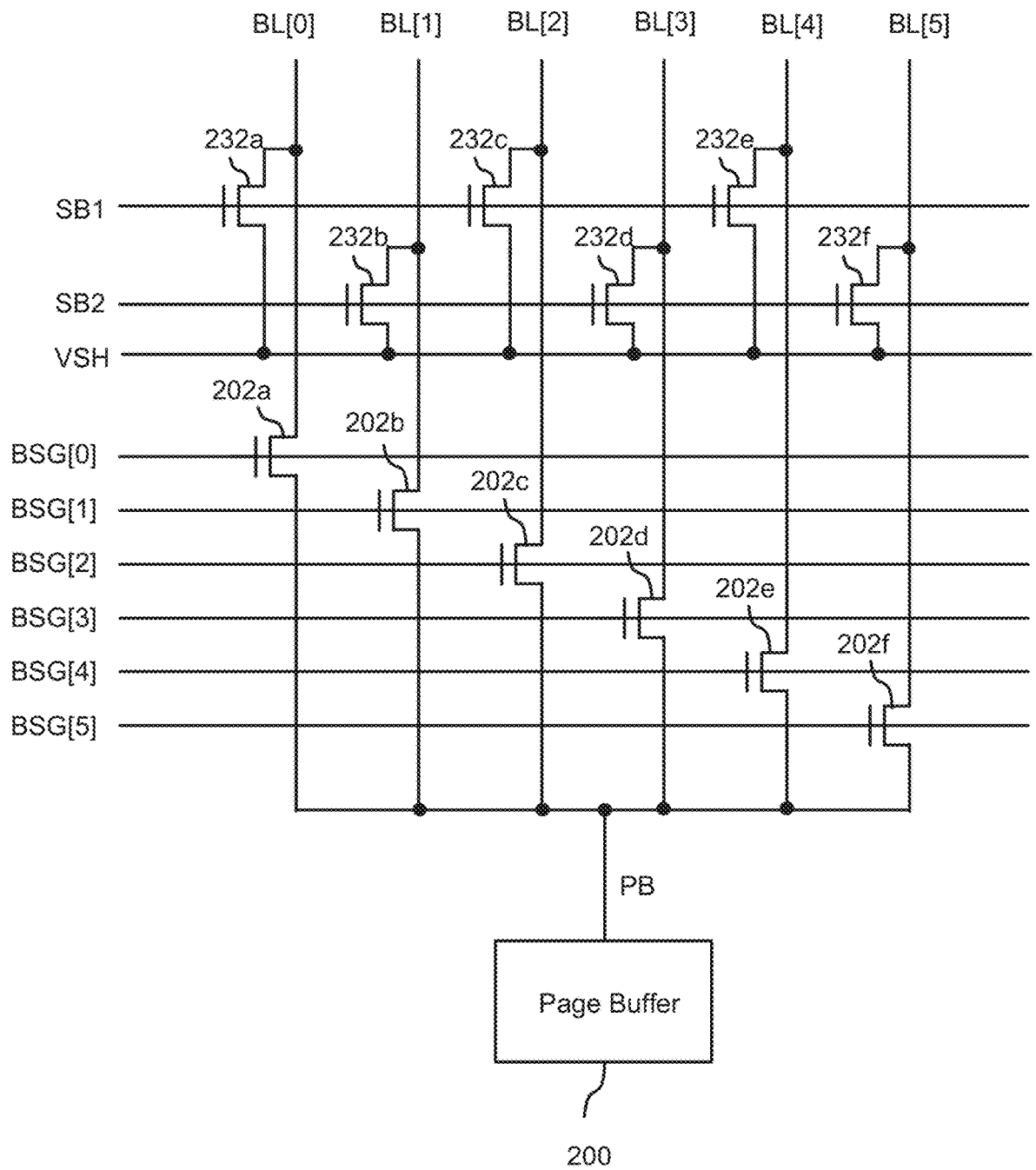

FIG. 25C shows another embodiment of the page buffer and bit line decoder circuit according to the invention. In this embodiment, the bit line select gates 202a to 202f are all connected to the page buffer 200. The even and odd bit lines are coupled to the shielding voltage, VSH, through the select gates 232a to 232f. When the page buffer 200 reads or loads data to the even bit lines, BL[0], BL[2], and BL[4], the even select gates 232a, 232c, and 232e are turned off. The even bit line select gates 202a, 202c, and 202e may be sequentially turned on to read data from the even bit lines to the page buffer 200 or to load data from the page buffer 200 to the even bit lines. Meanwhile, the odd bit line select gates 202b, 202d, and 202f are turned off. The odd select gates 232b, 232d, and 232f are turned on to pass the shielding voltage, VSH, to the odd bit lines, BL[1], BL[3], and BL[5]. Similarly, when the odd bit lines are read or loaded with data, the even bit lines can be supplied with a shielding voltage.

In previous embodiments, for example, as shown in FIG. 4A, the chip may contain multiple data latches to store multiple pages of data during program and read. However, embodiments with fewer data latches are possible.

Figure 26A:
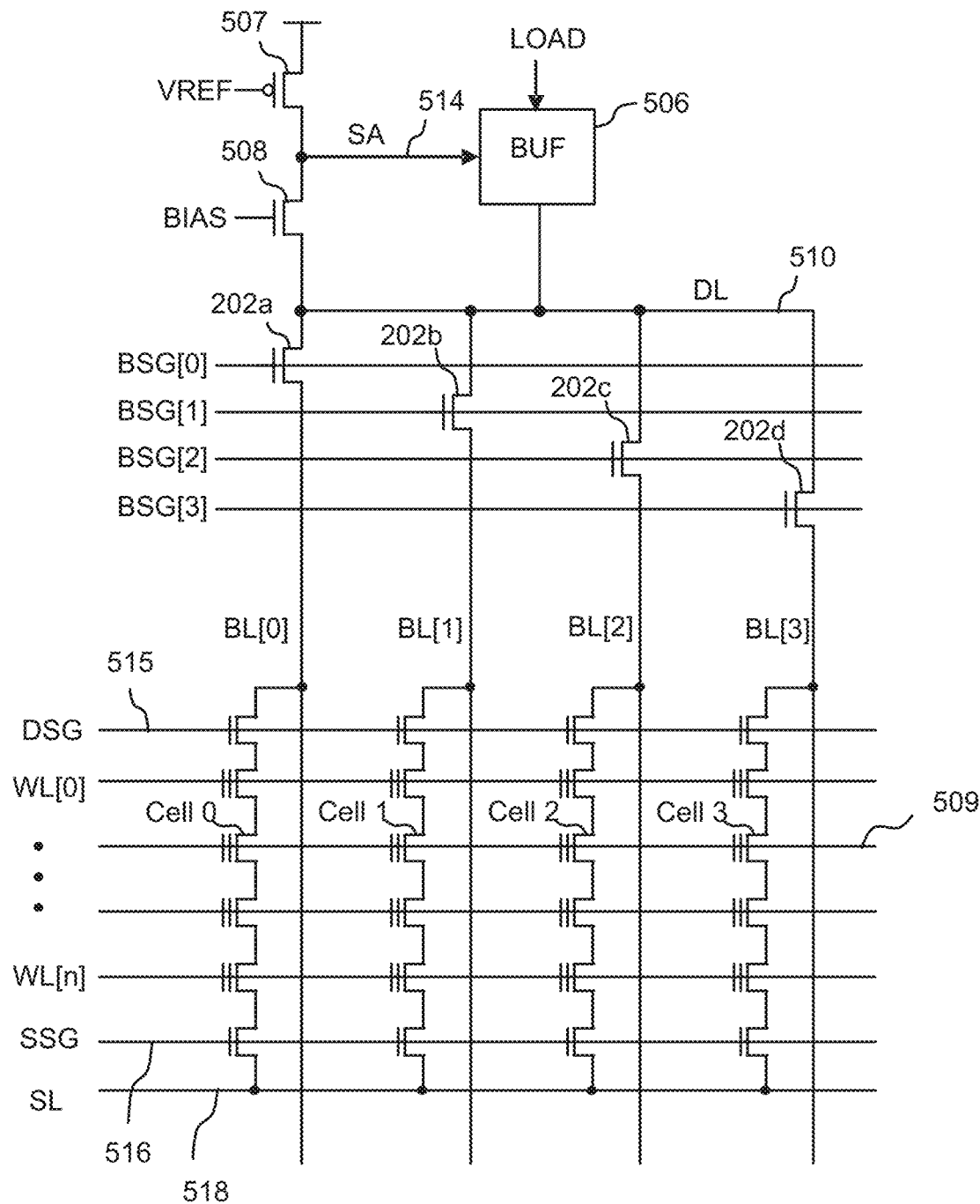
FIG. 26A shows an exemplary embodiment of a circuit according to the invention that utilizes only one data latch to perform

FIG. 26A shows an exemplary embodiment of a circuit according to the invention that only requires one data latch to perform the same operations as described above that use multiple data latches. In another embodiment, the circuit of FIG. 26A can be configured to utilize no data latch. In the circuit of FIG. 26A, four bit lines BL[0] to BL[3] are connected to page buffer 506 through four bit line select gates 202a to 202d. The bit line select gates are connected to signals BSG[0] to BSG[3]. It should also be noted that the array may use the even/odd bit line architecture shown in FIGS. 25A-C. The unselected even or odd bit lines are supplied with a DC voltage to shield those bit lines from bit line coupling. For simplicity, the circuit shown in FIG. 26A only shows the selected bit lines.

The data line 510 is connected to a bias device 508. The bias device 508 is used to pre-charge the data line 510 and the selected bit line to a bias voltage. The gate of the bias device 508 is connected to a bias voltage, BIAS, or a feedback circuit, or a comparator to increase pre-charging speed.

The device 507 is a loading device. The gate of the loading device 507 is connected to a reference voltage, VREF, to generate the desired load current for the sensing operation. In another embodiment, the loading device 507 may be implemented by an NMOS device. Moreover, the loading device may comprise multiple devices with different sizes, such as a larger device for fast pre-charging, and a smaller device for data sensing.

Assuming the word line 509 is selected for programming, the bit lines BL[0] and BL[1] are loaded with 0V to program Cell 0 and Cell 1. The bit lines BL[2] and BL[3] are loaded with VDD to inhibit Cell 2 and Cell 3. In accordance with novel programming operations provided by embodiments of the invention, the bit line data is loaded sequentially by sequentially turning on the bit line select gates 202a to 202d to store the bit line data using the bit line capacitance.

After one program pulse, a program-verification is performed to check the programmed cells' Vt and determine the next program data. As an example, Cell 0 to Cell 3 are assumed to have four different conditions. Assume Cell 0 is still an on-cell. That means that Cell 0 is not successfully programmed yet. The next data for BL[0] shall be 0V to keep on programming Cell 0. Assume Cell 1 has been successfully programmed to a desired Vt, thus it will become an off-cell during verification. That means that the next data for BL[1] shall be changed to VDD in order to inhibit Cell 1. Assuming Cell 2 and Cell 3 are an on-cell and an off-cell, respectively, because their current program data is VDD, which means they don't need to be programmed. The next data for BL[2] and BL[3] shall be kept at VDD to inhibit Cell 2 and Cell 3.

Figure 26B:
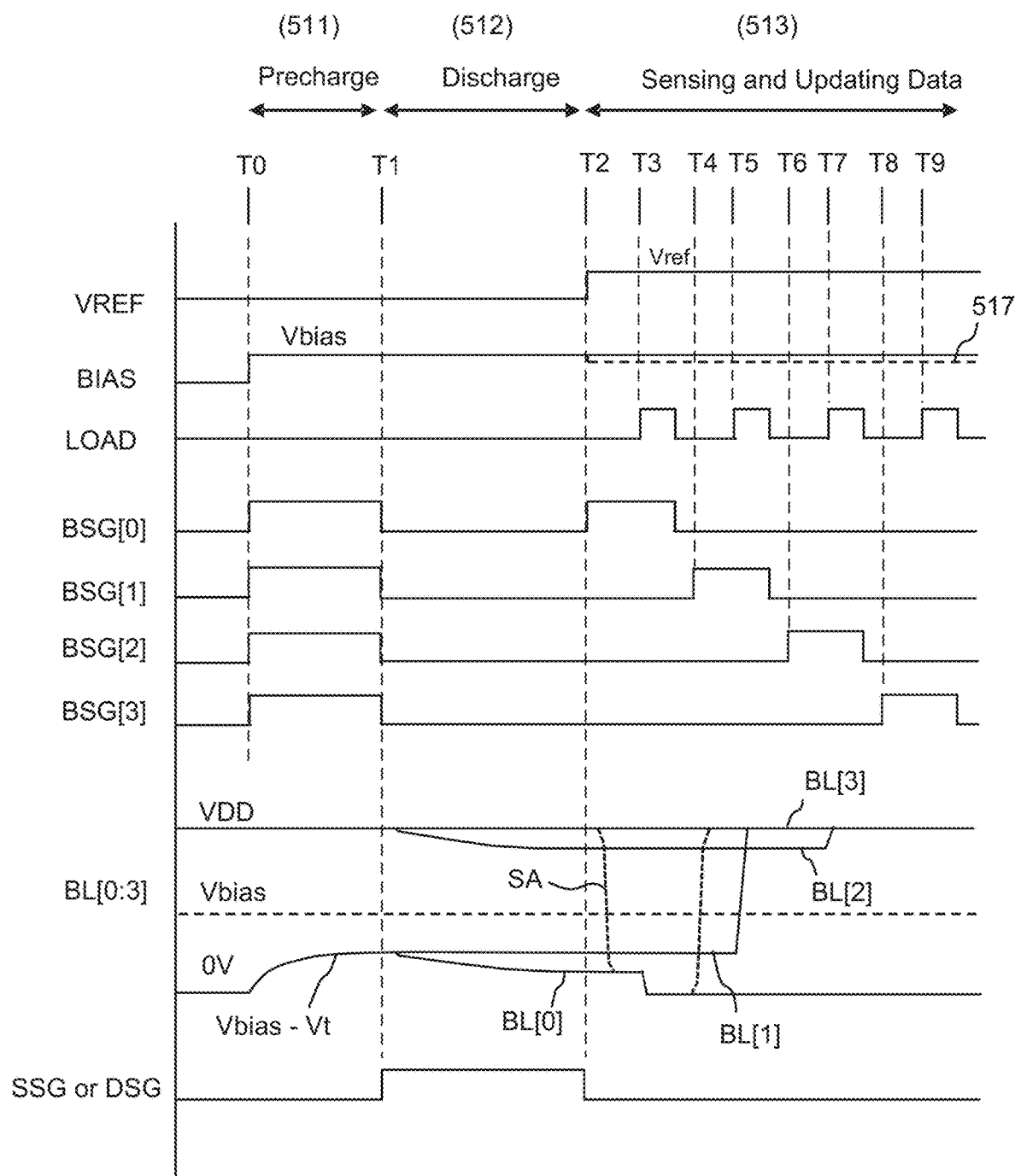
FIG. 26B shows a program-verify operation for use with the circuit shown in FIG. 26A.

FIG. 26B shows a program-verify operation for use with the circuit shown in FIG. 26A. The operation basically contains three steps, namely: pre-changing bit line step 511, discharging bit line step 512, and sensing and updating bit line data step 513. For step 511, pre-charging bit line, at time T0, BSG[0] to BSG[3] are supplied with VDD to turn on all the bit line select gates 202a to 202d. VREF is supplied with 0V to fully turn on the loading device 507 for fast precharging. BIAS is supplied with a bias voltage, Vbias. This condition will pre-charge BL[0] to BL[1] from 0V to Vbias−Vt. Vt is the threshold voltage of the bias device 508. Meanwhile, BL[2] and BL[3] are remained at VDD. Generally, the BIAS signal has a range of approximately Vt to VDD and should be greater than Vt to turn on the bias device (e.g., device 508 shown in FIG. 26A). The BL voltage is precharged to BIAS voltage minus Vt of the device 508 shown in FIG. 26A.

For step 512, discharging bit line, at time T1, all the bit line select gates BSG[0] to BSG[3] are turned off. The source select gate, SSG 516, and the drain select gate, DSG 515, of the selected strings are turned on. The selected word line 509 and the other unselected word lines are supplied with a verify voltage and a pass voltage, respectively. The source line 518 is supplied with 0V. This will turn on the on-cells, Cell 0 and Cell 2, to discharge BL[0] and BL[2], respectively. The BL[0] will be discharged from Vbias−Vt to a voltage lower than Vbias−Vt. In contrast, BL[2] may be still higher than Vbias-Vt, because BL[2]'s initial voltage is VDD. Due to large bit line capacitance, it will take very long time to discharge BL[2] to below Vbias-Vt using the on-cell current. BL[1] and BL[3] will remain at the pre-charged voltage Vbias-Vt and VDD, respectively. Because Cell 1 and Cell 3 are off-cells, they will not discharge BL[1] and BL[3].

At time T2, the source select gate 516 or the drain select gate 515 is turned off to stop Cell 0 and Cell 2 from discharging BL[0] and BL[2]. After that, the bit line voltage will be maintained by the large bit line capacitance. In another embodiment, the source select gate, SSG 516, and drain select gate, DSG 515, remain at a high level from T2 to T9. This will cause the on-cells, Cell 0 and Cell 2, to keep on discharging BL[0] and BL[2]. However, because the sensing time (T2 to T9) is very short, the current of Cell 2 will not discharge BL[2] to below Vbias-Vt before the end of the verification.

At step 513, sensing and updating bit line data, at time T2, VREF is supplied with a reference voltage, Vref, to control the load current of the loading device 507. The load current is preferred to be lower than the on-cell current. Then, in the interval between time T2 to T9, the bit line select gates BSG[0] to BSG[3] are sequentially turned on to connect the sensing circuit to BL[0] to BL[3], respectively. The sensing circuit will verify the bit line voltages and, according to the result, load the next data to the bit lines.

At time T2, the select gate signal BSG[0] will turn on the bit line select gate 202a shown in FIG. 26A. This causes charge sharing to occur between BL[0] and the data line, DL 510, and the signal node, SA 514. Because the capacitance of BL[0] is much larger than the capacitances of the data line 510 and SA 514, both data line 510 and SA 514 will be pulled low to near BL[0]'s voltage, which is below Vbias-Vt, in a very short time. The SA 514 node is connected to a data buffer 506. The data buffer 506 will determine the verify data is 1 based on SA's level.

At time T3, based on the verification result, the LOAD signal will go high to load 0V back to BL[0]. Then, BSG[0] will go low to isolate BL[0] from the data line 510 and sensing circuit. As a result, because BL[0] is loaded with 0V, the Cell 0 will be programmed again by the next programming pulse.

In one embodiment, from time T2 to T4, BSG[0] is supplied with VDD+Vt. This allows the page buffer to load full VDD to the bit line if the next data is VDD. Obviously, BSG[0] may be supplied with VDD, that will only load the bit line to VDD-Vt. In another embodiment, BSG[0] may use a two-step pulse with VDD for verification and VDD+Vt for loading the next data.

At time T4, BSG[1] will turn on the next bit line select gate 202b to connect the sensing circuit to BL[1] to verify the voltage of BL[1]. BL[1] is previously pre-charged to Vbias-Vt. Because the capacitance of data line 510 is much smaller than the capacitance of BL[1], the charge-sharing result will cause the data line 510 voltage to become very close to BL[1]'s voltage (e.g., Vbias-Vt). This will make the bias device 508 to turn off. Therefore, SA node 514 will be charged up by the load current of the loading device 507 to full VDD. This indicates that the next data will be 1.

At time T5, the LOAD signal will go high to load VDD to BL[1]. Then, BSG[1] will go low to isolate BL[1] from the page buffer circuit. As a result, Cell 1 will be inhibited from the next programming since it already passes the program-verification.

At time T6, BSG[2] will turn on the next bit line select gate 202c to verify the voltage of BL[2]. Because BL[2] remains at a voltage higher than Vbias-Vt, the bias device 508 will be turn off. The SA node will be charged up by the loading current of the device 507 to full VDD, if the previous bit line pulls SA low. This indicates that the next data will be 1.

At time T7, the LOAD signal will go high to load VDD to BL[2]. Then, BSG[2] will go low to isolate BL[2] from the page buffer circuit. The Cell 2 will be inhibited again for the next program pulse.

At time T8, BSG[3] will turn on the next bit line select gate 202d to verify the voltage of BL[3]. Because BL[3] remains at VDD, the bias device 508 will be turn off. The SA node will be charged up by the loading current of the device 507 to full VDD, if the previous bit line pulls SA low. This indicates that the next data will be 1.

At T9 time, the LOAD signal will go high to load VDD to BL[3]. Then, BSG[3] will go low to isolate BL[3] from the page buffer circuit. The Cell 3 will be inhibited again for the next program pulse.

After the bit lines are verified and loaded with the next data, the selected word line may be raised to the program voltage, such as 20V, to perform the next program pulse, as shown at time T3 in FIG. 5E.

It should be noted that during the sensing step 513, if the previously selected bit line has an on-cell, the data line 510 voltage after charge-sharing may be slightly lower than Vbias−Vt. This may cause the bias device 508 to turn on. If the selected bit line has an off-cell, the loading current of the loading device 507 will charge up the bit line and data line to Vbias−Vt, and pull the SA node 514 to VDD. However, this may cause a delay. To resolve this issue, in another embodiment, the VBIAS voltage may be slightly lowered during the sensing step 513, as shown by the dashed line 517 in FIG. 26B. This will prevent the loading device 507 from turning on by the slightly lower data line 510.

In another embodiment, the bias device 508 may contain two devices, one for pre-charging, and the other one for sensing. The device for sensing may have a longer channel length or a different Vt adjust implantation to make its Vt slightly higher. In another embodiment, the gates of the two bias devices may be connected to different bias voltages. The bias voltage for sensing may be slightly lower than the bias voltage for pre-charging.

Moreover, during sensing step 513, if the previously selected bit line's next data is VDD, the data line 510 will be pulled up to VDD. If the next bit line has an on-cell, this may cause the charge-sharing voltage to become too high if the bit line capacitance is not high enough. To resolve this issue, in another embodiment, after the previous bit line select gate is turned off, before the next bit line select gate is turned on, the data buffer 506 may apply a short pulse to discharge the data line 510 to 0V, and then let the bias device 508 pre-charge the data line 510 to Vbias-Vt. This may provide the desired initial voltage for data line 510 before each charge sharing. In another embodiment, a discharge device, as shown 505 in FIG. 24A, may be connected to data line 510 to perform the discharging.

The circuit and operation waveforms shown in FIGS. 26A-B are examples that demonstration one embodiment of the invention. It shown be known that the circuit and operational waveforms may be modified in many other ways. For example, the sensing circuits shown in FIG. 20A to FIG. 24B may be used to replace the sensing circuit shown in FIG. 26A. These modifications and variations are within the scope of the invention.

Figure 26C:
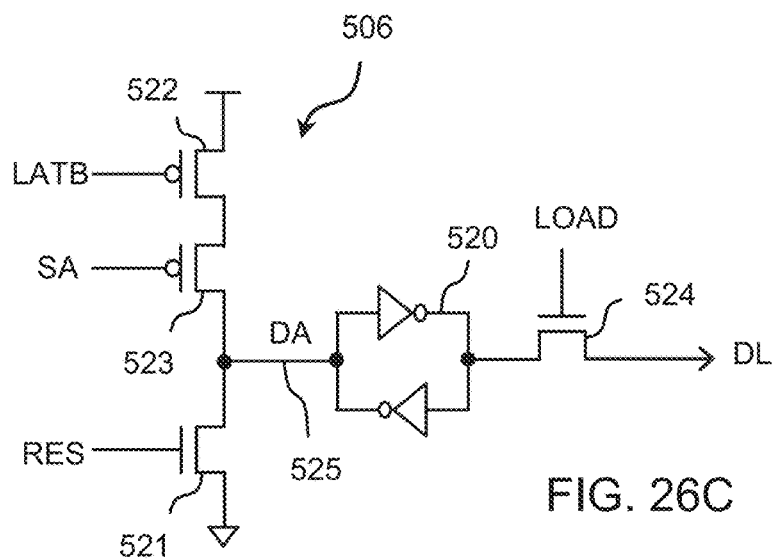
FIG. 26C shows an embodiment of a circuit implementation of a data buffer shown in FIG. 26A.

FIG. 26C shows an embodiment of a circuit implementation of the data buffer 506 in FIG. 26A. The circuit includes a data latch 520. The data latch 520 is reset by applying a RES pulse to turn on the NMOS 521. This will pull low the DA node 525 to 0V. The SA node of the previous stage sensing circuit is connected to PMOS 523. As described in FIG. 26B, for bit lines with off-cell, SA node will be pulled up to VDD. This will turn off PMOS 523. For bit lines with on-cell, SA node will be pulled down to below Vbias−Vt. This will turn on PMOS 523. After the SA voltage is ready, a LATB pulse may be applied to turn on PMOS 522. If SA is low, it will pull up DA node 525 to VDD. If SA is high, DA node 525 will remain at 0V. After that, a LOAD pulse can be applied to load the data of the latch 520 into the data line DL.

Please notice, the embodiment shown in FIG. 26C is an exemplary circuit targeted at minimizing circuit size. It is obvious that more complicated circuits, such as a sense amplifier or a comparator circuit, may be used to replace the input stage formed of PMOS 522 and 523. These variations and modifications shall remain in the scope of the invention.

Figure 27A:
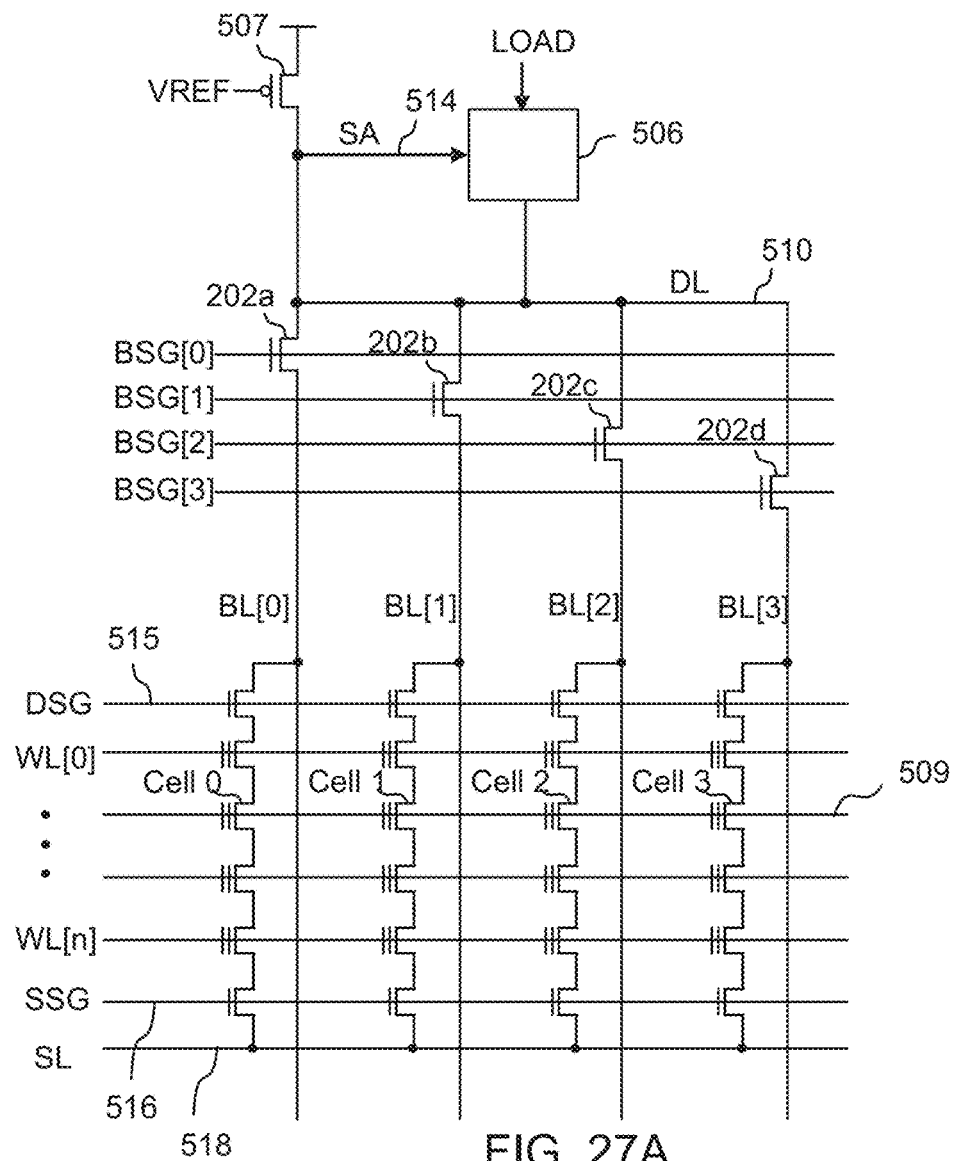
FIGS. 27A-B shows another embodiment using the sensing circuit shown in FIG. 20A and associated waveforms.
Figure 27B:
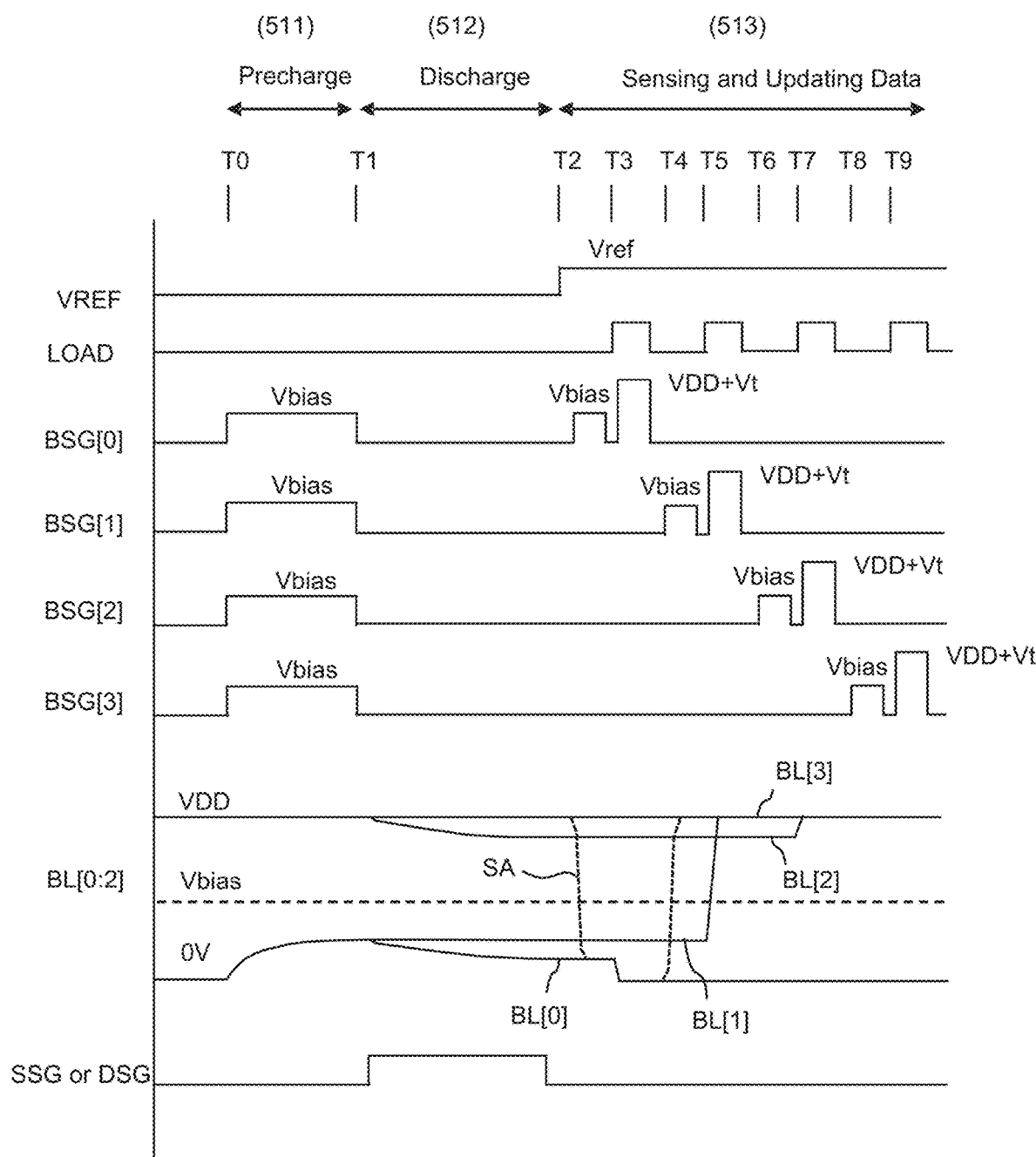

FIG. 27A shows another embodiment of a circuit implementation that uses the sensing circuit shown in FIG. 20A. In this embodiment, the bias device 508, as shown in FIG. 26A, is eliminated. The function of the bias device is performed by BSG[0] to BSG[3], as shown by the waveforms in FIG. 27B.

As previously disclosed, the program data are loaded into the bit lines and stored in the bit line capacitance during programming. During verification, the data of the cells are directly verified from the bit lines and load the next program data back to the bit line. There is no need to store the data in page buffers or data latches. This significantly reduces the requirement for a large number of data latches. For example, when using eight bit line select gates, BSG[0] to BSG[7], the previous approach shown in FIG. 4A requires eight data latches, to store the eight data for BL[0] to BL[7]. For this embodiment shown in FIG. 26A, because the program data is loaded to the bit line and stored in the bit line capacitance, it will only need one data latch, or no data latch at all if the input data is directly loaded into the bit lines. This can significantly reduce the circuit size and data throughput, especially for products using SLC single level cell only, it may not have multiple-bit data latches in the page buffer.

Figure 27C:
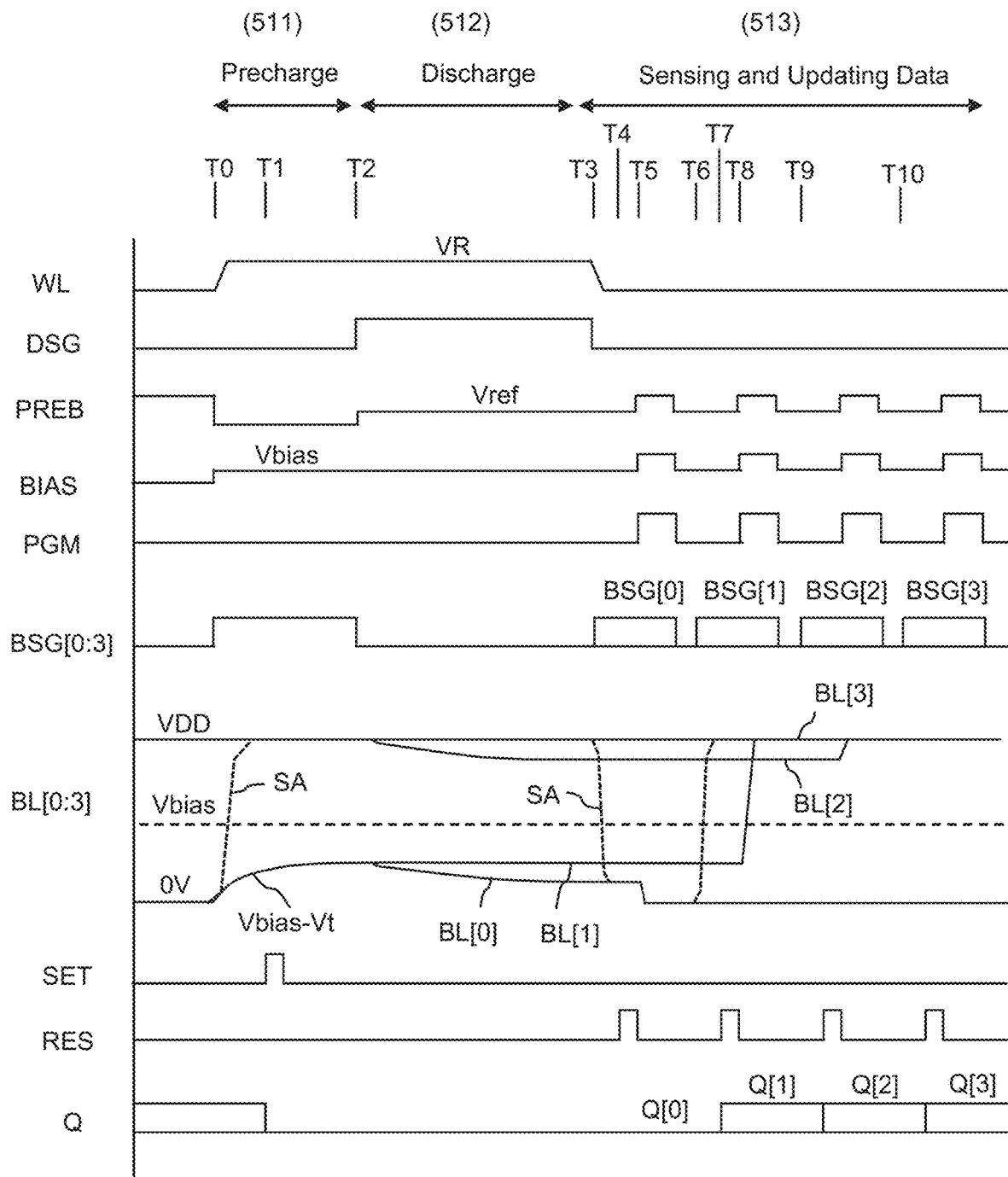
FIG. 27C shows another embodiment of the program-verify operation according to the invention using the page buffer circuit shown in FIG. 3C.

FIG. 27C shows another embodiment of program-verify operations according to the invention using the embodiment of the page buffer 200 and bit line select gates 202a to 202n shown in FIG. 6F. A detailed embodiment of the page buffer 200 is shown in FIG. 3C. For example, as illustrated in FIG. 3C, the page buffer circuit 200 includes a bias device 306 and a pre-charge device 303 that are connected to the SA node. Also shown are sensing device 310, latch pass gate 220, set device 311, reset device 312, and data latch 207 having Q and QB nodes. The descriptions of FIG. 3C above provide detailed circuit operations.

As illustrated in FIG. 27C, it will be assumed that four bit lines BL[0] to BL[3], as shown 201a to 201d in FIG. 6F, are used to perform program-verify operations. Assume BL[0] and BL[1] are programmed bit lines and BL[2] and BL[3] are inhibit bit lines. The data stored in BL[0] and BL[1] is 0 (0V) and the data stored in BL[2] and BL[3] is 1 (VDD), respectively.

At T0 time, the signals BSG[0:3] are supplied with VDD to turn on the bit line select gates 202a to 202d. The signal PREB supplies 0V to turn on pre-charge device 303 to charge the SA node to VDD. The signal BIAS supplies a bias voltage, Vbias. This will charge up the programmed bit lines BL[0] and BL[1] from 0V to Vbias-Vt of the bias device 306, while the inhibit bit lines BL[2] and BL[3] remain at VDD. In a preferred embodiment, Vbias may be slightly higher than Vt1+Vt2, where Vt1 and Vt2 are the threshold voltages of the bias device 306 and sensing device 310. This allows on-cells to quickly discharge the bit line voltage to below Vt of the sensing device 310.

At T1 time, the signal SET is supplied with a pulse to set the Q node of the latch 207 to 0V.

At T2 time, the signals BSG[0:3] go low to turn off the bit line select gates 202a to 202d. The selected word line (WL) is supplied with a verify voltage, VR. The signal DSG goes high to turn on the drain select gate of the selected string. Assume the selected cells on BL[0] and BL[2] are on-cells (Vt<VR) and the cells on BL[1] and BL[3] are off-cells (Vt>VR). The on-cells discharge the voltage of BL[0] and BL[2]. Because the initial voltage of BL[0] and BL[2] are different, after a time period, BL[0] is discharged to below Vt, while BL[2] is above Vt or even Vbias-Vt.

At T3 time, the signal BSG[0] goes high to turn on the bit line select gate 202a to couple BL[0] to the page buffer 200. Because the voltage of BL[0] is lower than Vbias-Vt, the bias device 306 is turned on to pull low the SA node of the page buffer to the same voltage of BL[0]. The SA voltage turns off the sensing device 310.

At T4 time, the signal RES is supplied with a pulse to turn on the reset device 312. However, because the sensing device 310 is turned off by the voltage of SA node, the latch 207 will not be reset and the Q node of the latch 207 remains 0V.

At T5 time, the signals PGM, BIAS, and PREB are supplied with pulses to update the program data on BL[0].

It will load the data 0 (0V) from the Q node of the latch 207 to BL[0]. Thus, the program data on BL[0] is updated to 0 (0V). Because the cell on the programmed bit line BL[0] is an on-cell, it indicates that the cell is not successfully programmed yet, thus it will be programmed again by the next program pulse.

At T6 time, the signal BSG[0] goes low to turn off the bit line select gate 202a of BL[0]. The signal BSG[1] goes high to turn on the bit line select gate 202b of BL[1] to couple BL[1] to the page buffer. Because the cell on BL[1] is an off-cell, the voltage of BL[1] remain at the precharge voltage, Vbias-Vt, which turns off the bias device 306. Therefore, the SA node of the page buffer is pulled up to VDD to turn on the sensing device 310.

At T7 time, the signal RES is supplied with a pulse to turn on the reset device 312. Because the sensing device 310 is turned on by the voltage of SA node, the reset device 312 will reset the Q node of the latch 207 to VDD.

At T8 time, the signals PGM, BIAS, and PREB are supplied with pulses to update the program data on BL[1]. It will load the data 1 (VDD) from the Q node of the latch 207 to BL[1]. In order to load VDD to BL[1], the level of the signals PGM, BIAS, and PREB may be VDD+Vt. Thus, the program data on BL[1] is updated from 0 (0V) to 1 (VDD). Because the cell on the programmed bit line BL[1] is an off-cell, it indicates that the cell is successfully programmed. Thus, it will be inhibited during the next program pulse.

At T9 and T10 time, the signals BSG[2] and BSG[3] go high to turn on the bit line select gates 202c and 202d on BL[2] and BL[3], respectively. The previously-described operations from T3 to T6 time are repeated to verify the cells and update the bit line data for BL[2] and BL[3], respectively. Because both BL[2] and BL[3] voltage is higher than Vbias-Vt, the bias device 306 is turned off and the SA node is pulled up to VDD. Similar to BL[1], the Q node of the latch 207 for both BL[2] and BL[3] will be reset by the reset pulse RES to data 1 (VDD), and updated by the PGM, BIAS, and PREB pulses to charge BL[2] and BL[3] to data 1 (VDD). As a result, the originally inhibited BL[2] and BL[3] remain at inhibit voltage VDD.

In the embodiments described above, VDD is used as an inhibit voltage. In another embodiment, the inhibit voltage may be VDD-Vt. In such case, at time T8, when applying a pulse to the signals PGM, BIAS, and PREB, the pulse can be at a VDD level, which will charge the BL to VDD-Vt.

Figure 28A:
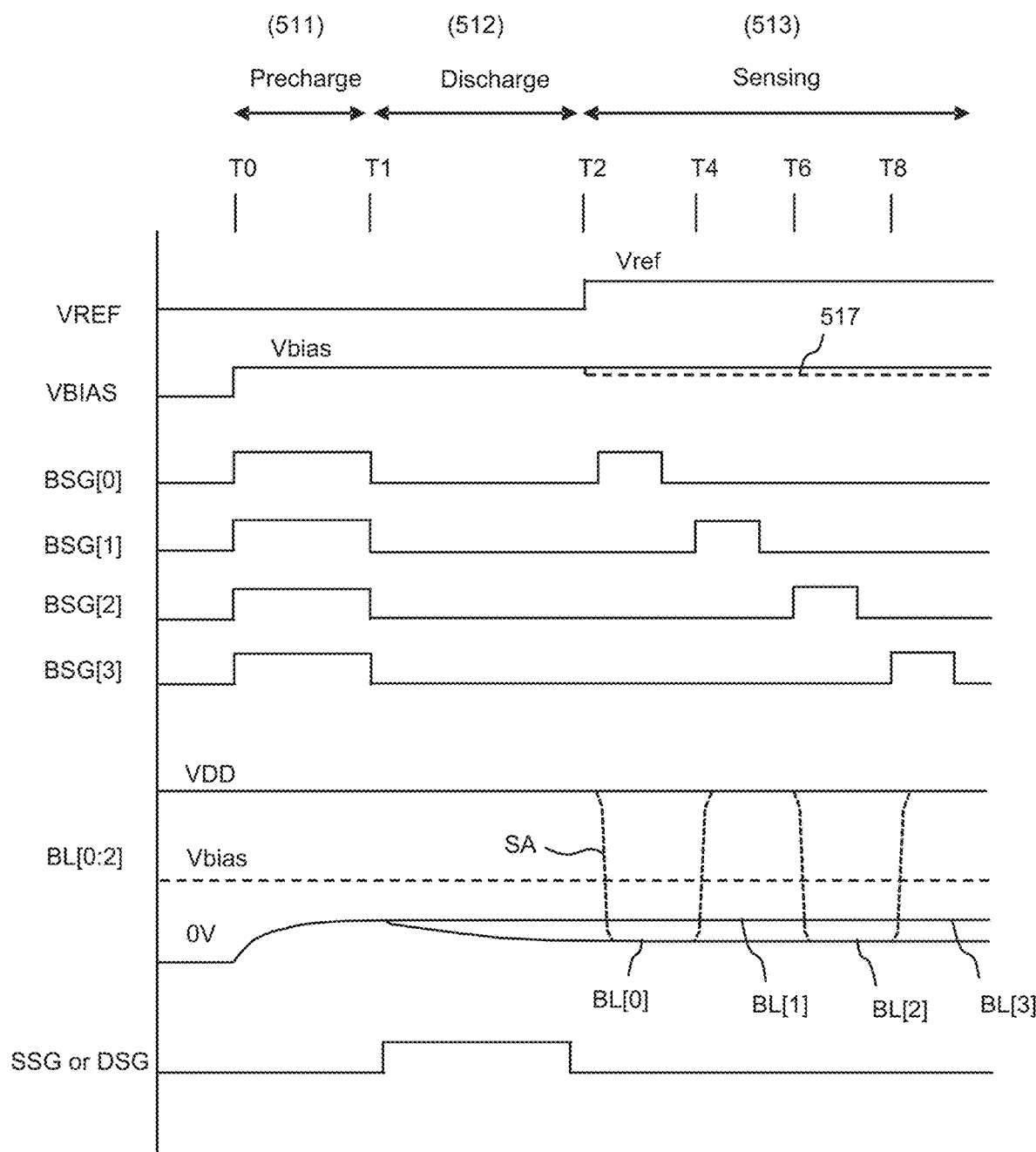
FIGS. 28A-B shows exemplary embodiments of waveforms for read operations.

FIG. 28A shows an exemplary embodiment of waveforms for read operations. These waveforms are similar to the program-verification waveforms shown in FIG. 26B, except that the steps of loading the next data back to the bit line are eliminated. Moreover, the selected word line is supplied with a read voltage instead of a verify voltage. The read waveforms illustrate how four cells, Cell 0 to Cell 3, are read sequentially. In this example, Cell 0 and Cell 2 are on-cells and Cell 1 and Cell 3 are off-cells. During step 511, pre-charging bit line, all the bit lines BL[0] to BL[3] are pre-charged to Vbias-Vt. During step 512, discharging bit line, the on-cells will discharge BL[0] and BL[1] to a voltage lower than Vbias-Vt. During step 513, sensing, the bit line select gates, BSG[0] to BSG[3], are sequentially turned on to connect the sensing circuit to BL[0] to BL[3]. This causes charge-sharing to occur between the capacitance of the data line 510 and the bit line. Due to the capacitance of data line 510 being much smaller than the bit line capacitance, the SA node 514 will be pulled up and down in very short time.

Figure 28B:
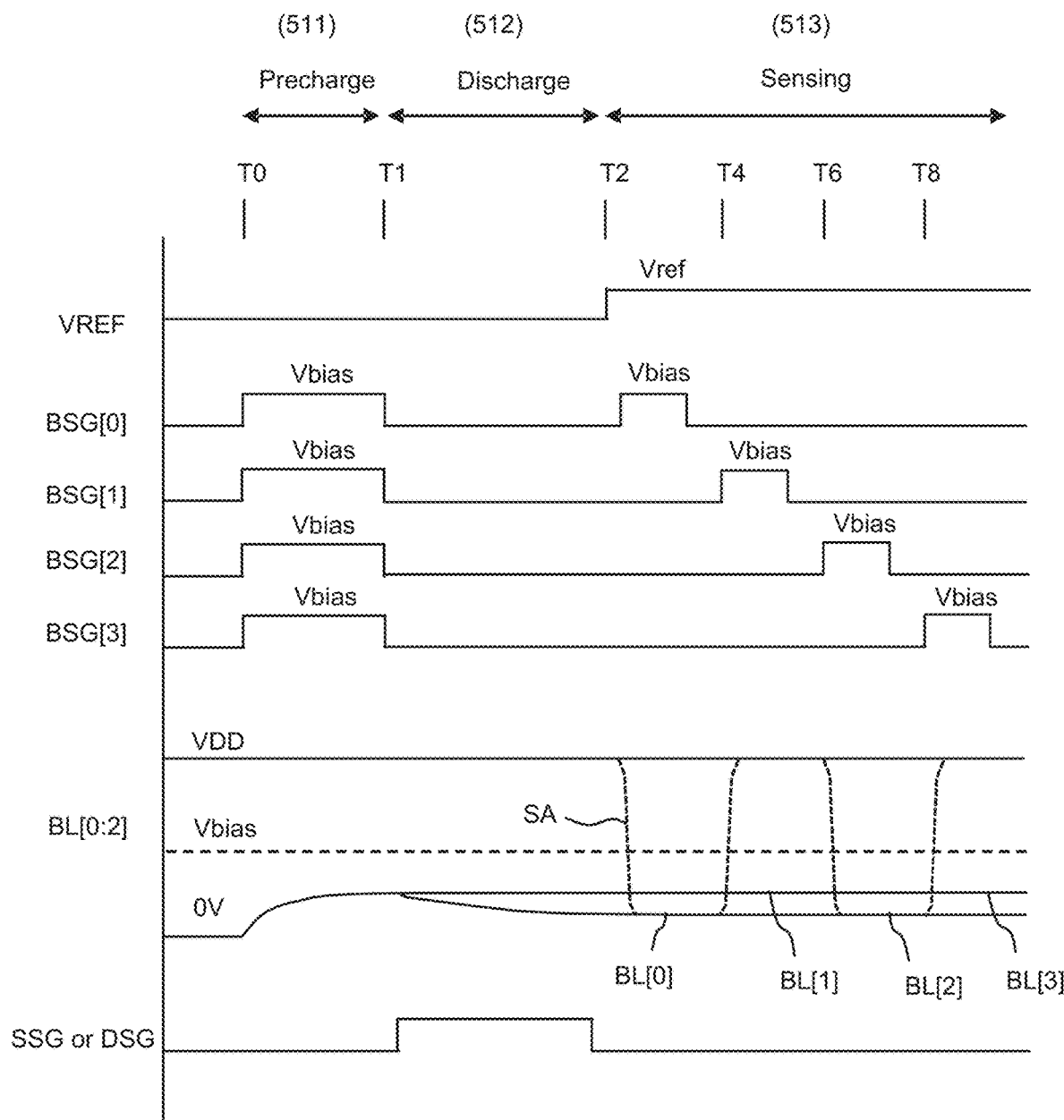

FIG. 28B shows another embodiment of waveforms for read operations for use with the circuit embodiment shown in FIG. 17A. The waveforms are similar to the verification waveforms shown in FIG. 27B, except that the steps of loading the next data back to the bit lines are eliminated.

Figure 29A:
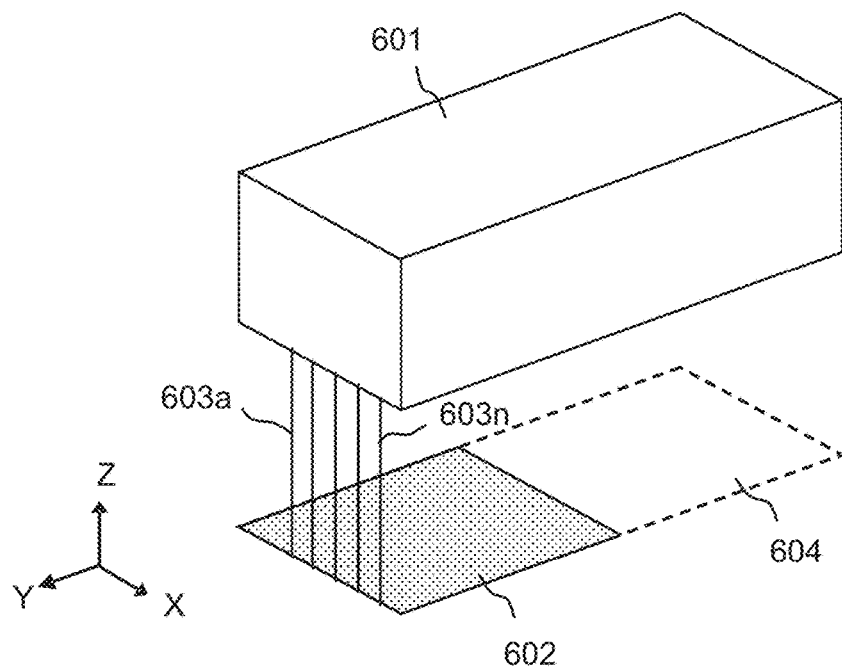
FIG. 29A shows a layout arrangement of a page buffer circuit of a conventional 3D NAND flash memory.

FIG. 29A shows a layout arrangement of a page buffer circuit of a conventional 3D NAND flash memory. The flash memory comprises a 3D NAND flash memory sub-array 601. The sub-array 601 contains multiple cell strings, as the equivalent circuit shown in FIG. 17C. The bit lines are located on top of the array 601 and run in the Y direction. Page buffers 602 are connected to the bit lines through the contacts 603a to 603n. In an All-Bit-Line (ABL) design, the number of the page buffers are the same as the number of bit lines. Each bit line is connected to one page buffer. In a Half-Bit-Line (HBL) design, the number of the page buffers is half of the bit lines. Each page buffer is connected to two bit lines. Circuits 604 are for data path, redundancy, page buffer drivers, word line drives, etc. The page buffers 602 and circuits 604 are located below the array 601 to reduce the die size.

Figure 29B:
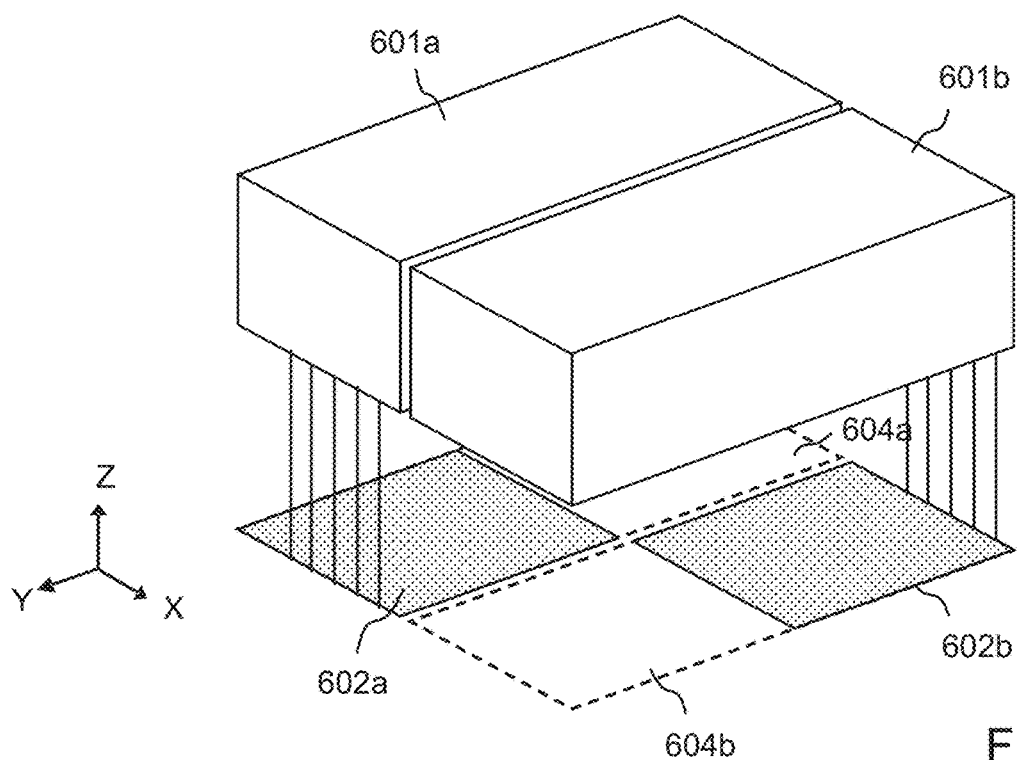
FIG. 29B shows a conventional array configuration having two adjacent sub-arrays 601a and 601b.

FIG. 29B shows a conventional array configuration having two adjacent sub-arrays 601a and 601b. It should be noted that the page buffers 602a and 602b and circuits 604a and 604b are interleaved, so that the circuits 604a and 604b can drive the page buffers 602b and 602a, respectively. The structure shown in FIG. 29B is called a 'tile'. A large memory array can be formed by arranging multiple tiles in both the X and Y directions.

Figure 30A:
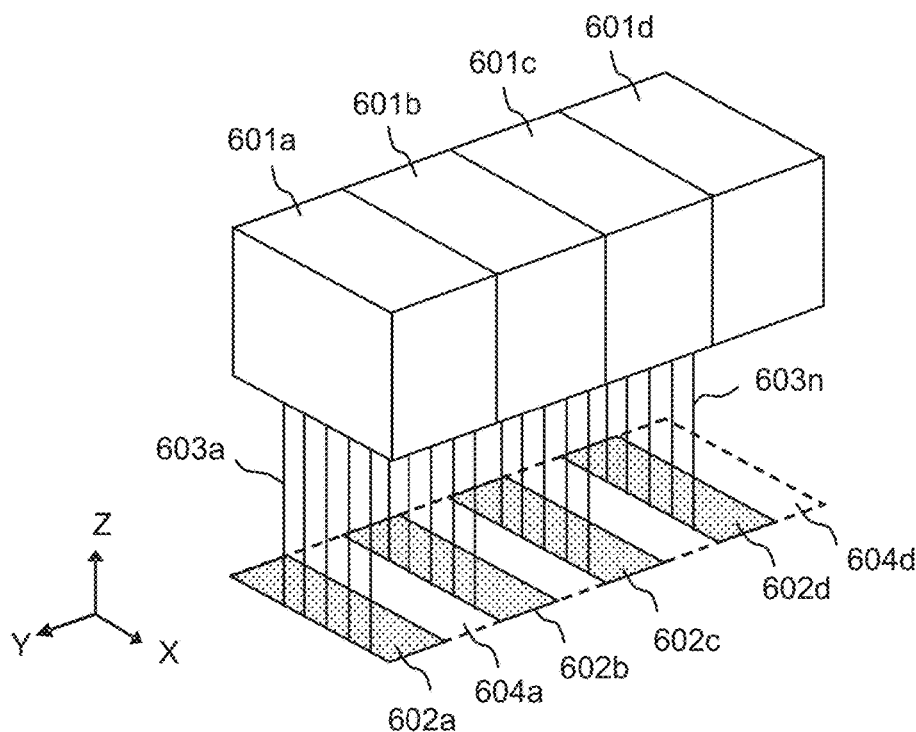
FIG. 30A shows an embodiment of a layout arrangement of page buffers and circuits for a 3D array according to the invention.

FIG. 30A shows an embodiment of a layout arrangement of page buffers and circuits for a 3D array according to the invention. In this embodiment, the 3D sub-array is divided into multiple sectors 601a to 601d. The bit lines between the sectors are separated. The bit lines of sectors 601a to 601d are connected to the page buffers 602a to 602d, respectively, through the contacts 603a to 603n. The contacts 603a to 603n may be located on the edges of the sectors 601a to 601d. Circuits 604a to 604d are circuits for data path, redundancy, page buffer drivers, word line drives, etc.

For the conventional art, shown in FIG. 29A, the number of the bit lines is 1 KB. The 1 KB bit lines are connected to 1 KB page buffers in 602 to perform program, verify, and read operations simultaneously. For an embodiment according to the invention, shown in FIG. 30A, assume the sub-array is divided into 4 sectors, as shown 601a to 601d. Each sector will contain 1 KB bit lines, and each bit line's length is ¼ of the conventional art's bit line length.

Assume the invention has the same total number of page buffers 1 KB as the conventional art. The page buffers are divided into 4 groups 602a to 602d. Each group contains 256B page buffers. By using 4 bit line select gates, such as 202a to 202d shown in FIG. 27A, each group of 256B page buffers can be connected to each sector's 1 KB bit lines, and perform simultaneous program, verify, and read operations to all the bit lines. As a result, the invention can perform read and write operations to total 4 KB bit lines simultaneously. This significantly increases the data throughput by 4 times, without increasing die size.

Moreover, the read and verification speed may be significantly improved due to the bit line length of each sector being only ¼ of the conventional circuit. This reduces the bit line capacitance to about ¼, thus drastically reduces the bit line charging and discharging time.

In accordance with invention, the sub-array can be divided into any number of sectors. The more sectors are used, the more pages may performed read and write simultaneously. For example, assume the sub-array is divided into N sectors. The total pages that can perform simultaneous read and write operations becomes N times, thus the data throughput is increased for N times. In addition, the bit line length becomes 1/N, which increases access speed N times. A consideration of embodiments of the invention is the increase of bit line select gates, which is very low and may be negligible.

Figure 30B:
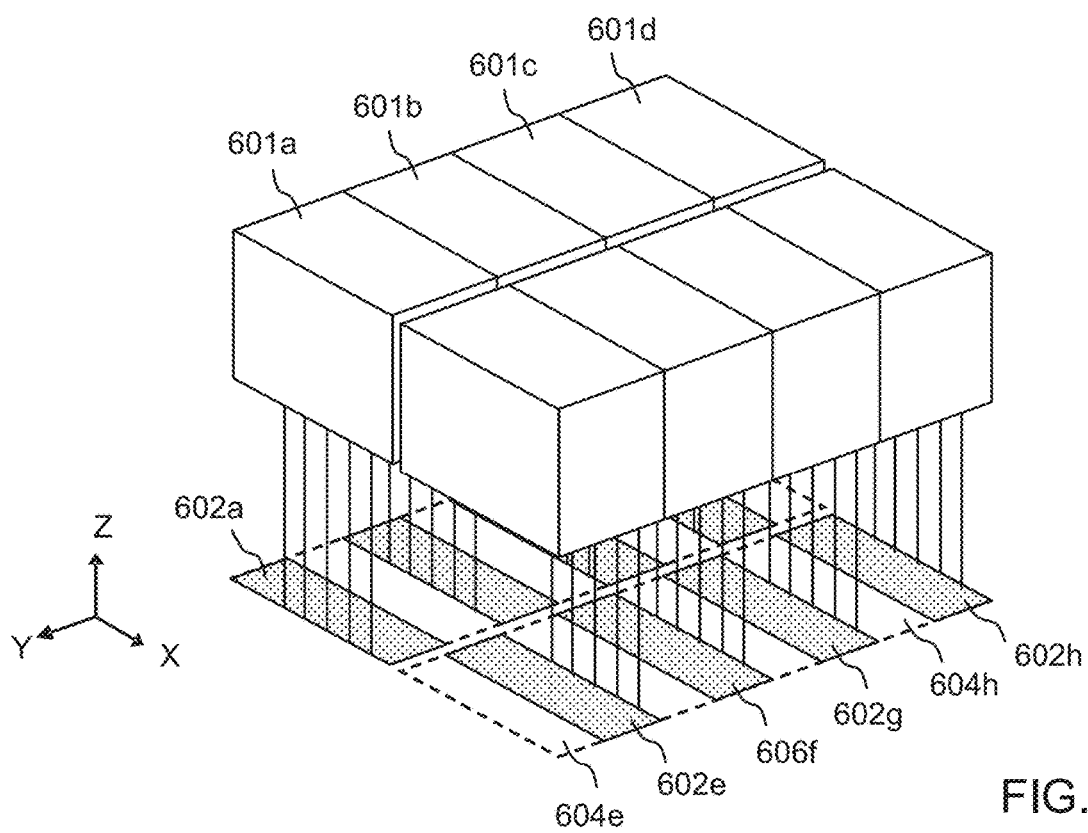
FIG. 30B shows an exemplary embodiment of a tile formed by two adjacent sub-arrays as shown in FIG. 30A.

FIG. 30B shows an exemplary embodiment of a tile formed by two adjacent sub-arrays as shown in FIG. 30A. The page buffers 602e to 602h and circuits 604e to 604h of the second sub-array may be interleaved with those of the first sub-array. Thus, the circuits 604a to 604d can drive the page buffers 602e to 602h, and the circuits 604e to 604h can drive the page buffers 602a to 602d, respectively.

Figure 31A:
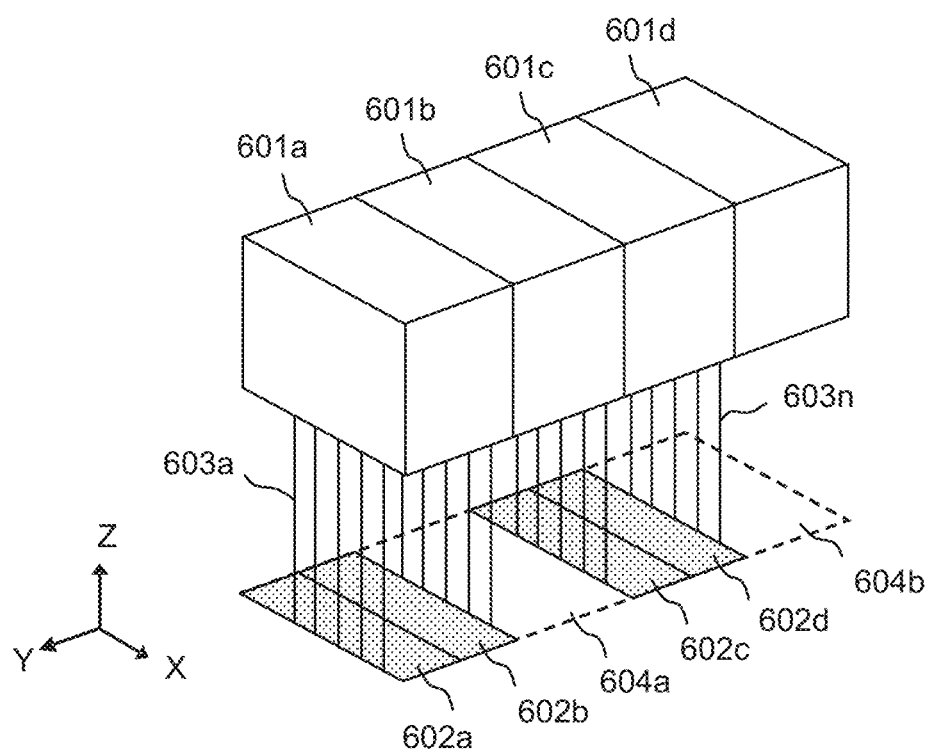
FIGS. 31A-B show embodiments of page buffer configurations in accordance with the invention.
Figure 31B:
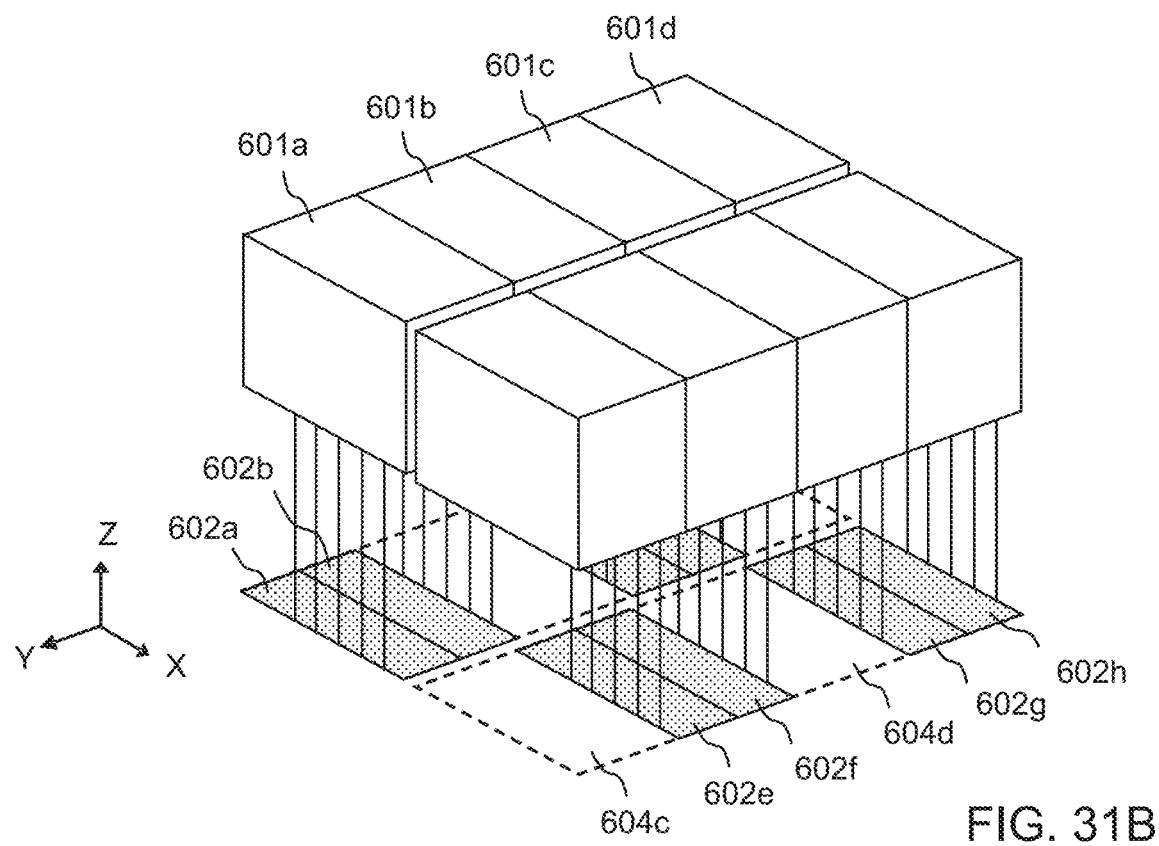

FIG. 31A-B show embodiments of page buffer configurations in accordance with the invention. These embodiments are similar to FIG. 30A-B, except that the layout arrangement for the page buffers 602a to 602d and circuits 604a to 604d are different. Similar to the embodiments of FIG. 30A-B, the bit lines of the sectors 601a to 601d are connected to the page buffers 602a to 602d, respectively, using the contacts 603a to 603n.

Although the embodiments in FIG. 30A-B show 3D array structures, it would be obvious to those with skill in the art that the invention may be implemented in 2D array structures. In these 2D embodiments, the page buffers and circuits are located on the sides of the sectors.

Figure 32:
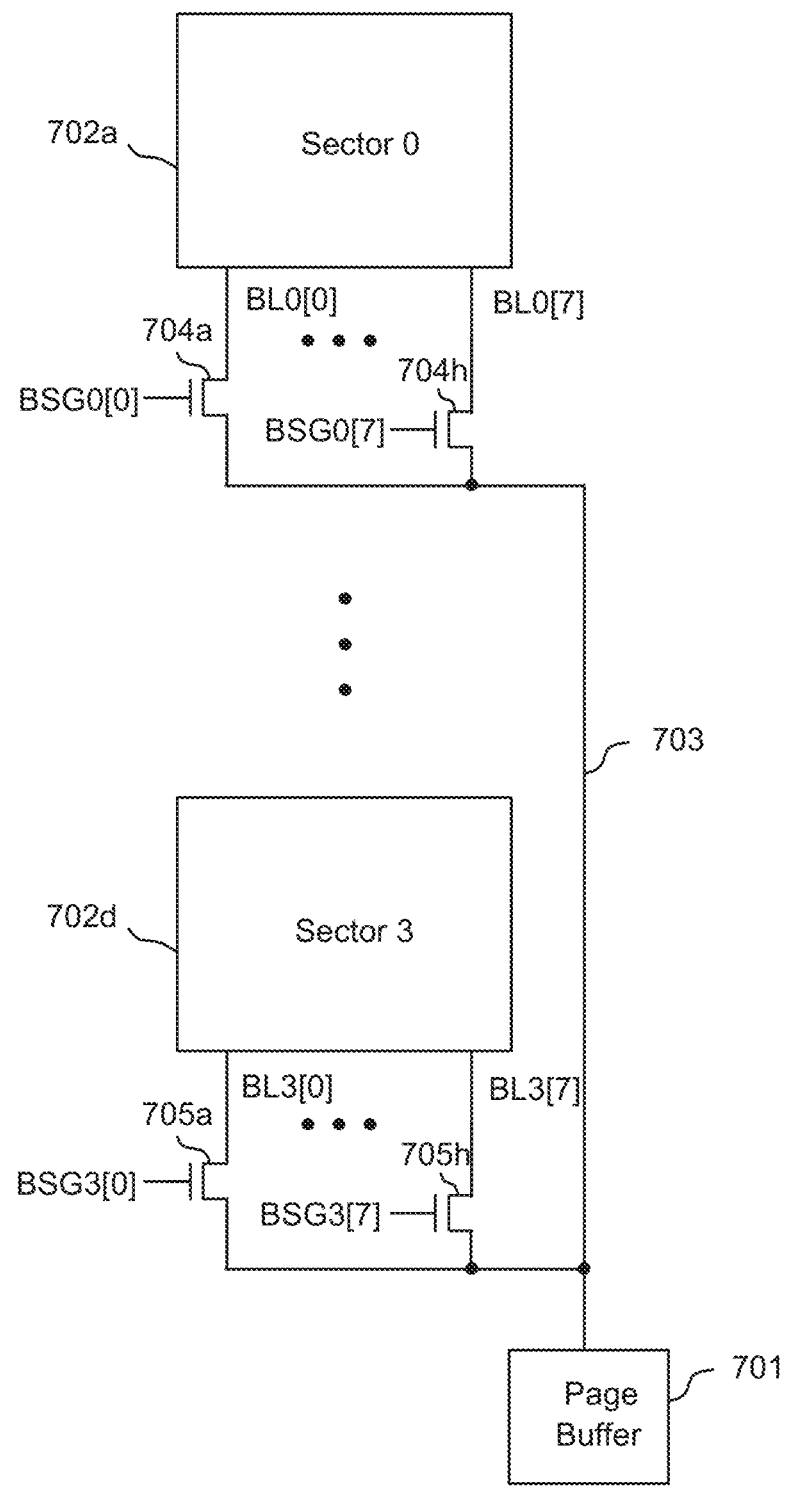
FIG. 32 shows an exemplary embodiment of a page buffer and bit line select gate structure in accordance with the invention.

FIG. 32 shows an exemplary embodiment of a page buffer and bit line select gate structure in accordance with the invention. In this embodiment, a page buffer 701 is connected to multiple array sectors 702a to 702d through a data line 703. The number of the sectors may be any number. For clarity, it will be assumed four sectors, Sector 0 to Sector 3, are used. Each sector's bit lines are connected to the data line 703 through bit line select gates, such as 704a to 704h and 705a to 705h. It will also be assumed that eight bit line select gates, such as BSG0[0] to BSG0[7] and BSG3[0] to BSG3[7] are used. For a 3D array structure, the bit line select gates, such as 704a to 704h and 705a to 705h, page buffer 701, and the data line 703 may be located under the array sectors 702a and 702d.

The divided sector structure in this embodiment provides multiple advantages. First, the total bit line capacitance will become the capacitance of ⅛ bit line length plus the data line capacitance since the data line 703 pitch is much larger than the bit line pitch. As a result, the total bit line capacitance is much smaller than that of conventional arrays. This will significantly increase the speed for pre-charging and discharging bit lines in read and verify operations.

Second, the page buffer 701 can load different data to the bit lines in multiple sectors 702a to 702d to preform multiple page program and verify operations using the previously described operations. This will significantly increase the program data throughput.

Third, the page buffer 701 can perform simultaneous pre-charge and discharge operations to the bit lines in the multiple sectors 702a to 702d using the previously described operations. This will significantly increase the read data throughput. Although the length of the data line 703 is longer than the data line 510 of the previous embodiment shown in FIG. 26A, due to the capacitance of the data line 703 being relatively smaller than the bit line capacitance, the read and verify operations described in FIG. 26A will still operate for this embodiment. However, the speed may be slower due to the larger capacitance of the data line 703.

Fourth, the bit line capacitance of the multiple sectors can be used as data caches to store data for multiple pages using the waveforms shown in FIGS. 11B-C. For example, when programming data to a selected page in Sector 0, the data for the next three pages can be input and stored in the bit lines of Sector 1, Sector 2, and Sector 3. In another embodiment, the data stored in the Sectors 1, Sector 2, and Sector 3 can be programmed into a page in Sector 0 using TLC Triple Level Cell mode.

For the embodiments shown in FIG. 26A, FIG. 27A, and FIG. 32, the program data can be directly stored in the bit line capacitance. This reduces the number of data latches required for each bit line's page buffer. Therefore, more page buffers may be packed inside a chip to increase the read and write data throughput. However, during 'Program Suspend', if the request data is located in the sector during program, the data stored in the bit lines may need to be moved to other unselected sector, before the read operation may be performed. After the read operation is completed, the data may be read from the unselected sector, and loaded back to the selected sector to continue the program operation.

For this purpose, when performing multiple sector programming to all the sectors in a plane or a bank, one sector may be reserved. Thus, when the system issues Program Suspend, the data of the selected sector may be transferred to the reserved sector. After the requested data is read from the selected sector, the data stored in the reserved sector can be transferred back to the selected sector to continue the programming.

Figure 33A:
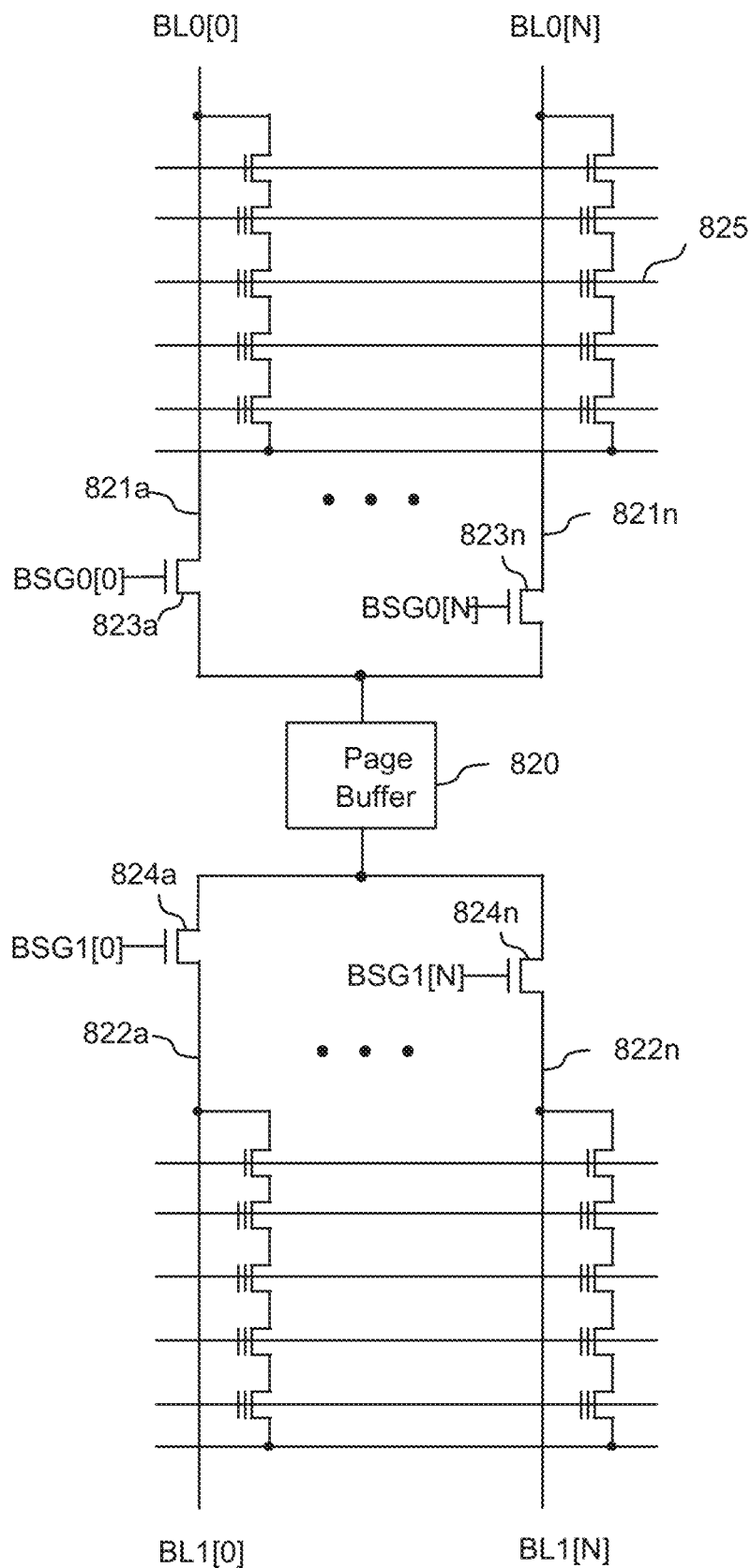
FIG. 33A shows another embodiment of a page buffer and bit line select gate structure in accordance with the invention.

FIG. 33A shows another embodiment of a page buffer and bit line select gate structure in accordance with the invention. In this embodiment, a page buffer 820 is connected to the first group of bit lines 821a to 821n through the bit line select gates 823a to 823n. The page buffer 820 is connected to the second group of bit lines 822a to 822n through the bit line select gates 824a to 824n.

Assuming the page 825 in the first bit line group 821a to 821n is selected for programming, the second bit line group 822a to 822n can be used to store the program data. The multiple-page programming may be performed by using the following steps. First, input data D[0] to D[N] are sequentially loaded into the second bit line groups 822a to 822n by using the operations described in FIGS. 11A-C. The data will be held by the bit line capacitance. Second, the data held by the second bit line group may be sequentially read by the page buffer 820 using the operations described in FIG. 11D and loaded to the first bit line group 821a to 821n to program the selected page 825 by using the operations described in FIGS. 5A-E.

After one program pulse, a program-verify operation can be performed to read the data from the programmed cells in the selected page 825 by using the operations described in FIGS. 7A-D. During the time interval between T4 to T6 of FIGS. 7A-D, the data of the first bit line group 821a to 821n can be compared with the input data stored in the second bit line group 822a to 822n to generate the next program data, and to load the next program data back to the first bit line group 821a to 821n. The next program pulse is then applied.

The program and program-verify operations can be alternately repeated until the data read from the selected page 825 equals to the input data stored in the second bit line group 822a to 822n. Then, the program operation is completed. The data stored in the first bit line group 821a to 821n and the second bit line group 822a to 822n can be cleared.

Similarly, when the selected page is located in the second bit line group 822a to 822n, the input data can be loaded to the first bit line group 821a to 821n and stored by the bit line capacitance. The input data can be used to verify the programmed data of the selected page in the second bit line group 822a to 822n.

In another embodiment, when loading the input data, both the bit line select gates 823a to 823n and 824a to 824n can be sequentially turned on together to load the input data to both the first bit line group 821a to 821n and the second bit line group 822a to 822n, because the first program data may be the same as the input data.

During read operation, the operations described in FIGS. 7A-D can be applied to pre-charge and discharge the first group's bit lines 821a to 821n in parallel. Then, the bit line select gates 823a to 823n can be sequentially turned on to sense the data of the bit lines 821a to 821n to the page buffer 820. The embodiment shown in FIG. 33A can be also applied to multi-level cell (MLC), triple-level cell (TLC), quad-level cell (QLC), or any other level cell's programming.

Figure 33B:
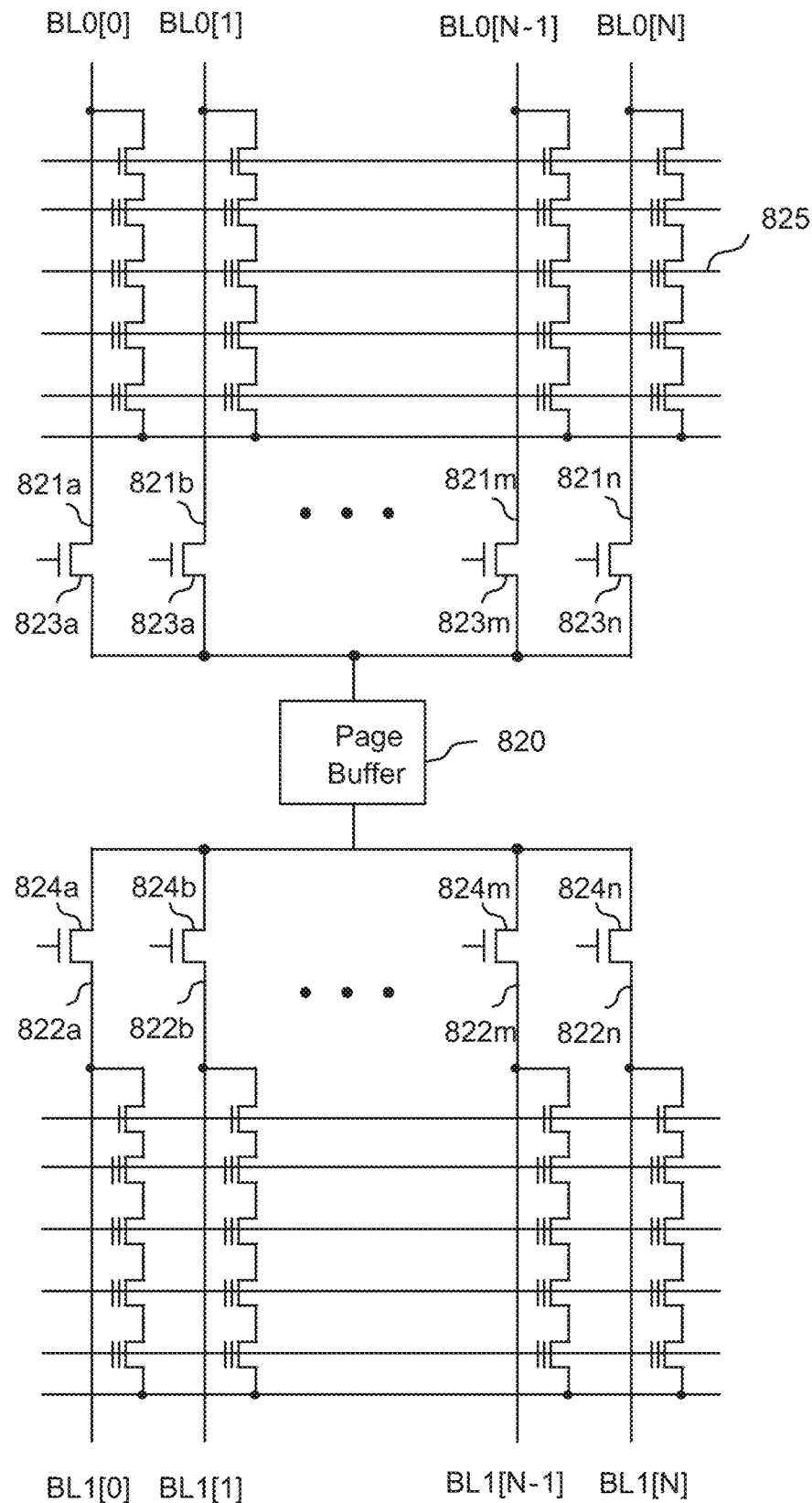
FIGS. 33B-C shows an embodiment configured for MLC programming.

FIG. 33B shows an embodiment configured for MLC programming. It will be assumed that the page 825 in the first bit line group 821a to 821n is selected. The first page (upper page) of input data may be sequentially loaded to the even bit lines such as 822a, 822c, . . . , to 822m of the second bit line group and stored by the bit line capacitance. The second page (lower page) of input data may be sequentially loaded to the odd bit lines such as 822b, 822d, . . . , to 822n of the second bit line group and stored by the bit line capacitance.

Next, the upper page data stored in the even bit line 822a and the lower page data stored in the odd bit line 822b are sequentially read to the page buffer 820. The page buffer 820 may contain two data latches to store the two-bit data. The pager buffer 820 will determine the program data for the first cell's threshold voltage level (Vt) according to the two-bit data, and then loads the program data to the first even bit line 821a of the first bit line group 821a to 821n.

Then, the next program data is determined by the data stored in the second bit line group's bit line 822c and 822d, and then loaded to the second even bit line 821c of the first bit line group. This operation is repeated until all the program data are loaded to the even bit lines 821a, 821c, . . . , to 821m of the first bit line group. Then, a program pulse is applied to program the even cells on the selected word line 825.

During program-verification, the two-bit data stored in the second bit line group 822a to 822n are sequentially read to the page buffer 820 to be compared with the data read from the select page 825 to determine the next program data. The next program data are loaded back to the even bit lines of the first bit line group 821a to 821n. Then, the next program pulse will be applied. These operations are repeated until all the three Vt levels for MLC are successfully programmed, and then the program operation is completed.

After that, the next upper page's and lower page's data may be loaded to the even and odd bit lines of the second bit line group 822a to 822n, respectively. The above-described operations are applied to program the data into the odd bit lines 821b, 821d, . . . , to 821n of the first bit line group.

The even bit lines and odd bit lines of the first bit line group 821a to 821n belong to two pages. During a read operation to read the page of even bit lines, the word line of the select page 825 is supplied with the first read voltage to read the upper page's data by using the operations described in FIGS. 7A-D. The data is sequentially stored to the even bit lines of the second bit line group 822a to 822n.

Next, the second read voltage is supplied to the word line of the selected page 825 to read the lower page's data by using the operations described in FIGS. 7A-D. The upper page's data stored in the even bit lines of the second bit line group 822a to 822n may be read to the page buffer 820 to be compared with the data stored in the first bit line group to determine the lower page's data. The lower page's data then is stored in the odd bit lines of the second bit line group 822a to 822n.

Next, the third read voltage is applied to the word line of the selected page 825 to read the lower page's data again by using the operations described in FIGS. 7A-D. The upper page's data stored in the even bit lines of the second bit line group 822a to 822n and the previously read lower page's data stored in the odd bit lines of the second bit line group 822a to 822n may be read to the page buffer 820 to be compared with the data stored in the first bit line group to determine the lower page's data. The lower page's data then is stored in the odd bit lines of the second bit line group 822a to 822n.

Thus, when performing a program operation and a read operation for the second bit line group 822a to 822n, the first bit line group 821a to 821n can be used to store the input data and output data, respectively.

Figure 33C:
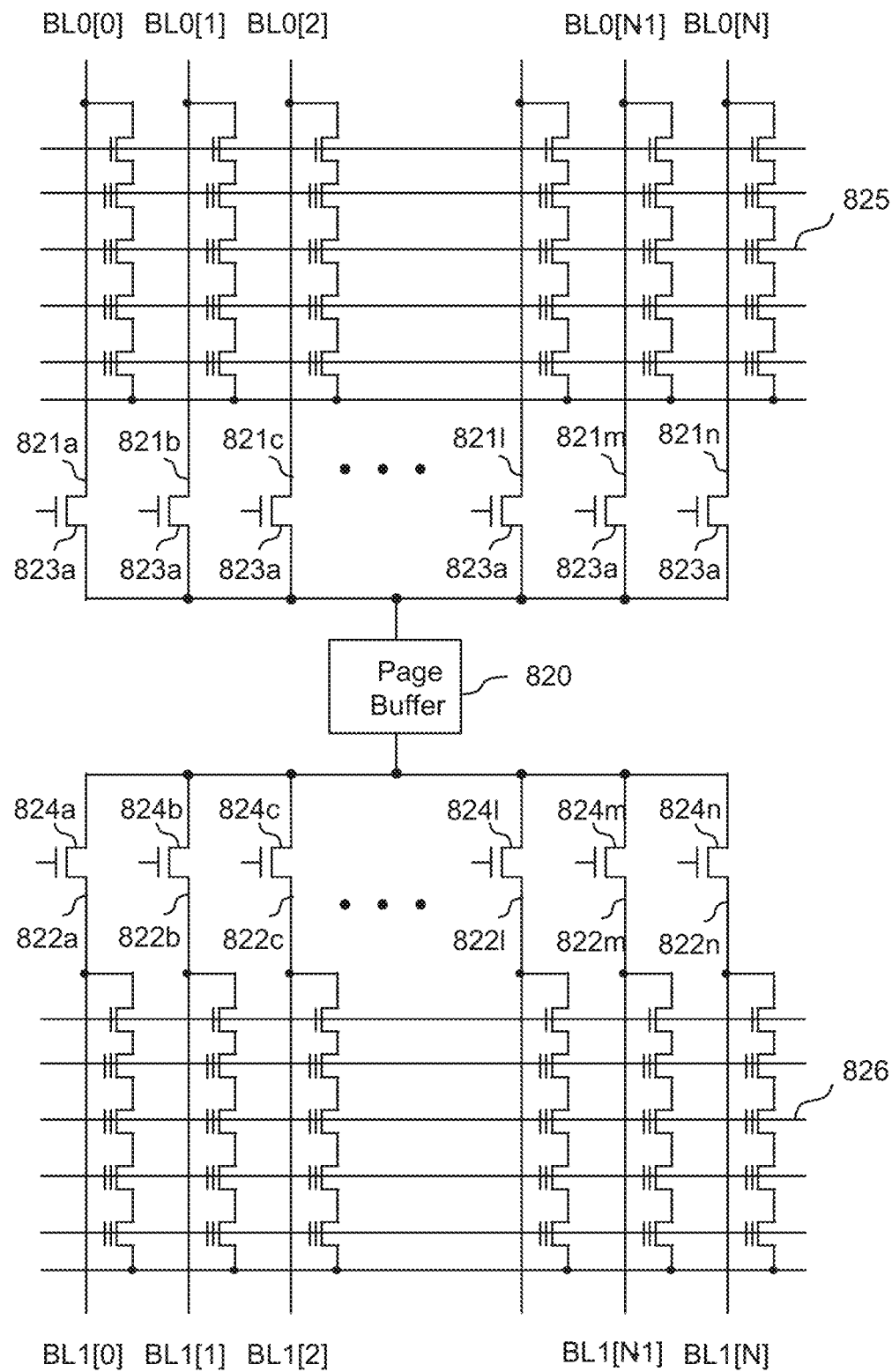

FIG. 33C shows another embodiment of the application for TLC programming. This operation is similar to the one shown in FIG. 33B except that the three input pages, i.e., upper page, middle page, and lower page, for the TLC cells are loaded to 822a, 822b, 822c to 8221, 822m, and 822n, respectively. The page buffer 820 contains three data latches to store the three-bit data read from the second bit line group, such as bit lines 822a, 822b, and 822c. The page buffer 820 will determine the program data according to the three-bit data and load the program data to the first bit line group. As a result, the data stored in the second group's bit lines 822a, 822b, and 822c are programed to the first group's bit line 821a. During read operation, the three-bit data read from the cell on the first group's bit line 821a will be stored in the second group's bit lines 822a, 822b, and 822c, respectively. Since the TLC program and read operations are similar to the MLC operations described in FIG. 33B, the detailed operations will not be repeated.

The embodiments shown in FIG. 33A-C can perform a 'program suspend' function. For example, assume that the page 825 is in programming. The input data is stored in the second bit line group 822a to 822n. If the system wants to read another page of the first bit line group 821a to 821n, the program operation can be suspended. The program data in the first group of bit lines 821a to 821n are cleared, and a read operation is performed to read the data from the selected page using the operations described in FIGS. 7A-D. After the read operation completes, the program operation may be resumed. The input data stored in the second bit line group 822a to 822n can be read to generate the program data for the first bit line group 821a to 821n again.

On the other hand, if the read page is located in the second bit line group 822a to 822n, the data of the first bit line group 821a to 821n may be cleared. The data stored in the second bit line group 822a to 822n may be read and transferred to the first bit line group 821a to 821n. After that, the selected page in the second bit line group 822a to 822n is read. After the read operation is completed, the data stored in the first bit line group 821a to 821n may be transferred back to the second bit line group 822a to 822n. Then, the program operation may be resumed.

The embodiments shown in FIGS. 33A-C can also perform 'simultaneous read/write' or 'read while write' operations. Assume the first bit line group 821a to 821n is performing a program operation using the method described in FIG. 26A to FIG. 28B. This approach stores the input data in the selected bit lines and updates the data directly in the bit lines during program-verification. It does not require storage of the input data in another place. Therefore, when programming the first bit line group 821a to 821n, the second bit line group 822a to 822n can perform a read operation simultaneously using the operations described in FIGS. 7A-D.

The embodiments shown in FIGS. 33A-C can also perform a 'data folding' operation that converts data stored in SLC pages into MLC or TLC pages. This mode is used to enhance the program data throughput. During sequential write operations, the system can write the data using the SLC mode. This significantly reduces the write time. During the idle time, the data stored in the SLC pages then is read and re-programmed to other pages using the MLC or TLC mode. After that, the SLC pages are erased. This can increase the data storage density.

Referring again to FIG. 33C, assume that the page 826 is the SLC page. To transfer the data from the SLC page 826 to the TLC page 825, the data of SLC page 826 is read by using the operations described in FIGS. 7A-D. The second group of bit lines 822a to 822n are pre-charged and discharged by the cells on the SLC page 826. Then, the data of the second group of bit lines 822a to 822n are sequentially read by the page buffer 820 to determine the program data for the TLC page 825 by using the MLC and TLC program operations described in FIGS. 33B-C. For example, the data of the second bit lines 822a, 822b, and 822c is used to determine the program data of the first group's bit line 821a. As a result, the data stored in the SLC page 826 is programmed to ⅓ bit lines of the TLC page 825, such as bit lines 821a, 821d, . . . , to 821l.

After that, the next SLC page in the second bit line group 822a to 822n can be read, and the above-described operations are repeated to program the data into next ⅓ bit lines of the TLC page 825, such as bit lines 821b, 821e, . . . , to 821m. After that, the third SLC page in the second bit line group 822a to 822n can be read programed into the next ⅓ bit lines of the TLC page 825, such as bit lines 821c, 821f, . . . , to 821n.

Figure 34A:
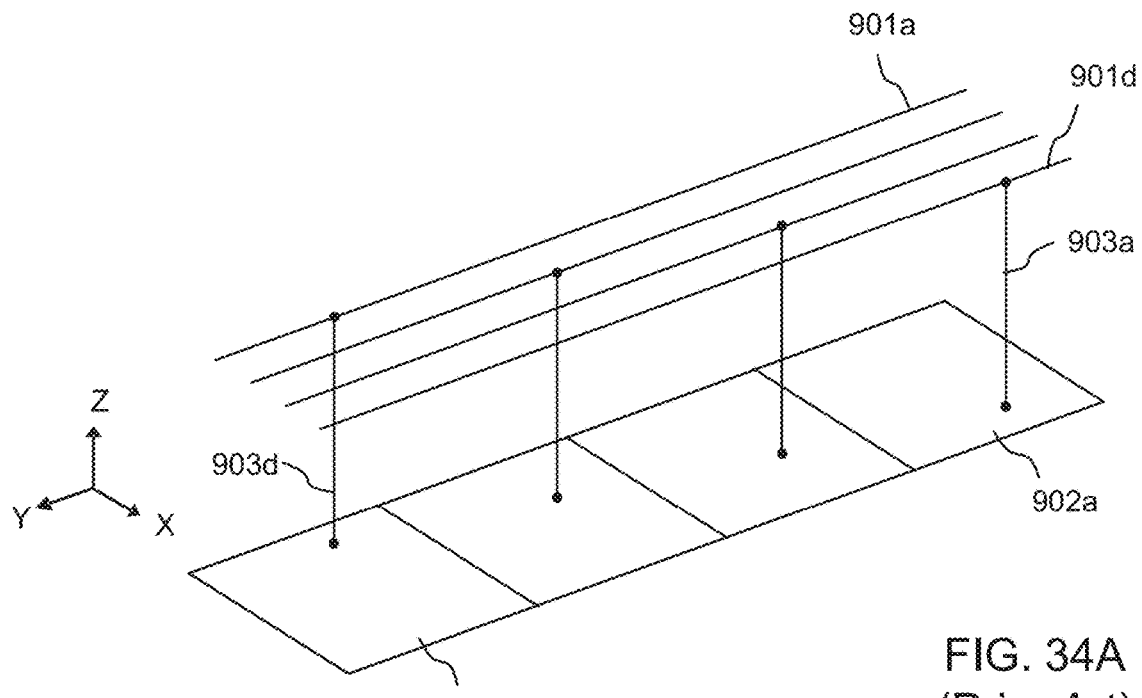
FIG. 34A shows a conventional 3D NAND flash memory's page buffers and bit line connections.

FIG. 34A shows a conventional 3D NAND flash memory's page buffers and bit line connections. Metal bit lines 901a to 901d run on top of the 3D cell array. The 3D cell is not shown in FIG. 34A but a detailed 3D array structure can be seen in FIG. 10D, FIG. 10E, and FIG. 17C. Page buffer circuits 902a to 902d are located under the 3D array. The bit lines 901a to 901d are connected the page buffers 902a to 902d through the vertical contacts 903a to 903d.

Although the embodiment in FIG. 34A shows the pitch of the page buffers 902a to 902d in the X-direction is four times that of the bit lines 901a to 901d, the figure is just an example for demonstration purpose only. The real proportion is determined by the actual layout size and technology. For example, if the X-pitch of the page buffers 902a to 902d is 32 times that of the bit lines 901a to 901d, the number of the page buffers along the Y direction will become 32, instead of 4.

Figure 34B:
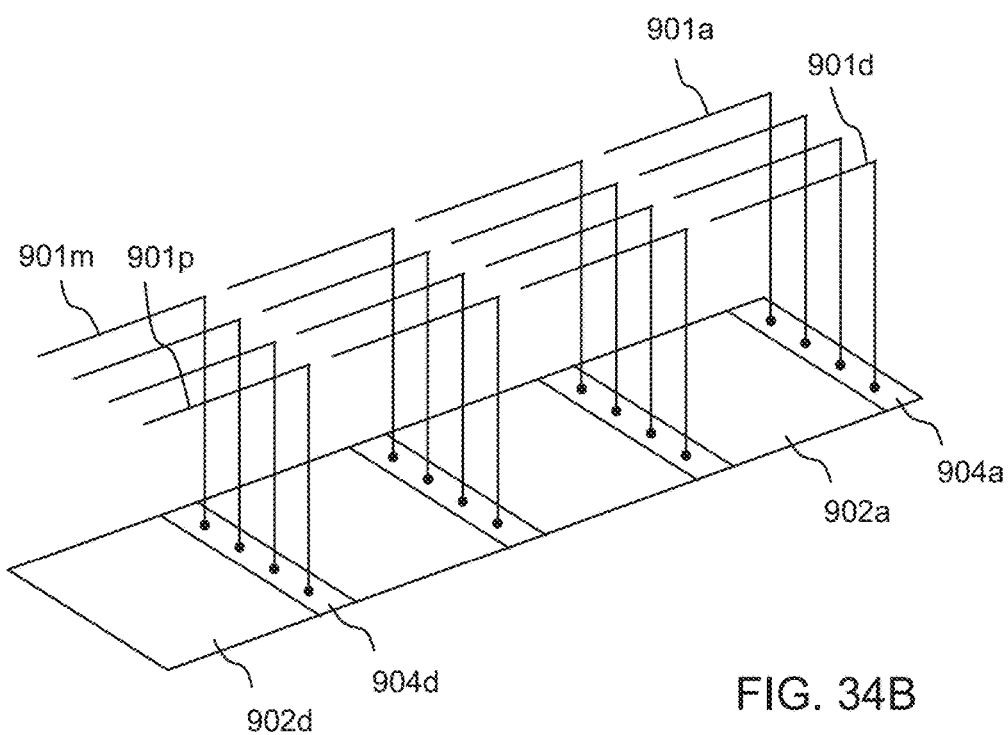
FIGS. 34B-C show a 3D NAND flash memory's page buffers and bit line connections in accordance with the invention.

FIG. 34B shows an embodiment of page buffers and bit line connections in accordance with the invention. This embodiment shows bit line select gates 904a to 904d. The bit line select gates 904a connect the bit lines 901a to 901d to the page buffer 902a. The bit line select gates 904d connect the bit lines 901m to 901p to the page buffer 902d. By using this structure, the number of the bit lines that may be simultaneously read and write are increased 4 times. This increases the data throughput for 4 times.

Moreover, because the bit line length is reduced to ¼, the bit line capacitance is reduced to ¼. Thus, the bit line discharging time, which dominates the read time for read operations and program-verify operations, may be roughly reduced to about ¼. If the X-pitch of the page buffer is 32 times of that the bit lines, the data throughput may be increased by 32 times. The read and program-verify time may be roughly reduced to about 1/32.

Figures 34C, 35:
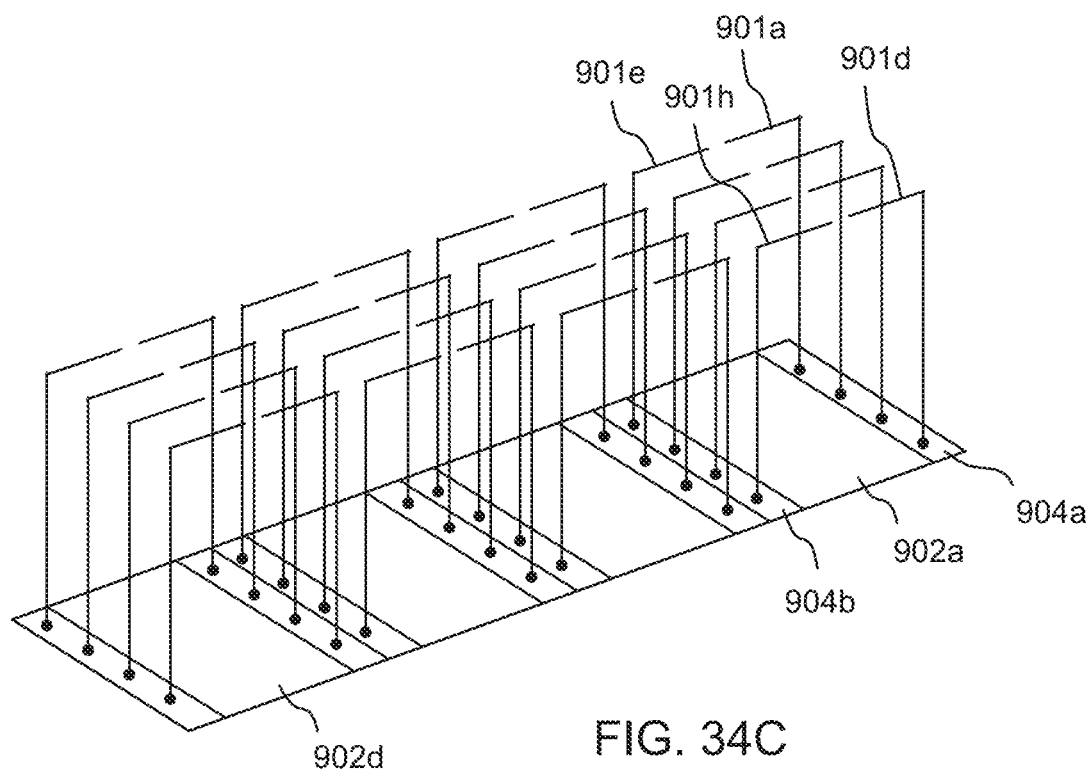
FIG. 35 shows an exemplary Vt distribution of a triple-level cell TLC.

FIG. 34C shows another embodiment of page buffer and bit line connections for the embodiment shown in FIG. 33A-C. In this embodiment, the first group of bit lines 901a to 901d are connected to the page buffer 902a through the bit line select gates 904a. The second group of bit lines 901e to 901h are connected to the page buffer 902a through the bit line select gates 904b. This embodiment's bit line length is ½ that of the embodiment shown in FIG. 34B.

FIG. 35 shows an exemplary Vt distribution of a triple-level cell TLC. The cells have eight Vt levels, Vt0 to Vt7, to represent three bits data, D0 to D2 as shown. The D0 to D2 bits of a cell can belong to three pages, Page 0 to Page 2. The data of these three pages can be read independently.

As illustrated in FIG. 35, the dark bars indicate the word line voltage levels that are utilized to read each bit. To read the cells' D0 bit, the selected word line is supplied with voltage VR1 and VR5 sequentially. The unselected word lines are supplied with a pass voltage, VPAS, which is higher than Vt7, to turn on all the other unselected cells on the NAND cell string.

When applying VR1, the Vt0 cells will be turned on and the Vt1 to Vt7 cells will be turned off. When applying VR5, the Vt0 to Vt4 cells will be turned on and the Vt5 to Vt7 cells will be turned off. A control logic then performs an exclusive OR (XOR) function on the two data read out by VR1 and VR5 to determine the D0 bit data.

Similarly, to read D1 bit, the selected word line is supplied with voltage VR2, VR4, and VR6 sequentially. The control logic performs the XOR function to the three data read out by VR2, VR4, and VR6 to determine the D1 bit data.

Similarly, to read D2 bit, the selected word line is supplied with the voltage VR3 and VR7 sequentially. The control logic performs the XOR function on the two data read out by VR3 and VR7 to determine the D2 bit data.

In an embodiment, the page buffer has three data latches to store the two data read out for D0 and D2 bits, and three data read out for D1 bit. Thus, the data stored in the data latches can be used to perform XOR functions to generate the final data of D0 to D2 bits.

The data assignment shown in FIG. 35 is exemplary and not limiting since there are many other ways to assign D0 to D2 bits. The various embodiments can be adjusted or modified to apply to virtually any data assignment. In an embodiment, the TLC cells can be read by using one data latch in the page buffer.

Figure 36:
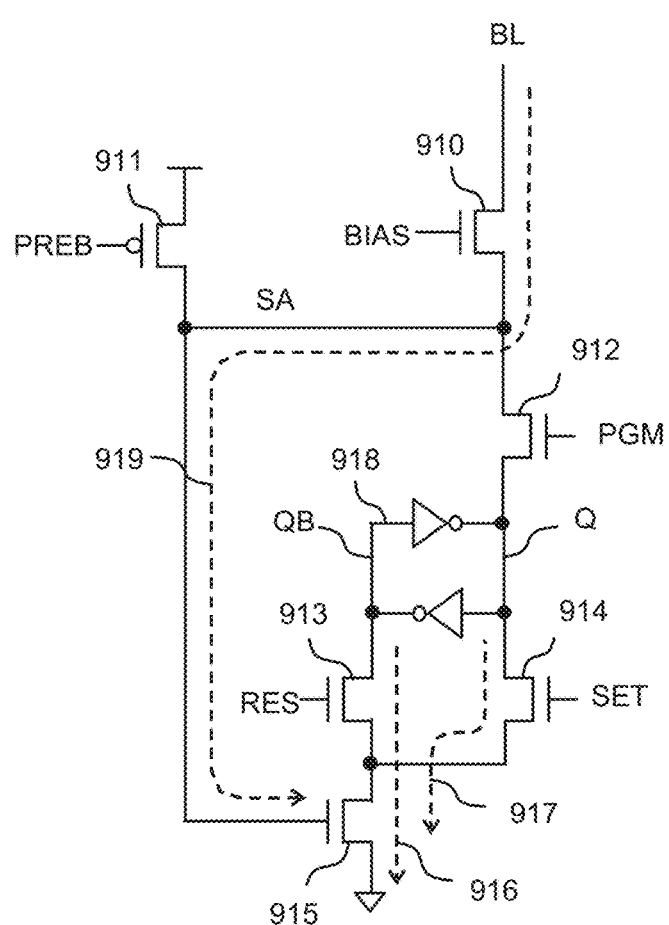
FIG. 36 shows an embodiment of a single latch page buffer circuit in accordance with the invention.

FIG. 36 shows an embodiment of a single bit latch page buffer circuit in accordance with the invention. A data latch 918 (comprising two inverters having Q and QB nodes) stores the data in the Q node. A bias device 910 is connected to the bit line BL. A pre-charge device 911 is connected to the sensing node SA. Also included is a latch pass gate 912. Reset 913 and set 914 devices are provided for the latch 918. The gate of the sensing device 915 is connected to the SA node.

Figure 37A:
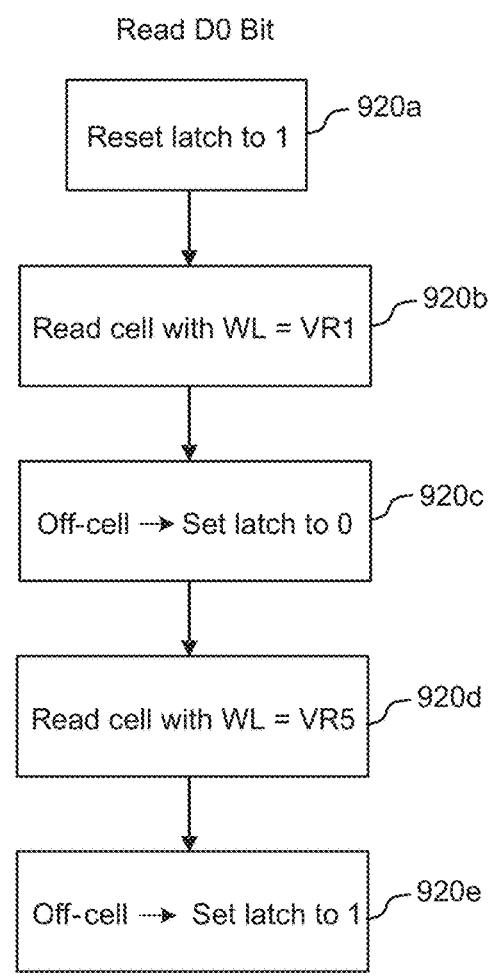
Figure 37D:
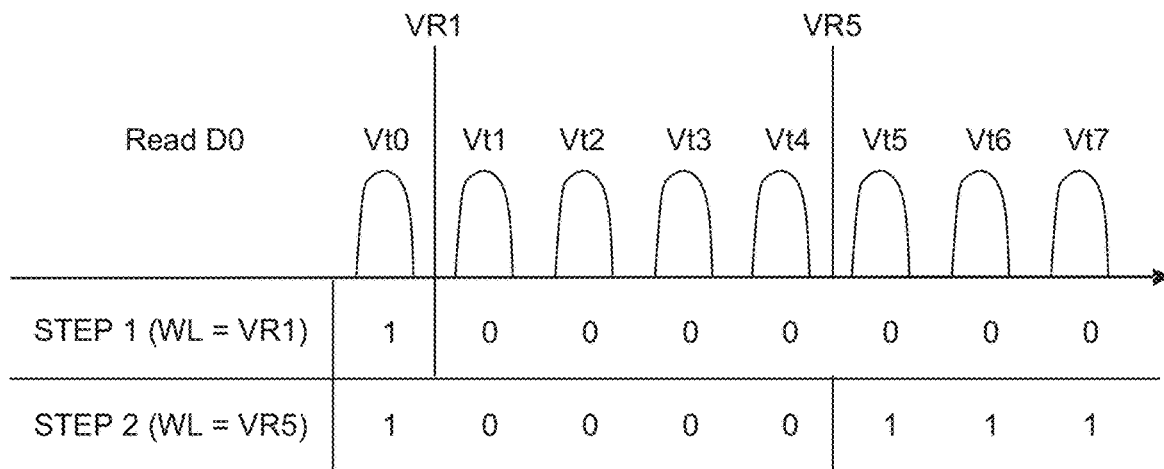
FIGS. 37D-E show exemplary diagrams associated with the operation of the circuit shown in FIG. 36.

FIG. 37A shows a method for reading a D0 bit using the single bit latch page buffer shown in FIG. 36. In various embodiments, a control unit or state machine located on the same integrated circuit as the memory array generates the various control signals shown in FIG. 36 and FIG. 41A. In step 920a, the Q node of the data latch 918 is reset to data 1 (VDD) by turning on devices 913 and 915, as shown by dashed line 916. The sensing device 915 is turned on by turning on pre-charge device 911 to pull up SA node to VDD. In step 920b, the selected word line is supplied with VR1 to read the cell coupled to the bit line (BL). If the cell is an off-cell, the sensing node SA will be pulled high and will turn on the sensing device 915 as shown by dashed line 919. In step 920c, a SET pulse will be applied to the set device 914 to set (or flip) the Q node of the latch to data 0 (0V), as shown by dashed line 917. If the cell is an on-cell, the sensing node SA will be pulled low and will turn off the sensing device 915 as shown by dashed line 919, thus the Q node of the latch will remain at data 1 (VDD). Referring to FIG. 37D, as shown in STEP 1, when applying voltage VR1 to the select word line, Vt0 cells will be turned on, and Vt1 to Vt7 cells will be turned off. Therefore, the previously described operations will set the latch for Vt0 cell to data 1 and Vt1 to Vt7 cells to data 0.

Referring again to FIG. 37A, in step 920d, the selected word line is supplied with VR5 to read the cell. If the cell is an off-cell, the sensing node SA will be pulled high and will turn on the sensing device 915. A RES pulse will be applied to the reset device 913 to reset (or flip) the Q node of the latch to data 1 (VDD), as shown in step 920e. If the cell is an on-cell, the sensing node SA will be pulled low and will turn off the sensing device 915, then the data of the Q node will remain unchanged. Referring again to FIG. 37D, as shown in STEP 2, when applying voltage VR5 to the select word line, Vt0 to Vt4 cells will be turned on, and Vt5 to Vt7 cells will be turned off. Therefore, the previously described operation will reset the latch for Vt5 to Vt7 cells to data 1, while the data for Vt0 to Vt4 remain unchanged. As a result, the D0 bit data shown in FIG. 35 is successfully read by using a single data latch.

Figure 37E:
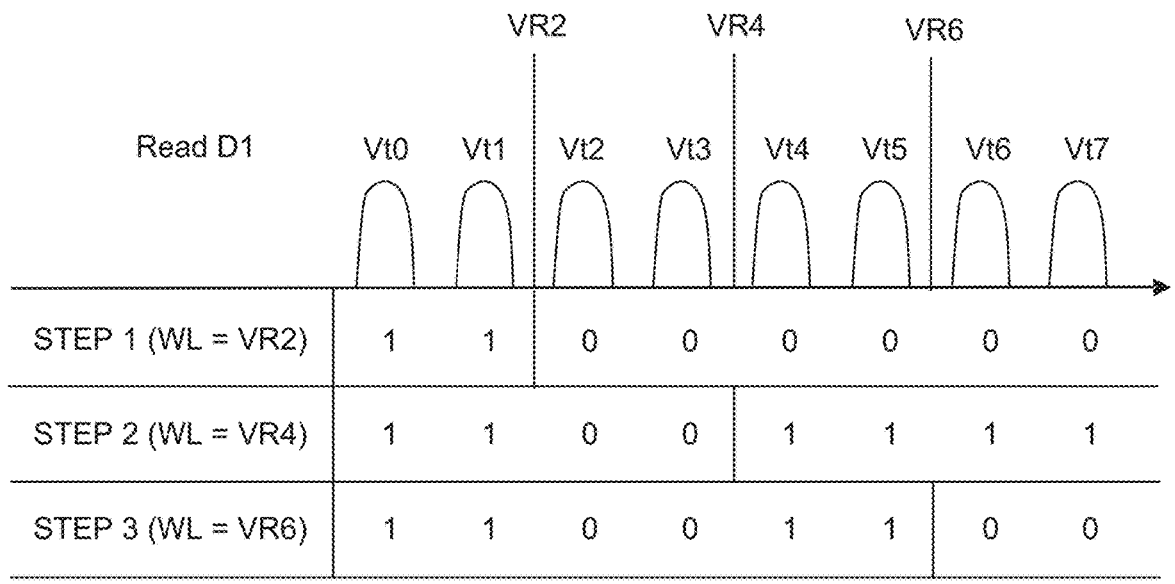

FIG. 37B shows an exemplary method for reading a D1 bit using the single latch page buffer shown in FIG. 36. In step 921a, the Q node of the data latch 918 is reset to data 1 (VDD) by turning on devices 913 and 915, as shown by dashed line 916. In step 921b, the selected word line is supplied with VR2 to read the cell. If the cell is an off-cell, the sensing node SA will be pulled high and will turn on the sensing device 915. A SET pulse will be applied to the set device 914 to set the Q node of the latch to data 0 (0V), as shown in step 921c. If the cell is an on-cell, the sensing node SA will be pulled low and will turn off the sensing device 915, thus the Q node of the latch will remain at data 1 (VDD). Referring to FIG. 37E, as shown in STEP 1, when applying VR2 to the select word line, Vt0 and Vt1 cells will be turned on, and Vt2 to Vt7 cells will be turned off. Therefore, the previously described operations will set the latch for Vt0 and Vt1 cells to data 1 and Vt2 to Vt7 cells to data 0.

Referring again to FIG. 37B, in step 921d, the selected word line is supplied with VR4 to read the cell. If the cell is an off-cell, the sensing node SA will be pulled high and will turn on the sensing device 915. A RES pulse will be applied to the reset device 913 to reset the Q node of the latch to data 1 (VDD), as shown in step 921e. If the cell is an on-cell, the sensing node SA will be pulled low and will turn off the sensing device 915, then the data of the Q node will remain unchanged. Referring again to FIG. 37E, as shown in STEP 2, when applying VR4 to the select word line, Vt0 to Vt3 cells will be turned on, and Vt4 to Vt7 cells will be turned off. Therefore, the previously described operations will reset the latch for Vt4 to Vt7 cells to data 1, while the data for Vt0 to Vt4 remain unchanged.

Referring again to FIG. 37B, in step 921f, the selected word line is applied with VR6 to read the cell. If the cell is an off-cell, the sensing node SA will be pulled high and turn on the sensing device 915. A SET pulse will be applied to the set device 914 to set the Q node of the latch to data 0 (0V), as shown in step 921g. If the cell is an on-cell, the sensing node SA will be pulled low and turn off the sensing device 915, then the data of the Q node will remain unchanged. Referring to FIG. 37E, as shown in STEP 3, when applying VR6 to the select word line, Vt0 to Vt5 cells will be turned on, and Vt6 to Vt7 cells will be turned off. Therefore, the previous described operation will reset the latch for Vt6 to Vt7 cells to data 0, while the data for Vt0 to Vt5 remain unchanged. As a result, the D1 bit data shown in FIG. 35 is successfully read by using single data latch.

FIG. 37C shows an exemplary method for reading a D2 bit using the single latch page buffer shown in FIG. 36. This operation is basically the same as FIG. 37A except that the word line voltage applied in steps 922b and 922d are VR3 and VR7, respectively. For simplicity, the description can be found with reference to FIG. 37A and will not be repeated here.

Figure 38A:
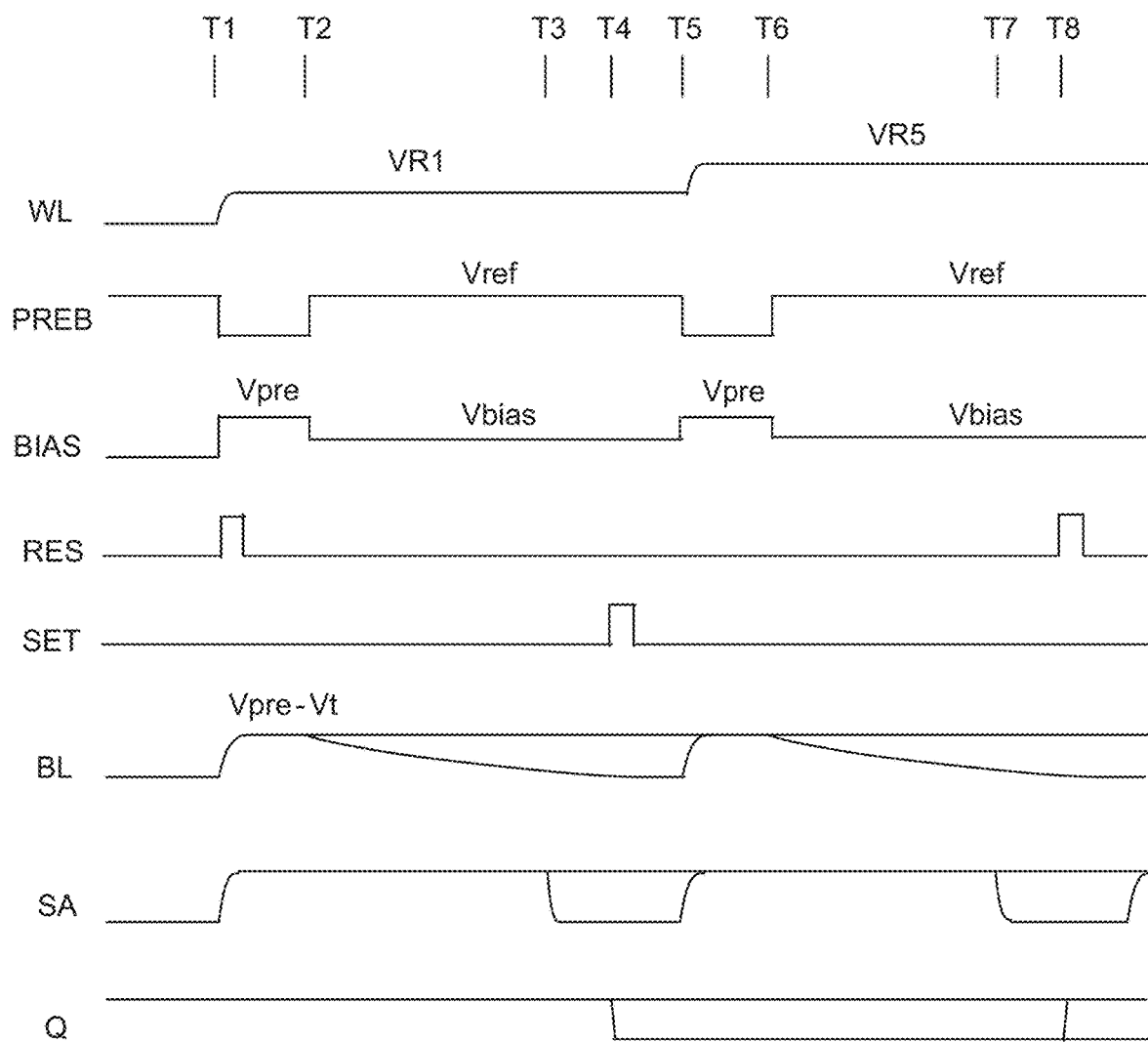
FIGS. 38A-B shows an embodiment of waveforms that illustrate signals for reading a bit using the circuit shown in FIG. 36.

FIG. 38A shows an embodiment of waveforms that illustrate signals for reading the D0 bit using the single latch page buffer circuit shown in FIG. 36 in accordance with the invention. The waveforms from time T1 to T5 illustrate the operation of the steps 920a to 920c shown in FIG. 37A. The waveforms from time T5 to T8 illustrate the operation of the steps 920d and 920e in FIG. 37A.

At time T1, the PREB signal goes low to turn on the pre-charge device 911. This will pull high the SA node and turn on the sensing device 915. The RES pulse goes high to reset the Q node of the latch to data 1 (VDD). Meanwhile, the BIAS signal goes high to VDD or a voltage Vpre to pre-charge the bit line, BL, to VDD-Vt or Vpre-Vt. Vt is the threshold voltage of the bias device 910.

At time T2, the PREB signal goes high to VDD to turn off the pre-charge device 911 or a voltage Vref to provide a loading current from the pre-charge device 911. The loading current may be lower than the on-cell's current. The selected word line, WL, is supplied with the first read voltage VR1. This will turn on Vt0 cell and start to discharge the bit line, BL, as shown. The Vt1 to Vt7 cells will remain off, thus their bit lines will not be discharged. The BIAS voltage is lower to a voltage Vbias. This will turn off the bias device 910.

When the bit line is discharged below Vbias-Vt, the bias device 910 will be turned on to discharge the SA node, as shown in T3 time. In another embodiment, the BIAS signal goes to 0V at T2 time to turn off the bias device 910 and goes to Vbias or VDD at T3 time to turn on the bias device 910. This will discharge the SA node to the BL voltage. In another embodiment, the voltage Vbias–Vt is designed to be lower than the threshold voltage of the sensing device 915. Thus, for on-cell, the sensing device 915 will be turned off. In contrast, for off-cell, the BL and SA node will remain at high, thus the sensing device 915 is turned on. At time T4, a SET pulse is applied to the set device 914 to set the off-cells' data latch, Q, to data 0 (0V). The on-cells' data latch will remain at data 1 (VDD). The steps 920a to 920c shown in FIG. 37A are completed.

At time T5, the PREB signal goes low again to turn on the pre-charge device 911. The BIAS signal goes to VDD or Vpre to pre-charge the bit line to VDD-Vt or Vpre-Vt. At time T6, the PREB signal goes high to VDD to turn off the pre-charge device 911 or a voltage Vref to provide a loading current from the charging device 911. The selected word line, WL, is supplied with the second read voltage VR5. This will turn on Vt0 to Vt4 cells and start to discharge the bit line. The Vt5 to Vt7 cells will remain off, thus their bit line will not be discharged.

When the bit line is discharged below Vbias-Vt, the bias device 910 will be turned on to discharge the SA node, as shown at time T7. In another embodiment, the BIAS signal goes to 0V at time T6 to turn off the bias device 910 and goes to Vbias or VDD at time T7 to turn on the bias device 910. This will discharge the SA node to the BL voltage and turn off the sensing device 915. For off-cells, both BL and SA node will remain high, thus the device 915 is turned on. At time T8, a RES pulse is applied to the reset device 913 to reset the off-cells' data latch, Q, to data 1 (VDD). The on-cells' data latch will remain unchanged. The steps 920*d* to 920*e* shown in FIG. 37A are completed.

Figure 38B:
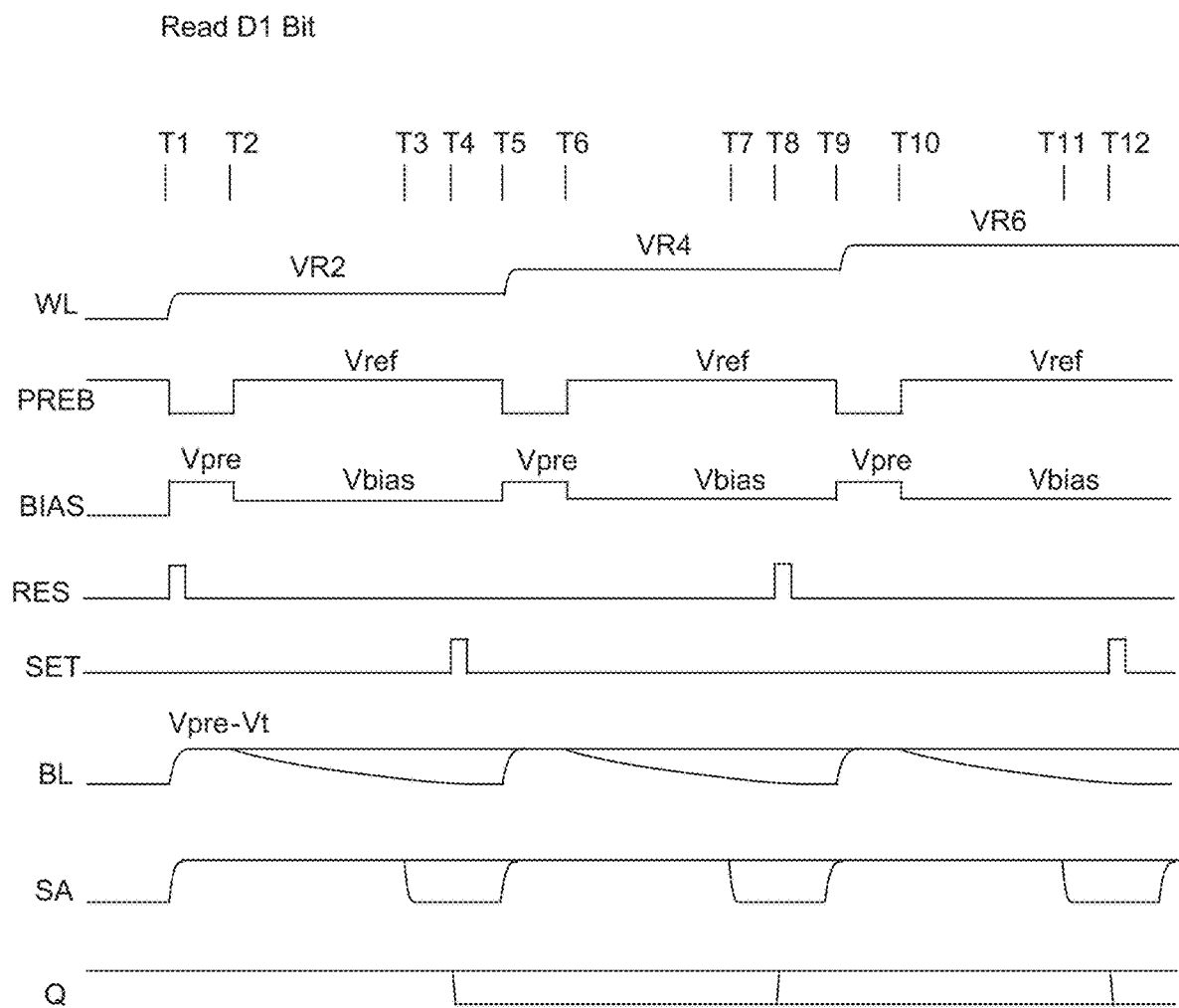

FIG. 38B an embodiment of waveforms that illustrate signals for reading a D1 bit using the single latch page buffer circuit shown in FIG. 36. The operation is similar to reading the D0 bit except that the selected word line is sequentially supplied with three voltages, VR2, VR4, and VR6. During the time interval T1 to T5, the steps 921*a* to 921*c* in FIG. 37B are performed. During the time interval T5 to T9, the steps 921*d* and 921*e* in FIG. 37B are performed. During the time interval T9 to T12, the steps 921*f* and 921*g* in FIG. 37B are performed.

Figure 39:
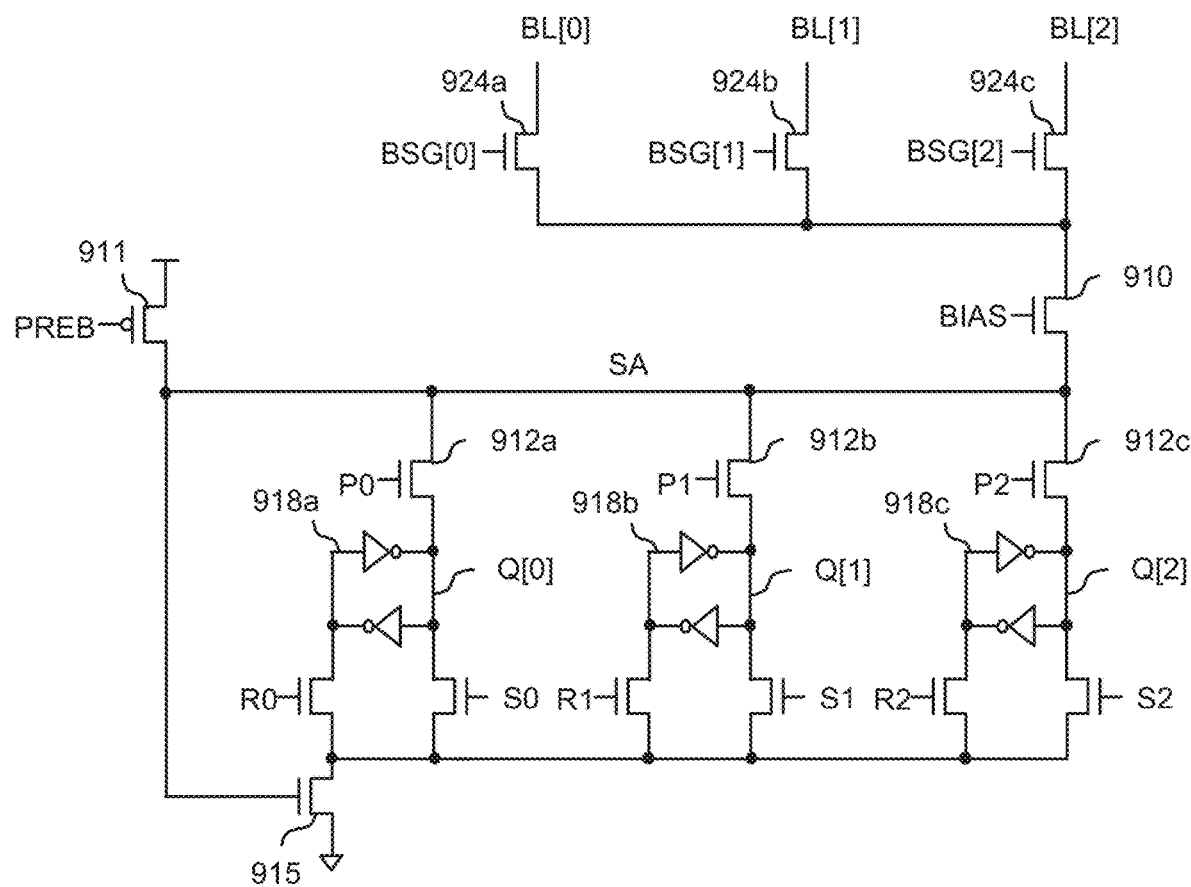
FIG. 39 shows another embodiment of a page buffer circuit in accordance with the invention.

FIG. 39 shows another embodiment of a page buffer circuit in accordance with the invention. The illustrated page buffer contains three data latches 918*a* to 918*c*. The three data latches store three data Q[0] to Q[2]. The data latches are reset and set by signals R0 to R2 and S0 to S2, respectively. The page buffer circuit is connected to three bit lines, BL[0] to BL[2], through bit line select gates 924*a* to 924*c*.

During programming, the signals P0 to P2 and BSG[0] to BSG[2] are sequentially turned on to apply the program data from Q[0] to Q[2] to the bit lines BL[0] to BL[2], respectively.

During a read operation, the signals BSG[0] to BSG[2] are sequentially turned on to connect the bit lines BL[0] to BL[2] to the sensing node SA, respectively. The sensing node SA will turn on or off the device 915 depending on the voltages of BL[0] to BL[2]. The reset and set pulses R0 to R2 and S0 to S2 will be applied to reset or set the corresponded data latches, respectively.

Figure 40:
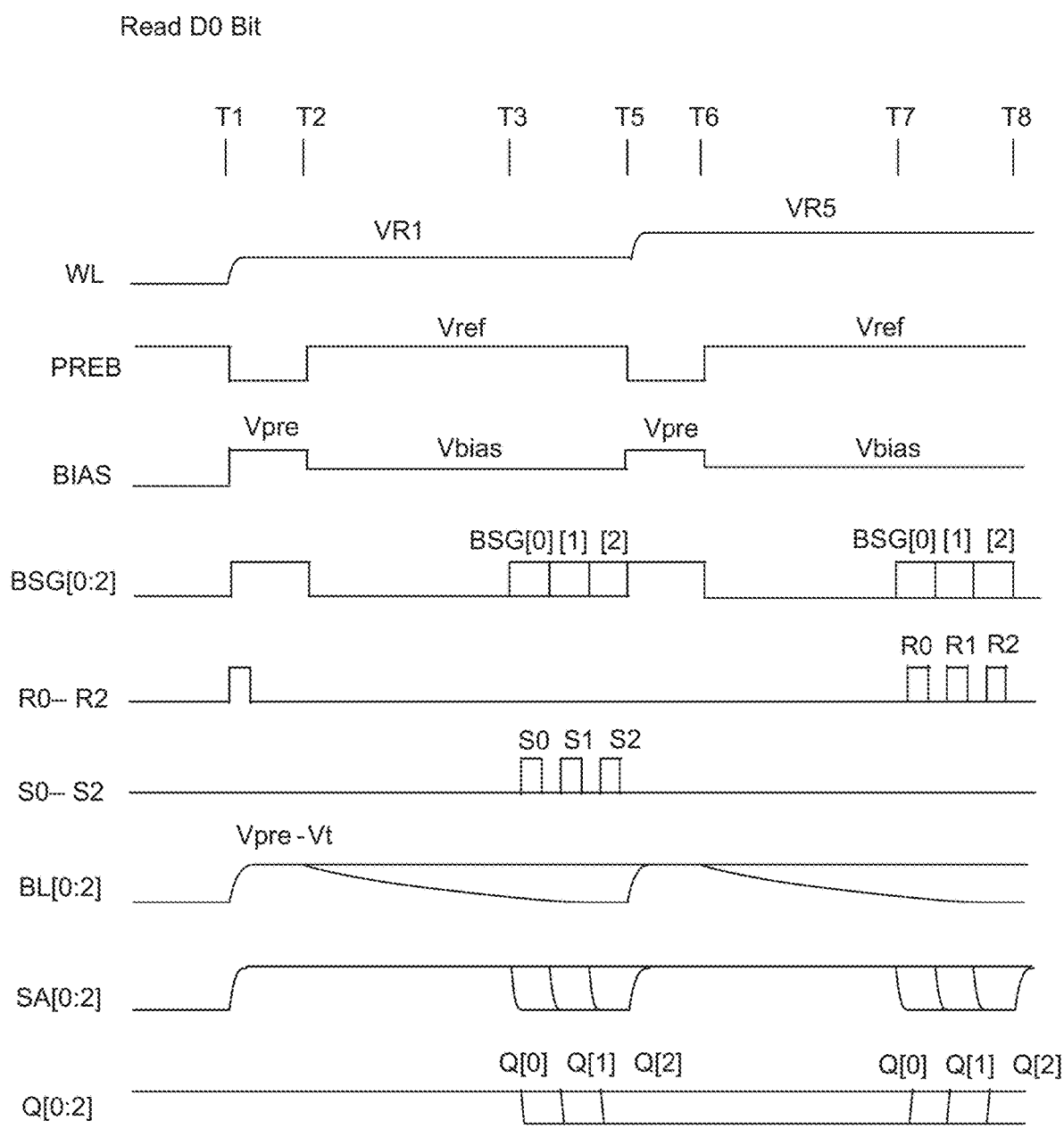
FIG. 40 shows an embodiment of waveforms that illustrate signals for reading a bit using the circuit shown in FIG. 39.

FIG. 40 shows an embodiment of waveforms that illustrate signals for reading a D0 bit from bit lines BL[0] to BL[2] using the page buffer circuit shown in FIG. 39. The operation is similar to FIG. 38A except that during the time T1 to T2, BSG[0] to BSG[2] are turned on together to pre-charge BL[0] to BL[2]. During the time T2 to T3, the selected word line is supplied with the first read voltage VR1. BSG[0] to BSG[2] are turned off to allow BL[0] to BL[2] to be simultaneously discharged by on-cells. During the time T3 to T5, BSG[0] to BSG[2] are sequentially turned on to connect BL[0] to BL[2] to the SA node, respectively. The corresponded set pulse S0 to S2 are applied to set the off-cells' data latches, Q[0] to Q[2], to data 0 (0V). As a result, the steps 920*a* to 920*c* shown in FIG. 37A are completed.

From the time T5 to T6, BSG[0] to BSG[2] are turned on to pre-charge BL[0] to BL[2] again. During the time T6 to T7, the selected word line is supplied with the second read voltage VR5. BSG[0] to BSG[2] are turned off to allow BL[0] to BL[2] to be simultaneously discharged by on-cells. During the time T7 to T8, BSG[0] to BSG[2] are sequentially turned on to connect BL[0] to BL[2] to the SA node, respectively. The corresponded reset pulse R0 to R2 are applied to reset the off-cells' data latches, Q[0] to Q[2], to data 1 (VDD). As a result, the steps 920*d* and 920*e* shown in FIG. 37A are completed.

In an embodiment, operations similar to those shown in FIG. 40 may be applied to read D1 and D2 bits from BL[0] to BL[2]. When reading the D1 bit, the selected word line may be sequentially supplied with three voltages, VR2, VR4, and VR6, as shown in FIG. 38B. When reading D2 bit, the operation is similar to FIG. 40 except that the selected word line is sequentially supplied with voltages VR3 and VR7.

By using the novel methods and apparatus described herein, the number of the data latches in the page buffer may be reduced to ⅓ while keeping the same data throughput. This allows the array to have more 'planes' to further increase the data throughput, and reduce the read latency due to shorter bit line length that causes shorter bit line discharging time.

It should be noted that although the embodiments use TLC for example, the same approach may be applied to any number of multiple-level cells, such as MLS, QLC, etc. For example, for MLC, the page buffer may contain two data latches to read from two bit lines simultaneously. For QLC, the page buffer may contain four data latches to read data from four bit lines simultaneously.

Figure 41A:
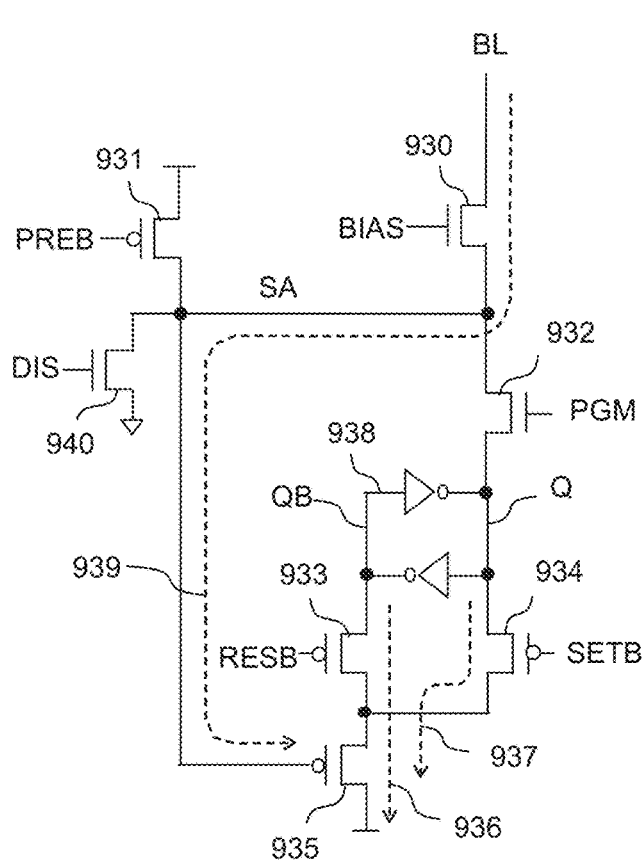
FIG. 41A shows an exemplary alternative embodiment of the page buffer circuit shown in FIG. 36 implemented using complementary logic.

FIG. 41A shows an exemplary alternative embodiment of the page buffer circuit shown in FIG. 36 implemented using complementary logic. In this embodiment, the set and reset devices 933, 934, and 935 are changed from NMOS to PMOS transistors, and the power level connected to device 935 is changed from 0V to VDD. In this way, the operation of the circuit will be changed to using an on-cell condition rather than an off-cell condition to flip the latch 938.

Figure 41B:
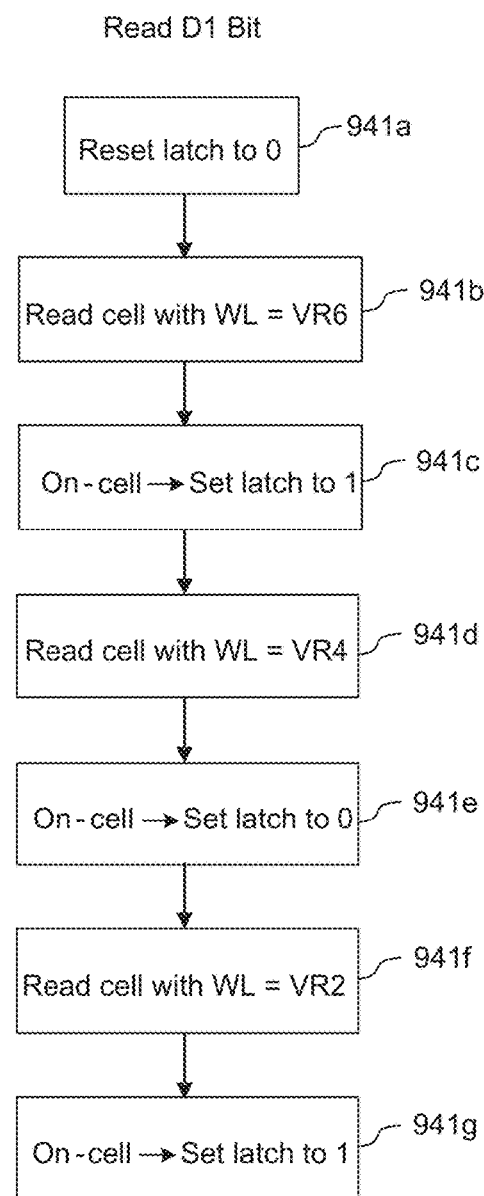
FIGS. 41B-D show exemplary method and diagrams associated with the operation of the page buffer circuit shown in FIG. 41A.
Figure 41C:
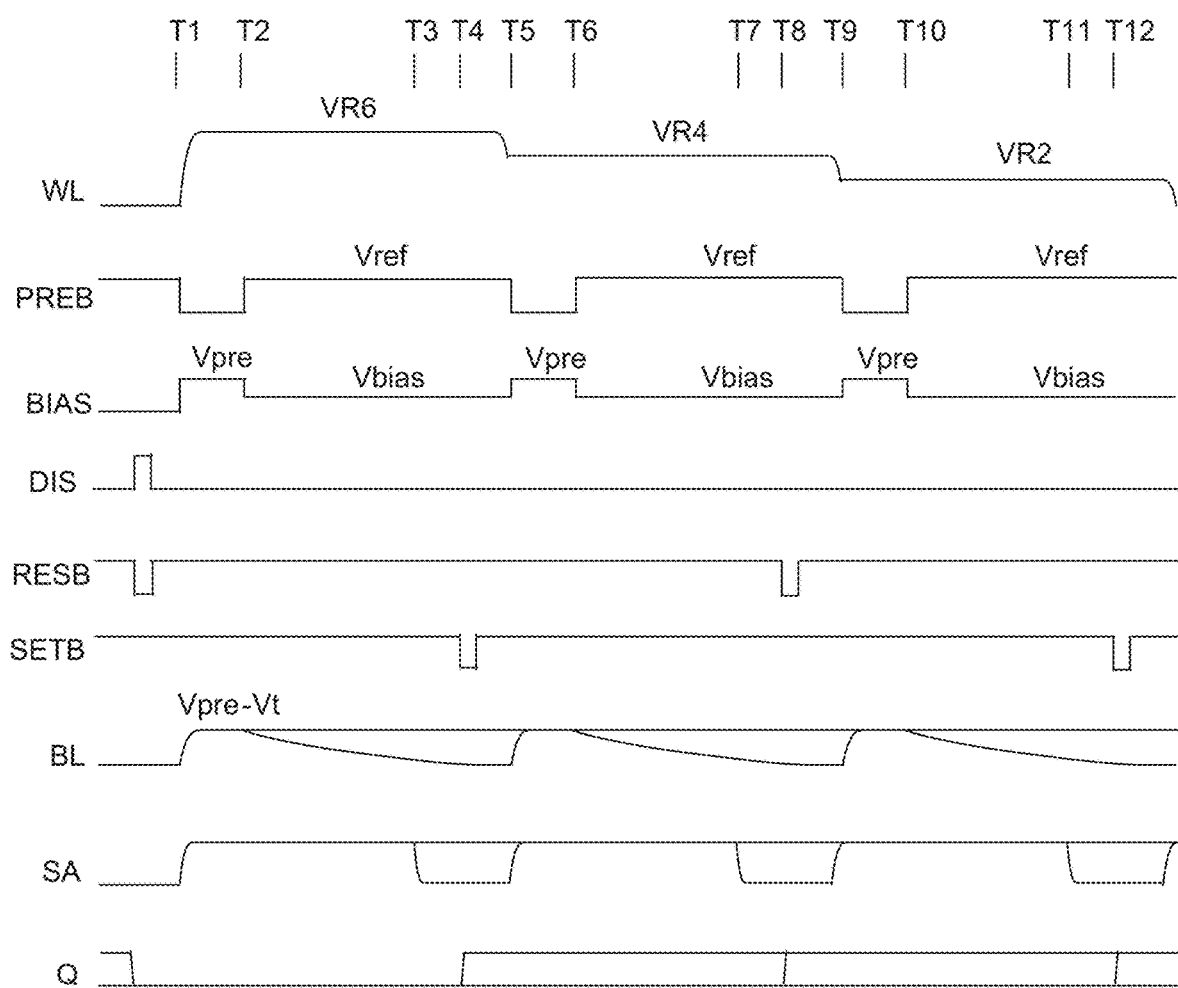
Figure 41D:
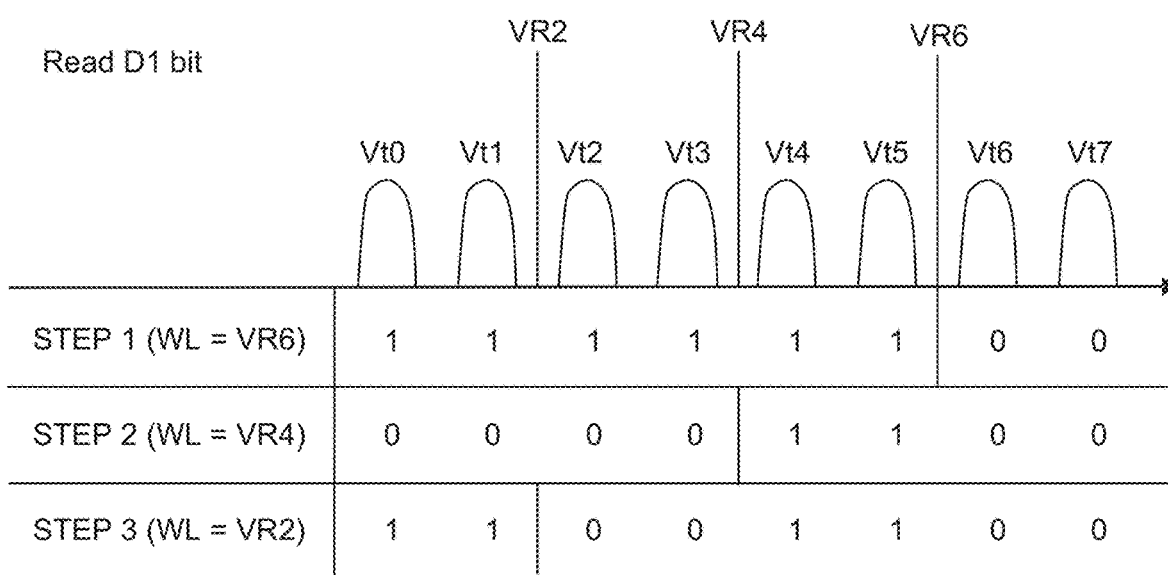

FIGS. 41B-D show exemplary method and diagrams associated with the operation of the page buffer circuit shown in FIG. 41A.

FIG. 41B shows an exemplary method for reading the D1 bit using the page buffer circuit shown in FIG. 41A. In this embodiment, the selected word line voltage is changed from ramping-up to ramping-down from VR6, VR4, to VR2 as shown in steps 941*b*, 941*d*, and 941*f*.

In step 941*a*, the latch is reset to data 0 by turning in devices 933 and 940. The device 940 will pull the SA node to 0V to turn on the device 935 to pull node QB to VDD.

In step 941*b*, the selected word line is supplied with the read voltage VR6. If the cell is an on-cell, it will discharge the bit line and the sensing node SA as shown by dashed line 939. When the sensing node SA is discharged below VDD-Vt, it will turn on the device 935.

In step 941*c*, a SETB pulse is applied to the device 934 to set the Q node of the latch to data 1 (VDD). If the cell is an off-cell, the sensing node SA will be pulled high to VDD, which turns off the device 935, and thus the Q node of the latch will remain at data 0 (0V).

Referring to FIG. 41D, as shown in STEP 1, when applying VR6 to the select word line, Vt0 to Vt5 cells will be turned on, and Vt6 to Vt7 cells will be turned off. Therefore, the data of the latch for Vt0 to Vt5 will be set to 1, and the data of the latch for Vt6 and Vt7 will remain at 0.

In step 941*d*, the selected word line is supplied with VR4. The on-cells will discharge the bit line and sensing node SA to below VDD-Vt to turn on device 935, while the off-cells' sensing node SA will be pulled up to VDD to turn off device 935.

In step 941*e*, a RESB pulse is applied to the device 933 to reset the on-cells' Q node of the latch to data 0 (0V), while off-cells' Q node of the latch remains unchanged.

Referring to FIG. 41D, as shown in STEP 2, when applying VR4 to the select word line, Vt0 to Vt3 cells will be turned on, and Vt4 to Vt7 cells will be turned off. Therefore, the data of the latch for Vt0 to Vt3 will be set to 0, and the data of the latch for Vt4 to Vt7 will remain unchanged.

In step 941f, the selected word line is supplied with VR2. The on-cells will discharge the bit line and sensing node SA to below VDD-Vt to turn on device 935, while the off-cells' sensing node SA will be pulled up to VDD to turn off device 935.

In step 941g, a SETB pulse is applied to the device 934 to set the on-cells' Q node of the latch to data 1 (VDD), while off-cells' Q node of the latch remains unchanged.

Referring to FIG. 41D, as shown in STEP 3, when applying VR2 to the select word line, Vt0 and Vt1 cells will be turned on, and Vt2 to Vt7 cells will be turned off. Therefore, the data of the latch for Vt0 and Vt1 will be set to 1, and the data of the latch for Vt4 to Vt7 will remain unchanged.

As a result, the D1 data shown in FIG. 35 is successfully read by using a single data latch. Moreover, similar operations can be used to read the D0 and D2 bits as well. For simplicity, the detailed operation for reading D0 and D2 bits are not repeated here.

FIG. 41C shows a waveform diagram for reading the D1 bit for use in this embodiment with the circuit of FIG. 41A. The waveform in FIG. 41C is similar to the waveform shown in FIG. 38B except that the word line voltage is ramped down from VR6, VR4, to VR2 rather than ramped up, and the data latch is initially reset to data 0 (0V) rather than data 1 (VDD). Also, a DIS signal is shown that controls the device 940 in FIG. 41A. The page buffer circuit shown in FIG. 41A may be applied to implement the 3-bit data latch page buffer circuit, as shown in FIG. 39, and operated by using ramp-down instead of ramp-up word line voltages on the waveform shown in FIG. 40.

Figure 42A:
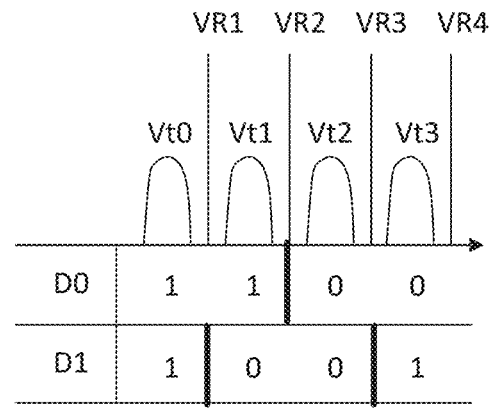
FIGS. 42A-F shows diagrams that provide word line voltages for reading various configurations of multiple level cells using a single bit latch in accordance with the invention.
Figure 42B:
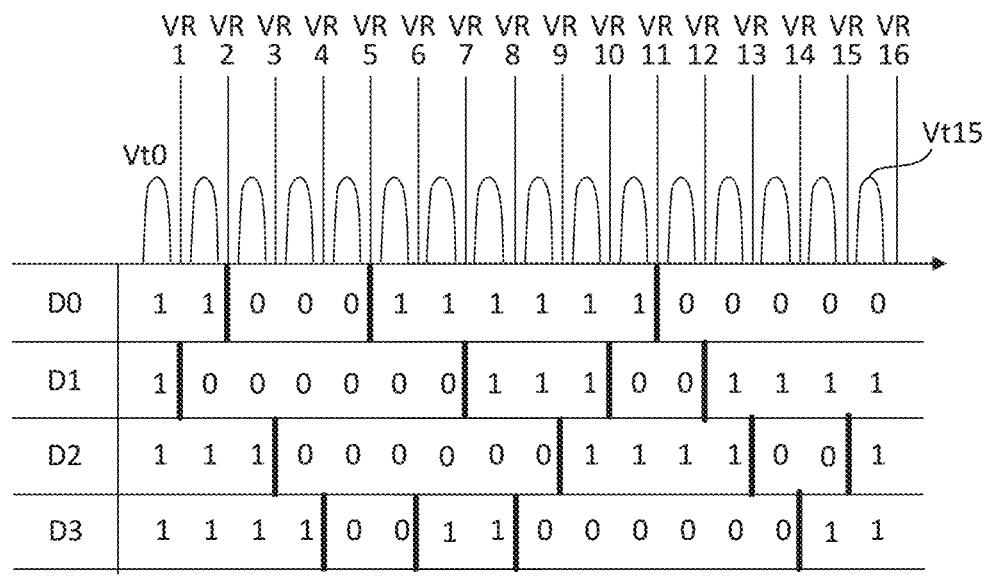

FIGS. 42A-B shows diagrams that provide word line voltage levels for reading various types of multiple level cells using a single bit latch in accordance with the invention. For example, FIG. 42A shows a diagram for reading a multilevel cell (MLC). FIG. 42B shows a diagram for reading a quad level cell (QLC). The dark bars indicate the word line voltage levels that are utilized to read each bit. For example, referring to FIG. 42A, to read D0, the word line voltage VR2 is used, and to read D1, the word line voltages VR1 and VR3 are used.

When reading data, the bits D0, D1, D2 are read independently. For example, if the system only needs to read the D2 data from a cell shown in FIG. 35, then the operations shown and described with reference to FIG. 37C are used to read the D2 data. The data for D0 and D1 are not read. Therefore, a generic process flow can be implemented to utilize the word line voltage levels shown to read any one or more of the data bits.

It should be noted that the data assignments for multiple-level cells is not limited to one configuration. Therefore, the read operations are configured according to the data assignment.

Figure 42C:
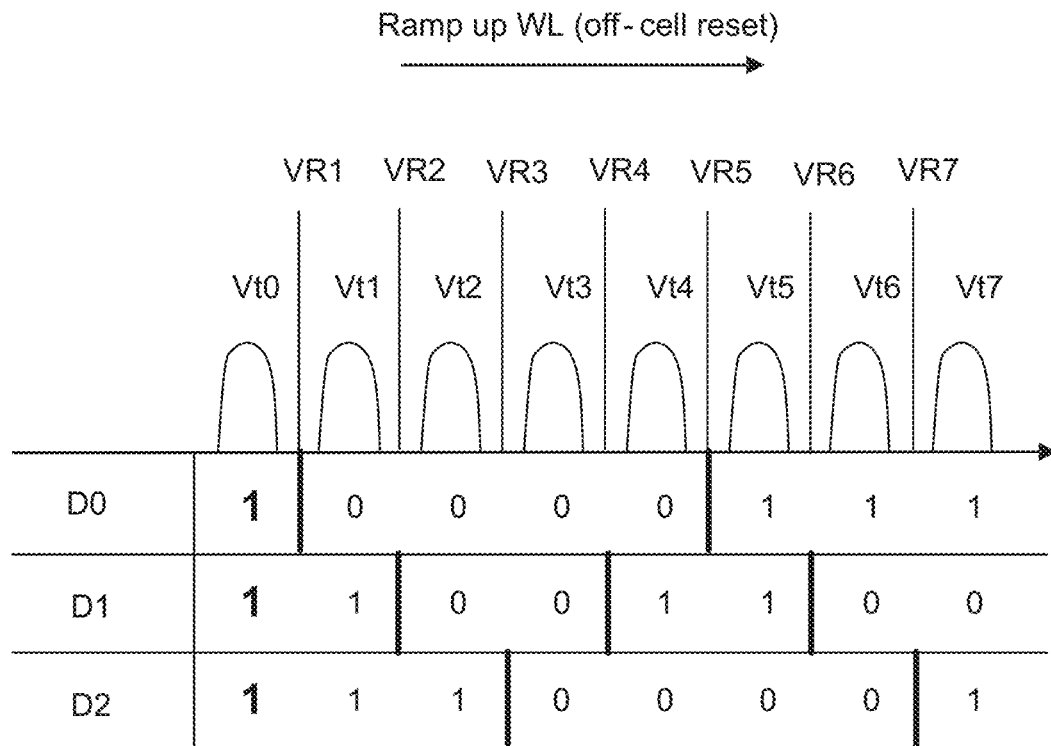

FIG. 42C-F show four exemplary configurations for assigning D0-D2 for TLC. Assume the page buffer circuit shown in FIG. 36 is used to implement the TLC read operation. In FIG. 42C shows a configuration where the D0-D1 data for Vt0 is assigned to 1. Therefore, the data can be read by setting the initial data of the latch 918 to 1, applying ramp-up word line voltages, and then for each word line voltage level, flipping the data of off-cells. The ramp-up word line voltages are VR3, VR7 for reading D0; VR2, VR4, VR6 for reading D1; and VR1, VR5 for reading D2.

Figure 42D:
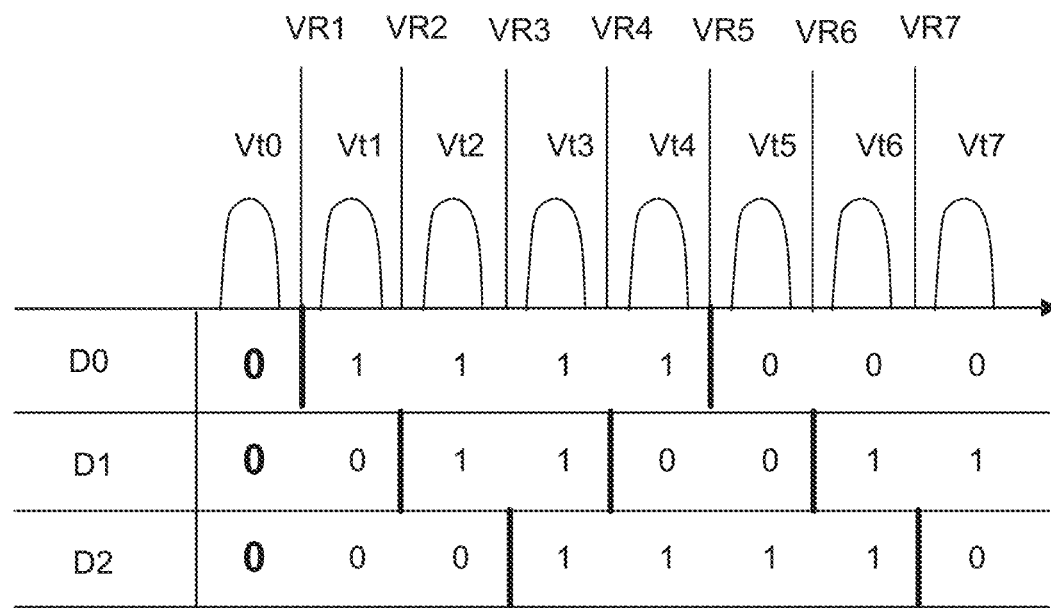

FIG. 42D shows a configuration where the D0-D1 data for Vt0 is assigned to 0. Therefore, the data can be read by setting initial data of the latch 918 to 0, applying ramp-up word line voltages, and then for each word line voltage level, flipping the data of off-cells. The ramp-up word line voltages are the same as FIG. 42C.

Figure 42E:
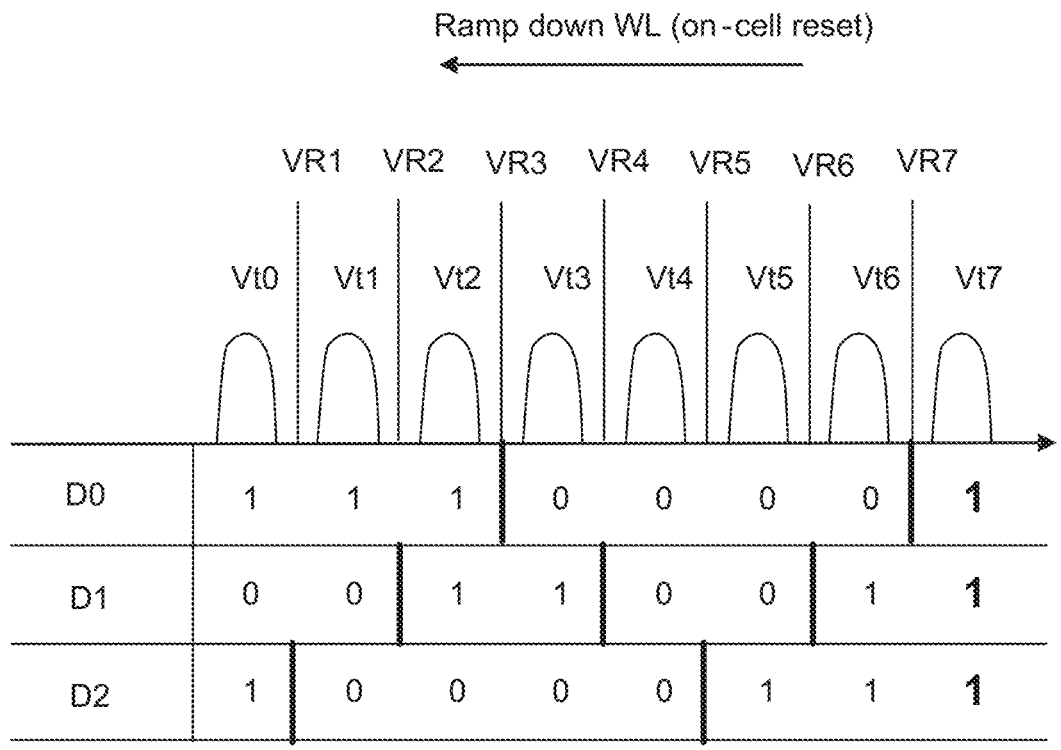

FIG. 42E shows another configuration where the D0-D1 data for Vt7 is assigned to 1. Therefore, the data can be read by setting initial data of the latch 918 to 1, applying ramp-down word line voltages, and then flipping the data of on-cells for each word line voltage level. The ramp-down word line voltages for reading D0 are VR7 and then VR3; for reading D1 are VR6, VR4, and then VR2; for reading D2 are VR5 and then VR1.

Figure 42F:
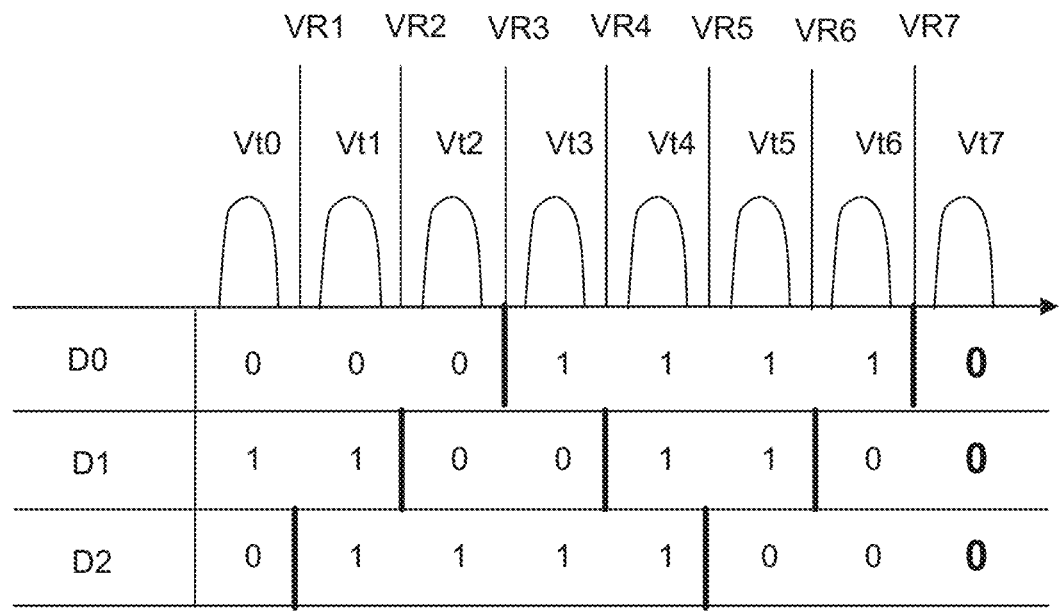

FIG. 42F shows a configuration where the D0-D1 data for Vt7 is assigned to 0. Therefore, the data can be read by setting initial data of the latch 918 to 0, applying ramp-down word line voltages, and then flipping the data of on-cells for each word line voltage level. The ramp-up word line voltages are the same as FIG. 42E.

Figure 43:
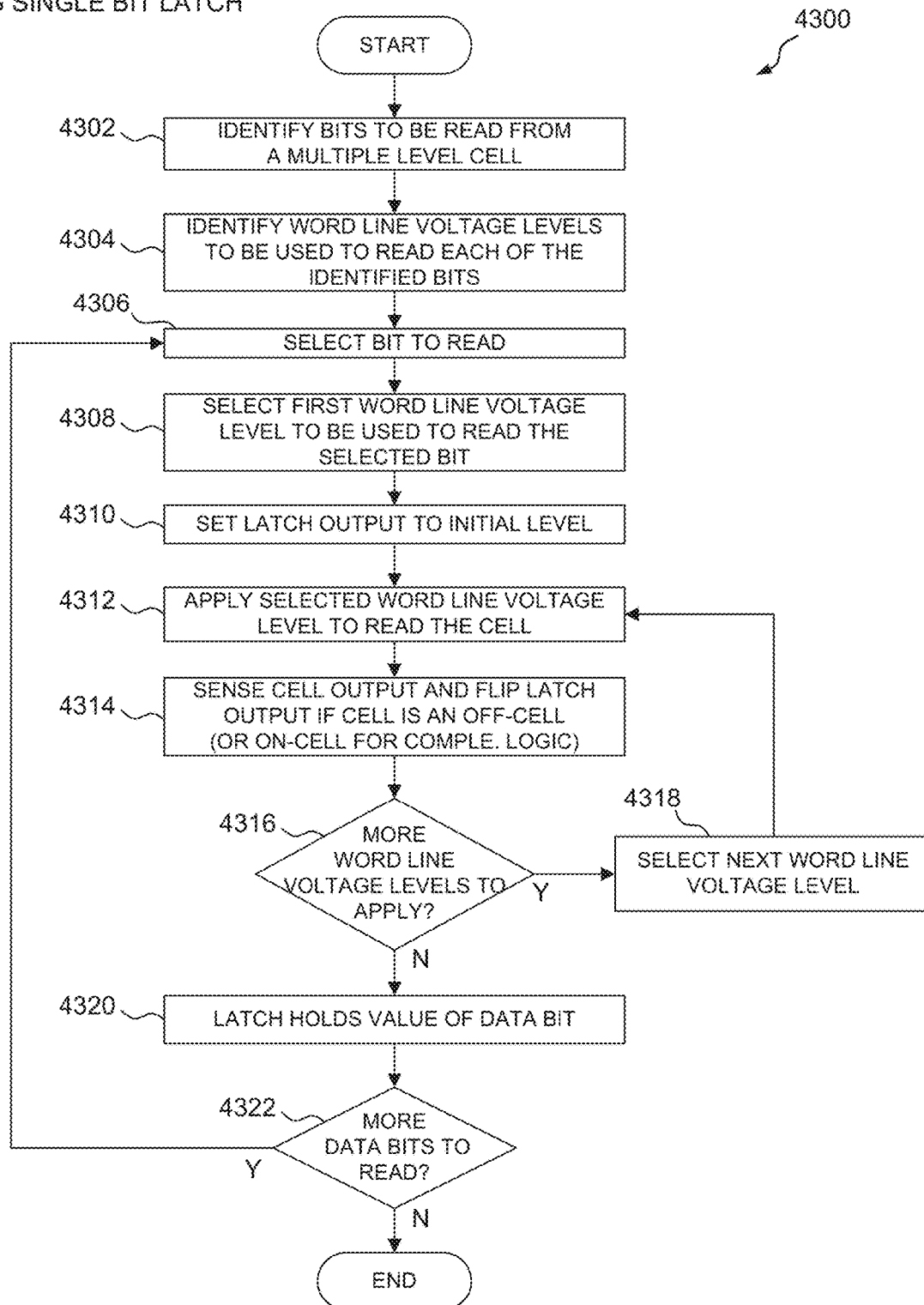
FIG. 43 shows an exemplary method for reading a multiple level cell using a single bit latch in accordance with the invention.

FIG. 43 shows an exemplary method 4300 for reading bits in a multiple level cell using a single bit latch in accordance with the invention. For example, the method is suitable for use to read a multiple level cell with the single bit latch circuit shown in FIG. 36.

At block 4302, one or more bits to be read from a multiple level cell are identified. For example, the bits D0, D1, and D2 as illustrated in FIG. 35 are identified to be read.

At block 4304, word line voltage levels to be used to read each of the identified bits are identified. For example, the word line voltage levels shown in FIG. 35 are identified to read the bits D0, D1, and D2. For example, to read D0, word line voltage levels VR1 and VR5 are identified. To read D1, word line voltage levels VR2, VR4, and VR6 are identified, and to read D2, word line voltage levels VR3 and VR7 are identified.

At block 4306, a bit to be read is selected. For example, bit D0 is selected to be read.

At block 4308, a first word line voltage level is selected to be used to read the selected bit. For example, word line voltage level VR1 is selected to read bit D0, as illustrated in FIG. 35.

At block 4310, a latch output of the single bit latch is set to an initial level. For example, as shown in FIG. 36, the Q output of the latch 918 is set to an initial value of 1.

At block 4312, the selected word line level is applied to the cell. For example, the word line voltage level VR1 is applied to read the cell.

At block 4314, the output of the cell is sensed and the latch is flipped if the cell is determined to be an off-cell. For example, as illustrated in FIG. 36, the output of the cell is sensed at the SA node. If the cell is an off-cell, the Q output of the latch is flipped. For example, the Q output of the latch 918 is flipped to a value of 0 by the RES signal. It should also be noted that in another embodiment, the latch circuit can be implemented using complementary logic as illustrated in FIG. 41A and in that case, the latch is flipped if the cell is an on-cell.

At block 4316, a determination is made if there are more word line voltage levels to be applied to the cell to read the selected bit. If there are more word line voltage levels to be applied, the method proceeds to block 4318. If there are no more word line voltage levels to be applied, the method proceeds to block 4320. In this example, to read D0 the next word line voltage level VR5 is to be applied to the cell. The method then proceeds to block 4318 to apply this voltage level to the cell and process the sensed result.

At block 4318, the next word line voltage level to be applied is selected. The method then proceeds to block 4312. It should be noted that when the method proceeds back to block 4314, if the cell is an off-cell, the Q output of the latch 918 is flipped again to a value of 1 by the SET signal. Thus, the output of the latch 918 is flipped (or toggled) by each adjustment.

At block 4320, the latch holds the value of the data bit. For example, since there are no more word line voltage levels to apply to the cell, the latch 918 holds the value of the selected data bit.

At block 4322, a determination is made as to whether there are more data bits to be read from the cell. If there are more data bits to be read, the method proceeds to block 4306. If there are no more data bits to be read, the method ends. For example, to read the D1 bit, the method proceeds to block 4306 to select this bit to read. The above operations are again performed to read the D1 bit. The method will again return to block 4306 to perform the above operations again to read the D2 bit. After reading the D2 bit the method ends.

Thus the method 4300 operates to read bits in a multiple level cell using a single bit latch in accordance with the invention. It should be noted that the operations provided are exemplary and that additions, deletions, changes, and/or modifications are within the scope of the embodiments.

In various exemplary embodiments, methods and apparatus are provided that use bit line capacitance to store program and read data, and use page buffers to load and sense the data to increase data throughput. However, because the bit line capacitance needs time to charge and discharge, when data is directly loaded into the bit line capacitance, a slower clock rate may be used for the I/O bus to ensure that data is loaded correctly. This may slow down the I/O bus speed.

Figure 44A:
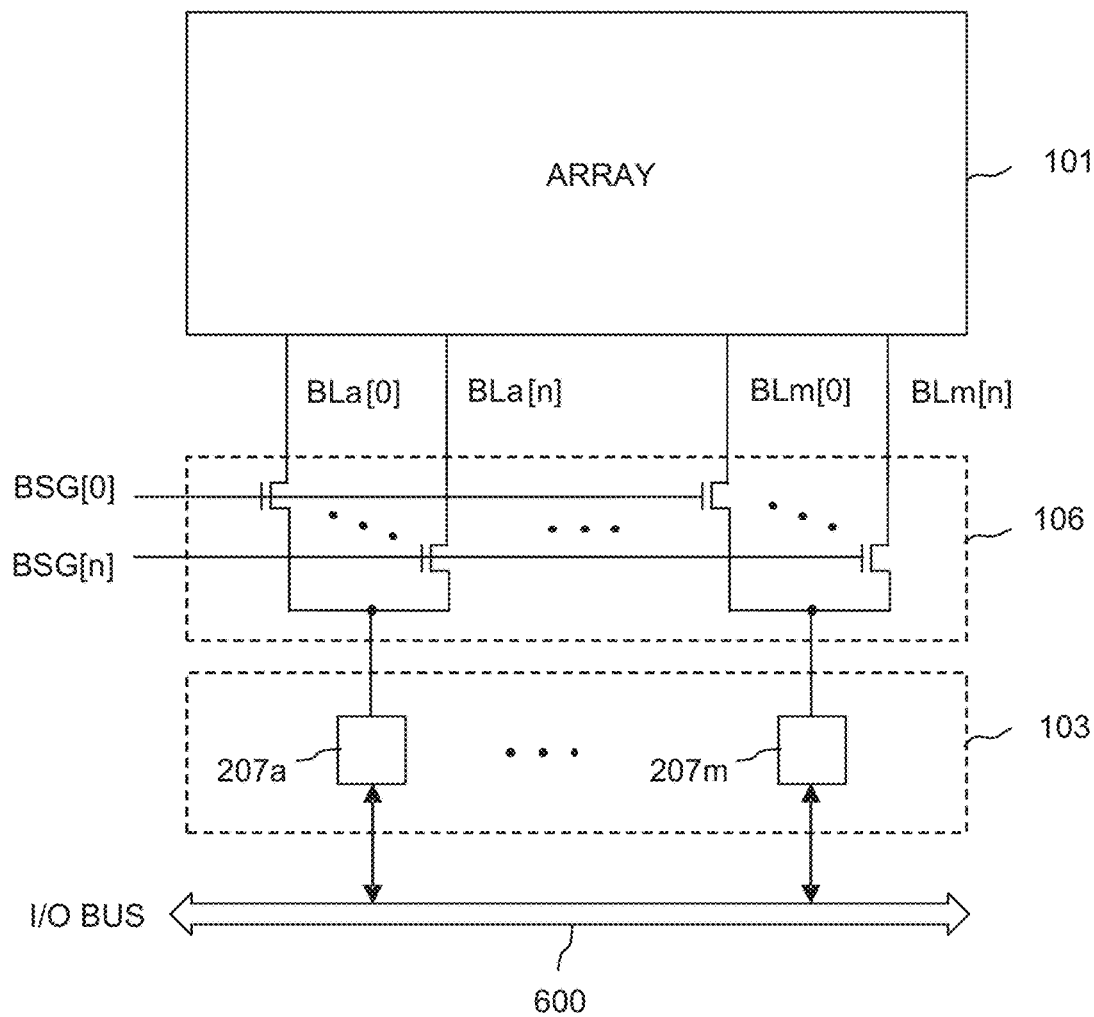
FIGS. 44A-B shows an exemplary array structure and data loading and output sequences in accordance with the invention.
Figure 44B:
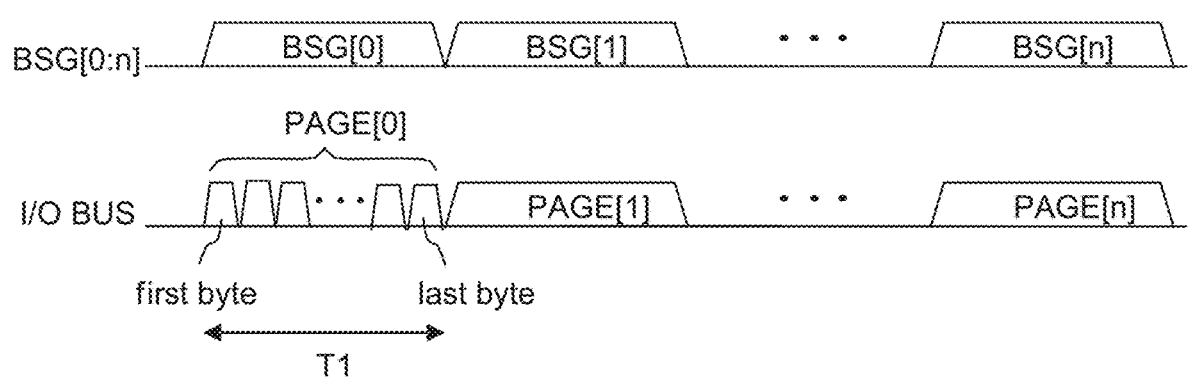

FIGS. 44A-B show an exemplary array structure and data loading and output sequences in accordance with the invention.

FIG. 44A shows an exemplary architecture comprising a memory cell array 101 and a page buffer block 103 that contains page buffers 207a to 207m. The architecture also comprises bit line select gates 106 that connect the page buffers to bit lines BLa[0:n] to BLm[0:n]. An I/O bus 600 is shown that has bandwidth from 8 bits to 64 bits.

FIG. 44B shows a data loading sequence for the circuit shown in FIG. 44A. The bit line select gate signals BSG[0:n] are sequentially turned on to load data from the I/O bus 600 to BLa[0] to BLm[n], respectively. During T1 time, the signal BSG[0] goes high to select BLa[0] to BLm[0] to be connected to the page buffers 207a to 207m, respectively. The data is sequentially loaded from I/O bus 600 to the page buffers 207a to 207m, and then loaded to BLa[0] to BLm[0], which is defined as PAGE[0]. It will be assumed that there are 4 KB page buffers, and the I/O bus width is one byte. It will further be assumed that the I/O bus clock period is 10 ns. The 4 KB data are loaded from the I/O bus 600 into the 4 KB page buffers 106 and then BLa[0] to BLm[0] from the first byte data to the last byte. Each byte takes 10 ns, thus the time interval T1 for loading the 4 KB page will be 40 microsecond (us). This time is far more than enough for the first byte of data to be loaded into the bit lines. However, the last byte of data has just 10 ns to be loaded into the bit lines before the signal BSG[0] goes low. This may not be enough time to load the data of the last byte into the high-capacitance bit lines, thus the loading data operation may fail.

For output data, the same waveform shown in FIG. 44B can be used. During T1 time interval, the signal BSG[0] selects the BLa[0] to BLm[0] to be connected to the page buffers 207a to 207m. During the same time, the I/O bus outputs the data from the page buffers 207a to 207m. Similarly, for the last byte, there is only 10 ns to read data from the bit lines to the I/O bus. The short time to read the last byte may not be enough, thus the output data operation may fail.

To solve the above identified problems, one solution is to delay the time when BSG[0] goes low. However, this reduces I/O speed, and thus is not preferred. Another technique is to add extra data registers, as shown 104a to 104d in FIG. 1A. However, this increases the die size.

Figure 45A:
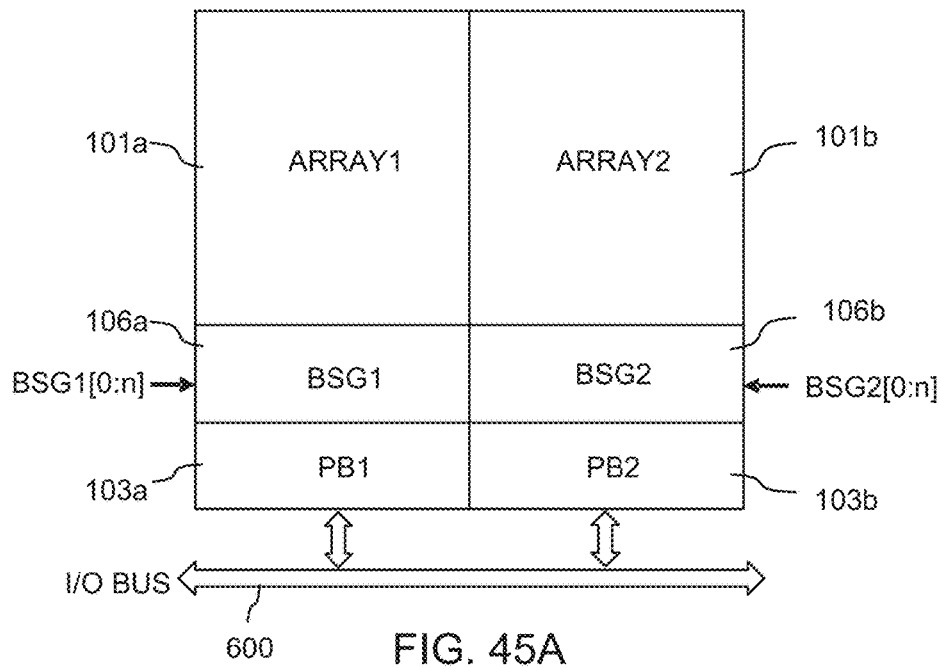
FIGS. 45A-C shows an exemplary array structure and data loading and output sequences in accordance with the invention.
Figure 45B:
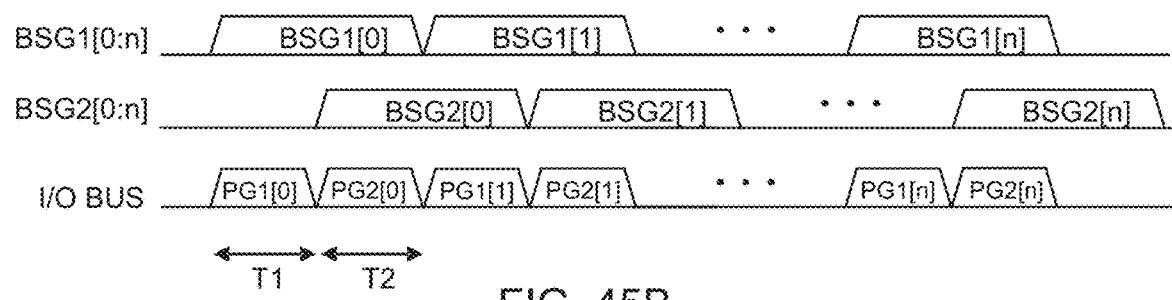
Figure 45C:
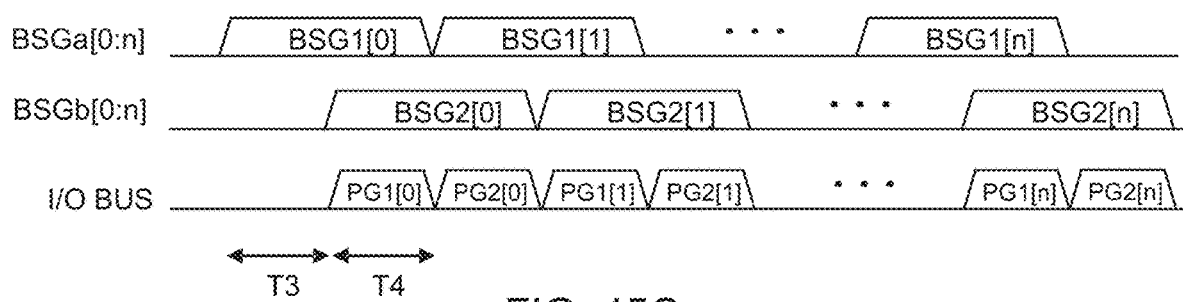

FIGS. 45A-C show an exemplary array structure and data loading and output sequences in accordance with the invention.

FIG. 45A shows an exemplary architecture according to the invention. The array 101 is divided into two sub-arrays, namely, ARRAY1 101a and ARRAY2 101b. The ARRAY1 and ARRAY2 are connected to page buffer blocks 103a and 103b through the bit line select gate blocks 106a and 106b, respectively. The bit line select gate blocks 106a and 106b are connected to different select gate signals BSG1[0:n] and BSG2[0:n], respectively. The page buffer blocks 103a and 103b are connected to I/O bus 600.

FIG. 45B shows an exemplary data loading sequence for use with the architecture shown in FIG. 45A. The signals BSG1[0:n] and BSG2[0:n] are interleaved as shown. The I/O bus 600 alternatively loads data to the page buffer blocks 103a and 103b. For example, during the time interval T1, the I/O bus loads the first page of data (PG1[0]) to the first page buffer block 103a. Then, the page buffer 103a loads the data to the bit lines selected by BSG1[0]. During the time interval T2, the I/O bus loads the second page of data (PG2[0]) to the second page buffer block 103b. Meanwhile, because the signal BSG1[0] is till high, the first page buffer block 103a continues loading the first page of data to the bit lines selected by BSG1[0]. As a result, the insufficient loading time problem for the last byte of data shown in FIGS. 44A-B is eliminated.

It will be assumed that the page buffer blocks 103a and 103b are 2 KB page buffers each. With the same I/O bandwidth and clock rate as the example shown in FIGS. 44A-B, the length of the time interval T2 is 20 microsecond (us), which is far more than enough time for the last byte of the first page buffer 103a to load into the bit lines. As a result, the loading time problem shown in FIGS. 44A-B is solved. Moreover, the clock rate of the I/O bus may be increased to enhance the data transfer rate.

FIG. 45C shows a data output sequence of the embodiment shown in FIG. 45A. During the time interval T3, the signal BSG1[0] goes high to select bit lines in the ARRAY1 to be connected to the first page buffer block 103a to read the first page of data (PG1[0]). During the time interval T4, the signal BSG2[0] goes high to select bit lines in the ARRAY2 to be connected to the second page buffer block 103b to read the second page of data (PG2[0]). During the same time interval T4, the I/O bus outputs the first page of data from the page buffer block 103a.

Utilizing the same I/O bandwidth and clock rate shown in FIG. 45B, the T3 time length is 20 microsecond (us), which is sufficient for reading data from the bit lines to the page buffers. As a result, the problem of the output operation shown in FIG. 44B is solved. Moreover, the clock rate of the I/O bus may be increased to enhance the data transfer rate.

Figure 46A:
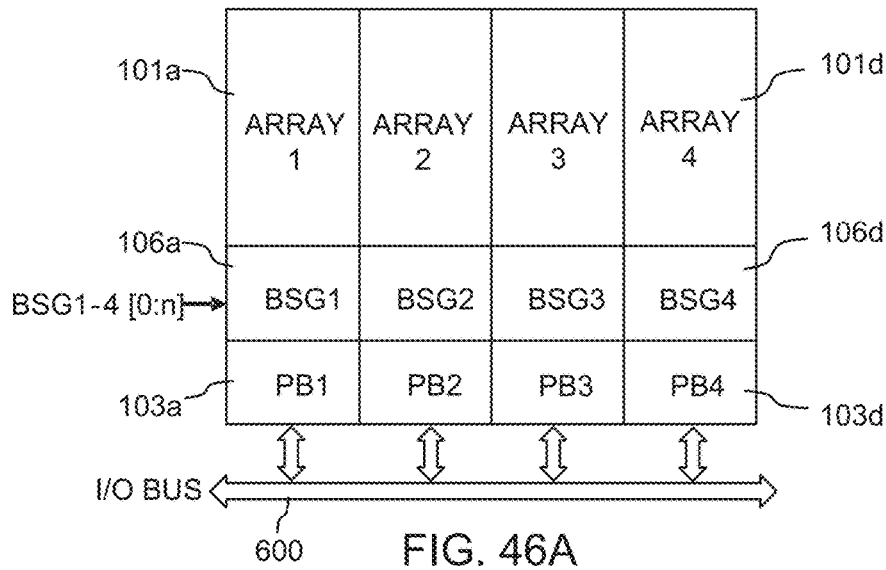
FIGS. 46A-C shows an exemplary array structure and data loading and output sequences in accordance with the invention.
Figure 46B:
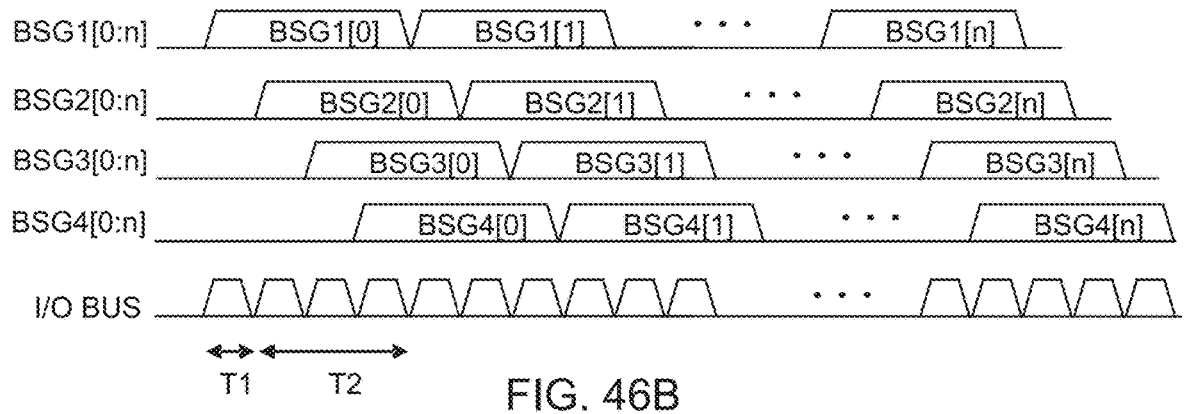
Figure 46C:
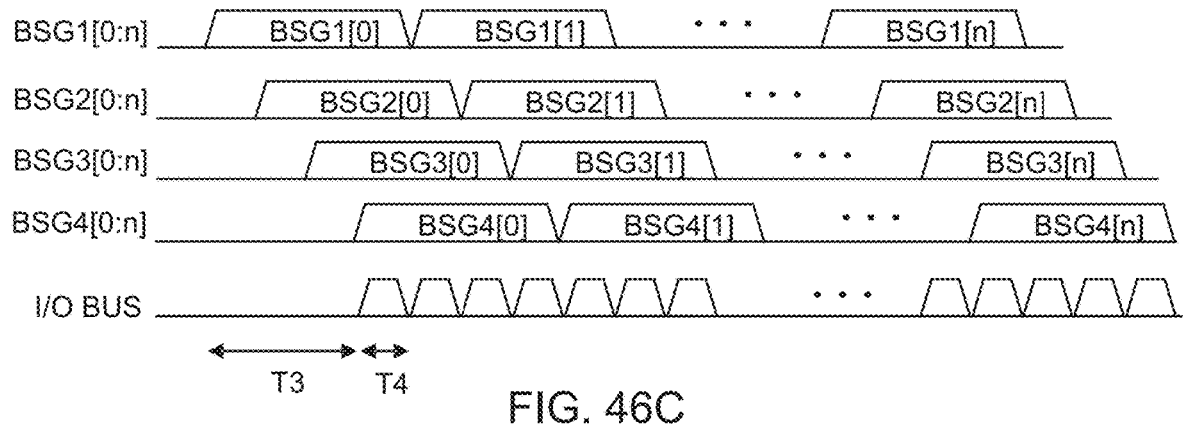

FIGS. 46A-C show an exemplary array structure and data loading and output sequences in accordance with the invention.

FIG. 46A shows another embodiment of an exemplary architecture according to the invention. In this embodiment, the array is further divided into four sub-arrays, namely, ARRAY1 101a to ARRAY4 101d. The four sub-arrays are connected to four page buffer blocks 103a to 103d through four bit line select gate blocks 106a to 106d, respectively. The bit line select gate blocks 106a to 106d are controlled by four groups of select gate signals BSG1[0:n] to BSG4[0:n], respectively.

FIG. 46B shows a data loading sequence for use with the architecture shown in FIG. 46A. The select gate signal groups BSG1[0:n] to BSG4[0:n] for the bit line select gate blocks 106a to 106d are interleaved as shown. During the time interval T1, the first page of data is loaded into the first page buffer block 103a. During the time interval T2, the first page of data is continued to be loaded to the bit lines selected by the signal BSG1[0]. According to the I/O width and clock rate shown in FIG. 44B, the time intervals T1 and T2 are 10 microsecond (us) and 30 microsecond (us), respectively. Therefore, for this embodiment, the data has more time to be loaded into the bit line capacitance. In addition, the I/O clock rate can be further increased to increase the data transfer rate.

FIG. 46C shows an output data sequence for use with the architecture shown in FIG. 46A. During the time interval T3 time, the first page of data is read from the bit lines selected by BSG1[0] to the first page buffer block 103a. During the time interval T4 time, the first page of data is output from the page buffer block 103a to the I/O bus. The time intervals T3 and T4 time are 30 microsecond (us) and 10 microsecond (us), respectively. Therefore, for this embodiment, the data has more time to read from the bit lines to the page buffers. In addition, the I/O clock rate can be further increased to increase the data transfer rate. In various exemplary embodiments, the number of sub-arrays used is not limited, for example, the number of sub-arrays may be 2, 4, 8, 16, or any suitable number.

In various exemplary embodiments, during programming operations, program data is loaded to multiple bit lines and stored in the bit line capacitances to perform the program operation. If the inhibit voltage (VDD) on a bit line is leaked below VDD-Vt, it may turn on the drain select gate (DSG) of the selected string, and cause the inhibit voltage (8V) stored in the channel of the string to leak to the bit line. As a result, the inhibited cell may be accidentally programmed.

Referring to FIG. 5A, the time interval of program pulse (Tpgm) is approximately 10 us to 30 us. A bit line capacitance is approximately 1 pF to 5 pF. If the leakage current is higher than 20 nA, it may leak the bit line voltage from VDD to below VDD-Vt during a program pulse time interval. Typically the junction leakage current of a bit line is much lower than 20 nA. However, when bit line length is reduced, the bit line capacitance is reduced and the margin becomes smaller.

To address this problem, a 'refresh' operation can be performed to maintain the bit line voltages. Referring to the circuit shown in FIG. 6F, during the program operation, the program data are stored in the bit line capacitances 206a to 206n. To maintain the voltages of the bit line capacitance 206a to 206n, a refresh operation may be performed to sequentially turn on bit line select gates 202a to 202n to connect the page buffer 200 to the bit lines 201a to 201n, respectively, to use the sense amplifier 208 to sense the selected bit line voltage and restore the voltage back to full VDD or 0V levels.

Figure 47A:
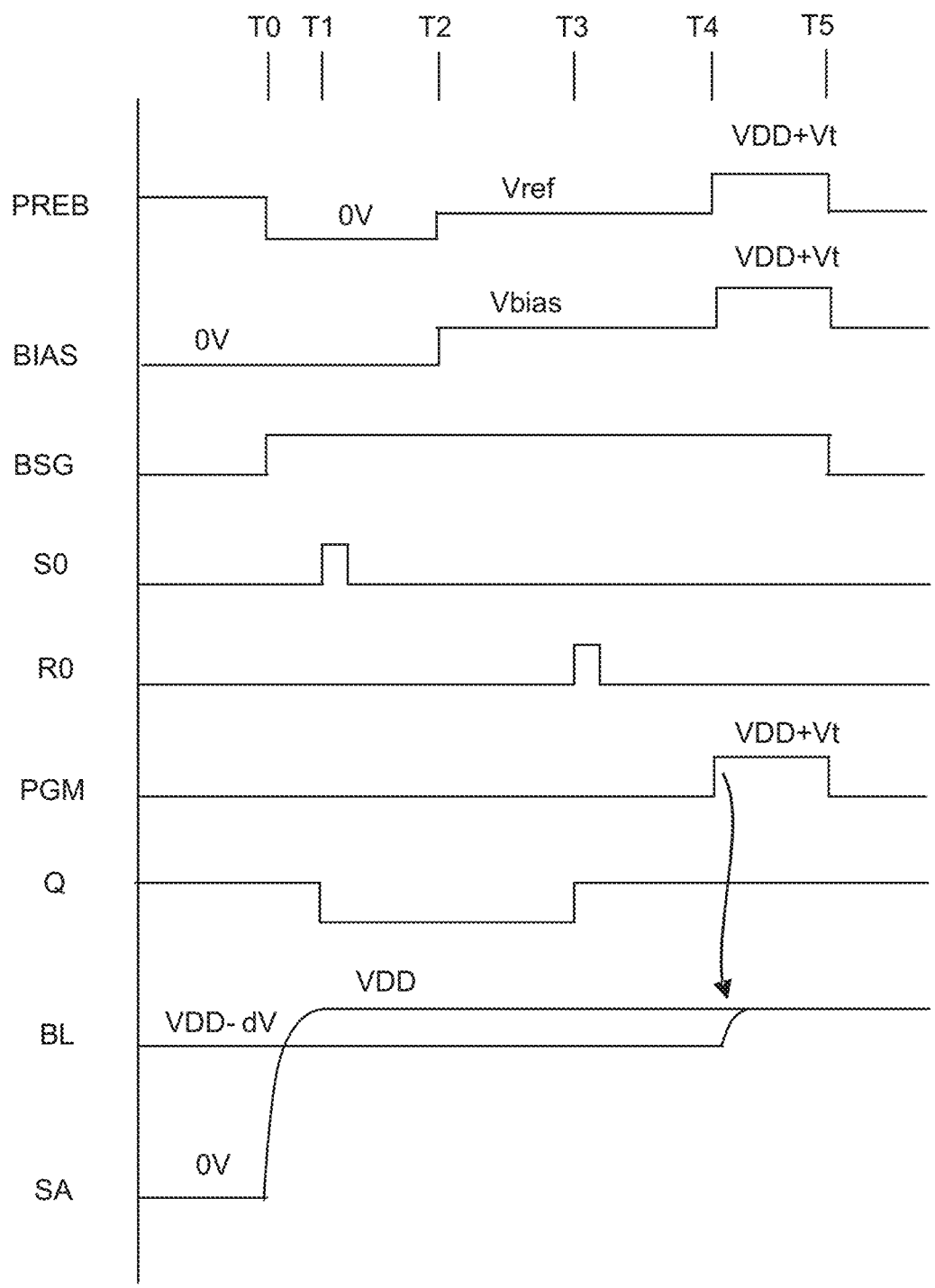
FIGS. 47A-B illustrate embodiments of refresh operations according to the invention.
Figure 47B:
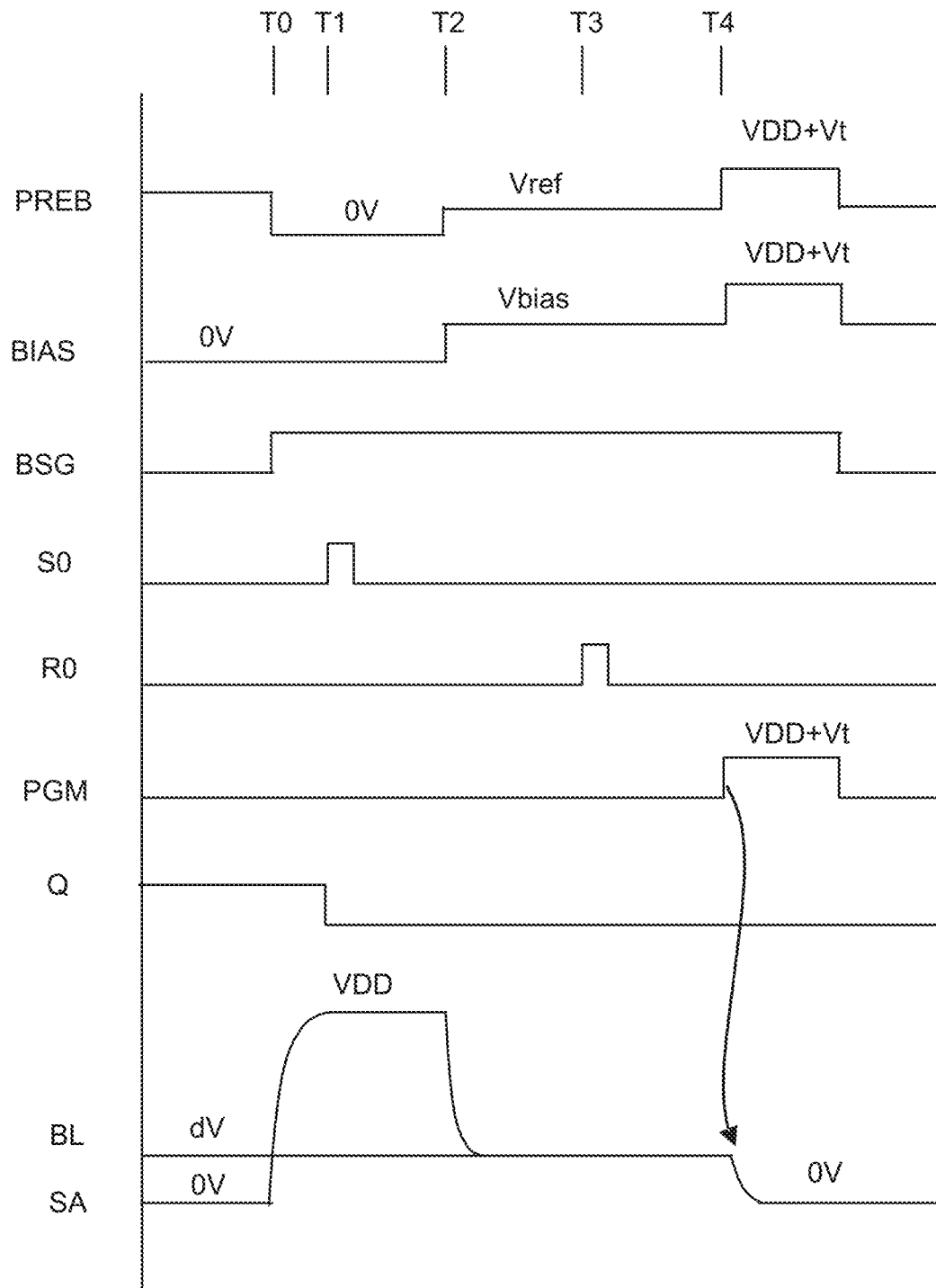

FIGS. 47A-B shows an embodiment of waveforms for refresh operations according to the invention. The provided waveforms are discussed with reference to the detailed page buffer circuit shown in FIG. 3C.

FIG. 47A shows operations for refreshing a bit line that stores inhibit data 1 (VDD). Assuming the bit line (BL) has leakage and the voltage is dropped to VDD-dV, where dV is a delta voltage lower than Vt. At T0 time, both the PREB and BIAS signals are supplied with 0V to turn on the pre-charge device 303 and turn off the bias device 306 to charge up the SA node to VDD. At T1 time, a SET pulse is applied to set the Q node of the latch 207 to 0V. At T2 time, the BIAS signal is supplied with Vbias to turn on bias device 306 to sense BL voltage. PREB is supplied with Vref to limit the pull-up current of pre-charge device 303. Because the BL voltage is higher than Vbias-Vt, the bias device 306 is turned off, and the SA node remains VDD to turn on sensing device 310. At T3 time, a RES pulse is applied to turn on reset device 312. Because the sensing device 310 is turned on, this will reset the Q node of the latch 207 to VDD. At T4 time, the PGM, BIAS, and PREB signals are supplied with a pulse of VDD+Vt. This will turn on the pass gate 220 and the bias device 306, and turn off the pre-charge device 303, respectively. The BL will be charged by the Q node of the latch 207 from VDD-dV to VDD. Therefore, the refresh operation for the selected bit line is complete. At T5 time, the current bit line select gate (BSG) is turned off and the next bit line select gate (BSG) may be turned on to repeat the operations from T0 to T5 time to refresh the next bit line.

FIG. 47B shows operations for refreshing a bit line that stores program data 0 (0V). Assuming the bit line (BL) has leakage and the voltage is increased to dV, where dV is a delta voltage lower than Vt. At T0 time, both the PREB and BIAS signals are supplied with 0V to turn on the pre-charge device 303 and turn off the bias device 306 to charge up the SA node to VDD. At T1 time, a SET pulse is applied to reset the Q node of the latch 207 to 0V. At T2 time, the BIAS is supplied with Vbias to turn on bias device 306 to sense the BL voltage. PREB is supplied with a Vref to limit the pull-up current of pre-charge device 303. Because the BL voltage is lower than Vbias-Vt, the bias device 306 is turned on and pulls low the SA node to the same voltage as the BL. Because the SA voltage is lower than Vt, it turns off the sensing device 310. At T3 time, a RES pulse is applied to turn on reset device 312. However, the Q node of the latch 207 will remain at 0V because the sensing device 310 is turned off. At T4 time, the PGM, BIAS, and PREB signals are supplied with a pulse of VDD+Vt. This will turn on the pass gate 220 and the bias device 306, and turn off the pre-charge device 303, respectively. The BL will be discharged by the Q node of the latch 207 from dV to 0V. As a result, the refresh operation for the selected bit line is complete. At T5 time, the current bit line select gate (BSG) is turned off and the next bit line select gate (BSG) may be turned and repeat the operations from T0 to T5 time to refresh the next bit line.

In the above embodiment, VDD is used as an inhibit voltage. In another embodiment, the inhibit voltage may be VDD-Vt. In such case, at time T4, when applying a pulse to the signals PGM, BIAS, and PREB, the pulse can be at the VDD level, which will charge the BL to VDD-Vt.

FIGS. 47A-B illustrate embodiments of refresh operations according to the invention. The frequency of the refresh operations depends on the bit line capacitance and bit line leakage current. The refresh operations may be repeatedly performed to refresh all the selected bit lines during the entire program pulse.

For multiple-level cells that stored many bits in a cell, such as TLC, QLC, or PLC, the cell current becomes smaller, and therefore bit line shielding is very important to reduce the adjacent bit lines' capacitance coupling. Current sensing may be preferred over the voltage sensing, because for current sensing, the bit line voltage is determined by the balance of the cell current and load current of the sense amplifier. If bit line capacitance coupling occurs, after a period of time, the bit line voltage will still come back to the correct voltage.

Various embodiments in accordance with the invention are applicable to the read operation using voltage sensing or current sensing. For high-speed applications, current sensing is preferred because it utilizes a smaller bit line voltage swing than voltage sensing. This significantly reduces the bit line discharging time. In addition, current sensing is also preferred for multiple-level cell applications such as MLC, TLC, and QLC, because the load current can prevent bit line capacitance coupling from adjacent bit lines. However, the bit line select gate circuit shown in the previous embodiments, such as in FIG. 1E does not work with current sensing, because the circuit cannot supply a load current from the page buffer to the unselected bit lines. To address this issue, a novel bit line select gate circuit comprising load devices to supply the load current to each bit line is disclosed, for instance, as shown in FIG. 48A.

Figures 48A, 48B:
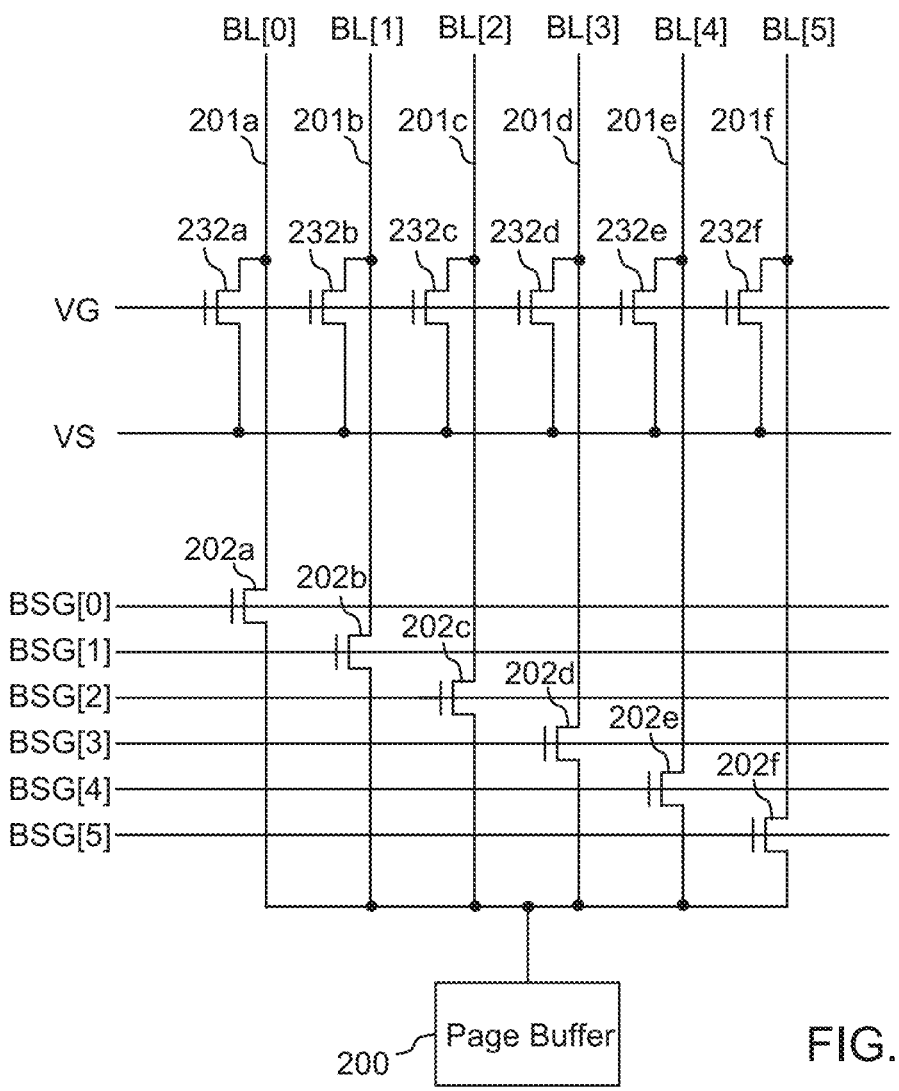
FIG. 48A shows an exemplary embodiment of a bit line select gate circuit.
FIG. 48B shows a table of exemplary bias conditions for VG and VS signal lines shown in FIG. 48A.

FIG. 48A shows an exemplary embodiment of a bit line select gate circuit in which bit lines 201a-f are connected to a page buffer circuit 200 through bit line select gates 202a-f. The bit lines 201a-f are also connected to load devices 232a-f. The gate terminals of the load devices 232a-f are connected to a signal VG. The source terminals of the load devices 232a-f are connected to a voltage source VS.

Figure 48C:
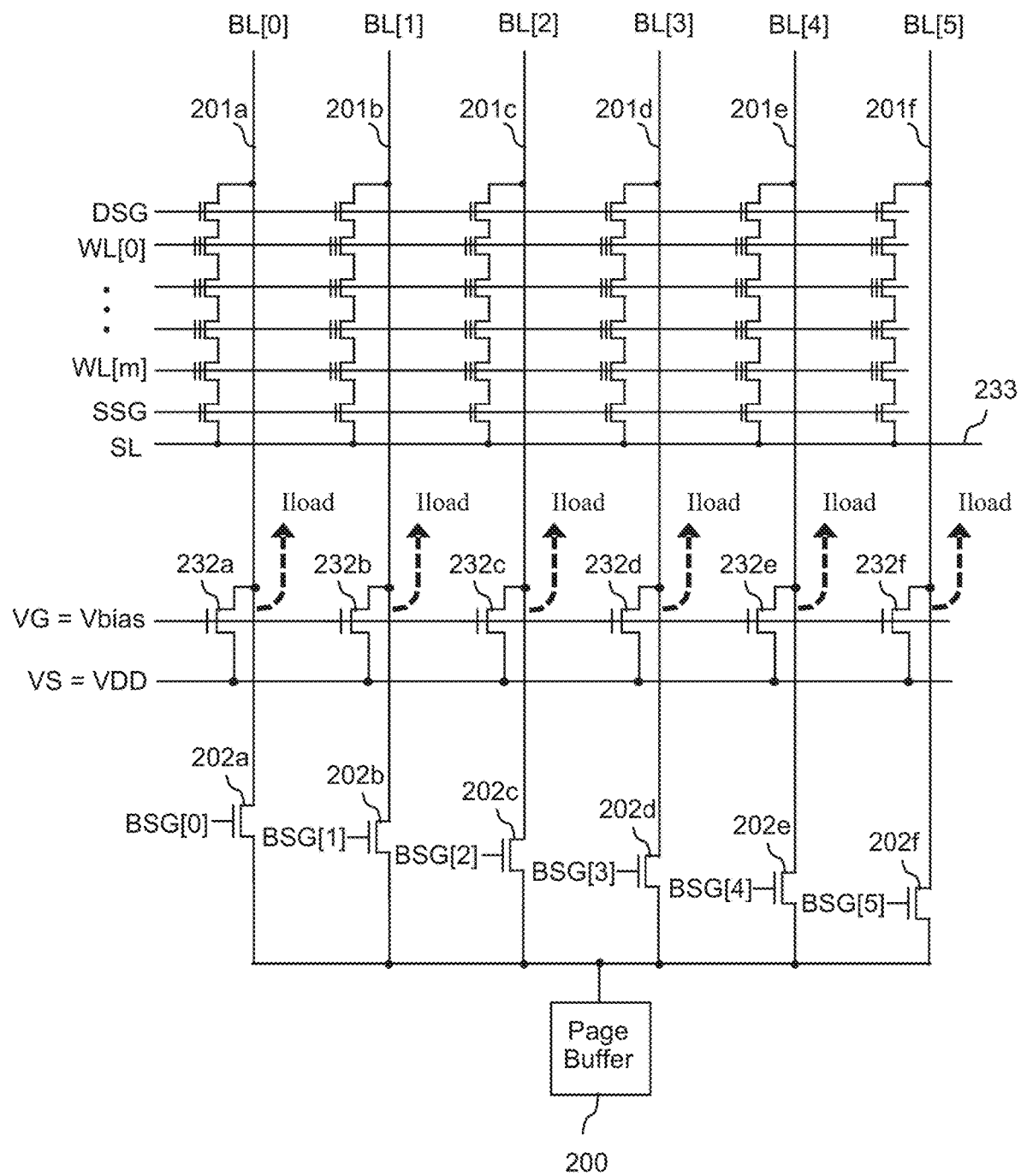
FIG. 48C shows an exemplary embodiment of a bit line select gate circuit that illustrates operation under the bias conditions shown in FIG. 48B.

FIG. 48B shows a table of exemplary bias conditions for VG and VS signal lines for the load devices 232a-f shown in FIG. 48A. During a read operation, the bit line select gates 202a-f are turned off. The voltage source VS is supplied with a positive voltage, such as VDD. The gate signal VG is supplied with a bias voltage, Vbias. In an embodiment, the voltage level of Vbias is higher than Vt to turn on the load devices 232a-f to apply a load current, "Iload" to the bit lines 201a-f, as illustrated in FIG. 48C. The load current Iload will charge up the bit lines 201a-f to a voltage level of (Vbias−Vt), where Vt is the threshold voltage of the load devices 232a-f.

Figure 48D:
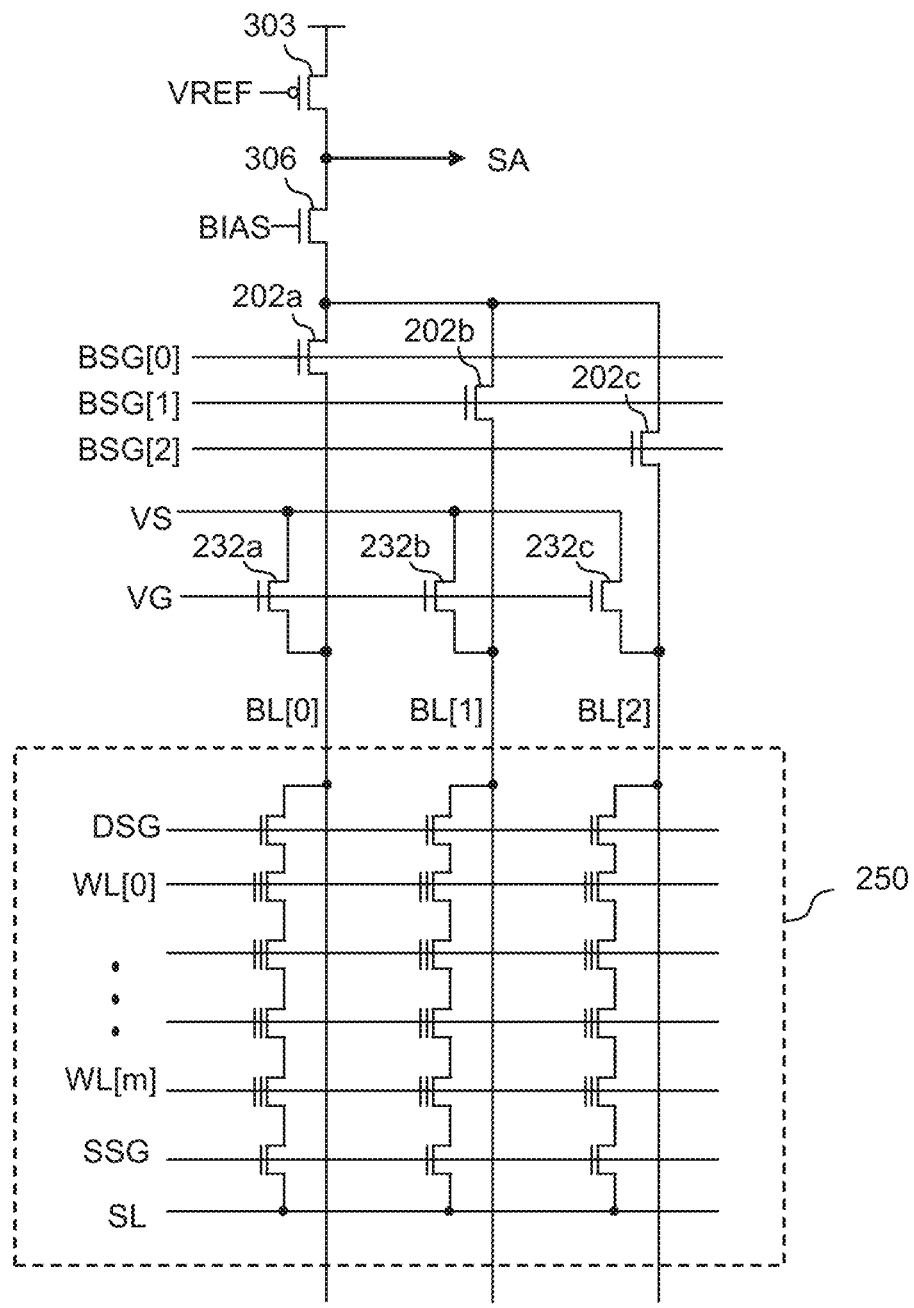
FIG. 48D shows an exemplary embodiment of a bit line select gate circuit that illustrates operations under the bias conditions shown in FIG. 48B.

FIG. 48D shows an exemplary embodiment of a bit line select gate circuit that illustrates operations under bias conditions shown in FIG. 48B.

Figure 48E:
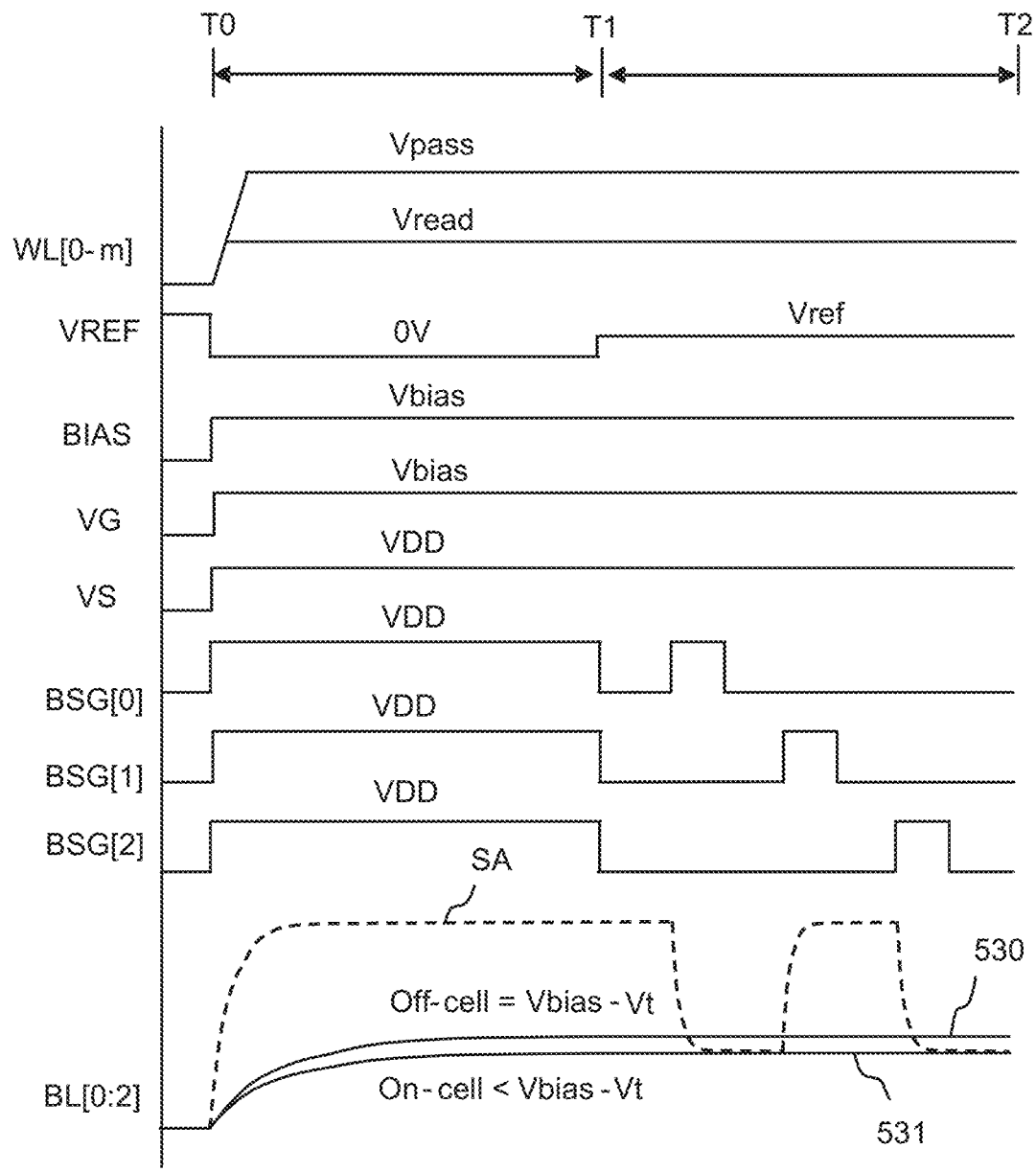
FIG. 48E shows an embodiment of read operation waveforms generated during operation of the embodiment shown in FIG. 48D.

FIG. 48E shows an embodiment of read operation waveforms generated during operation of the bit line select gate circuit shown in FIG. 48D.

In an embodiment, the circuit shown in FIG. 48D comprises bit line select gates 202a-c, load devices 232a-c, selected cell strings 250, a pre-charge device 303, and a bias device 306 of a page buffer circuit, for example, the page buffer circuit shown in FIG. 3C. The devices 303 and 306 form a sensing circuit. It will be assumed that the cells on the bit lines BL[0], BL[1], and BL[2] are on-cell, off-cell, and on-cell, respectively. During the pre-charge period (T1) shown in FIG. 48E, the load devices 232a-c provide a load current to precharge the bit lines to a bias voltage. The voltage source, VS, is supplied with VDD. The gate signal, VG, of the load devices 232a-c is supplied with a bias voltage, Vbias, to turn on the load devices 232a-c to re-charge the bit lines BL[0]-[2] to (Vbias−Vt). Meanwhile, the signals BSG[0]-[2] are supplied with VDD to turn on the bit line select gates 202a-c. The signal VREF is supplied with 0V to turn on the precharge device 303. The signal BIAS is supplied with a voltage, Vbias, to turn on the bias device 306 and precharge all the bit lines BL[0]-[2] to (Vbias−Vt).

The cells are connected to the word lines WL[0-m]. The selected word line is supplied with a read voltage, Vread, to read the selected cells and the unselected word lines are supplied with a pass voltage, Vpass, to turn on all the unselected cells in the strings. If a selected cell is an off-cell, the bit line voltage will stay at a level of (Vbias−Vt), as shown by 530. If the selected cell is an on-cell, the cell will conduct current and pull the bit line voltage to a level below (Vbias−Vt), as shown by 531. The bit line voltage 531 will be determined by the ratio of the cell current and the load current of the load devices 232a-c. The load current may be adjusted by changing the gate voltage, VG, of the load devices 232a-c.

During time T1-T2 shown in FIG. 48E, the signal VREF is supplied with a reference voltage, Vref, to control the precharge device 303 to generate a reference current. The signals BSG[0]-[2] sequentially turn on the bit line select gates 202a-c for a period of time to let the sensing circuit 303 and bias device 306 sense the voltage of each bit line, as shown by the SA signal. If the bit line voltage is (Vbias−Vt), as shown by 530, the bias device 306 will be turned off and the SA node will be pulled up to VDD by the precharge device 303. Because the SA node's capacitance is very small, the SA node will be pulled up in a short time. If the bit line voltage is lower than (Vbias−Vt), as shown by 531, the bias device 306 will be turned on and cause charge-sharing to occur between the bit line capacitance and the SA node capacitance. Because the bit line capacitance is far higher than the SA node capacitance, the SA node will be pulled low to near the voltage 531 in very short time. In this way, each bit line's voltage can be sequentially sensed by the sensing circuit of the page buffer in high speed, as shown during time T1-T2 of FIG. 48E.

In various embodiments, during read operations, the timing of applying the word line voltage and precharging the bit line voltage is flexible. For example, FIG. 48E shows an embodiment in which the word line voltage is applied at the same time as precharging the bit lines. In this configuration, the on-cells are already turned on by the word line voltage during the precharging period (T0-T1). Therefore, for on-cells, the bit line voltage will be charged up to the voltage shown at 531, which is determined by the ratio of the cell current and the load current. For off-cells, the bit line voltage will be charged up to the voltage (Vbias−Vt) by the load current, as shown at 530. The time T0-T1 can be referred to the 'bit line settling time'.

Figure 48F:
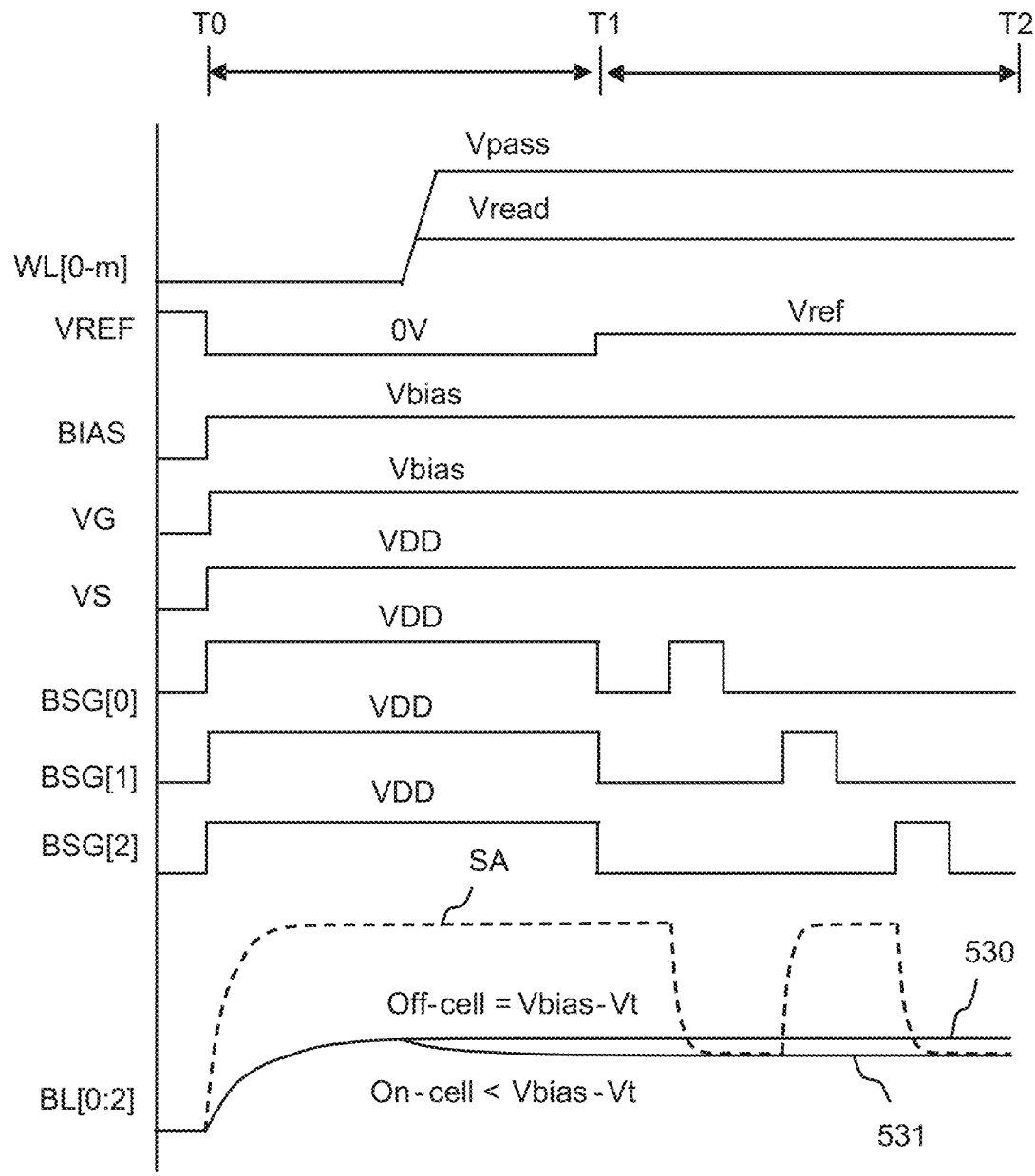
FIG. 48F shows an embodiment of read operation waveforms generated during operation of the embodiment shown in FIG. 48D.

In another embodiment illustrated in FIG. 48F, if the word line voltage is applied after precharging the bit lines, all the bit lines will be precharged to the voltage (Vbias−Vt) first. Then, when the word line voltage is applied, the on-cells will start to discharge the bit lines to the voltage 531, which is determined by the ratio of the cell current and the load current.

During a program operation, the gate voltage signal VG is set to 0V to turn off the load devices 232a-f. The bit line select gates 202a-f are sequentially turned on for a period of time to let the page buffer circuit 200 load program data into each bit line.

It should be noted that the NMOS load devices 232a-f shown in FIG. 48A are exemplary and that other types of load devices could be utilized. According to the invention, the load devices can be implemented using any suitable devices or circuits, such as NMOS transistors, PMOS transistors, or PMOS and NMOS combined circuits, and these variations are within the scope of the invention.

Figure 48G:
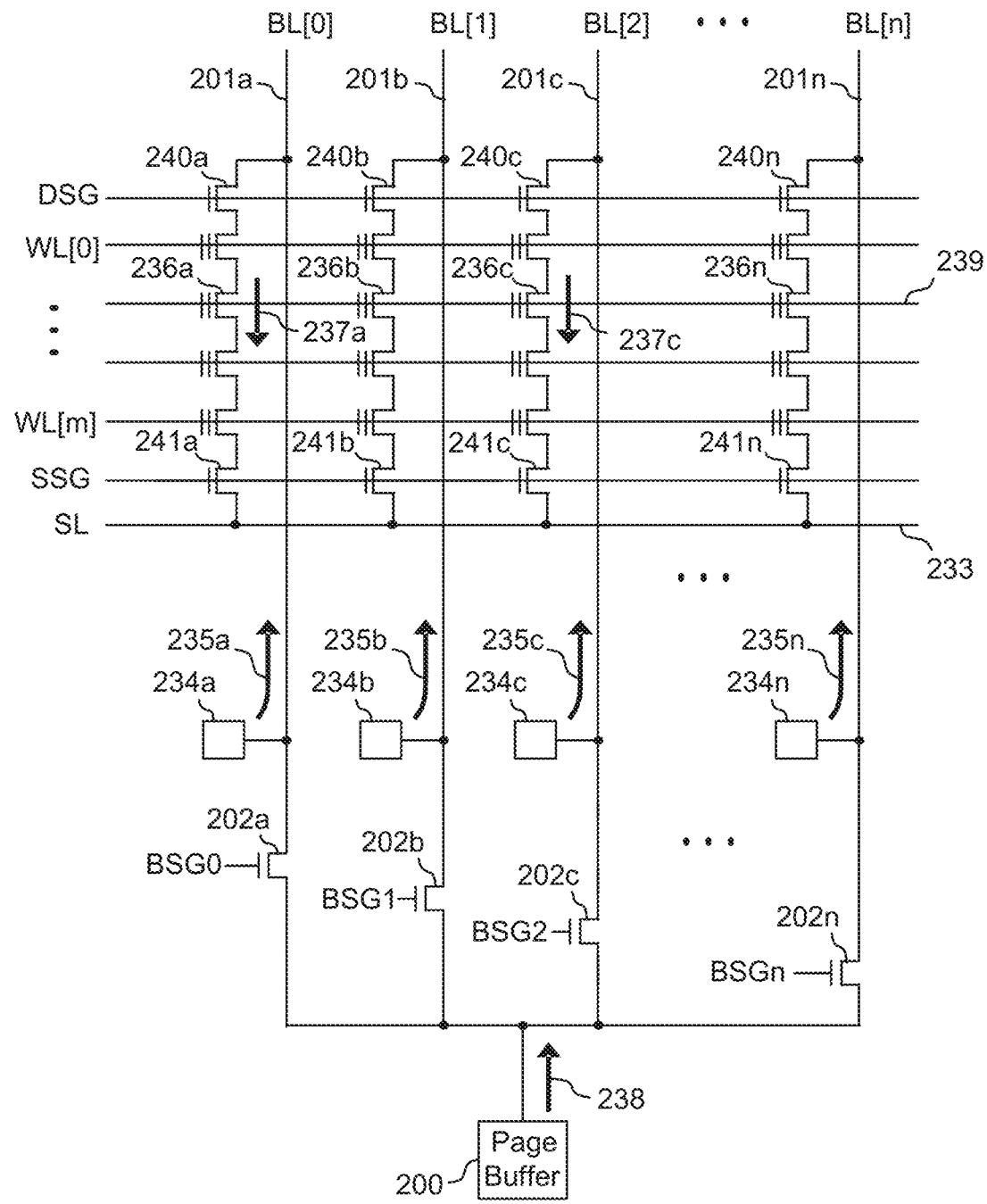
FIG. 48G shows an exemplary embodiment of a bit line select gate circuit that comprises generic load devices.

FIG. 48G shows an exemplary embodiment of a bit line select gate circuit that utilizes generic load devices to perform current-sensing operations according to the invention. In this embodiment, the load devices 234a-n are connected to the bit lines 201a-n to provide load currents 235a-n. The load current is controlled to be lower than the on-cell current. The DSG and SSG signals are supplied with VDD to turn on the drain select gates 240a-n and the source select gates 241a-n. The source line 233 is supplied with 0V. It will be assumed that the word line 239 is selected. The word line 239 is supplied with a read voltage that flows to the cells 236a-n. It will further be assumed that the cells 236a and 236c are on-cells and the cells 236a and 236n are off-cells. The on-cells 236a and 236c will be turned on and will conduct cell currents 237a and 237c. Because the cell currents 237a and 237c are higher than the load currents 235a and 235c, the voltages of the bit lines 201a and 201c will be pulled low by the cell currents 237a and 237c. For the bit lines 201b and 201n, because the cells 236a and 236n are off-cells, the bit line voltages will be pulled high by the load currents 235b and 235n.

To sense the bit line current, the bit line select gates 202a-n are sequentially turned on for a period of time to sequentially connect the page buffer 200 to each of the bit lines 201a-n. An exemplary circuit of the page buffer 200 is shown in FIG. 3C. For the on-cell's bit lines 201a and 201c, because the bit line voltage is lower, it will turn on the bias device 306 shown in FIG. 3C to conduct current 238. The current 238 will pull low the SA node 302 shown in FIG. 3C. For off-cell's bit lines 201b and 201n, because the bit line voltage is higher, it will turn off the device 306 shown in FIG. 3C. The SA node 302 will be pulled up to VDD by the device 303 shown in FIG. 3C.

In an embodiment, all the bit lines 201a-n are selected to perform a read or program operation. This scheme is called "all bit line" (ABL) operation. For clarity, "ABL" and "HBL" refer to whether all the bit lines or half of the bit lines are selected for read or write operations.

Figures 49A, 49B:
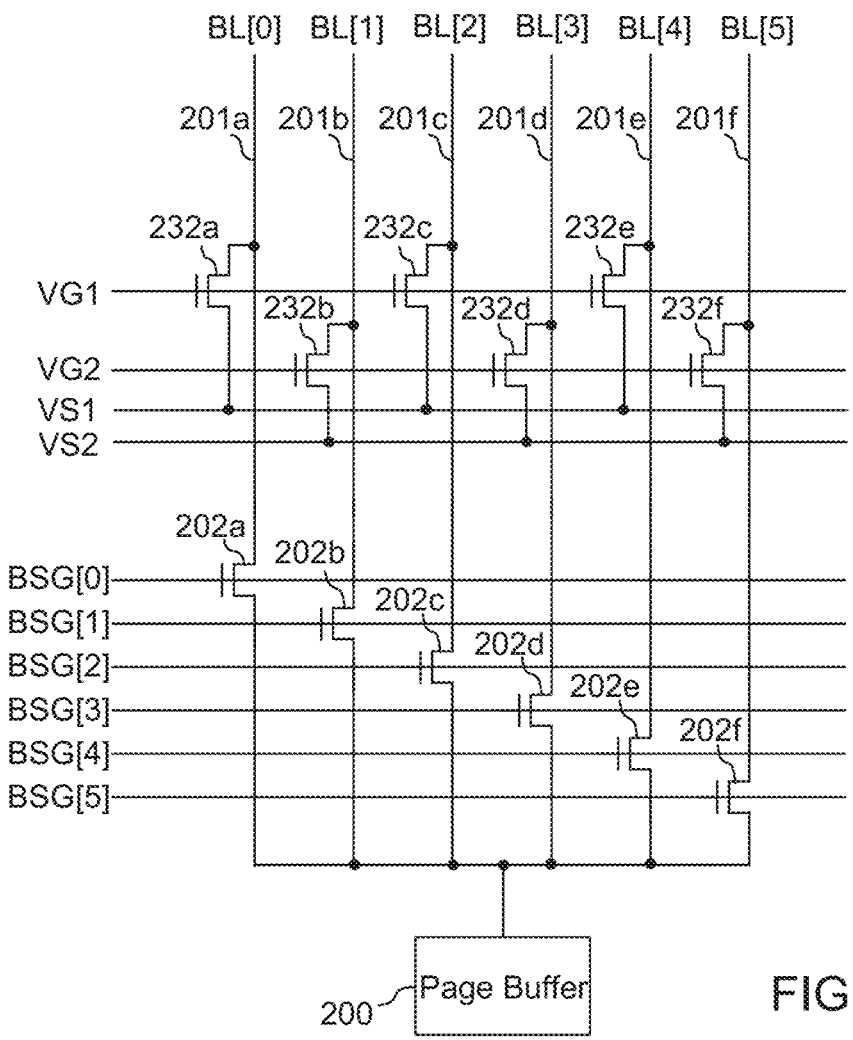
FIG. 49A shows an exemplary embodiment of a bit line select gate circuit configured to provide "half bit line" (HBL) operation.
FIG. 49B shows a table of exemplary bias conditions for VG1, VG2, VS1, and VS2 signals during read operations.

FIG. 49A shows another exemplary embodiment of a bit line select gate circuit configured to provide "half bit line" (HBL) operation. In this embodiment, either all the even bit lines or all the odd bit lines are selected for read and program operations. The unselected odd or even bit lines are supplied with a voltage called a "shielding voltage" to prevent bit line capacitance coupling between adjacent bit lines. This embodiment is well suited for use with multiple level cells, such as MLC, TLC, and QLC, because their lower cell current is more sensitive to noise.

The embodiment of the bit line select gate circuit shown in FIG. 49A is similar to the one shown in FIG. 48A except that the even load devices 232a, 232c and 232e and the odd load devices 232b, 232d, and 232f are connected to different gate signals, VG1 and VG2, and different voltage sources, VS1 and VS2, respectively.

Figure 49C:
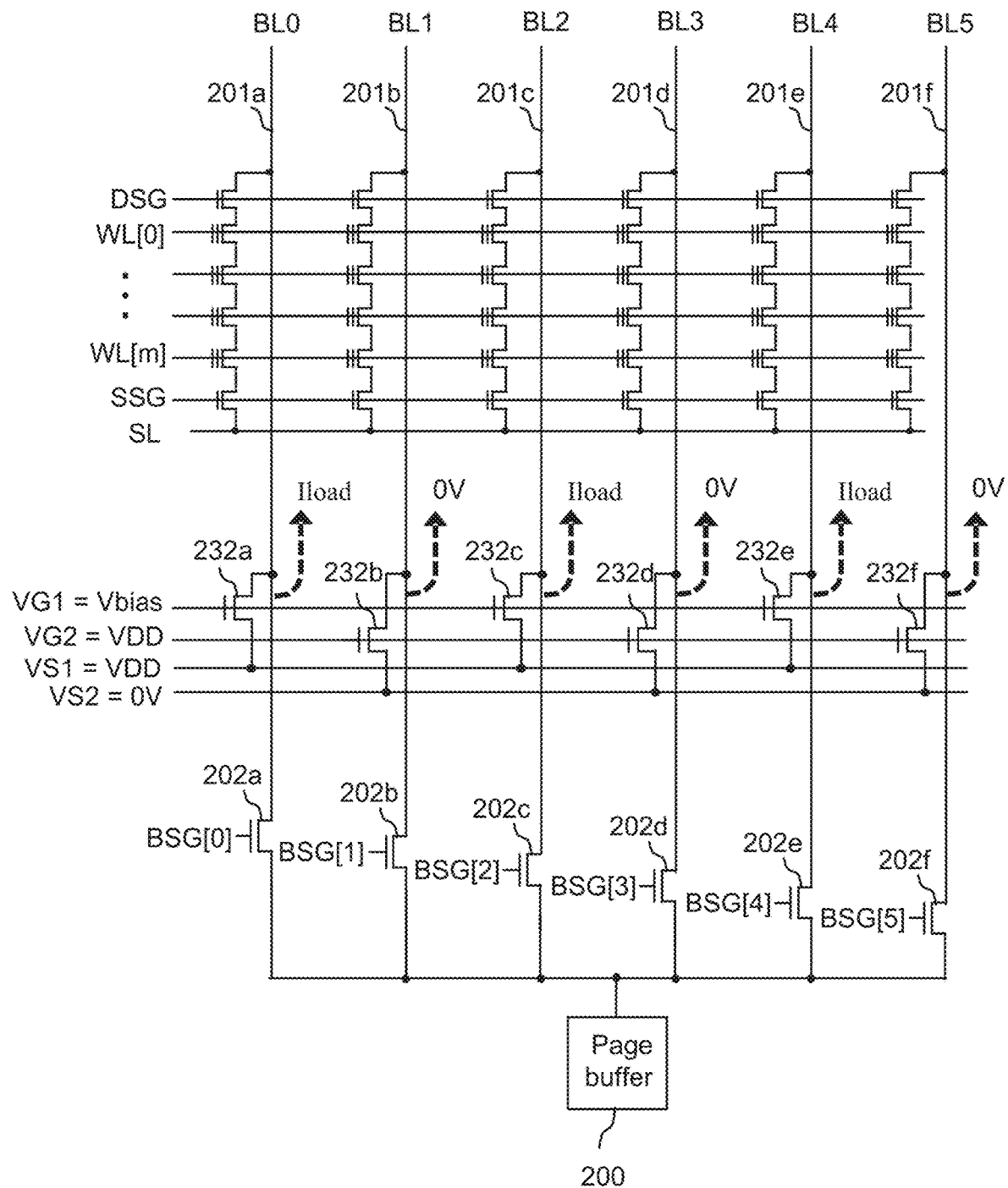
FIG. 49C shows an exemplary embodiment of a bit line select gate circuit that illustrates the bias conditions for programming operations.

FIG. 49B shows a table of exemplary bias conditions for the signals VG1, VG2, VS1, and VS2 during read operation. When reading even bit lines 201a, 201c, and 201e, the bit line pass gates 202a-f are turned off. The gate signal VG1 is supplied with a bias voltage, Vbias. The voltage source VS1 is supplied with a positive voltage such as VDD. This will turn on the even load devices 232a, 232c, and 232e to apply a load current, Iload, to the even bit lines 201a, 201c, and 201e. This will cause the even bit lines 201a, 201c, and 201e to be balanced at voltages depending on the cell current and the load current, as shown in FIG. 49C. If the selected cell is an off-cell, the bit line voltage will be pull up to a level of (Vbias−Vt) by the load devices. If the selected cell is an on-cell, the cell will conduct current and pull low the bit line voltage to below a level of (Vbias−Vt).

Meanwhile, the gate signal VG2 is supplied with a voltage, such as VDD. The voltage source VS2 is supplied with a shielding voltage, such as 0V. This condition will turn on the odd load devices 232b, 232d, and 232f to apply 0V to the odd bit lines 201b, 201d, and 201f. This prevents bit line capacitance coupling between the even bit lines 201a, 201c, and 201e.

After the voltages of the bit lines are balanced, the even bit line select gates 202a, 202c, and 202e are sequentially turned on for a period of time to let the page buffer circuit 200 sense the voltage of each even bit line to determine the data. When reading the odd bit lines 201b, 201d, and 201f, the operation is similar to reading the even bit lines except that the bias conditions of VG1, VS1, and VG2, VS2 are swapped.

FIG. 49C shows an exemplary embodiment of a bit line select gate circuit that illustrates the bias conditions for programming operations.

FIG. 49D shows a table of exemplary bias conditions for the signals VG1, VG2, VS1, and VS2 used during programming operations of the circuit shown in FIG. 49C.

Referring now to FIG. 49C, when programming even bit lines 201a, 201c, and 201e, the gate signal VG1 is supplied with 0V to turn off the even load devices 232a, 232c, and 232e. This will cause the even bit lines to be floating. The even bit line select gates 202a, 202c, and 202e are sequentially turned on for a period of time to let the page buffer 200 load the program data into the even bit lines 201a, 201c, and 201d.

Meanwhile, the gate signal VG2 is supplied with a voltage level of (VDD+Vt) or VDD. The voltage source VS2 is supplied with an 'inhibit' voltage such as VDD. This will turn on the load devices 232b, 232d, and 232f to charge the odd bit lines 201b, 201d, and 201f to a voltage level of VDD or (VDD−Vt). This inhibit voltage will prevent the cells on the odd bit lines from being programmed. It also prevents bit line capacitance coupling between the even bit lines 201a, 201c, and 201e. When programming the odd bit lines 201b, 201d, and 201f, the operation is similar to programming the even bit lines except the bias conditions of VG1, VS1, and VG2, VS2 are swapped.

Figures 50A, 50B:
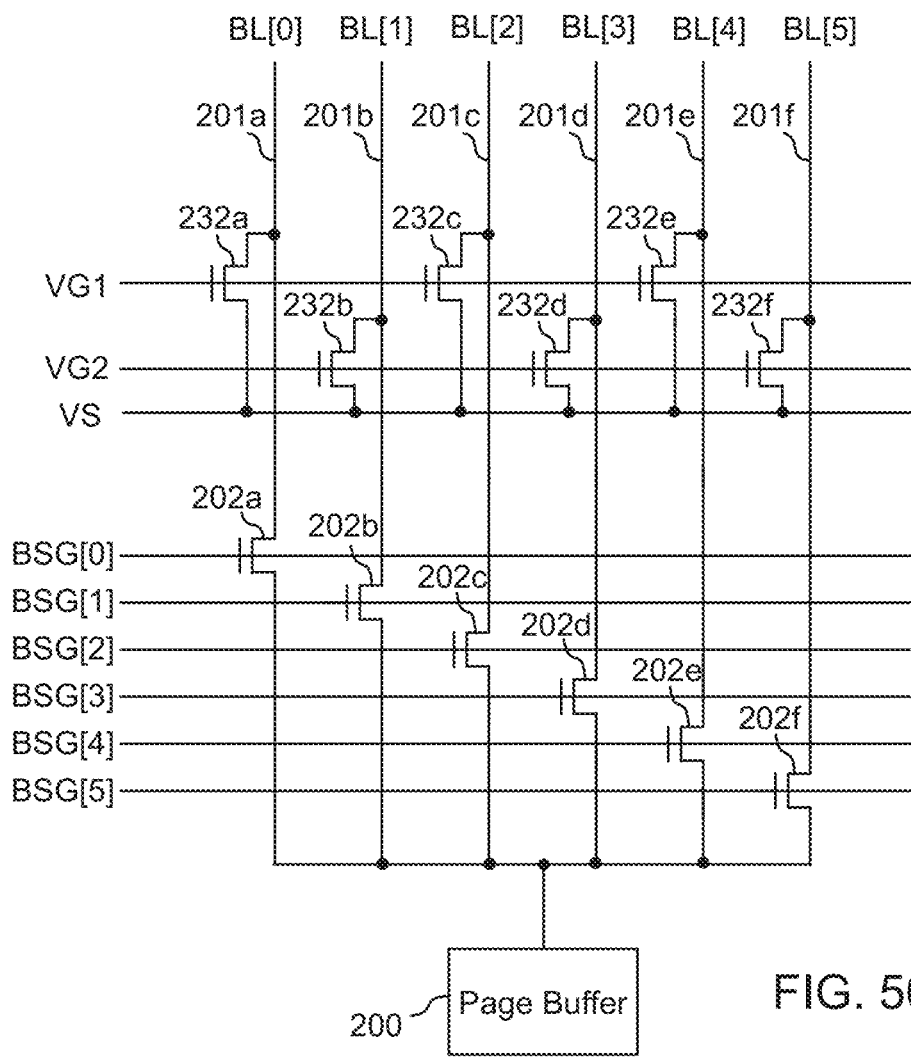
FIG. 50A shows an embodiment of a bit line select gate circuit configured for half bit line (HBL) current sensing according to the invention.
FIG. 50B shows an exemplary embodiment of bias conditions for the signals VG1, VG2, and VS for read operations according to this embodiment.

FIG. 50A shows another embodiment of a bit line select gate circuit comprising select gates 202a to 202f and load devices 232a to 232f configured for half bit line (HBL) current sensing according to the invention. This embodiment is similar to the embodiment shown in FIG. 49A except that the sources of the even and odd load devices 232a-f are all connected to the same voltage source, VS.

FIG. 50B shows an exemplary embodiment of bias conditions for the signals VG1, VG2, and VS for read operations according to this embodiment. When reading even bit lines 201a, 201c, and 201e, the bit line pass gates 202a-f are turned off. The gate signal VG1 is supplied with a bias voltage, Vbias. The voltage source VS is supplied with a positive voltage, such as VDD. This will turn on the even load devices 232a, 232c, and 232e to apply a load current, Iload, to the even bit lines 201a, 201c, and 201e. This will cause the even bit lines 201a, 201c, and 201e to be balanced at voltages depending on the load current and cell current of each bit line. If the selected cell is an off-cell, the bit line voltage will be pull up to a level of (Vbias−Vt) by the load devices. If the selected cell is an on-cell, the cell will conduct current and pull low the bit line voltage to below a level of (Vbias−Vt).

Meanwhile, the gate signal VG2 is supplied with a voltage, such as VDD or (VDD+Vt). This condition will turn on the odd load devices 232b, 232d, and 232f to apply a voltage level of (VDD−Vt) or VDD to the odd bit lines 201b, 201d, and 201f. This will create shielding effect to prevent bit line capacitance coupling between the even bit lines 201a, 201c, and 201e. In this embodiment, if the unselected odd bit lines have on-cells, they may cause leakage current. However, because the odd load devices 232b, 232d, and 232f are strongly turned on by the gate voltage level of VDD or (VDD+Vt), the cell current will have insignificant effect to the shielding voltage applied by the odd load devices.

Figures 51A, 51B:
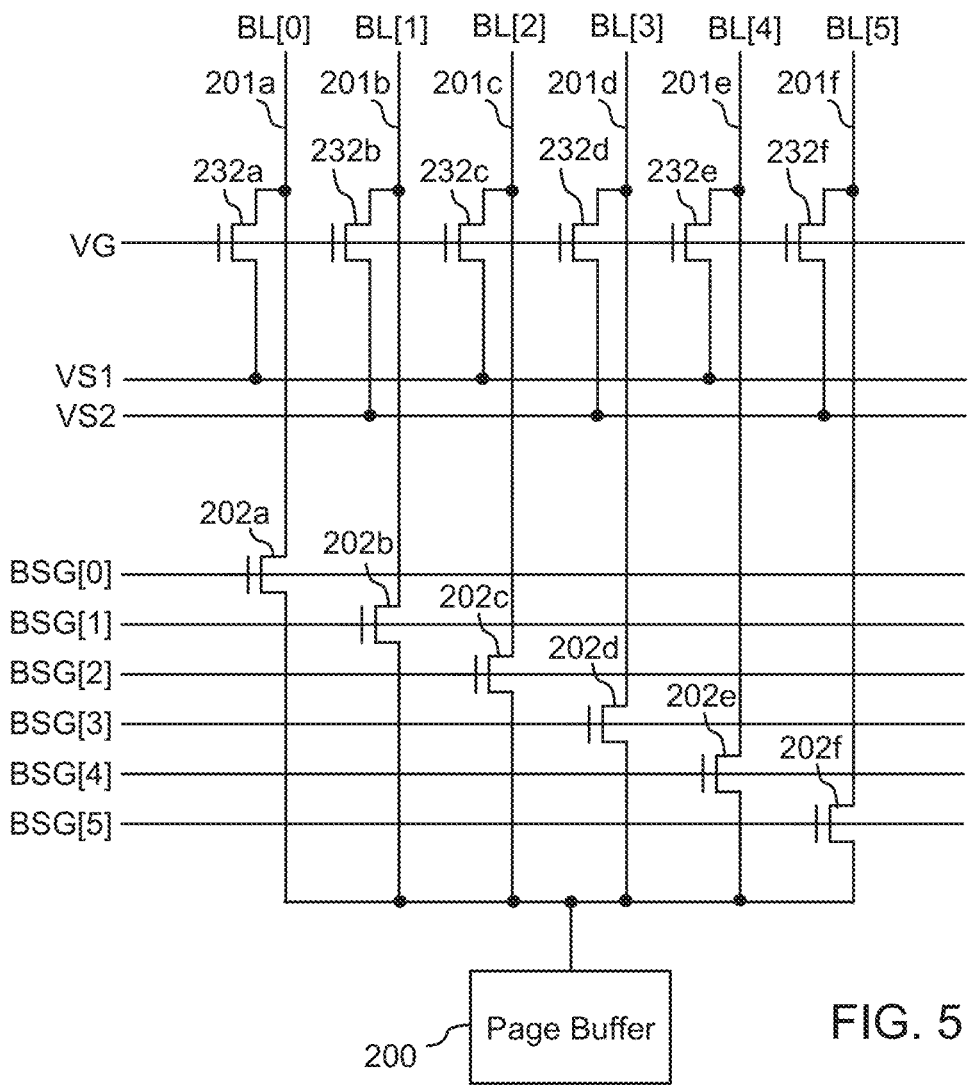
FIG. 51A shows an exemplary embodiment of a bit line select gate circuit configured for half bit line (HBL) current sensing according to the invention.
FIG. 51B shows an exemplary embodiment of bias conditions for the signals VG, VS1, and VS2 for read operations according to this embodiment.

FIG. 51A shows another exemplary embodiment of a bit line select gate circuit comprising bit line select gates 202a-f and load devices 232a-f configured for half bit line (HBL) current sensing according to the invention. This embodiment is similar to the embodiment shown in FIG. 48A except that the sources of the even load devices 232a, 232c, and 232e and the odd load devices 232b, 232d, and 232f are connected to different voltage sources; namely, VS1 and VS2.

FIG. 51B shows an exemplary embodiment of bias conditions for the signals VG, VS1, and VS2 for read operations according to this embodiment. During a read operation, the gate signal VG is supplied with a bias voltage, Vbias, which is higher than Vt to turn on the load devices 232a-f. To read the even bit lines 201a, 201c, and 201e, the voltage source VS1 is supplied with a high voltage, such as VDD. The gate voltage VG will turn on the even load devices 232a, 232c, and 232e to apply the load current, Iload, to the even bit lines 201a, 201c, and 201e. This will cause the even bit lines 201a, 201c, and 201e to be balanced at voltages depending on the load current and cell current of each bit line.

For the unselected odd bit lines, the voltage source VS2 is supplied with a shielding voltage, such as 0V. The gate signal VG will turn on the odd load devices 232b, 232d, and 232f to apply 0V (shielding voltage) to the odd bit lines 201b, 201d, and 201f. This will prevent capacitance coupling between the even bit lines 201a, 201c, and 201e. To read the odd bit lines 201b, 201d, and 201f, the bias conditions of VS1 and VS2 are swapped.

Compared with the embodiment shown in FIG. 49A, the embodiment in FIG. 51A has driving current for the unselected load devices that may be lower, due to the gate signal VG being connected to Vbias rather than VDD.

Figures 52A, 52B:
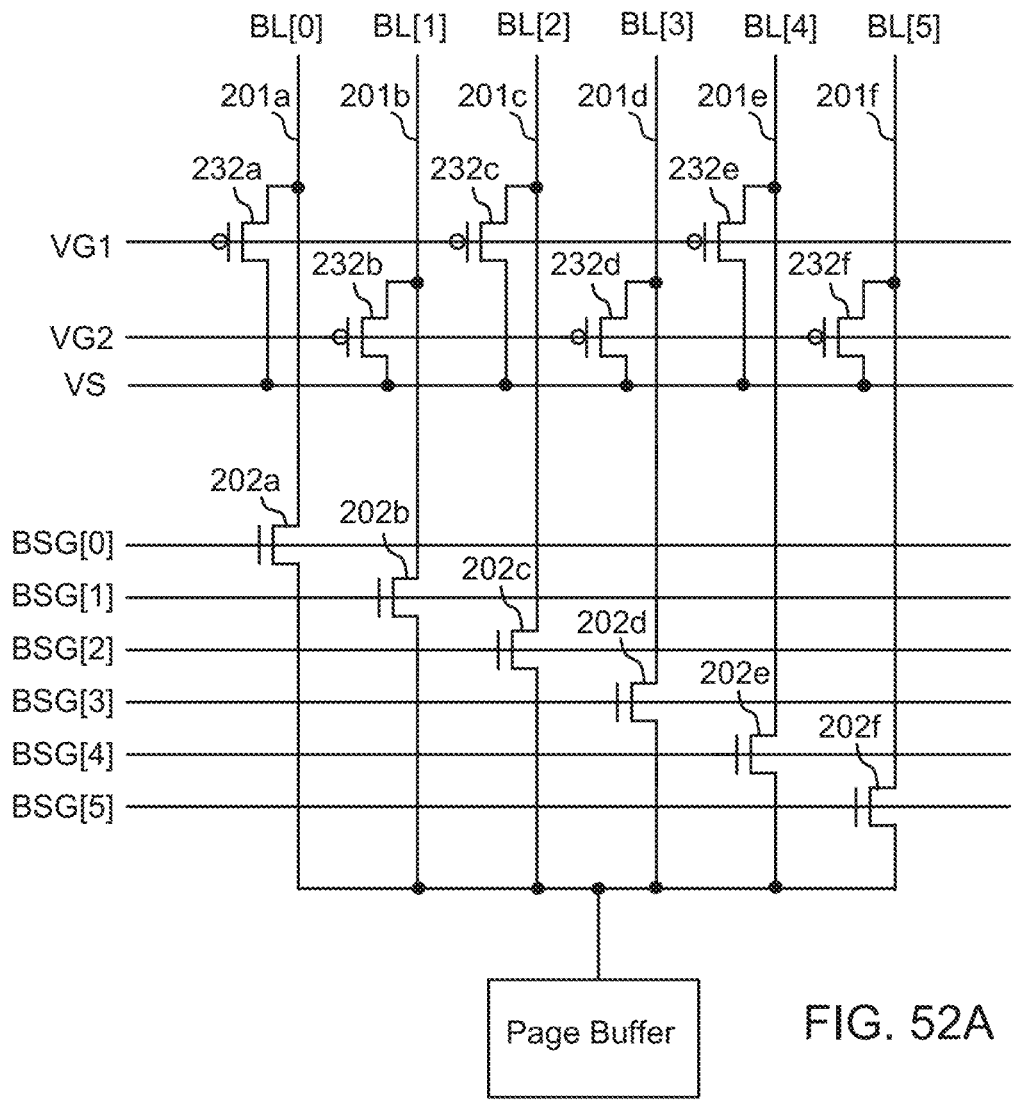
FIG. 52A shows an exemplary embodiment of a bit line select gate circuit for half bit line (HBL) current sensing according to the invention.
FIG. 52B shows an exemplary embodiment of bias conditions for the signals VG, VG2, and VS for read operations according to the embodiment shown in FIG. 52A.

FIG. 52A shows another exemplary embodiment of a bit line select gate circuit comprising bit line select gates 202a-f and load devices 232a-f for half bit line (HBL) current sensing according to the invention. This embodiment is similar to the embodiment shown in FIG. 50A except that the load devices 232a-f are changed from NMOS transistors (used in FIG. 50A) to PMOS transistors (used in this embodiment).

FIG. 52B shows an exemplary embodiment of bias conditions for the signals VG, VG2, and VS for read operations according to this embodiment shown in FIG. 52A. To read the even bit lines 201a, 201c, and 201e, the voltage source VS is supplied with a bias voltage, such as ½ VDD. The gate signal VG1 is supplied with a bias voltage slightly lower than (Vbias−Vt) to weakly turn on the even load devices 232a, 232c, and 232e to apply a load current, Iload, to the even bit lines 201a, 201c, and 201e. This will cause the even bit lines 201a, 201c, and 201e to be balanced at selected voltage levels depending on the load current and cell current of each bit line. If the cell is an off-cell, the bit line will be pulled up to Vbias by the load current. If the cell is an on-cell, the bit line will be pulled lower than Vbias. The load current can be adjusted by changing the gate voltage VG1.

For unselected odd bit lines 201b, 201d, and 201f, the gate signal VG2 is supplied with a low voltage level, such 0V. This will strongly turn on the odd load devices 232b, 232d, and 232f to provide a shielding voltage (e.g., VDD) to the odd bit lines 201b, 201d, and 201f.

An advantage of this embodiment is the driving current for VDD of PMOS is higher than NMOS. However, the drawback is that the PMOS load devices 232a-f and the NMOS bit line select gates 202a-f will need spacing between their N-well and P-well.

Figure 52C:
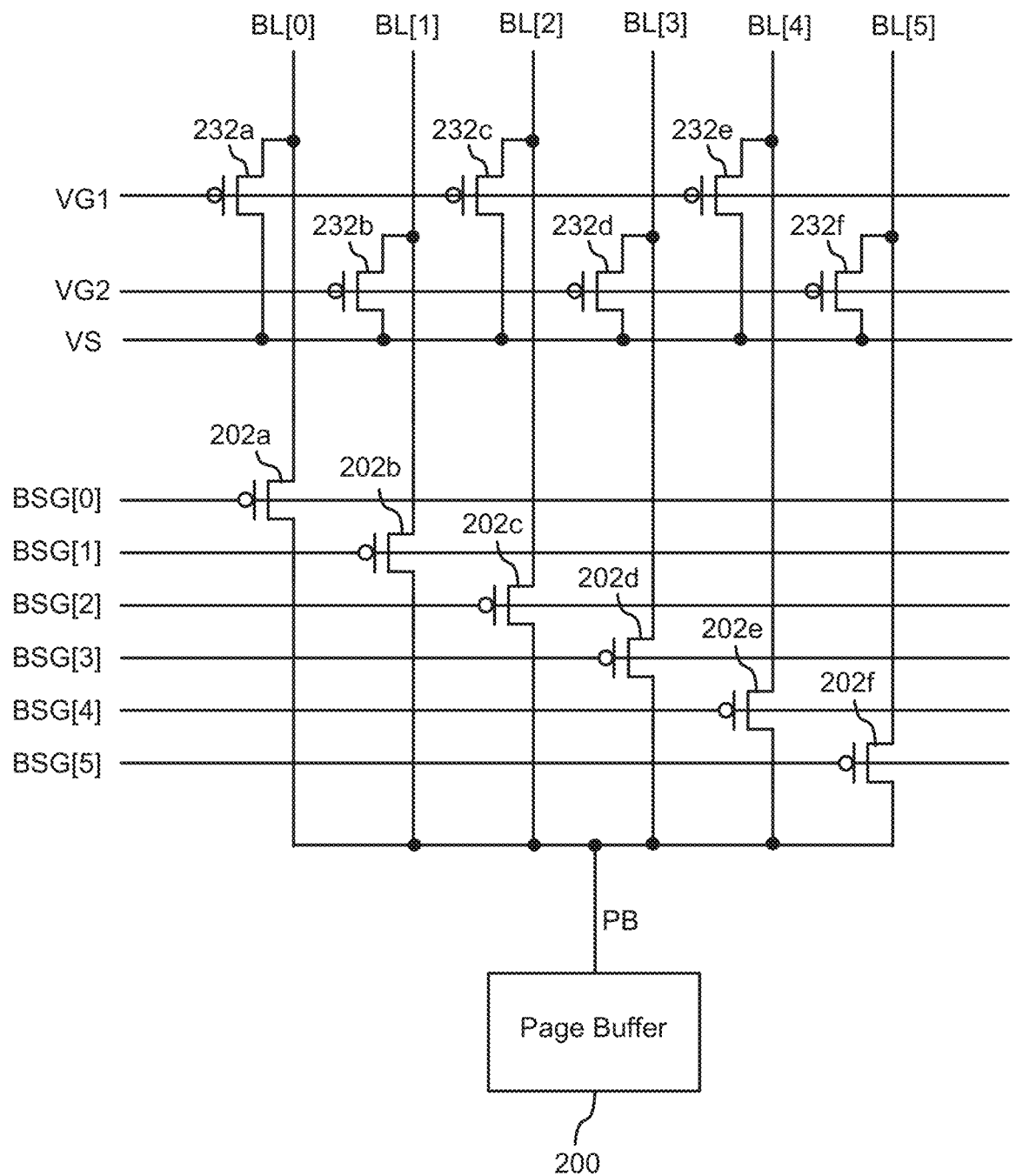
FIG. 52C shows an exemplary embodiment of a bit line select gate circuit for half bit line (HBL) current sensing operations according to the invention.

FIG. 52C shows another exemplary embodiment of a bit line select gate circuit comprising bit line select gates 202a-f and load devices 232a-f for half bit line (HBL) current sensing operations according to the invention. This embodiment is similar to the embodiment shown in FIG. 52A, except that the bit line select gates 202a-f are changed from NMOS transistors to PMOS transistors. Therefore, the above-mentioned spacing between the wells may be eliminated.

Figures 52D, 52E:
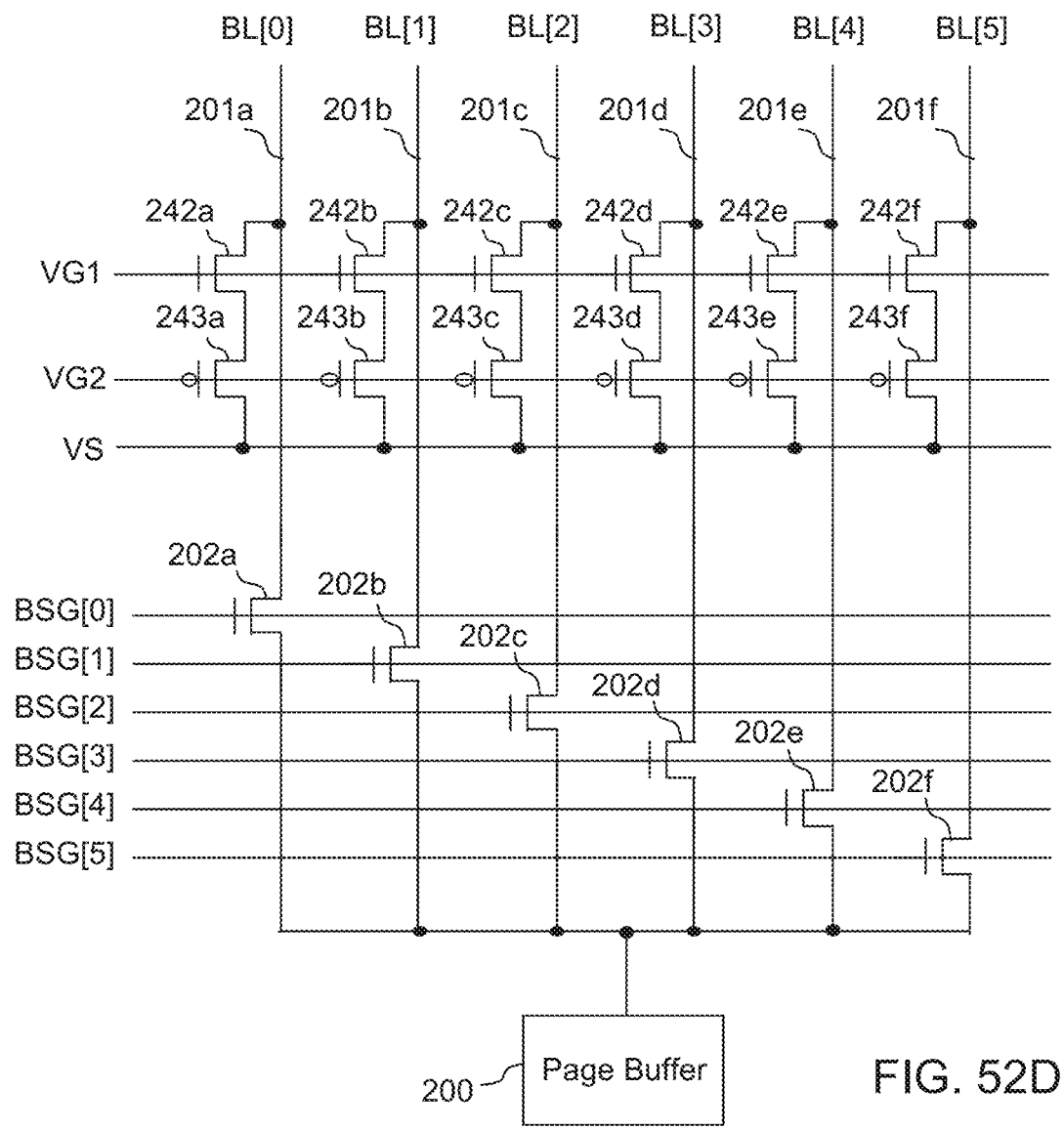
FIG. 52D shows an exemplary embodiment of a bit line select gate circuit for all bit line (ABL) current sensing operations according to the invention.
FIG. 52E shows an exemplary embodiment of bias conditions for read and pre-charge operations for the embodiment shown in FIG. 52D.

FIG. 52D shows another exemplary embodiment of a bit line select gate circuit comprising bit line select gates 202a-f and load devices 232a-f and 243a-f for all bit line (ABL) current sensing operations according to the invention. In this embodiment, the load devices comprise both NMOS transistors 242a-f and PMOS transistors 243a-f. During read operations, the voltage source VS is supplied with VDD. The gate voltage VG2 is supplied with a voltage slightly lower than (VDD−Vt) to weakly turn on the PMOS transistors 243a-f to generate the load current. In an embodiment, the gate voltage VG2 is generated by a current mirror circuit to accurately control the load current of the PMOS transistors 243a-f. The gate voltage VG1 is supplied with a voltage Vbias, that will limit the pull up voltage of the bit line at (Vbias−Vt). By using this circuit, the load current and the bit line voltage can be separately controlled by VG1 and VG2. During pre-charging, the gate voltage VG2 is supplied with 0V. This strongly turns on the PMOS transistors 243a-n to increase the load current to reduce the pre-charging time.

The previous embodiments shown in FIGS. 48A-52A use "bit line discharging" read operations. Referring to FIG. 48C, in a "bit line discharging" read operation, the source line 233 of the memory cell strings is supplied with a low voltage, such as 0V. The bit lines 201a-f are supplied with a voltage higher than the source line voltage. If the selected cells are on-cells, the cells will be turned on and conduct current from the bit lines to the source line to discharge the bit lines.

In addition to the bit line discharging read operations, the embodiments shown in FIGS. 48A-52A operate to provide read operations called "bit line charging" read operations, as illustrated in the read operation waveforms shown in FIG. 7B. In "bit line charging" read operations, a high voltage, such as VDD, is supplied to the source line 233 of the memory cell strings. The bit lines 201a-f are supplied with a voltage lower than the source line voltage, such as 0V. If the selected cells are on-cells, the cells will be turned on and conduct current from the source line to the bit lines to charge up the bit lines.

For "bit line charging" read operations using current sensing, because on-cells will charge up the bit lines, the load current is changed to discharge the bit lines. Therefore, if the selected cell is an off-cell, the bit line will be discharged to a low voltage by the load current. If the selected cell is an on-cell, the bit line will be balanced at a higher voltage by the cell current and the load current.

FIG. 52E shows an exemplary embodiment of bias conditions for read and pre-charge operations for the embodiment shown in FIG. 52D. During pre-charge operation, the power line VS is supplied with VDD. The signal VG2 is supplied with 0V to strongly turn on the PMOS transistors 243a-f to apply large current to pre-charge the bit lines 201a-f. The signal VG1 is supplied with a Vbias voltage to limit the pre-charged voltage of the bit lines 201a-f to (Vbias−Vt). After pre-charging, during read operations, the signal VG1 is supplied with a voltage lower than (VDD−Vt) to weakly turn on the PMOS transistors 243a-f to supply the loading current to the bit lines 201a-f.

FIG. 53A shows an exemplary embodiment of bias conditions for on-cell charging current sensing operations for the embodiment shown in FIG. 50A. The power line VS is supplied with 0V. The signal VG1 for the selected bit line is supplied with a bias voltage, Vbias, to generate the load current. The signal VG2 for the unselected bit lines is supplied with VDD to strongly turn-on the shielding devices to pull the unselected bit lines to 0V.

FIG. 53B shows an exemplary embodiment of bias conditions for the embodiment shown in FIG. 49A. The bias conditions for embodiment are similar to the ones shown in FIG. 53A except that the power line VS2 for the unselected bit line is supplied with a high voltage such as VDD to apply the shielding voltage to the unselected bit lines.

FIG. 53C shows an exemplary embodiment of bias conditions for the embodiment shown in FIG. 51A. This embodiment is similar to the embodiment shown in FIG. 53B except that the gates of the shielding devices are all connected to the signal VG, which is supplied with Vbias. This may reduce the driving current of the unselected bit lines' shielding devices, however, sufficient driving current exists since VS2 is supplied with 0V.

Figure 54A:
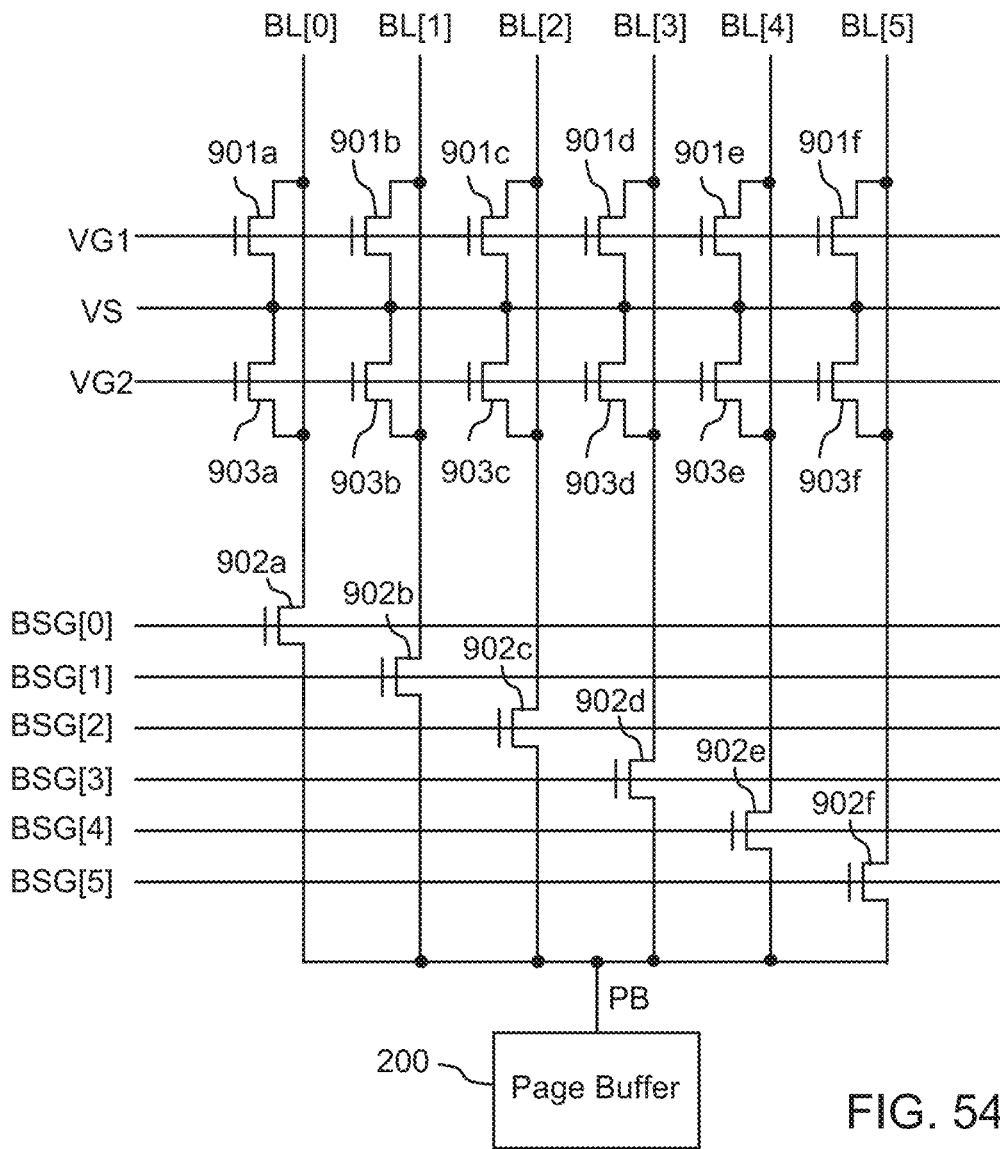
FIG. 54A shows an exemplary embodiment of bit line load devices according to the invention.

FIG. 54A shows another exemplary embodiment of bit line load devices according to the invention. In this embodiment, the bit lines are connected to two groups of load devices. The first group of load devices, such as 901a-f are used to pre-charge the bit lines before a read operation, thus they may have a larger channel width to increase the pre-charge current. The second group of load devices, such as 903a-f are used to provide the load current during sensing, thus they may have smaller channel width to control the small load current. Because the load current may be lower than 100 Nano Amps (nA), without the larger load devices 901a-f, it may take very long time for the smaller load devices 903a-f to pre-charge the high-capacitance bit lines.

Figure 54B:
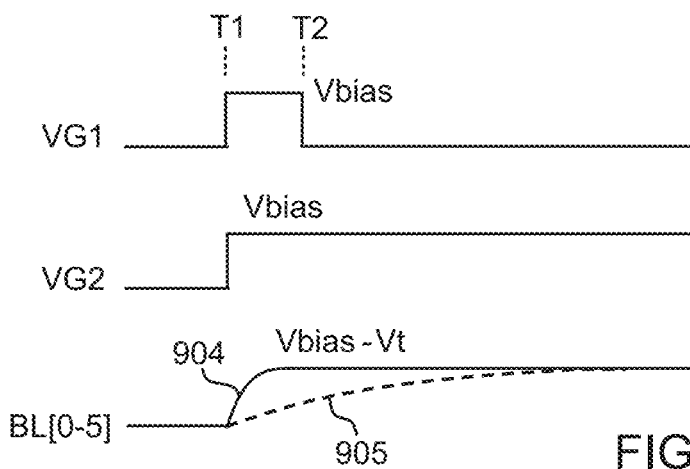
FIG. 54B shows exemplary waveforms for pre-charging bit lines for use with the embodiment shown in FIG. 54A.

FIG. 54B shows exemplary waveforms for pre-charging the bit lines for use with the embodiment shown in FIG. 54A. At T1 time, both the signal VG1 and VG2 are supplied with a bias voltage (Vbias) to pre-charge the bit lines (BL0-15) to a voltage level of (Vbias−Vt). The signal VG1 will turn on the larger load devices 901a-f to increase the pre-charging current. After the bit lines are pre-charged, at T2 time, the larger load devices 901a-f are turned off by the VG1 signal. Then, a smaller load current is supplied by the smaller load devices 903a-f. The bit line indicator 904 shows the bit line pre-charging speed with the larger load devices 901a-f and the bit line indicator 905 shows the bit line pre-charging speed without the aid of the large devices and using only the smaller load devices 903a-f.

Figure 54C:
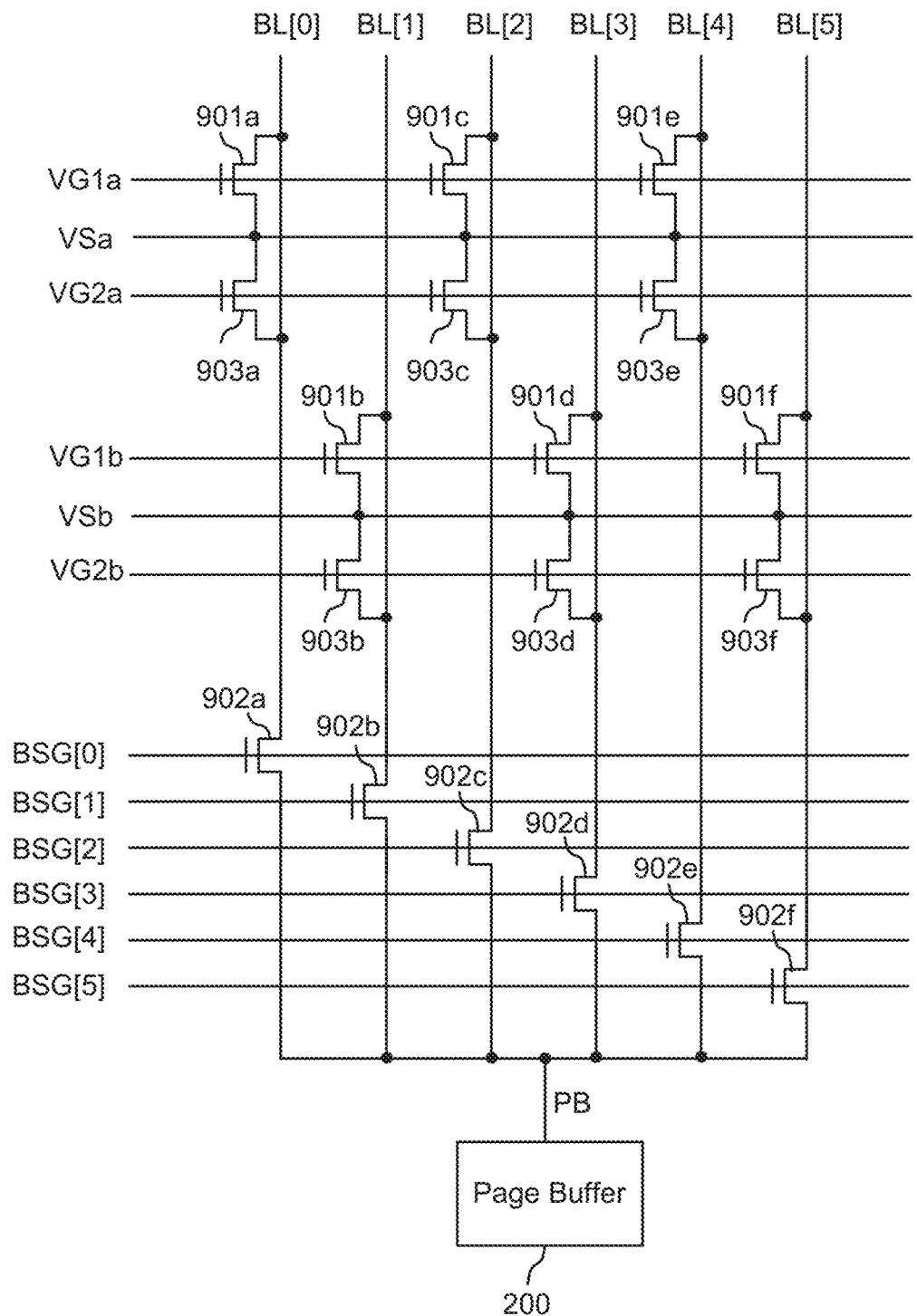
FIG. 54C shows an exemplary embodiment of bit line load devices that implement the configuration of double load devices shown in FIG. 54A in accordance with a half-bit line (HBL) design.

FIG. 54C shows another exemplary embodiment of bit line load devices that implement the configuration of double load devices shown in FIG. 54A in accordance with a half-bit line (HBL) design. In FIG. 54C, the load devices 901a-f are larger devices for pre-charging the bit lines. The load devices 903a-f are smaller devices for providing the load current to the bit lines.

Figure 55A:
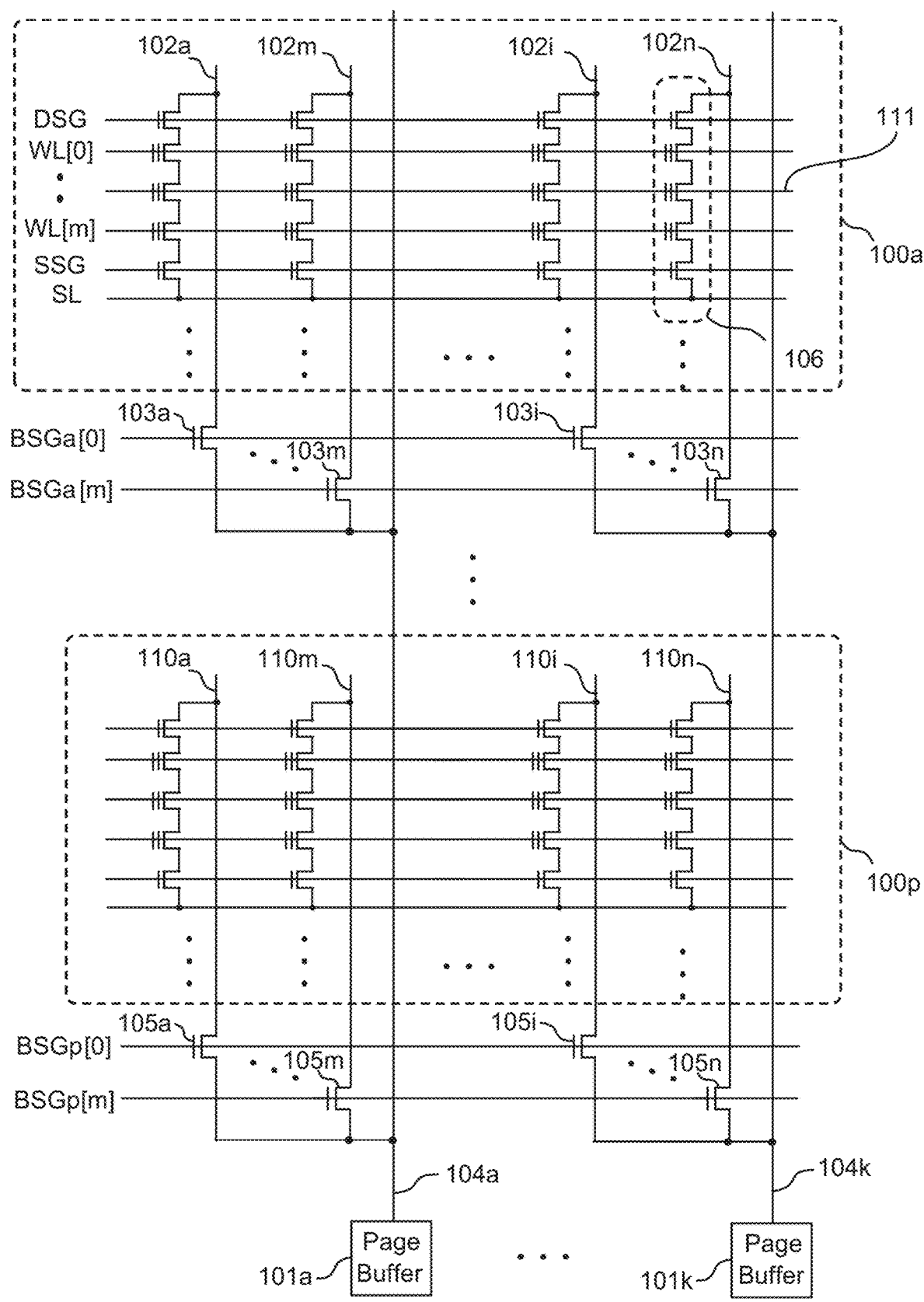
FIG. 55A shows an exemplary embodiment of an array architecture constructed according to the invention.

FIG. 55A shows an exemplary embodiment of an array architecture constructed according to the invention. The array architecture comprises multiple sub-arrays called sectors 100a-p. Each sector comprises multiple bit lines, such as bit lines 102a-n. For example, in the sector 100a, the bit lines 102a-m are connected to a data line called a global bit line 104a through bit line select gates 103a-m. The bit lines 102a-m are connected to a data line 104k through bit line select gates 102i-n. In the sector 100p, the bit lines 110a-m are connected to the global bit line 104a through bit line select gates 105a-m. The bit lines 110i-n are connected to a data line 104k through bit line select gates 105i-n. The data lines 104a-k are connected to page buffers 101a-k, respectively.

During read and program operations, one of the sectors 100a-p is selected. It will be assumed that the sector 100a is selected. The bit line select gates 103a-m will be sequentially turned on for a period of time to connect the bit lines 102a-m to the page buffer 101a through the global bit line 104a to perform read and program operations to all the bit lines 102a-m. The bit line select gates of the unselected sectors such as 105a-m are turned off.

During program operations, the bit line select gates 103a-m are sequentially turned on for a period of time to connect the bit lines 102a-m to the page buffer 101a through the global bit line 104a to load program data from the page buffer 101a to the bit lines 102a-m. Similarly, the bit line select gates 103i-n are sequentially turned on for a period of time to connect the bit lines 102i-n to the page buffer 101k through the global bit line 104k to load program data from the page buffer 101k to the bit lines 102i-n.

After the program data is loaded to the bit lines 102a-n, the bit line select gates 103a-n are turned off to isolate the bit lines 102a-n from the global bit lines 104a-k. The selected word line, such as 111, is applied with a program high voltage to program the selected cells according to the data stored in the bit lines 102a-n.

During read operations, the selected bit lines 102a-n are pre-charged to a bias voltage. In an embodiment, the bias voltage is ½ VDD, for example. The bit lines 102a-n are pre-charged by turning on the bit line select gates 103a-n and applying the bias voltage from the page buffers 101a-k.

After a pre-charging time, the bit line select gates 103a-n are turned off to isolate the bit lines 102a-n from the global bit lines 104a-k. The selected word line is applied with a read voltage. The read voltage will turn on the 'on-cells' that have a threshold voltage (Vt) lower than the read voltage. The on-cells will discharge the corresponding sub-bit lines to a low voltage, such as 0V for example.

After a discharging time, the bit line select gates 103a-m are sequentially turned on for a period of time to connect the bit lines 102a-m to the page buffer 101a through the global bit lines 104a to read the data of the bit lines 102a-m by the page buffer 101a. Similarly, the bit line select gates 103i-n are sequentially turned on for a period of time to connect the bit lines 102i-n to the page buffer 101k through the global bit lines 104k to read the data of the bit lines 102i-n by the page buffer 101k.

By using the above operations, the page buffers 101a-k can perform program and read operations to the bit lines 102a-n in parallel. Therefore, the read and program data throughputs are increased. For example, assuming a chip has 1 KB page buffers 101a-k, and each page buffer, such as 101a, is connected to 16 bit lines 102a-m through the global bit line 104a. The 1 KB page buffers 101a-k can read and program 16 KB bit lines 102a-n. Compared with the conventional devices that can only read and program one bit line per page buffer, the conventional device's 1 KB page buffers can only read and program 1 KB bit lines. Therefore, the invention increases the read and program data throughputs by 16 times.

Moreover, in another embodiment, during program operations, after the bit line select gates 103a-n are sequentially turned on for a period of time to load program data to the bit lines 102a-n, the bit line select gates 103a-n are turned off to isolate the bit lines 102a-n. A second sector's bit line select gates, such as 105a-n are sequentially turned on for a period of time to load program data to the second sector's bit lines 110a-n. This procedure may be repeated to load program data to multiple sectors' bit lines. Then, the selected word lines in each selected sector are supplied with a program high voltage to program the selected cells on the selected bit lines in parallel. In this way, the program data throughput is significantly increased.

For example, to describe the data throughput, it will be assumed that each global bit line, such as 104a is connected to M bit lines 102a-m. Assuming further that there are N sectors whose bit lines are loaded with program data, then the program data throughput will be increased by M×N times by using this embodiment.

In an embodiment, similar steps are performed for read operations to increase the read data throughput over conventional devices. First, the bit lines in multiple sectors, such as 102a-n and 110a-n are pre-charged to a bias voltage. This may be done by turning on the bit line select gates 103a-n and 105a-n and applying pre-charging voltage from the page buffers 101a to 101k.

After a pre-charging time, the first sector's bit line select gates 103a-n and 105a-n are turned off to isolate the bit lines 102a-n and 110a-n from the bit lines 104a-k. A selected word line in each selected sector is supplied with a read voltage to turn on the on-cells. The on-cells will discharge the corresponding bit lines.

After a discharging time, the bit line select gates 102a-n are sequentially turned on for a period of time to connect the bit lines 102a-n to the global bit lines 104a-k, and to read the data from the bit lines 102a-n by the page buffers 101a-k.

After the data of the first sector's bit lines 102a-n are read, the first sector's bit line select gates 103a-n are turned off. The second sector's bit line select gates 105a-n are sequentially turned on for a period of time to connect the second sector's bit lines 110a-n to the global bit lines 104a-k, and read the data from the bit lines 110a-m by the page buffers 101a-k. This procedure may be repeated until all the data of selected sectors' bit lines are read. By using this way, the read data throughput can be significantly increased by M×N times, where M is the number of the bit lines connected to a global bit line, and N is the number of the selected sectors.

Figure 55B:
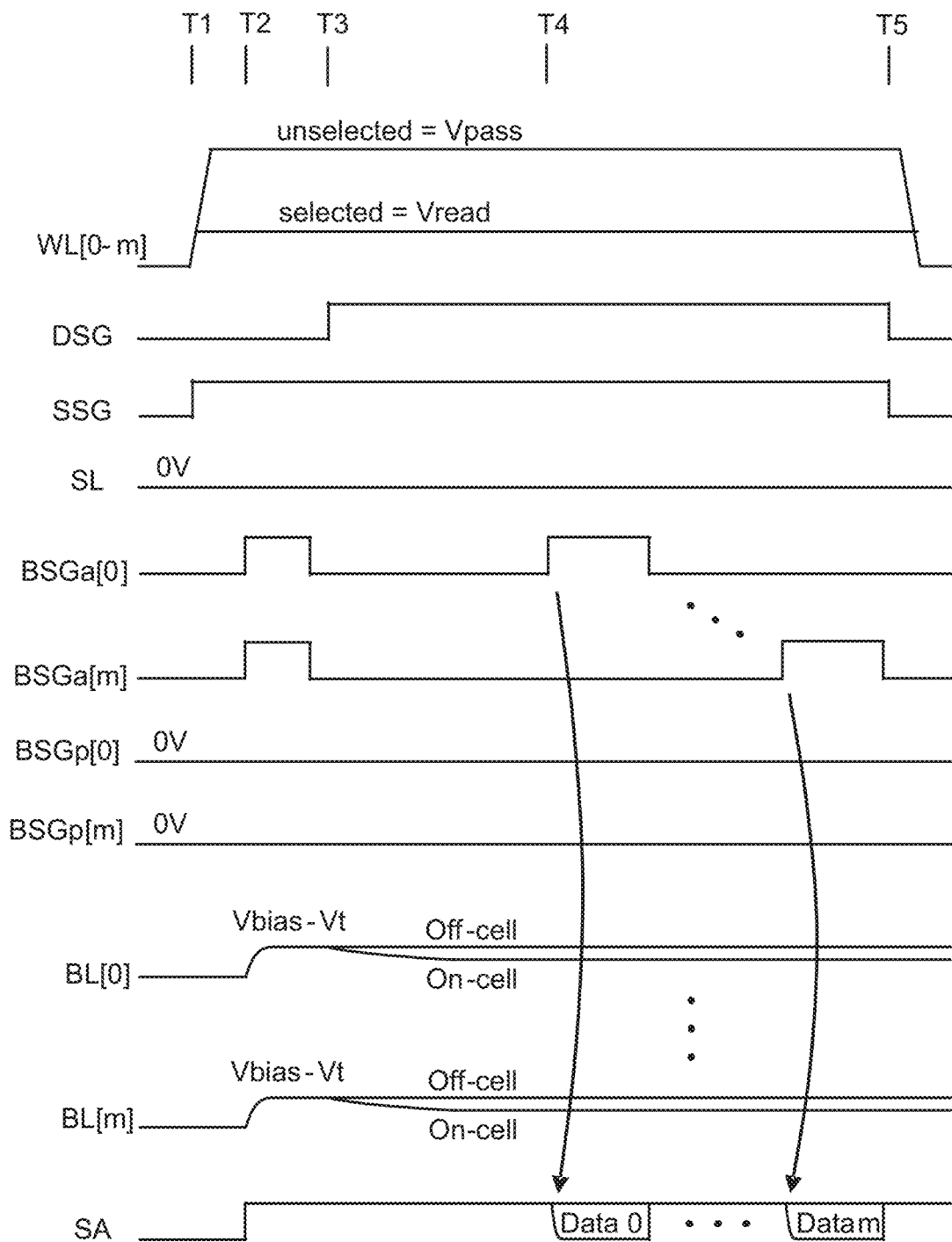
FIG. 55B shows a diagram illustrating exemplary read and program-verify operation of the array structure shown in FIG. 55A according to the invention.

FIG. 55B shows a diagram illustrating exemplary read and program-verify operation of the array structure shown in FIG. 55A according to the invention.

At time T1, the selected word line is supplied with a read voltage, Vread, and the unselected word lines are supplied with a pass voltage, Vpass, as shown in WL[0-m].

At time T2, assuming the bit line select gates BSGa[0] to BSGa[m] are selected, the bit line select gates BSGa[0] to BSGa[m] are turned on to pre-charge BL[0] to BL[m] to a pre-charge voltage, Vpre. The unselected bit line select gates BSGp[0] to BSGp[m] remain at 0V.

At time T3, the bit line select gates BSGa[0] to BSGa[m] are turned off and the bit lines BL[0] to BL[m] become floating. The drain select gate (DSG) of the selected string is turned on to connect the selected strings to the bit lines. Because the source select gate (SSG) is turned on and the source line (SL) is supplied with 0V, the on-cells will start to discharge their associated bit lines. For off-cells, their bit lines will remain at the pre-charged voltage.

At time T4, which is a selected time interval after T3, the bit line select gates BSGa[0] to BSGa[m] are sequentially turned on for a period of time to connect the page buffer to BL[0] to BL[m]. The bit line voltage will be sensed by the sensing circuit of the page buffer to determine the data of each bit line. The data of on-cells and off-cells may be 1 or 0, respectively.

The bit line discharge time from time T3 to T4 is dependent on the bit line capacitance and the cell current. For TLC NAND flash memory products, the typical bit line discharge time is about 10-30 us. By using the multiple-plane architecture shown in FIG. 9D according to the invention, the number of the planes may be increased by K times without increasing the total number of page buffers. This reduces the bit line length as well as the bit line capacitance of each plane to 1/K. Therefore, it can reduce the bit line discharge time to 1/K. This significantly reduces the read latency and increase the read data throughput. Thus, the discharge time may be much shorter.

At time T5, after the data of all the bit lines are read, the word line voltages are discharged and the read or program-verify operation stops.

It should be noted that the waveforms shown in FIG. 55B are for reading SLC (single-level cell) devices. The selected word line is supplied with a read voltage to check if the cell's Vt is higher or lower than the read voltage. For multiple level cells, such as MLC (multi-level cell), TLC (triple-level cell), QLC (quad-level cell), and PLC (penta-level cell), the waveforms are repeated multiple times with different selected word line voltages to check the cell's Vt level and then converted to multiple-bit data.

Figure 55C:
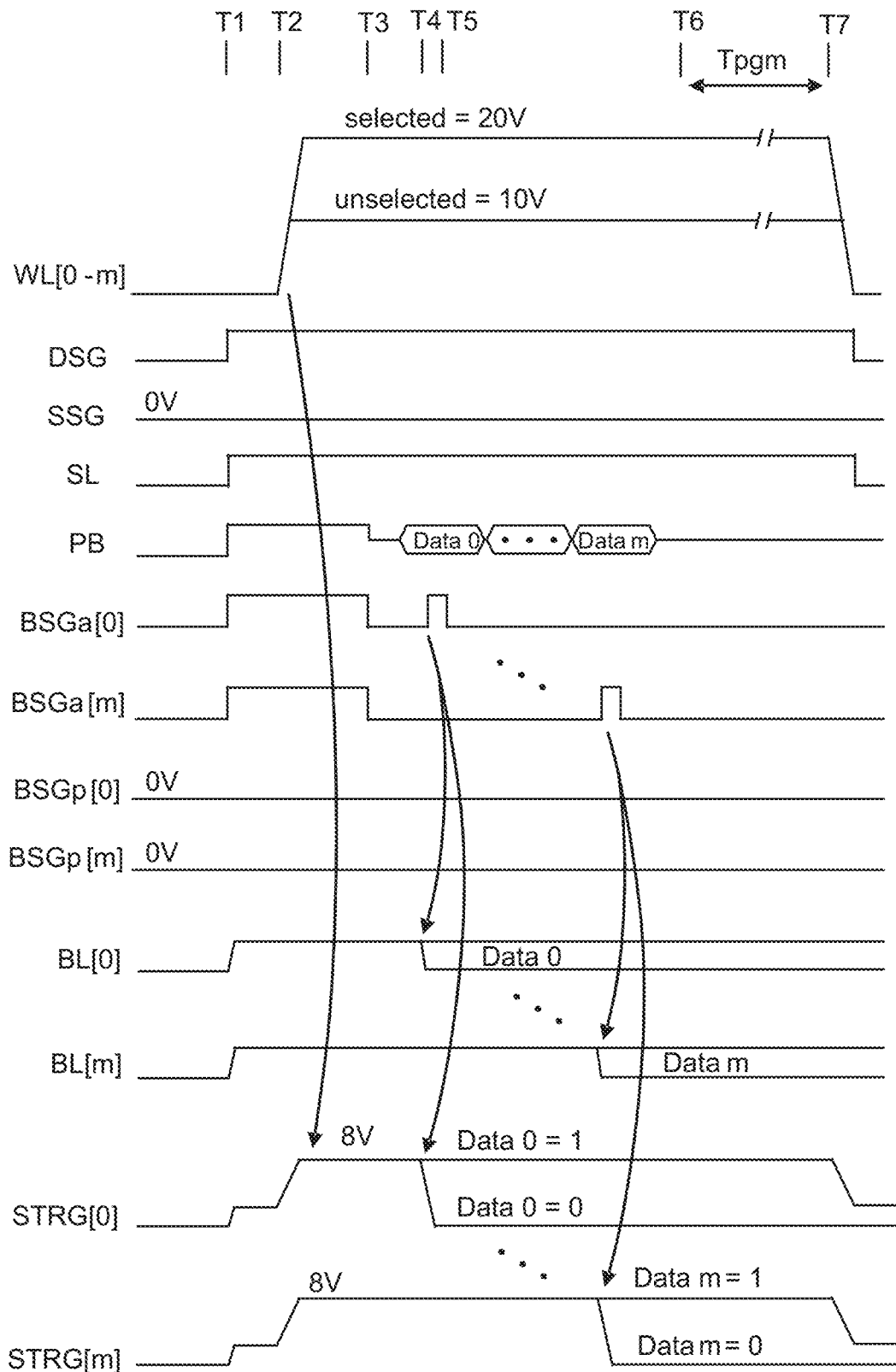
FIG. 55C shows a diagram illustrating exemplary program operations of the array structure shown in FIG. 55A according to the invention.

FIG. 55C shows a diagram illustrating exemplary program operations of the array structure shown in FIG. 55A according to the invention. It will be assumed that the bit line select gates BSGa[0] to BSGa[m] are selected.

At time T1, BSGa[0] to BSGa[m] are set to a high level to load inhibit data, VDD, to BL[0] to BL[m]. The unselected bit line select gates BSGp[0] to BSGp[m] remain at 0V. The drain select gates (DSG) of the selected strings are supplied with VDD. The source select gate (SSG) is supplied with 0V and the source line (SL) is supplied with VDD.

At time T2, the selected word line and the unselected word lines are supplied with the program voltage, such as 20V, and the inhibit voltage, such as 10V, respectively. The word line voltage will couple the channel region of the strings STRG[0] to STRG[m] to a voltage of approximately 8V. This voltage inhibits the programming of the cells. Due to the bit lines being supplied with VDD, the drain select gates are reverse-biased. Thus, the drain select gates will be turned off to prevent the channel voltage from leaking to the bit lines.

At time T3, the bit line select gates BSGa[0] to BSGa[m] are turned off. The bit line capacitance will hold the bit line voltage at VDD.

At time T4, the bit line select gates BSGa[0] to BSGa[m] are sequentially turned on for a period of time to apply the program data from the page buffer (PB) to BL[0] to BL[m], respectively. If the data is 1 (VDD), the channel of the string will remain at the inhibit voltage. If the data is 0 (0V), it will turn on the drain select gate and discharge the channel of the string to 0V. This will cause the selected cell in the string to be programmed.

After all the data is loaded into the bit lines, the cells will be programmed for a time period (from T6 to T7) of programming time (Tpgm), such as 10 us to 20 us. Then, the word line voltage is discharged and the program pulse is complete. Next, a program-verify operation is performed to check the program result. The program and program-verify operations may be repeated many times until the cells are programmed successfully.

It should be noted that although FIGS. 55B-C show the operations for reading and programming multiple bit lines BL[0] to BL[m] simultaneously, it is obvious that the operations may be performed on a single bit line only. In this embodiment, the waveforms shown in FIGS. 55B-C are applied as shown except that only one bit line select gate, such as BSGa[0], for example, is selected. This will perform read and program operations to BL[0] only. The unselected bit line select gates, such as BSGa[1] to BSGa[m] are supplied with the pre-charge pulses at time T1, as shown in FIG. 55C. This will pre-charge the unselected bit lines BL[1] to BL[m] to VDD and allow the word lines to boost the channel of the strings in the unselected bit lines BL[1] to BL[m] to the inhibit voltage (e.g., 8V) at time T2. During data loading, the unselected bit line select gates BSGa[1] to BSGq[m] remain at 0V. Only the selected BSGa[0] is supplied with a pulse to load the program data to BL[0]. Therefore, the channel of the unselected strings, STRG[0] to STRG[m], will remain at the inhibit voltage (e.g., 8V) to inhibit the programming of the cells.

In another embodiment, the read and program operations for multiple bit lines shown in FIGS. 55B-C are performed for multiple sectors. This results in multiple bit lines in multiple sectors performing simultaneous read and program operations. For example, for read operations as shown in FIG. 55B, it will be assumed that both sectors of BSGa[0] to BSGa[m] and BSGp[0] to BSGp[m] are selected. The BSGp[0] to BSGp[m] also will be turned on at time T2 to pre-charge the bit lines to (Vbias−Vt). At time T4, after BSGa[0] to BSGa[m] are supplied with pulses to read BL[0] to BL[m], BSGp[0] to BSGp[m] are also supplied with pulses to read the corresponding bit lines.

Similarly, for program operations shown in FIG. 55C, both the sectors' bit line select gates, BSGa[0] to BSGa[m] and BSGp[0] to BSGp[m] are supplied with pulses to pre-charge the corresponded bit lines at time T2 and load data from times T4 to T6. In this way, both sectors' bit lines are programmed simultaneously. It should be noted that for both read and program operations, the bit line select gates (BSG) can be enabled in either a sequential or a non-sequential manner and that the order in which the BSG's are enabled is not limited to any particular pattern or order.

Figure 56:
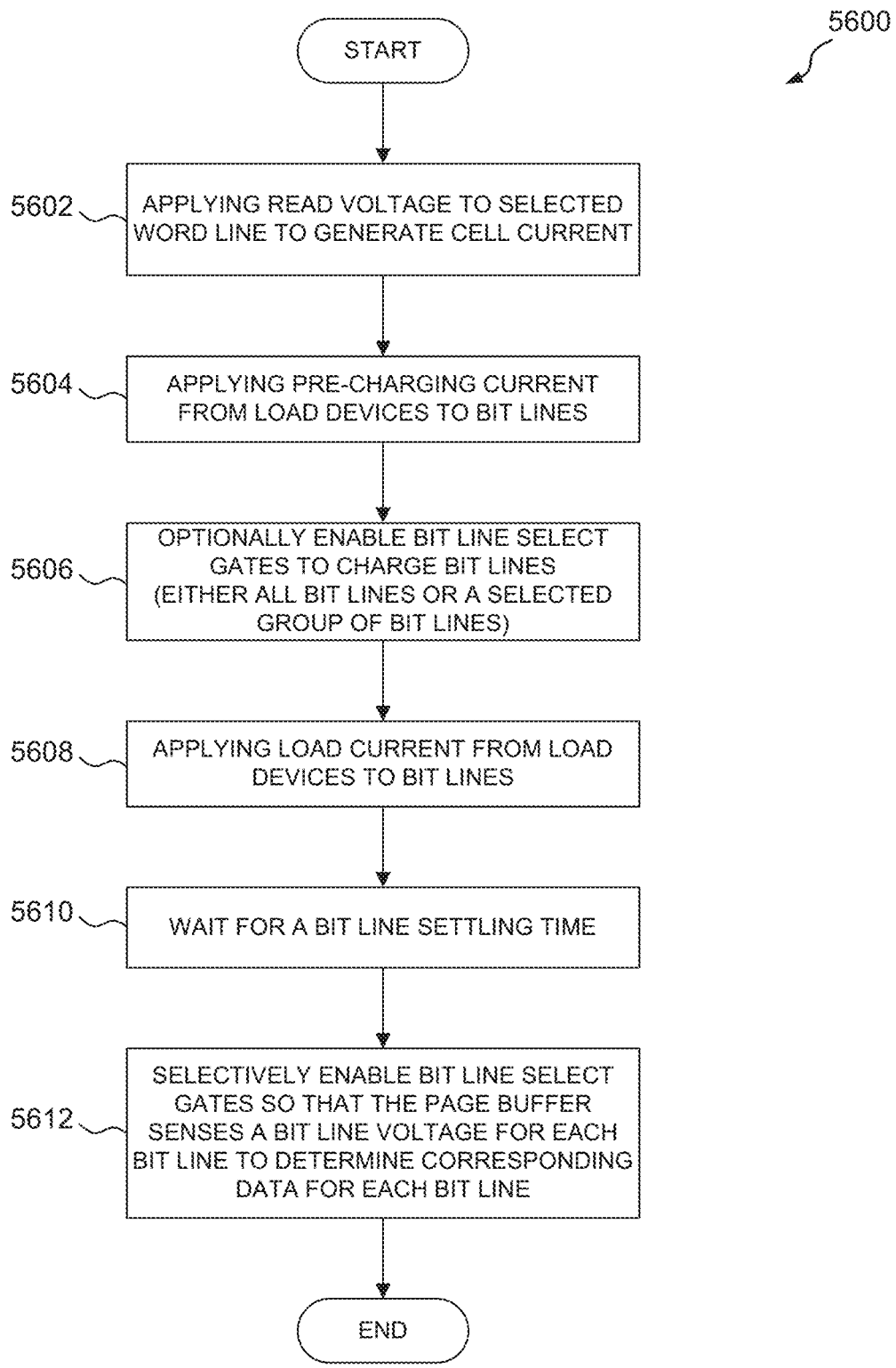
FIG. 56 shows an exemplary method for reading data bits of a NAND flash memory in accordance with the invention.

FIG. 56 shows an exemplary method 5600 for reading data bits of a NAND flash memory in accordance with the invention. For example, the method is suitable for use to read data bits as shown in FIGS. 48E-F.

At block 5602, a read voltage is applied to a selected word line to generate a cell current. Unselected word lines may be supplied with a pass voltage. For example, as illustrated in FIG. 48E, the word lines are supplied with the Vread and Vpass voltages at time T0.

At block 5604, a pre-charging current is provided from the load devices to bit lines at time T0.

At block 5606, in an optional step, the bit line select gates are enabled for a short time interval to charge the bit lines. In an embodiment, either all bit lines or a selected group of bit lines are charged. For example, in FIGS. 48E-F a selected group of bit line select gates BSG[0-2] are enabled at time T0.

At block 5608, a load current from the load devices is applied to the bit lines. For example, the load current causes the bit line voltages to adjust to a voltage level based on a ratio of the cell current and load current, as illustrated during the time interval (T0–T1) shown in FIGS. 48E-F.

At block 5610, the method waits for a selected bit line settling time to allow the bit lines to settle to a particular voltage level.

At block 5612, the bit line select gates are selectively enabled for a period of time so that the page buffer can sense a bit line voltage for each bit line to determine corresponding data for each bit line. In an embodiment, the bit line select gates are enabled and then disabled in a sequential order. In another embodiment, the bit line select gates are enabled and then disabled in any desired order. For example, as illustrated in FIGS. 48E-F, the bit line select gates BSG[0-2] are enabled and then disabled in sequential order from time T1 to time T2.

Thus the method 5600 operates to read bits in a NAND flash memory in accordance with the invention. It should be noted that the operations provided are exemplary and that additions, deletions, changes, rearrangements, and/or modifications of the operations are within the scope of the embodiments.

Figure 57A:
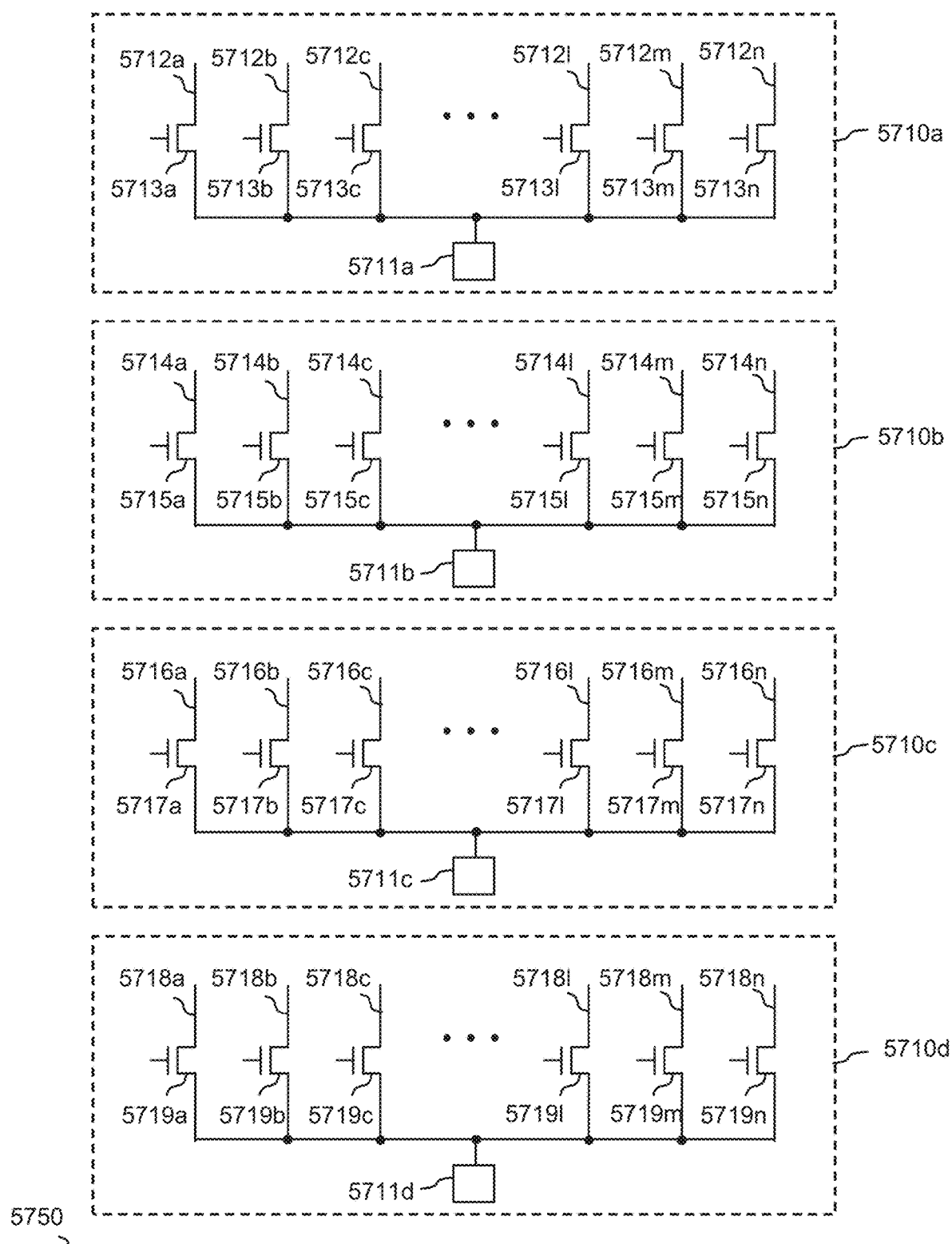
FIG. 57A shows an exemplary embodiment of an array block and page buffer architecture according to the invention.

FIG. 57A shows an exemplary embodiment of an array block and page buffer architecture according to the invention. Multiple array blocks, as shown in FIG. 57A, can be placed horizontally to form a large array. The array block contains multiple planes 5710a-d. Each plane, such as plane 5710a, comprises multiple bit lines, such as bit lines 5712a-n. The bit lines 5712a-n are connected to a page buffer 5711a through select gates 5713a-n. Thus, the page 5710a includes select gates 5713a-n, the page 5710b includes select gates 5715a-n, the page 5710c includes select gates 5717a-n, and the page 5710d includes select gates 5719a-n. The select gates are controllable by the stage machine 5750 so that connection of the bits lines to their associated page buffer can be controlled. For simplicity, the NAND flash memory cell strings connected to the bit lines are not shown.

The architecture shown in FIG. 57A also comprises state machine 5750. In an embodiment, the state machine 5750 comprises at least one of a CPU, processor, memory, discrete logic, and/or any other suitable components. During operation, the state machine 5750 operates to pass data to and from the page buffers 5711. For example, single bit data (D0, D1, and D2) can be obtained by the state machine 5750 from the page buffers 5711a-c coupled to the planes 5710a-c, respectively. The stage machine can then formulate this data into a level that is passed to the page buffer 5711d for multilevel programming into the plane 5710d. Thus, the stage machine 5750 is configured to control data flow between the page buffers thus allowing single level programming and multiple level programming to be performed within selected planes.

In this embodiment, when programming multiple-level cells in one plane, the input data may be stored in the bit lines of other planes. The data is held by the large bit line capacitance through the entire program operation. If necessary, a refresh operation may be performed periodically to read the data stored in the bit lines and load the data with full VDD and 0V values back to the bit lines. This will maintain the stored data in the bit lines during the entire operation. For this description, the bit lines chosen to store the input data are called 'data bit lines', and the bit lines chosen to be programmed are called 'program bit lines'.

For example, for TLC applications, it will be assumed that the plane 5710*a* is selected to be programmed, and the planes 5710*b*, 5710*c*, and 5710*d* are chosen to store input data D0, D1, and D2, respectively. When the system inputs D0 data, the bit line select gates 5715*a-n* are sequentially turned on to let the page buffer 5711*b* load data into the bit lines 5714*a-n*. When the system inputs D1 data, the bit line select gates 5717*a-n* are sequentially turned on to let the page buffer 5711*c* load data into the bit lines 5716*a-n*. When the system inputs D2 data, the bit line select gates 5719*a-n* are sequentially turned on to let the page buffer 5711*d* load data into the bit lines 5718*a-n*. Please refer to FIG. 11A to 11C for the detailed data loading sequence.

After the D0, D1, D2 data are sequentially loaded to the bit lines of planes 5710*b*, 5710*c*, and 5710*d*, respectively, the first bit line select gates 5715*a*, 5717*a* and 5719*a* of the planes 5710*b*, 5710*c*, and 5710*d*, respectively, may be turned on to connect the first bit lines 5714*a*, 5716*a*, and 5718*a* to the page buffers 5711*b*, 5711*c* and 5711*d*, respectively, to let the page buffers read the D0, D1, and D2 data stored in the bit lines. Please refer to FIG. 11D for the detailed waveform to read data from the data bit lines.

According to the D0, D1, and D2 data, the programmed data is determined and then loaded to the program bit line 5712*a* from the page buffer 5711*a*. These operations may be repeated to read all the D0, D1, and D2 data stored in the planes 5710*b*, 5710*c*, and 5710*d* to determine the program data and load the program data to the bit lines in plane 5710*a*. Then, a program pulse is applied to program the selected cells on the bit lines 5712*a-n* according to the program data stored in the bit lines. In an embodiment, the state machine 5750 generates the control signals to perform all memory operations.

After a program pulse, the cells on the bit lines 5712*a-n* are read by the verify word line voltages to perform program-verification. The bit lines select gates of the plane 5710*a* may be sequentially turned to let the page buffer 5711*a* sense the data read from the cells on the bit lines 5712*a-n*. Meanwhile, the bit line select gates of the planes 5710*b*, 5710*c*, and 5710*d* may be sequentially turned on to read the corresponding D0, D1, and D2 data stored in the data bit lines to the page buffers 5711*b*, 5711*c*, and 5711*d*, respectively. The read data in the page buffer 5711*a* then is compared with the corresponding D0, D1, and D2 data stored in the page buffers 5711*b*, 5711*c*, and 5711*d* to determine of the cell has been programmed to the target Vt or not. If yes, the page buffer 5711*a* will load inhibit data, such as VDD, to the program bit line 5712*a*. If not, the page buffer 5711*a* will load program data, such as 0V, to the program bit line 5712*a* to program the cell again.

This operation may be repeated until all the programmed cells on the bit lines 5712*a-n* are verified and the next program data are loaded to the program bit lines 5712*a-n*. Then, the next program pulse is applied. The program pulse and verification are alternatively performed until all the program bit lines are loaded with inhibit data, then the program operation is complete. In an embodiment, the state machine 5750 generates the control signals to perform all memory operations.

Please notice, in this embodiment, because the 3 data bits for TLC programming are stored in the data bit lines, not the page buffers, the page buffer does not need three data latches to store the 3 data bits.

Thus, utilizes the array shown in FIG. 57A, a method for programming multiple-level cells in a memory array can be performed. The array comprises a plurality of planes, such as planes 5710*a-d*, and each plane comprises a plurality of bit lines coupled to a page buffer through select gates. For example, the page 5710*a* comprises bit lines coupled to the page buffer 5711*a* through the select gates 5713*a-n* that are controllable by the state machine 5750. The method comprises storing multiple data bits in a first group of planes, one data bit per plane. The multiple data bits are stored in bit line capacitances of the first group of planes. For example, the planes 5710*a*, 5710*b* and 5710*c* each store one data bit in a bit line capacitance. Next, a programming operation is performed by programming a selected multiple-level cell in a selected plane according to the multiple data bits that are stored in the bit line capacitances of the first group of planes. The selected plane is not one of the first group of planes. For example, the selected plane can be plane 5710*d* and a selected multiple-level cell can be programmed using the multiple data bits that are stored in the bit line capacitances of the planes 5710*a-c*. For example, data bits D0, D1, and D2 are stored in the planes 5710*a-c*, one bit per plane. Then those data bits are retrieved by the corresponding page buffers and passed to the state machine 5750. The state machine then uses those bits to generate a value or level that is passed the page buffer 5711*d* for programming into a selected multiple-level cell in page 5710*d*.

Figures 57B, 58:
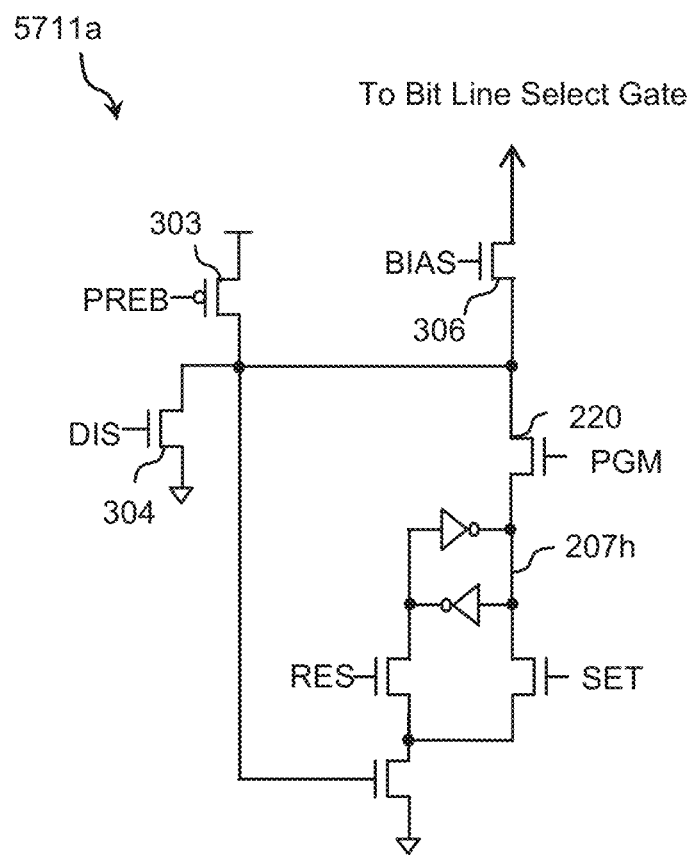
FIG. 57B shows an exemplary embodiment of a page buffer constructed in accordance with embodiments of the invention.
FIG. 58 shows an exemplary table for data assignment for memory planes in an embodiment of the invention.

FIG. 57B shows an exemplary embodiment of a page buffer constructed in accordance with embodiments of the invention. The page buffer shown in FIG. 57B comprises only one data latch 207*h*. In another embodiment, the page buffer can still contain 3 data latches, as shown by 207*a*, 207*b*, and 207*c* in FIG. 3A. This circuit allows the page buffer to access 3 bit lines and store 3 data from the bit lines to the data latches. Similarly, when another plane, like plane 5710*b* is selected for programming, the D0, D1, and D2 data may be loaded to planes 5710*a*, 5710*c*, and 5710*d*, respectively.

FIG. 58 shows a table for the data assignment embodiment for plane0 (5710*a*) to plane3 (5710*d*). When one plane is selected for programming, the other planes may be selected to store the input data D0, D1, and D2. These assignments are exemplary and not limiting of other possible assignments. It is obvious that the data may be assigned in other ways that are within the scope of the invention.

It should be noted that, in an embodiment, the number of the planes for storing the input data are determined by the levels of Vt stored in the cells. For example, for MLC, QLC, and PLC applications, the array may store the data in the bit lines of 2, 4, and 5 planes, respectively.

It should also be noted that the sequences of the bit line select gates shown in the previous description are for example only. There may be other ways to organize the sequences. For example, in another embodiment, when loading the input data, the data bit lines of the first plane 5710*a*, such as bit lines 5714*a*, 5714*b*, and 5714*c* may be loaded with D0, D1, and D2 data, respectively, and then determine the program data for the first program bit line 5712*a*. Also, the data bit lines of the second plane 5710*b*, such as bit lines 5716*a*, 5716*b*, and 5716*c* may be loaded with D0, D1, and D2 data, respectively, and then determine the program data for the second program bit line 5712*b*. Further, the data bit lines of third plane 5710*d*, such as bit lines 5718*a*, 5718*b*, and 5718*c* may be loaded with D0, D1, and D2 data, respectively, and then determine the program data for the third program bit line 5712*c*. These variations are within the scope of the invention.

Similarly, during read and program-verify operations, the data read from a plane may be stored in the bit lines of other planes. For example, for TLC read, the 3 data bits D0, D1, and D2 read from the bit lines 5712a to 5712n may be stored in the bit lines 5714a to 5714n, 5716a to 5716n, and 5718a to 5718n, respectively. The read data is transferred in the reverse direction from the program operation. For example, the data read from the bit line 5712a may be transferred to the page buffer 5711a, and transferred to page buffer 5711b, and then transferred to the bit line 5714a.

In the embodiment shown in FIG. 57A, the page buffers 5711a to 5711d may be connected to the data bus through individual decoders or select gates (not shown). Therefore, the data can be transferred between the page buffers through the data bus.

Figure 59A:
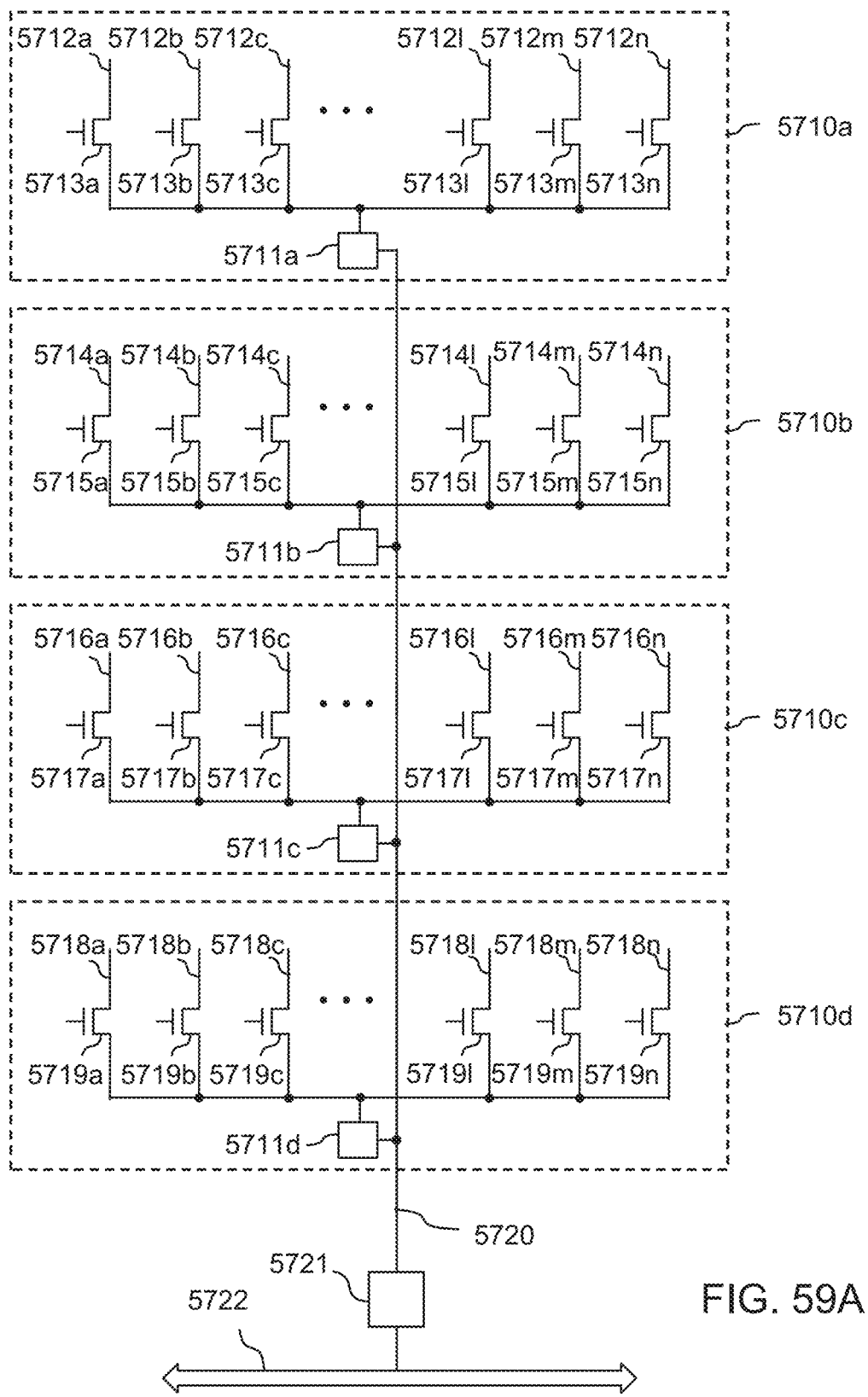
FIG. 59A shows another embodiment of an array architecture constructed according to the invention.

FIG. 59A shows another embodiment of an array architecture constructed according to the invention. In this embodiment, the page buffers 5711a to 5711d are connected to a data line 5720 as shown. The data line 5720 allows data to be transferred between the page buffers 5711a to 5711d. For example, the data stored in the bit lines 5718a to 5718n of the plane 5710d may be sequentially read by the page buffer 5711d, and transferred to the page buffer 5711a through the data line 5720, and then loaded to the bit lines 5712a to 5712n of the plane 5710a.

This operation is very useful for some modes, such as 'program-suspend read'. During programming, if a plane that stores input data is selected to interrupt-read, the data stored in the bit lines may be transferred to another plane using this technique. This frees the bit lines for read operations. After the data is read, the previously transferred input data may be transferred back to the plane to continue the program operation.

Moreover, the data line 5720 can be connected to the data bus 5722 through a decoder or select gates represented by block 5721. This allows data to be loaded to the page buffers 5711a to 5711d without routing an individual data bus for each page buffer. In addition, the decoder or select gates 5721 is shared by multiple page buffers, thus it reduces the silicon area occupied by the decoders and data bus for each plane. Moreover, because one data line 5720 is shared by multiple bit lines, the data line 5720 can be formed by using relaxed metal pitch and does not require an additional metal layer to form it.

Figure 59B:
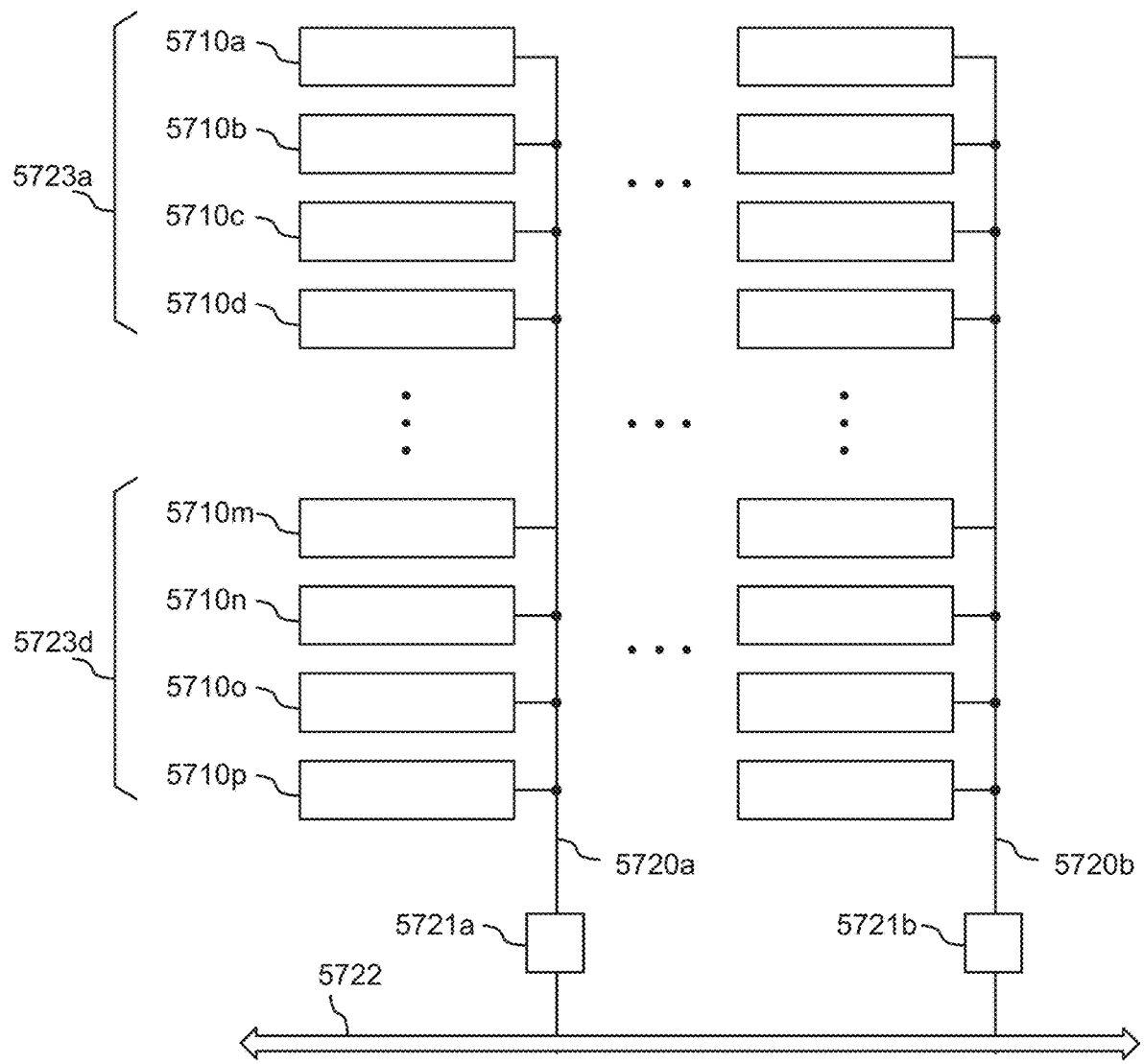
FIG. 59B shows an embodiment of an array architecture constructed according to the invention.

FIG. 59B shows an embodiment of an array architecture constructed according to the invention. The array shown in FIG. 59B comprises multiple blocks as shown in FIG. 59A to build a large array. For example, the first block comprises multiple planes 5710a to 5710p. Please refer to FIG. 59A for a detailed structure of the planes 5710a to 5710p. As described with reference to FIG. 59A, the page buffers of the planes 5710a to 5710p can be connected to the data line 5720a. The data line 5720a is connected to the data bus 5722 through a decoder or select gates 5721.

As shown in FIG. 59B, for TLC applications, the array may have more than 4 planes. For example, the array may have 4, 8, 16, 32, 64, or any other number of planes. For example, it will be assumed that the array has 16 planes as shown 5710a to 5710p. The 16 planes may be divided into 4 groups, such as 5723a to 5723d, and each group may have 4 planes. During program and read operations, the 4 planes in a group may perform the operations shown in FIG. 57A and FIG. 58. According to the invention, multiple groups 5723a to 5723d may perform program and read operations in parallel. This significantly increases the read and program data throughputs.

Figure 60A:
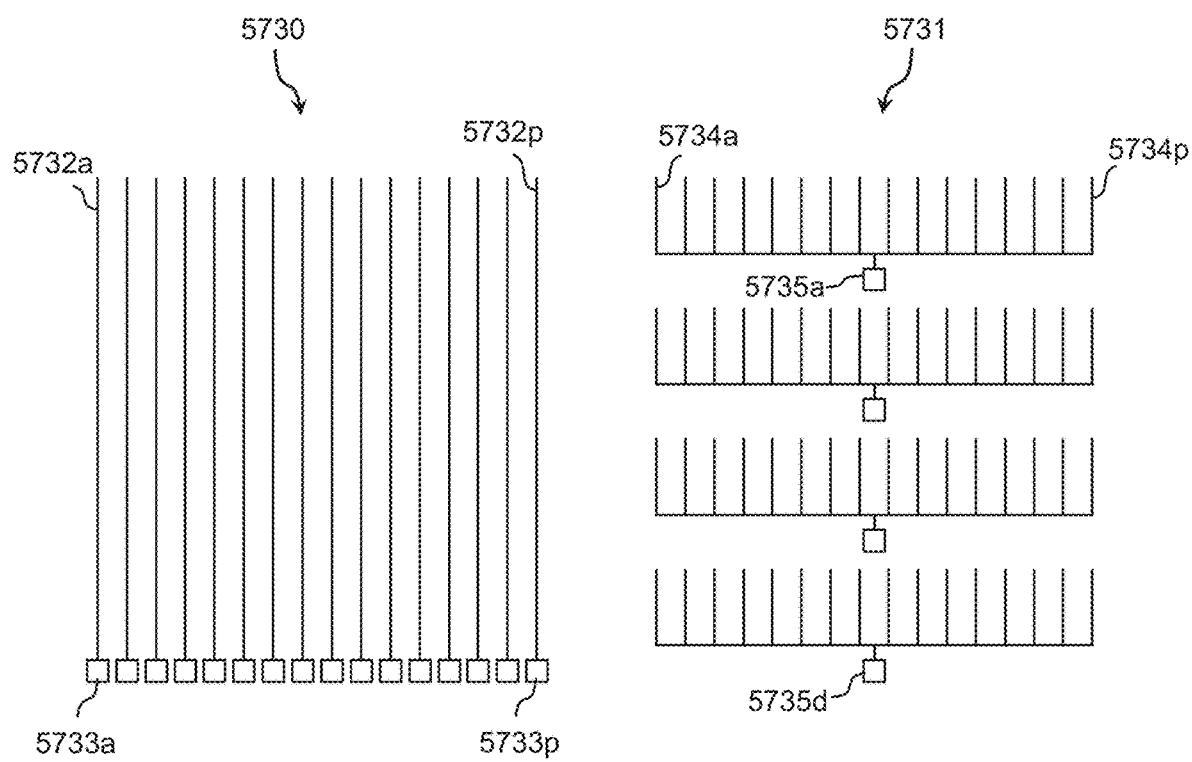
FIG. 60A shows an exemplary diagram that illustrates a comparison between a conventional array architecture and an embodiment of an array architecture constructed according to the invention.

FIG. 60A shows a comparison between a conventional array architecture 5730 and an embodiment of the array architecture 5731 constructed according to the invention. In this embodiment, the array 5731 comprises 4 planes as shown. The length of the bit lines, such as bit lines 5734a-p of the array 5731, in accordance with the invention, are only ¼ of the length of the bit lines 5732a to 5732p of the conventional array 5730. This reduces the bit line capacitance to ¼ of the conventional array, thus significantly reducing the bit line delay during read and program-verify operations. In addition, the conventional array 5730 requires one page buffer for one bit line, as shown by page buffers 5733a to 5733p. However, the array 5731 constructed according to the invention utilizes only one page buffer for one plane, as shown by page buffers 5735a to 5735d. Therefore, the layout area of the page buffers is significant reduced.

Figures 60B, 61:
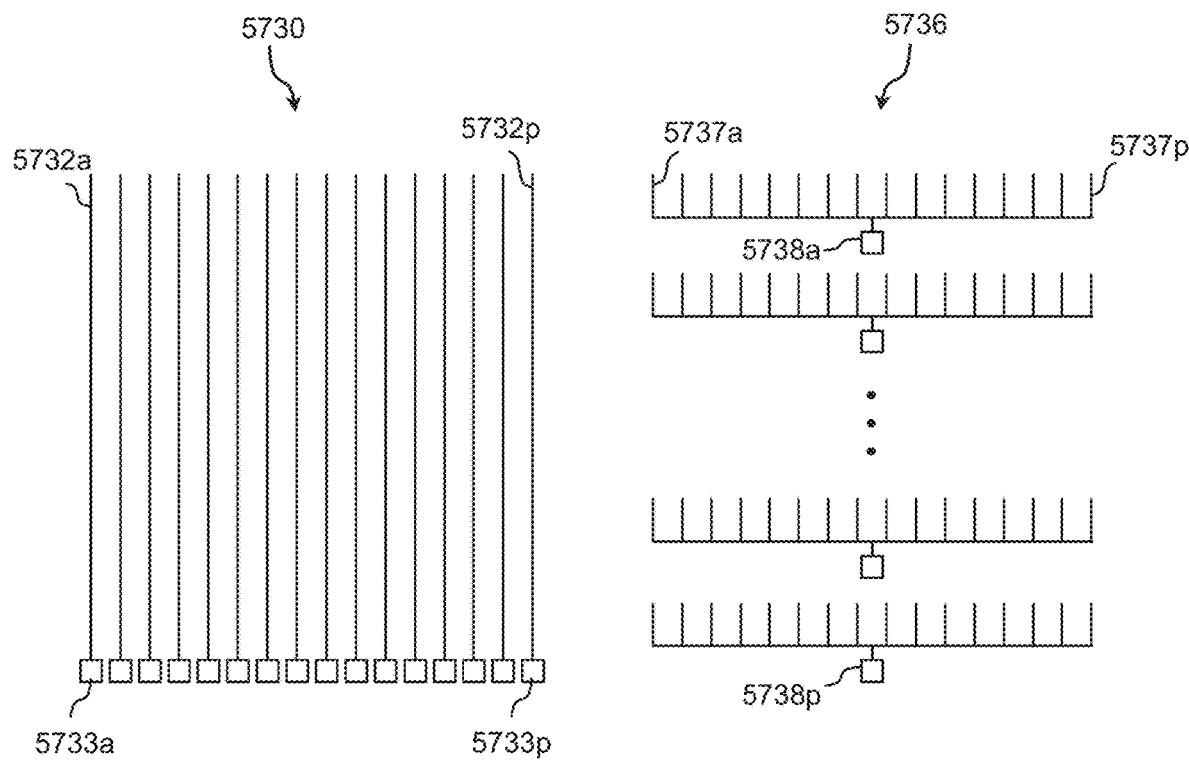
FIG. 60B shows an exemplary diagram that illustrates a comparison between a conventional array architecture and an embodiment of an array architecture constructed according to the invention.
FIG. 61 shows exemplary read and program data throughout increases that result from using N planes of an array according to the invention.

FIG. 60B shows a diagram that illustrates a comparison between the conventional array architecture 5730 and an embodiment of the array architecture 5736 constructed according to the invention. In this embodiment, the array 5736 comprises 16 planes. Therefore, the length of the bit lines, such as bit lines 5737a to 5737p of the array 5736 according to the invention, is only ¹⁄₁₆ of the length of the bit lines 5732a to 5732p of the conventional array 5730. This reduces the bit line capacitance to ¹⁄₁₆ of the conventional array, and thus further reduces the bit line delay during read and program-verify operations. In addition, because the 16 planes of the array 5736 can be divided into 4 groups, each group contains 4 planes that can perform read and program operations as shown in FIG. 57A. Therefore, the array 5736 can perform read and program operations for 4 planes in parallel. This increases the read and program data throughput by 4 times compared with the conventional array. For number of page buffers, both the conventional array 5730 and the array embodiment 5736 have the same number (e.g., 16) of page buffers. Thus, for this embodiment, the layout area of the page buffers is similar for both arrays.

FIG. 61 shows a read and program data throughout increase that results from using N planes of an array according to the invention. If the array comprises N planes, for MLC, TLC, QLC, and PLC, the read and program data throughput can be increased by N/3, N/4, N/5, and N/6 times, respectively. For example, the typical read time and program time for TLC is about 3 times of SLC's. Therefore, when using 12 planes of the array according to the invention, the read and program data throughput of TLC can be increased by (N/4=3 times) to be similar to SLC's.

Figure 62:
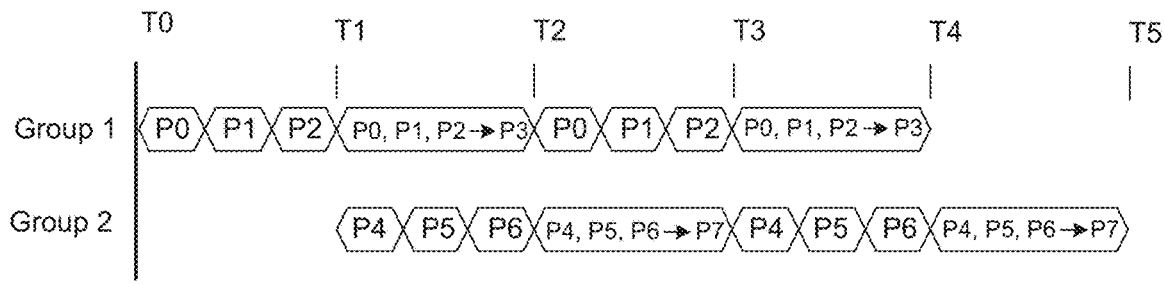
FIG. 62 shows exemplary program operation according to embodiments of the invention.

FIG. 62 shows another program operation according to an embodiment of the invention. This program operation allows multiple-level cells to achieve similar random program speeds to SLC's. The following embodiment shows an example for a TLC program operation. Referring to the array architecture shown in FIG. 557B it will be assumed that the array comprises at least two groups 5723a and 5723d, and each group comprises 4 planes. For easy of description, the planes 5710a, 5710b, 5710c, and 5710d of the first group 5723a are called P0, P1, P2, and P3, respectively. The planes 5710m, 5710n, 5710o, and 5710p of the second group 5723d are called P4, P5, P6, and P7, respectively.

FIG. 62 shows the operation of random page program to TLC using the speed similar to SLC. From time T0 to T1, the first, second, and third pages of data are programmed using SLC mode to the first group's P0, P1, and P2, respectively. This achieves program speed similar to SLC. From time T1 to T2, the fourth, fifth, and sixth pages of data are programmed using SLC mode to the second group's P4, P5, and P6, respectively. Meanwhile, the first group performs the operation described with respect to FIG. 57A to program D0, D1, and D2 data stored in P0, P1, and P2, to P3 using TLC mode, except the data of D0 to D2 are stored in the cells in P0 to P2 rather than the bit line capacitance. Because the program time for TLC is about 3 times of SLC's, the TLC program for P3 will be finished about the same time as the SLC program of P4, P5, and P6, as shown at T2 time. By using this technique, the TLC program time of P3 is 'shadowed' or hidden inside P0 to P2's program time. Therefore, no extra program time is required for the TLC programming.

From time T2 to T3, the seventh, eighth, ninth pages of data are programmed using SLC mode to P0, P1, and P2 again. During the same time, the data previously programmed to P4, P5, P6 will be read from the cells and programmed to P7 using TLC mode. As a result, the TLC program of P7 may be finished about the same time as the SLC program of P0, P1, and P2, as shown in T3 time. These procedures may be repeated until the last page is programmed to P6 at T4 time. Then, the system will perform one more TLC program cycle to read the data of P4, P5, P6, and program to P7. Although this approach requires an extra TLC programming time for the last page, since the system is in idle, it will not cause any performance bottleneck. If another read or program operation is initiated, the TLC programming of the last page can be shadowed with the next operation. Thus, no extra time is required.

As a result, the data are programmed to P0, P1, P2, and P4, P5, P6 using SLC mode, and then programmed to P3 and P7 using TLC mode in parallel. By using this configuration, the invention achieves TLC programming using program speed similar to SLC. Please notice the difference between this operation and the TLC program operation described with respect to FIG. 57A. In FIG. 57A, the input data D0, D1, and D2 are stored in the bit lines of P0, P1, and P2, and then programmed to P3 using TLC mode. Before the TLC programming is finished, the P0, P1, and P2 cannot be read or programmed, otherwise the data stored in the bit lines may be lost. Therefore, the system must wait until the TLC programming of P3 is finished, then P0 to P3 can be read or programmed again.

In contrast to operations described with reference to FIG. 57A, the operations described with reference to FIG. 62 operate to program the data D0, D1, and D2 to P0, P1, and P2 using SLC mode first. Therefore, after the SLC programming is finished, the system may read or program P0, P1, and P2 immediately. This does not cause data loss because the data is already programmed to the cells. Even during the time the data of P0, P1, and P2 are programmed to P3 using TLC mode, the program operation can be interrupted to let the system read or program P0 to P3 first. When the interruption is complete, the TLC program can be resumed by reading the data from the cells in P0, P1, and P2 again.

The program operation described above may be also used in 'random page programming'. For NAND flash memory, the random page programming does not mean the physical location of the data is random. It only means single page data can be read and programmed in random behavior. Because NAND flash memory needs to be erased before programming, and the erasure is performed in a big block size, the data is never programmed to a random location. Instead, the data is sequentially programmed to a pre-erased block and managed by using address mapping. Therefore, the operations shown in FIG. 62 are suitable for random program operations.

Figure 63A:
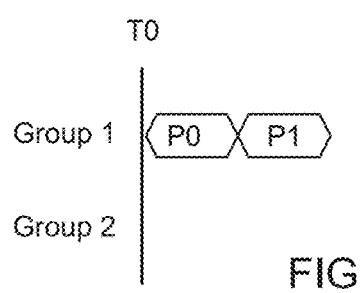
FIGS. 63A-C show exemplary programming operations of an array constructed according to the invention.
Figure 63B:
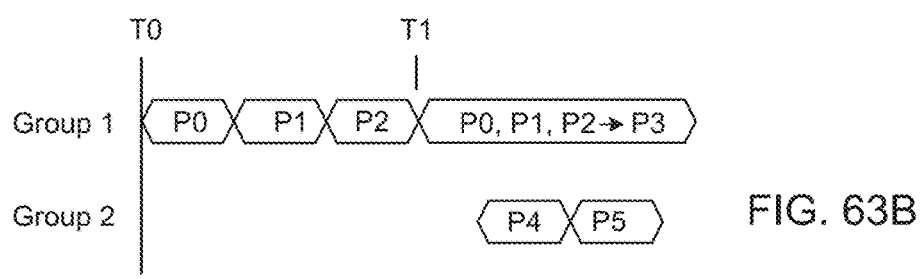
Figure 63C:
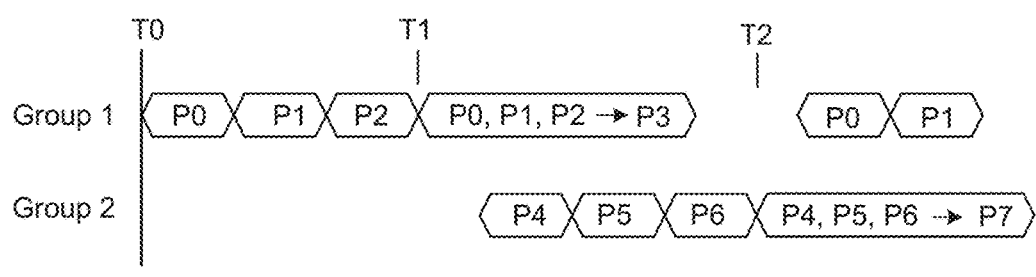

FIGS. 63A-C show programming operations of an array constructed according to the invention. In FIG. 63A, when single page of data is input, the data is programmed to the first group using SLC mode. This uses the SLC programming speed of each page. If less than 3 pages of data are input, the data may stay in the SLC pages, as shown by P1 and P2. If more than 3 pages of data is input, as shown at time T1 in FIG. 63B, after the third page P2 is programmed, the system will perform TLC programming to program the 3 SLC pages of data, P0, P1, and P2, into a TLC page P3. The TLC programming is done in background, thus the program time is hidden. If another page P4 is input during the TLC programming, the data will be programmed to the second group using SLC mode, as shown by P4 and P5. In this configuration, the data of P4 and P5 can be programmed in SLC speed without being affected by the TLC programming in the first group. If less than 3 pages of data is input, the data P4 and P5 will stay in SLC cells.

If more than 3 pages of data is input, as shown in FIG. 63C, after the third page P6 is programmed, the system will start TLC programming for the second group to combine the 3 SLC pages P4, P5, and P6 into a TLC page P7. Because TLC programming time is about 3 times that of SLC's, when the TLC programming of the second group is started at time T2, the TLC programming of the first page is already finished. Therefore, the first group is freed up for the next page of data to input and programmed to the first group using SLC mode again. By using this configuration, the data can be programmed to TLC pages using SLC programming speed.

The above embodiment uses 3 SLC pages for TLC programming. For QLC and PLC applications, 4 SLC pages and 5 SLC pages may be used, respectively. Also, although the above embodiment uses 3 SLC pages in one group to store data for a TLC page, in fact, the SLC page number is not limited to 3. It may be any number suitable for the operation.

Figure 64:
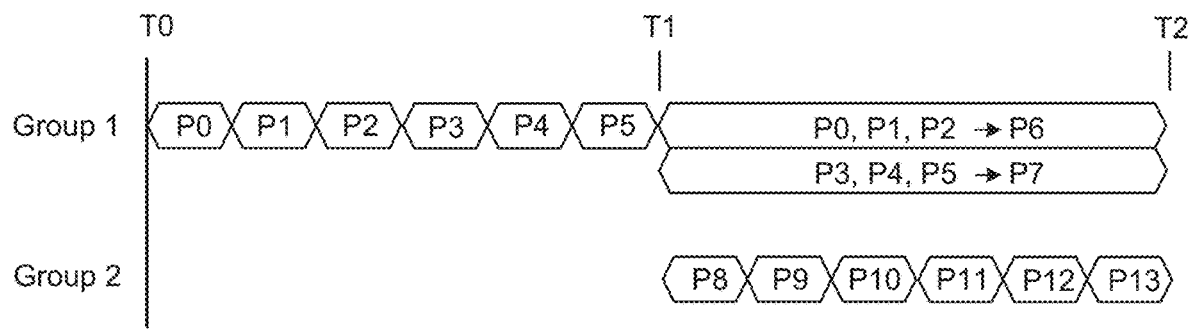
FIG. 64 shows another exemplary embodiment of programming operations using 6 SLC pages in one group in accordance with the invention.

FIG. 64 shows another embodiment of programming operations using 6 SLC pages in one group. As shown from time T0 to T1, 6 pages of data may be programmed to the 6 SLC pages, P0 to P5. At time T1, the system initiates TLC programming to program the data of SLC pages P0, P1, P2 to a TLC page P6, and the data of SLC pages P3, P4, and P5 to a TLC page P7. It should be noted that for the embodiments of the array architecture constructed according to the invention, multiple planes of data can be programmed in parallel. Therefore, the pages P6 and P7 can be programmed at the same time.

Meanwhile, the next 6 pages of data may be input and programmed to the second group's pages P8 to P3, as shown from time T1 to T2. In this way, the budget for the TLC programming time for the first group is doubled. This can guarantee that the TLC programming of the first group can be finished by time T2, if the TLS programming takes longer than 3 times of SLC programming.

The embodiments of the invention shown in FIG. 62 are superior to the conventional 'SLC cache' approach. SLC cache approach uses a designated area of the array. When data is programmed, it is programmed to the SLC cache using SLC mode first. This allows SLC program speed. Then, when the system is idle, the data stored in the SLC cache will be read and programmed to other location of the array using TLC mode. The data is not programmed using TLC mode until the system is in idle. In the other words, the TLC program time is not saved, but just delayed. If a large amount of data is programmed to SLC cache, it will take a long time to program the data to TLC location during idle time. If the SLC cache is full, the TLC program needs to be performed immediately. This will significantly slow down the program speed. Moreover, for program-heavy applications, such as data center applications, the system may become heavily used and does not have idle time. This will cause the SLC cache to become full most of time because the SLC data cannot be move to TLC location.

However, according to the invention, the program operations described with reference to FIGS. 62-64 do not have the problems described above. The SLC data programmed to the P0, P1, and P2 are programmed to P3 using TLC mode immediately after P0, P1, and P2 are programmed. After the TLC programming is finished, P0, P1, and P2 can be freed up for the next read and program operation immediately. In this way, the data is not accumulated inside the SLC pages. The problems associated with the SLC cache being full as described for the conventional implementation does not occur in embodiments of the invention.

As a result, embodiments of the invention can achieve high program speed like SLC and the low cost of TLC. Please notice, the above description uses TLC only as example. A similar approach can be applied to other technologies such as MLC, QLC, and PLC, and these applications are within the scope of the invention. For QLC, because QLC program time is about 4 times that of SLC programming, to shadow the QLC programming time, each group may contain 5 planes. Therefore, when the first group is performing QLC programming, the second group performs SLC programming to 4 planes. In this way, the QLC and SLC programming can be finished about the same time. Thus, the QLC programming time is hidden. Similarly, for PLC, because PLC programming time is about 5 times of SLC programming, each group may contain 6 planes.

Although the embodiments in FIGS. 62-64 show program operation using two groups to hide the TLC programming time, it is not limited to two groups only. According to embodiments of the invention, the operations shown in FIG. 62-64 can be performed for any number of groups equal to or higher than two groups. For example, the operation may be performed for 4 groups. Therefore, after the first group is programmed by using SLC mode, the SLC programming can be continued to program the second, third, and fourth group. This allows the TLC programming time of the first group to become triple. This embodiment is especially useful for the multiple-level cell programming scheme that requires longer programming time, such as two-pass or three-pass programming.

It should also be noted that although the previous descriptions put the planes of a group together, such as the planes 5710a-d of a group 5723a shown in FIG. 59B, in fact, the planes of a group can be located in any locations of the array. This is because for the array architecture constructed according to the invention, each plane can perform read and program operation independently, and data can be transferred between the planes using the data bit lines, such as bit lines 5720a-b as shown in FIG. 59B. Therefore, the planes of a group may be located in any random locations in the array.

Figure 65:
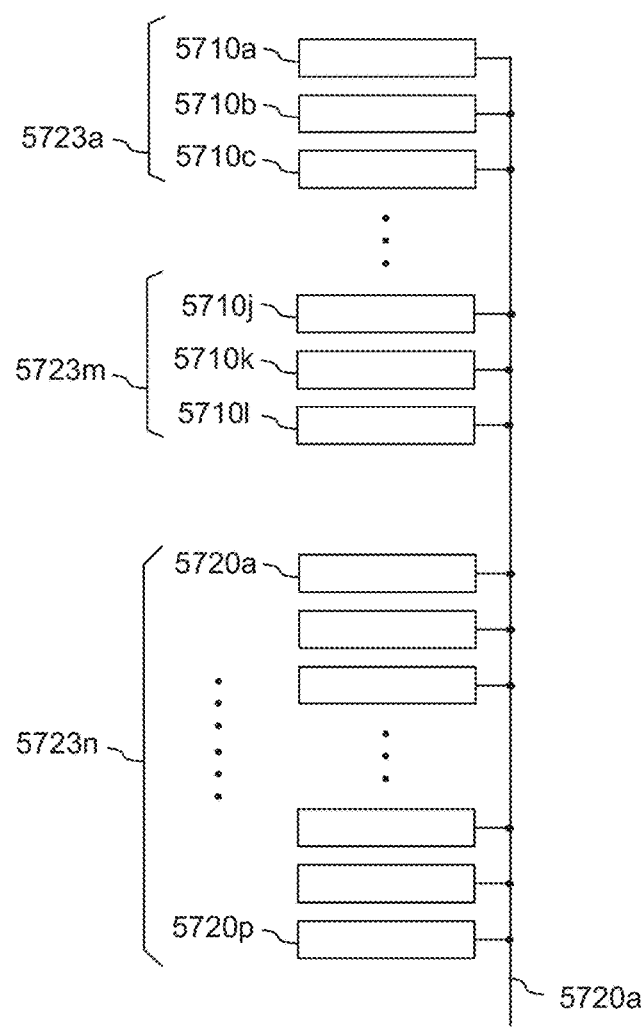
FIG. 65 shows an exemplary embodiment of an array that utilizes an exemplary arrangement for locations of memory planes.

FIG. 65 shows another embodiment using another arrangement for the locations of the planes, where the groups 5723a-m are multiple groups for SLC pages. Each group contains 3 planes for TLC application. For example, the group 5723a contains 3 planes 5710a, 5710b, and 5710c for D0, D1, and D2 pages for TLC programming. In this embodiment, all the TLC pages are located in a group 5723n. The group 5723n contains multiple planes 5720a-p for TLC pages. When a single page is input, the data is programmed to the SLC pages in groups 5723a-m first. When 3 SLC pages are programmed, the data may be programmed to a TLC page in group 5723n, as described in previous embodiments. For example, after 3 SLC pages are programmed to the planes 5710a, 5710b, and 5710c, the data can be read from the 3 SLC pages and programmed to a page in plane 5720a using TLC mode. During the TLC programming, the next pages can be input and programmed to another SLC groups, such as group 5723m for example.

After the data of SLC pages is programmed to TLC pages, the SLC pages may be erased, then the pages can be used again to program new data. NAND flash memory is typically erased in block sizes, such as block of 1 Mb to 4 Mb. After all the pages of a block are programmed and the data is moved to TLC pages, the system can perform an erase operation to the SLC block. During erase operation the bit lines need to be applied with a high voltage such as 20V. Therefore, during the erase operation, the entire plane will not be able to perform read or program operations. Since the erase time is very long, typically from 2 ms to 5 ms, the erase operation significantly limits the NAND flash memory's performance. This is especially true since conventional NAND flash memory only contain 1 to 4 planes in bit line directions. This is because according to the conventional array architecture, each bit line is connected a page buffer circuit. When increasing the number of planes, the number of the page buffers need to be increased as well. This significantly increases the die size and cost.

In contract to the conventional array, the array architecture according to embodiments of the invention allows multiple bit lines to be connected to one page buffer. This allows the array to be divided into many planes, such as 16 to 64, for example, in the bit line direction. This provides negligible delay for erase operations. For example, assuming the array has 16 planes in bit line direction, when one plane is performing an erase operation, the other 15 planes can still perform read, program, or erase operation. Therefore, the erase operation will have very low impact to the performance of the memory according to embodiments of the invention.

In various embodiments, read and write operations for multiple-level-cell NAND flash memory are disclosed. The multiple-level-cell may be MLC (2 bits per cell), TLC (3 bits per cell), QLC (4 bits per cell), PLC (five bits per cell), etc. The NAND flash memory may be formed of a 2D or 3D array.

Figure 66:
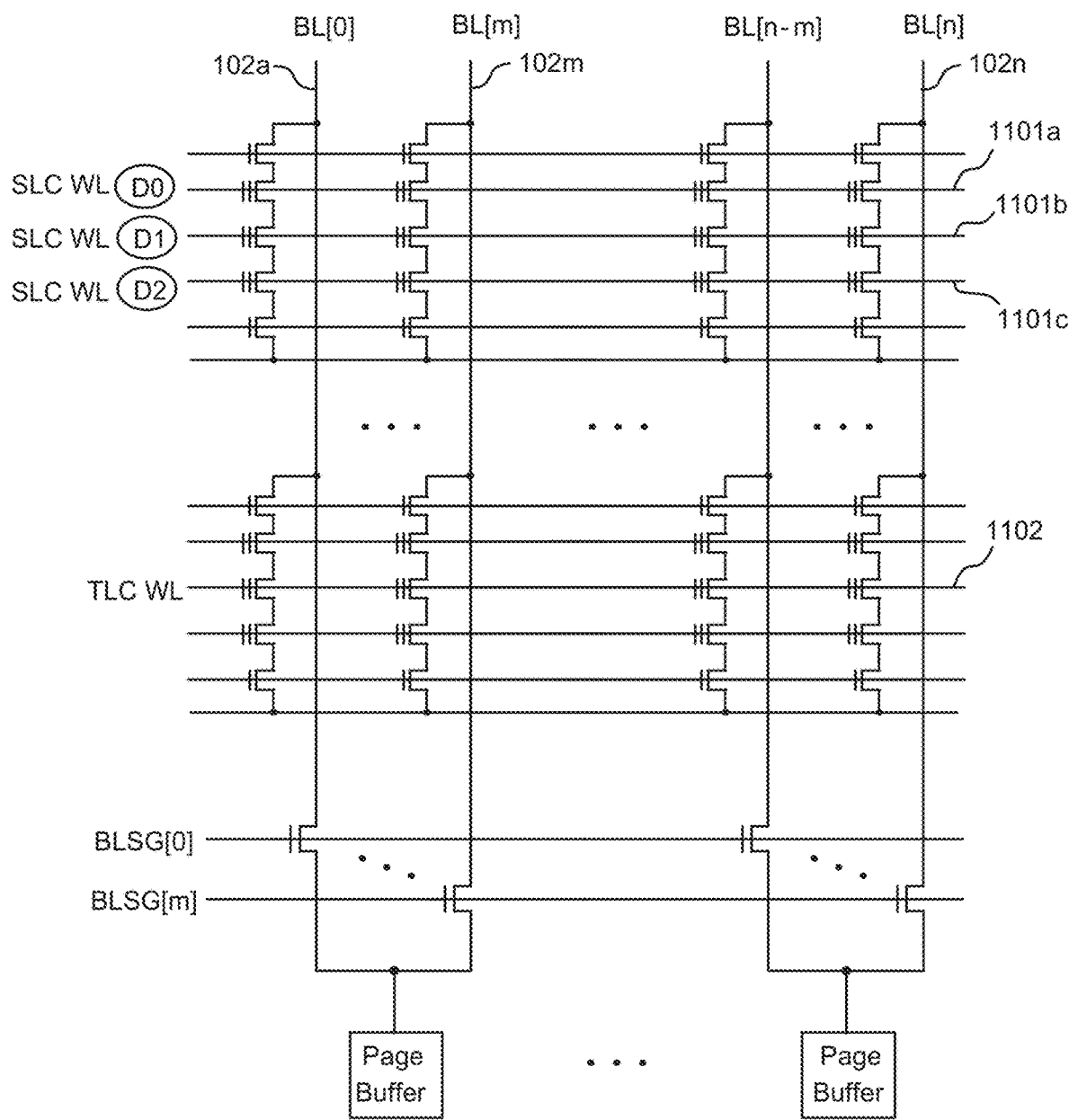
FIG. 66 shows an exemplar embodiment of a TLC memory array.

FIG. 66 shows an embodiment of a TLC memory array. Because the program speed for TLC is very slow, the state machine may write the 3-bit data, D0, D1, D2, into three word lines 1101a, 1101b, and 1101c, respectively, using SLC mode. In this way, the data can be programmed at a much faster speed. After the data is programmed to the three SLC word lines, the SLC data stored in the three word lines will be read and re-programmed to another word line 1102 using TLC mode. At the same time, the system can program next data to the SLC word lines in another plane. In this way, the TLC program operation will not become the bottleneck of the system performance.

FIG. 66 illustrates operations in accordance with the embodiments that comprising a first step in which the D0 data is read from the word line 1101a and stored in the capacitance of bit lines 102a to 102n. Next, the D0 data is programmed to the TLC word line 1102. In a second step, the D1 data is read from the word line 1101b and stored in the capacitance of bit lines 102a to 102n. Next, the D1 data is programmed to the TLC word line 1102. In a third step, the D2 data is read from the word line 1101c and stored in the capacitance of bit lines 102a to 102n. Next, the D1 and D2 data is programmed to the TLC word line 1102.

By using these operations, the invention programs all the bit lines 102a to 102n simultaneously, and therefore the program data throughput can be increased M times of the conventional NAND flash memory. In addition, the page buffer circuit shown in FIG. 8A according to the invention only requires one data latch, compared with the conventional art that requires three data latches in one page buffer. Thus, embodiments of the invention may fit 3 times the number of page buffers of the conventional art in the same die size. As a result, the invention may achieve (3×M) times of program data throughput of the conventional memory.

Figure 67:
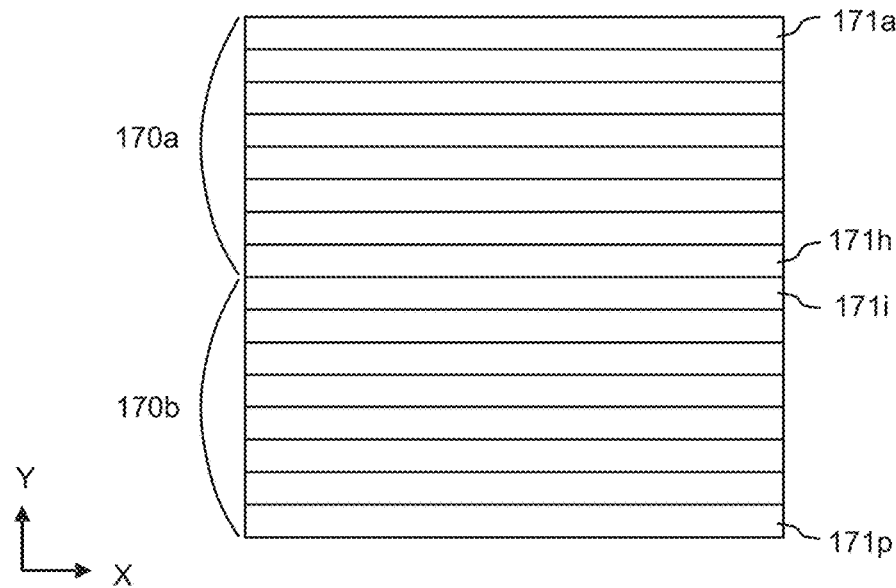
FIG. 67 shows an embodiment of an array architecture according to embodiments of the invention.

FIG. 67 shows an embodiment of an array architecture according to embodiments of the invention. This architecture allows the array to perform simultaneous SLC and TLC programming for two banks. It should be noted that FIG. 67 illustrates operations utilizing two banks, however, the operations can be extended for use with any number of banks. When the first bank is performing SLC programming for the input data, the second bank may perform TLC programming to move data from SLC pages to TLC pages. By doing this way, the TLC programming can be hidden inside SLC programming time, thus the TLC programming can achieve equivalent throughput to SLC programming.

As illustrated in FIG. 67, it will be assumed word lines (WL) are running along the X direction and bit lines (BL) are running along the Y direction. The array may be divided into at least two banks 170*a* and 170*b*. Each bank comprises multiple planes, such as planes 171*a* to 171*h* for bank 170*a* and planes 171*i* to 171*p* for bank 170*b*. The number of the planes in each group depends on the desired program throughput. For example, assuming TLC program time is 8 times that of SLC program time, each bank may have 8 planes.

The 'planes' in this embodiment are the sub-arrays along the bit line (Y) direction. The array may be divided into multiple sub-arrays along the word line (X) direction. For easy of description, these sub-arrays along the word line direction will be treated as one plane in the description.

Each plane, such as plane 171*a*, may have the structure shown in FIG. 1A according to the invention. Because each page buffer, such as page buffer 101*a* in FIG. 1A, is connected to M bit lines, such as bit lines 102*a* to 102*m*, the number of the page buffers is reduced to the number of bit lines divided by M. This prevents a die size increase due to the multiple-plane array shown in FIG. 17. For example, in a conventional array, each page buffer is connected to one or two bit lines. Assuming the array contains N planes, the number of page buffers will be increased by N or N/2. This will significantly increase the dies size because the layout size of page buffers is large.

Each plane comprises certain word lines to store SLC data, which are called SLC word lines. The number of the SLC word lines is determined by the product specification and desired performance. Referring to FIG. 15, during programming, 3 pages of data for D0, D1, and D2 may be input and programmed to 3 SLC word lines, SLC WL0-2 1101*a* to 1101*c* using SLC mode. After the 3 SLC word lines are programmed, the data of the 3 SLC word lines may be read and re-programmed to a TLC word line 1102.

The number of SLC word lines depends on the number of bits stored in one cell. For example, for QLC, each cell stores 4 bits of data, D0, D1, D2, and D3, thus it may have 4 SLC word lines to store the 4-bit data. Similarly, for PLC, it may have 5 SLC word lines to store the 5-it data.

During TLC programming, because the D0, D1, and D2 data are already stored in the SLC word lines of 8 planes, the read operation of the 3 SLC word lines and the TLC word line's programming may be performed in 8 planes simultaneously. This increases the throughput of the TLC programming by 8 times. As a result, the TLC programming throughput is similar to SLC programming throughput.

In this embodiment, 8 planes are used as examples. It is obvious that a bank can have any number of planes. When a bank has more planes, the TLC programming throughput becomes higher. For example, assuming a bank has 16 planes, the TLC programming throughout will become 2 times that of SLC programming. As a result, this architecture can drastically increase the TLC programming throughput without increasing the die size.

The architecture may be applied to any multiple-level cells, such as QLC and PLC, for example. For QLC, assume the programming time is 20 times that of SLC. A bank may have 20 planes to increase the QLC programming throughput by 20 times. In this way, the QLC programming throughput may become similar to the SLC programming throughput.

Figure 68:
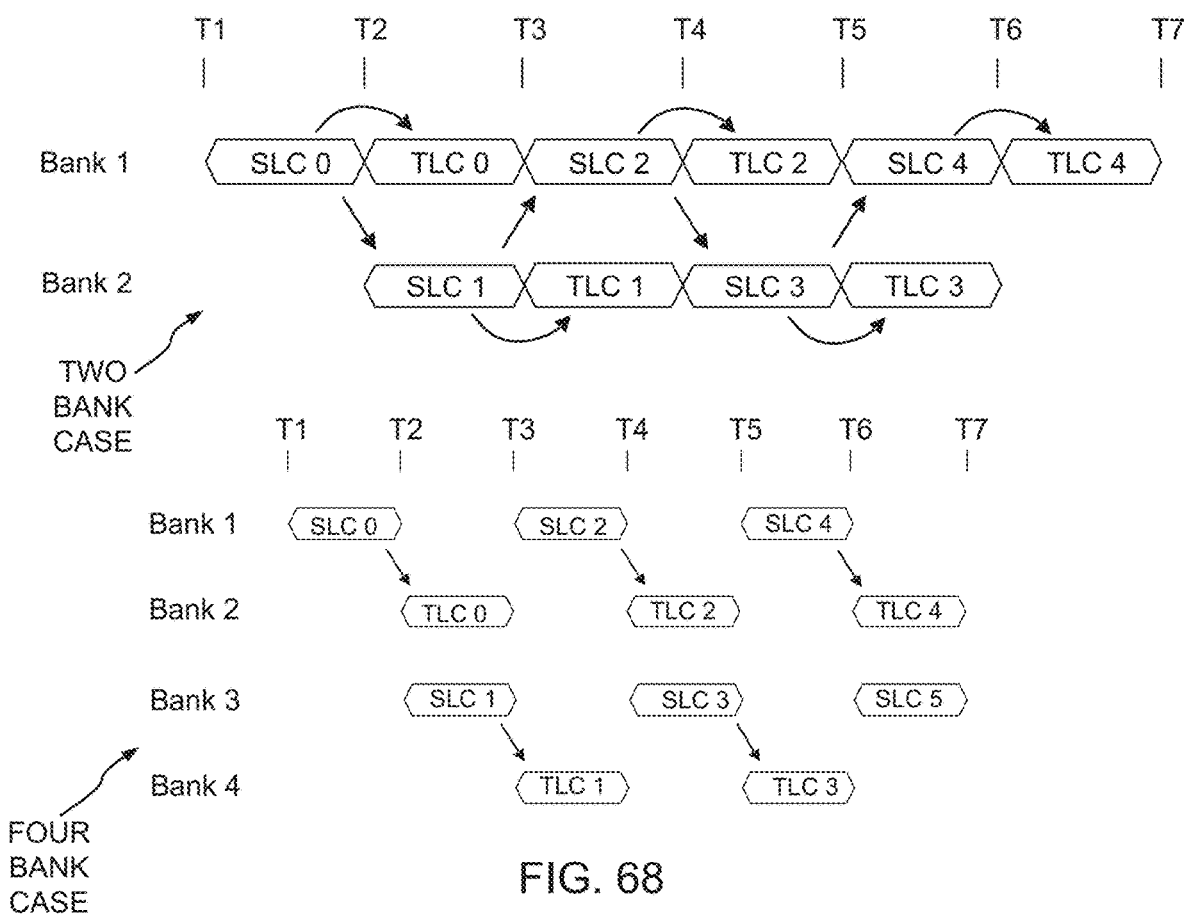
FIG. 68 shows exemplary programming sequences according to embodiments of the invention.

FIG. 68 shows programming sequences according to embodiments of the invention. FIG. 68 shows a two bank programming case and a four bank programming case. Referring to the two bank programming cases, the two banks, (bank 1 and bank 2) alternatively perform SLC and TLC programming. It should be noted that FIG. 68 illustrates operations utilizing two banks, however, the operations can be extended for use with any number of banks, such as the four bank case shown.

For bank 1, from time T1 to T2, the state machine may load data to bank 1 and performs SLC programming to program the D0, D1, and D2 data into 3 SLC word lines. After the 3 SLC word line's programming is finished, from time T2 to T3, the data is read from the 3 SLC word lines and re-programmed to a TLC word line in the bank 1.

Meanwhile, the state machine switches to load data to the bank 2, and perform SLC programming to program the data into 3 SLC word lines in bank 2. In the other words, the bank 1 and bank 2 are performing TLC and SLC programming simultaneously. As assumed, TLC programming time is 8 times that of SLC programming. Since the TLC programming is done by 8 planes in bank 1 in parallel, the TLC programming data throughput of bank 1 is about the same as the SLC programming of bank 2. As a result, the programming of bank 1 and 2 may be finished at about the same time.

At time T3, the state machine switches to load data to bank 1 and preform SLC programming to bank 1. At the same time, the state machine starts to read data from the 3 SLC word lines in bank 2 and re-program the data to a TLC word line in bank 2. By using these operations, the input data is alternatively programmed to SLC word lines in bank 1 and 2, and then re-programmed from the SLC word lines to TLC word lines in parallel. As a result, the data is programmed into TLC word lines by using SLC programming data throughout. The four bank case performs similar operations but utilizes more banks.

Embodiments of the invention have several advantages over the conventional approach that uses SLC cache. The conventional SLC cache uses a fixed or dynamic number of SLC word lines to store the input data. When the system is in idle, the state machine will start to read the data from the SLC word lines and re-program the data into TLC word lines.

The problem with the SLC cache is that for a substantial workload, such as Cloud or NAS, a large quantity of data may be continuously programmed without any idle time. This will cause the SLC cache become full, and then the data needs to be programmed to TLC word lines directly. As a result, the program throughput will drop to the TLC programming throughput, such as ⅛ that of SLC as an example.

In contrast to using the SLC cache, in arrays having the architecture and operation according to embodiments of the invention, the data programmed to the SLC word lines are re-programmed to TLC word lines immediately after the programming of the 3 SLC word lines is finished. Therefore, system idle time is not needed to move the data from SLC to TLC word lines. As a result, the programming can always maintain at SLC throughput.

Although the embodiment uses 3 SLC word lines to store D0, D1, and D2 bits for the TLC, the switching time of the bank 1 and 2 is not limited to the time finishing the programming of the 3 SLC word lines. For example, another embodiment may use 6 SLC word lines and program the data of 6 SLC word lines into two TLC word lines, for example. These variations and modifications shall remain in the scope of the embodiments of the invention.

Figures 69, 70:
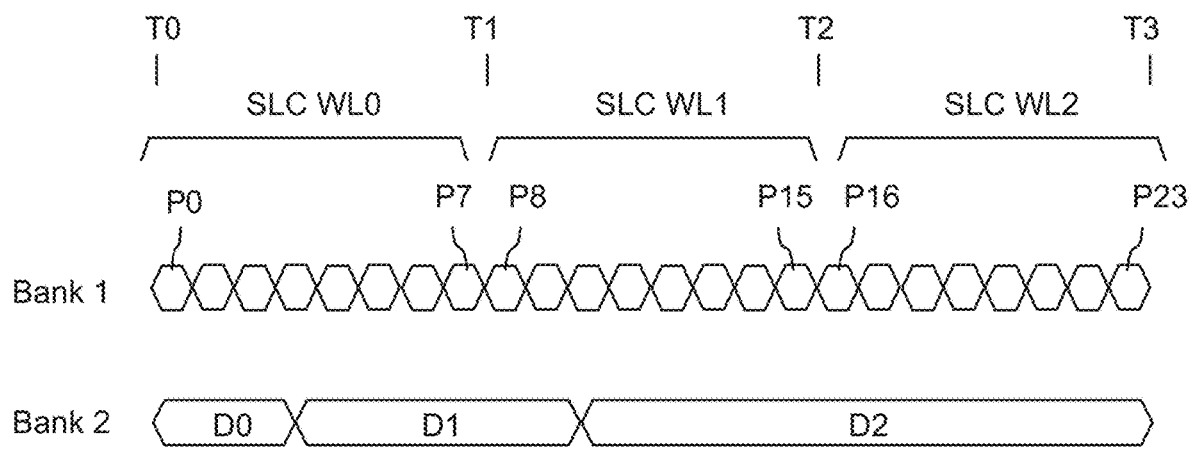
FIG. 69 shows a more detailed exemplary programming sequence for programming banks 1 and 2 of an array according to the invention.
FIG. 70 shows an exemplary map of page locations in a memory array.

FIG. 69 shows a more detailed programming sequence for bank 1 and 2. It will be assumed that bank 1 is performing SLC programming and bank 2 is performing TLC programming. In bank 1, from time T0 to T1, 8 pages of D0 data may be input and programmed to the SLC WL0 of the 8 planes, as shown by P0 to P7. From time T1 to T2, 8 pages of D1 data may be input and programmed to the SLC WL1 of the 8 planes, as shown by P8 to P15. From time T2 to T3, 8 pages of D2 data may be input and programmed to the SLC WL2 of the 8 planes, as shown by P16 to P23.

Over the same time (T0-T3), bank 2 is performing TLC programming. The 3 bits of data, D0, D1, and D2, are read from 3 SLC word lines and programmed to a TLC word line. The programming time for D0, D1, and D2 bits are different because their programming Vt levels are 2, 4, and 8, respectively. During the TLC programming, all 8 planes are programmed simultaneously. This increases the TLC programming throughput by 8 times. As assumed that TLC programming time is 8 times of SLC programming, the SLC programming of bank 1 and 2 will be finished at about the same time.

FIG. 70 shows a map of the location of the pages P0 to P23 that are shown in FIG. 69.

Figure 71:
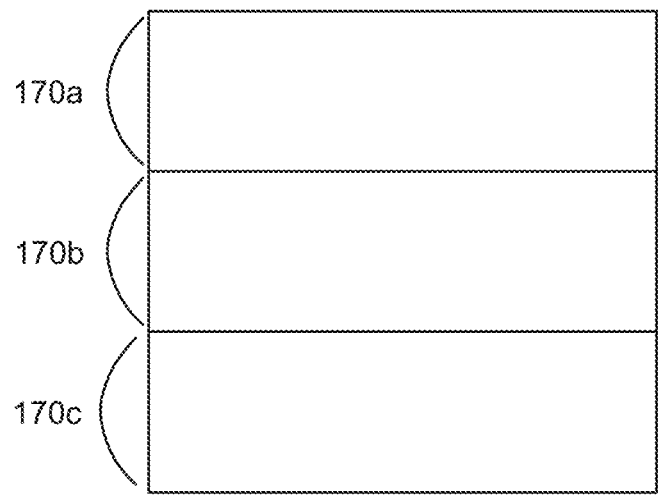
FIG. 71 shows another exemplary embodiment of an array architecture constructed according to the invention

FIG. 71 shows another embodiment of an array architecture constructed according to the invention. In this embodiment, the array comprises at least 3 banks 170a to 170c. Each bank has multiple planes, for example, planes 171a to 171h shown in FIG. 67. When two banks are performing alternating SLC and TLC programming as described above, the third bank performs erasure operation to erase the data stored in the SLC word lines. The 3 banks take turns (or alternate) to erase the SLC word lines, while the other two banks are performing program operations. Once the SLC word lines are erased, the SLC word lines may be used in the next program operation again. This operation prevents the SLC word lines in the banks from becoming full during continuous heavy workload, such as during Cloud or NAS operations.

Figure 72:
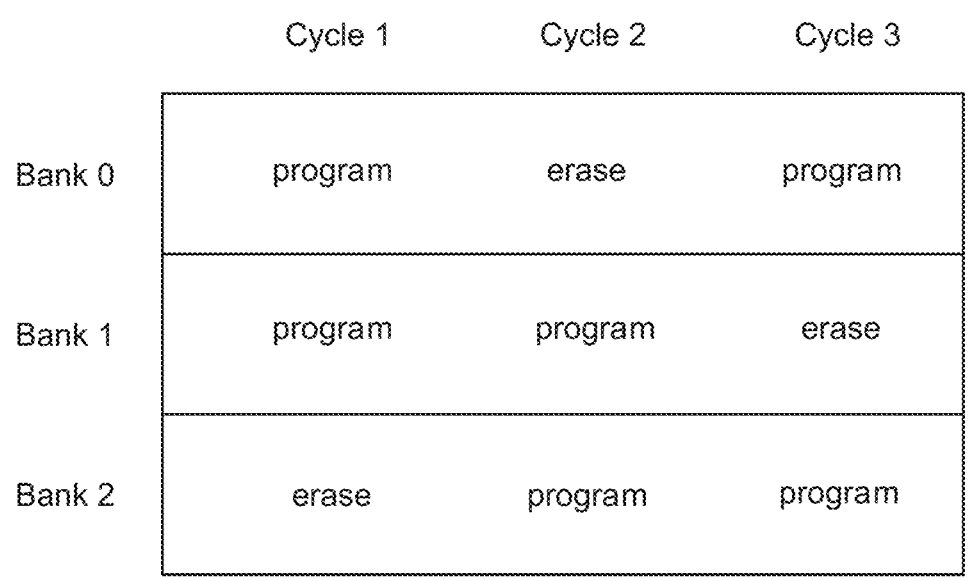
FIG. 72 shows an exemplary table illustrating alternating operations described with reference to FIG. 71

FIG. 72 shows a table illustrating the alternating operations described with reference to FIG. 71. For example, as shown in FIG. 72, during Cycle 1, bank 0 and bank 1 are selected to perform the previously described program operations. At the same time, bank 2 performs an erasure operation to erase the SLC word lines previously programmed. After the erasure, the SLC word lines in bank 2 become blank and are available for programming in the next cycle.

In Cycle 2, bank 1 and 2 are selected to perform the previously described program operations, and the bank 0 performs an erasure operation to erase the SLC word lines. Because the data of the SLC word lines in bank 0 are already programmed to the TLC word lines during Cycle 1, the data in the SLC word lines may be erased. After erasure, the SLC word lines in bank 0 become blank and are available for programming in the next cycle.

In Cycle 3, bank 0 and 2 are selected to perform the previously described program operations, and bank 1 performs an erasure operation to erase the SLC word lines. Because the data of the SLC word lines in bank 1 are already programmed to the TLC word lines during Cycle 2, the data in SLC word lines may be erased. After erasure, the SLC word lines in bank 1 become blank and are available for programming in the next cycle.

In the previous description, each cycle may perform multiple program operations. For example, a cycle may be defined as 100, 1000, or 10,000 program operations. In another embodiment, the cycle is determined by the usage of the SLC page inside a bank. For example, a cycle may be determined when 90% of the SLC word lines in a bank are programmed.

During erasure operations, because data still can be programmed into another two banks, the erasure operation will not affect the program data throughput. Although the erase time (such as 5 ms for TLC) is much longer than the programming time, the erase operation can be performed to large number of the word lines simultaneously. Therefore, the erase throughput may be higher than the programming throughput, depending on the number of the erased word lines.

Figure 73:
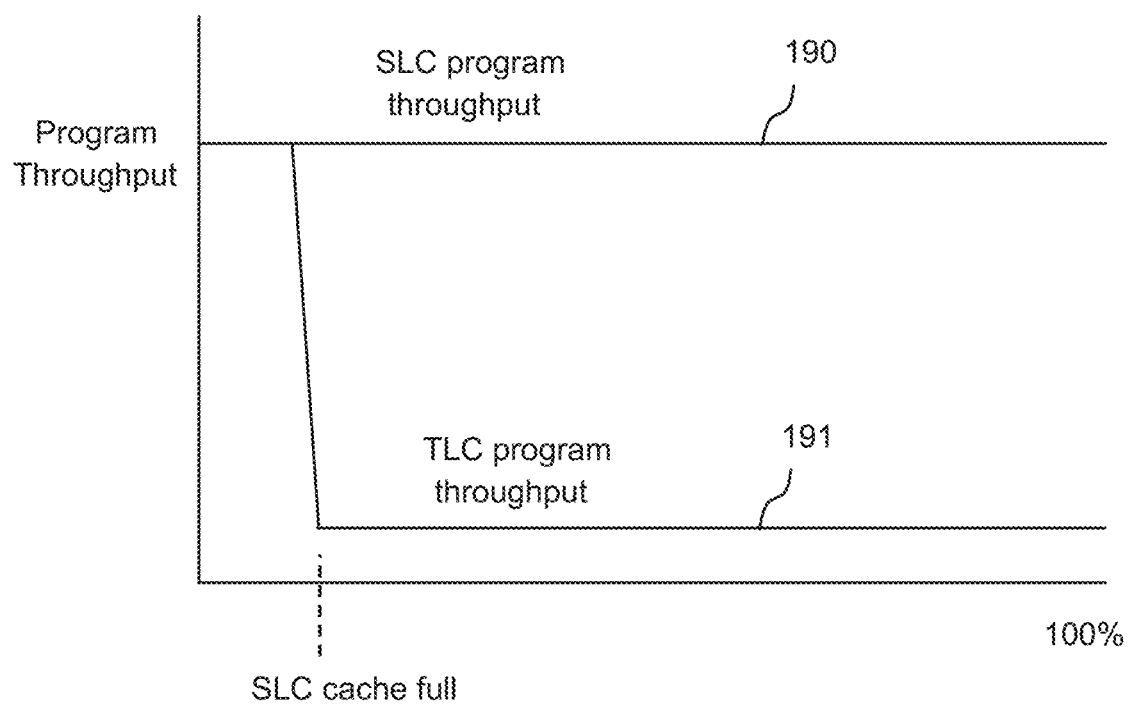
FIG. 73 shows an exemplary diagram that illustrates a comparison of program throughput of embodiments of the invention compared with that of a conventional memory array that utilizes an SLC cache.

FIG. 73 shows a test result that compares the substantial program throughput of embodiments of the invention 190 with the conventional memory using SLC cache 191. During the test, workload data is continuously programmed into the memory array until the array is full. For embodiments of the invention 190, as described above, the program throughput can be maintained at SLC throughput rates for entire array. For the conventional array 191, since there is no idle time available to copy the data stored in the SLC cache to TLC word lines, once the SLC cache is full, the data has to be directly programmed to TLC word lines, and thus the program throughput will drop to TLC program throughput, which may be only ⅛ of SLC programming.

The various exemplary embodiments of the invention can be used in any type of memory technologies including but not limited to NAND flash memory, ferroelectric random-access memory (FRAM), phase-change memory (PCM), resistive random-access memory (RRAM), magnetoresistive random-access memory (MRAM), dynamic random-access memory (DRAM), read only memory (ROM), content-addressable memory (CAM), and many other suitable memory arrays.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A method for programming multiple-level cells in a memory array, wherein the memory array comprises a plurality of planes, and wherein each plane comprises a plurality of bit lines, the method comprising:
   storing multiple data bits in a first group of planes, one data bit per plane, wherein the multiple data bits are stored in bit line capacitances of the first group of planes, and wherein the first group of planes is coupled to a first group of page buffers, respectively;

programming a selected multiple-level cell in a selected plane according to the multiple data bits that are stored in the bit line capacitances of the first group of planes, and wherein the selected plane is not one of the first group of planes; and latching the multiple data bits that are stored in the bit line capacitances of the first group of planes into data latches of the first group of page buffers.

2. The method of claim 1, wherein the multiple-level cells are configured to have a selected number of levels greater than 2 levels.

3. The method of claim 2, wherein the multiple data bits represent any number of levels up to a maximum number of levels of the selected multiple-level cell.

4. The method of claim 1, wherein the multiple data bits comprise three data bits that are stored in three planes of the first group of planes, and wherein the multiple-level cell comprises a TLC cell.

5. The method of claim 1, wherein the operation of programming comprises:

determining a level from the multiple data bits latched in the data latches of the first group of page buffers; and programming the level into the selected multiple-level cell in the selected plane.

6. The method of claim 1, wherein the multiple level cell comprises one of a MLC, TLC, QLC, and PLC cell.

7. A method for programming multiple-level cells in a memory array, wherein the memory array comprises a plurality of banks, and wherein each bank comprises a plurality of multiple-level cells, the method comprising:

storing first data bits in a first selected bank using single level cell programming;

reprogramming the first data bits in the first selected bank to a multiple-level cell in a second selected bank using multiple level cell programming during a first reprogramming time interval; and storing second data bits in a third selected bank during the first reprogramming time interval using single level cell programming.

8. The method of claim 7, wherein the first selected bank and the second selected bank are the same bank.

9. The method of claim 7, wherein the first selected bank, the second selected bank, and the third selected bank are all different banks.

10. The method of claim 7, wherein the multiple-level cells are configured to have a selected number of levels greater than 2 levels.

11. The method of claim 7, further comprising simultaneously performing the operations of reprogramming the first data bits and storing the second data bits.

12. The method of claim 7, further comprising simultaneously performing the operations of:

storing third data bits in the first selected bank using single level cell programming; and reprogramming the second data bits in the second bank to a multiple-level cell in a four selected bank using multiple level cell programming during a second reprogramming time interval.

13. The method of claim 12, further comprising simultaneously performing the operations of reprogramming the second data bits and storing the third data bits.

14. The method of claim 13, further comprising alternating the operations of storing and reprograming between banks.

* * * * *